US011569111B2

(12) United States Patent
Krupyshev et al.

(10) Patent No.: US 11,569,111 B2
(45) Date of Patent: Jan. 31, 2023

(54) SUBSTRATE PROCESSING APPARATUS

(71) Applicant: Brooks Automation, Inc., Chelmsford, MA (US)

(72) Inventors: Alexander Krupyshev, Chelmsford, MA (US); Joseph Hallisey, Pepperell, MA (US); Kevin Bourbeau, Pepperell, MA (US); Emilien Audebrand, Marlborough, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

(21) Appl. No.: 17/108,530

(22) Filed: Dec. 1, 2020

(65) Prior Publication Data

US 2021/0183675 A1  Jun. 17, 2021

Related U.S. Application Data

(60) Provisional application No. 63/081,186, filed on Sep. 21, 2020, provisional application No. 62/942,530, filed on Dec. 2, 2019, provisional application No. 62/942,544, filed on Dec. 2, 2019.

(51) Int. Cl.
H01L 21/677 (2006.01)

(52) U.S. Cl.
CPC .. H01L 21/67742 (2013.01); H01L 21/67766 (2013.01); H01L 21/67769 (2013.01)

(58) Field of Classification Search
CPC ......... H01L 21/67742; H01L 21/67766; H01L 21/67769
See application file for complete search history.

(56) References Cited

U.S. PATENT DOCUMENTS

| 6,121,743 | A | 9/2000 | Genov et al. |
| 6,186,722 | B1 | 2/2001 | Shirai |
| 2004/0216475 | A1 | 11/2004 | Sasaki et al. |
| 2014/0010625 | A1 | 1/2014 | Hudgens et al. |
| 2015/0013910 | A1* | 1/2015 | Krupyshev ....... H01L 21/67184 |
| | | | 156/345.32 |
| 2017/0040203 | A1* | 2/2017 | Caveney ......... H01L 21/68707 |
| 2017/0282357 | A1 | 10/2017 | Caveney et al. |
| 2020/0384634 | A1* | 12/2020 | Muthukamatchy .... B25J 9/1612 |

FOREIGN PATENT DOCUMENTS

| EP | 1152456 | 11/2001 |
| EP | 1152456 A2 * | 11/2001 ....... H01L 21/67248 |

* cited by examiner

Primary Examiner — Gerald McClain
(74) Attorney, Agent, or Firm — Perman & Green, LLP; Colin C. Durham

(57) ABSTRACT

A substrate transport apparatus having a drive section and at least one articulated multi-link arm having an upper arm joined at one end to the drive section and a forearm joined to the upper arm. The upper arm being a substantially rigid unarticulated link. Dual end effector links that are separate and distinct from each other are each rotatably and separately joined to a common end of the forearm about a common axis of rotation. Each end effector link has at least one holding station. The holding station of at least one end effector link includes one holding station at opposite ends of the at least one end effector link that is substantially rigid and unarticulated between the opposite ends, and the holding station at one of the opposite ends is substantially coplanar with the holding station of each other end effector link.

34 Claims, 63 Drawing Sheets

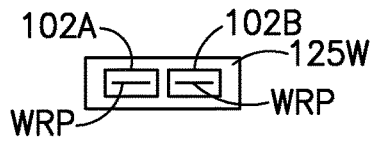
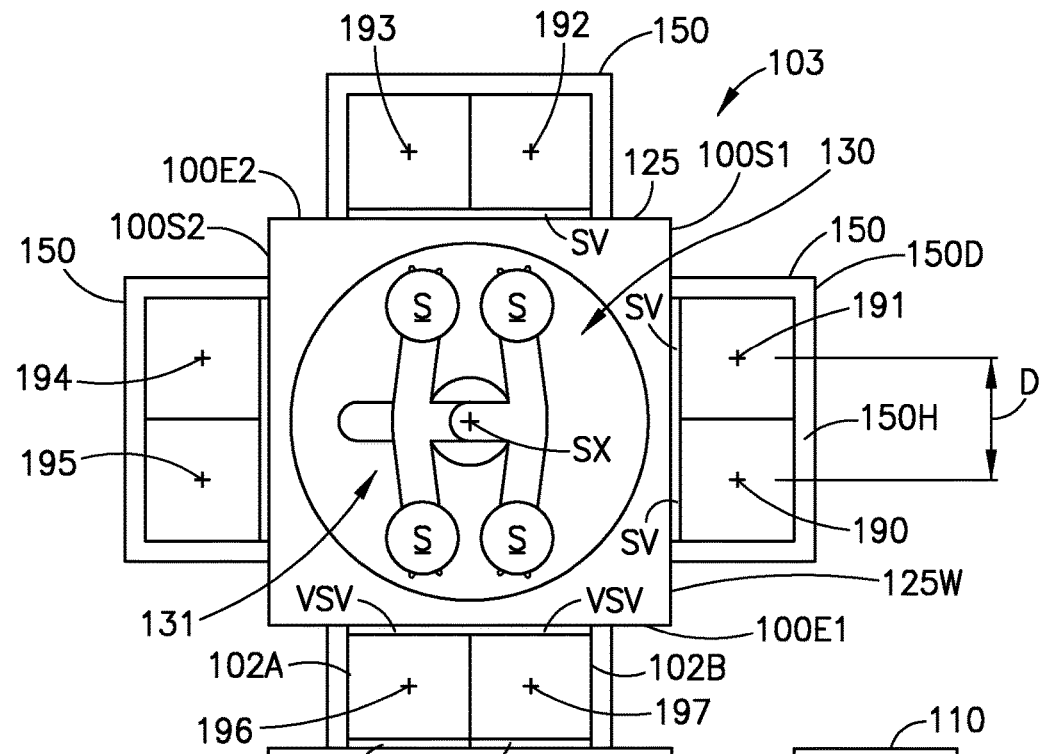
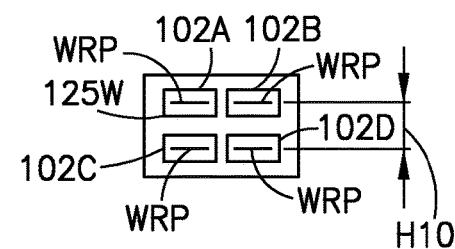

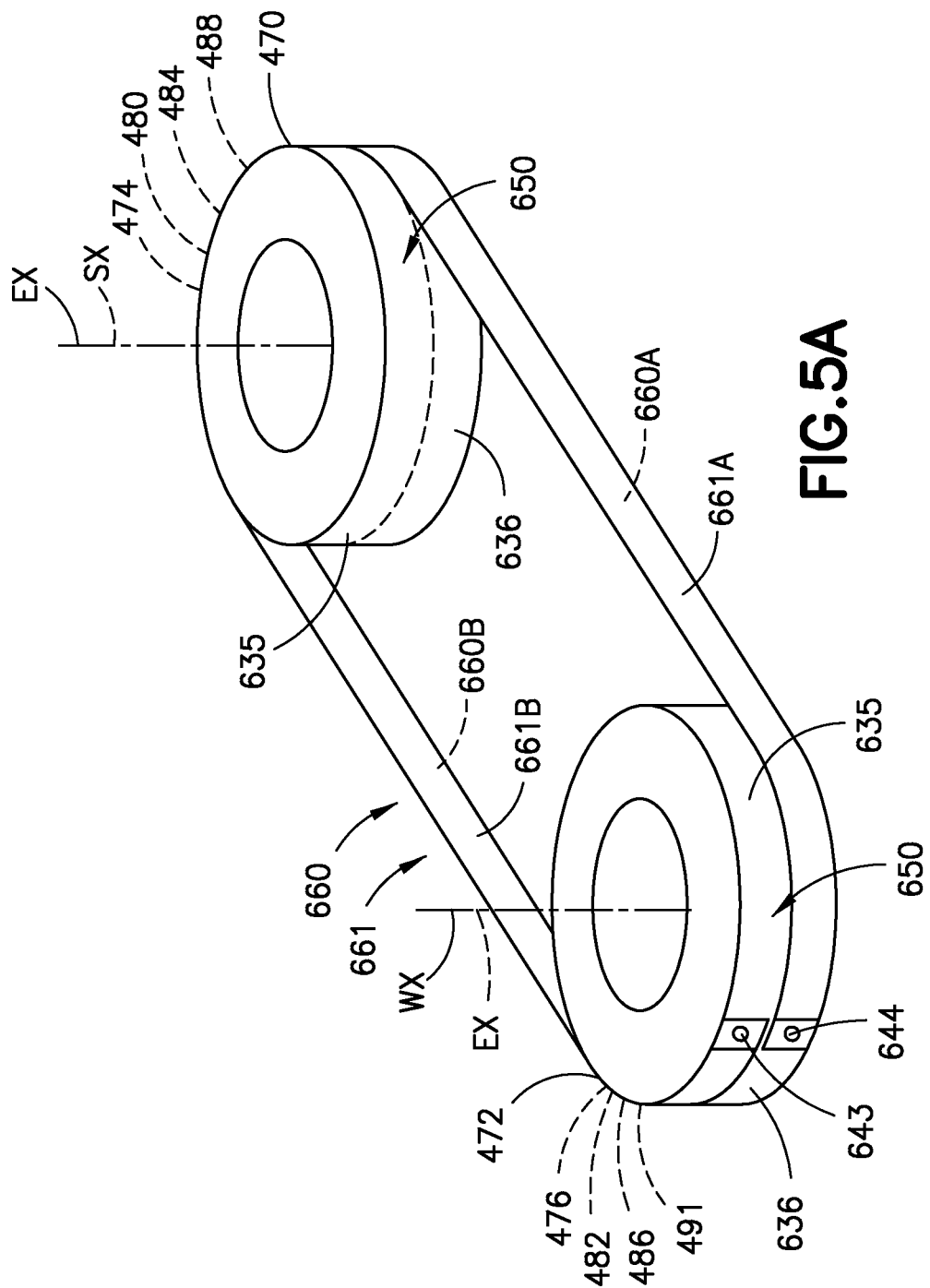

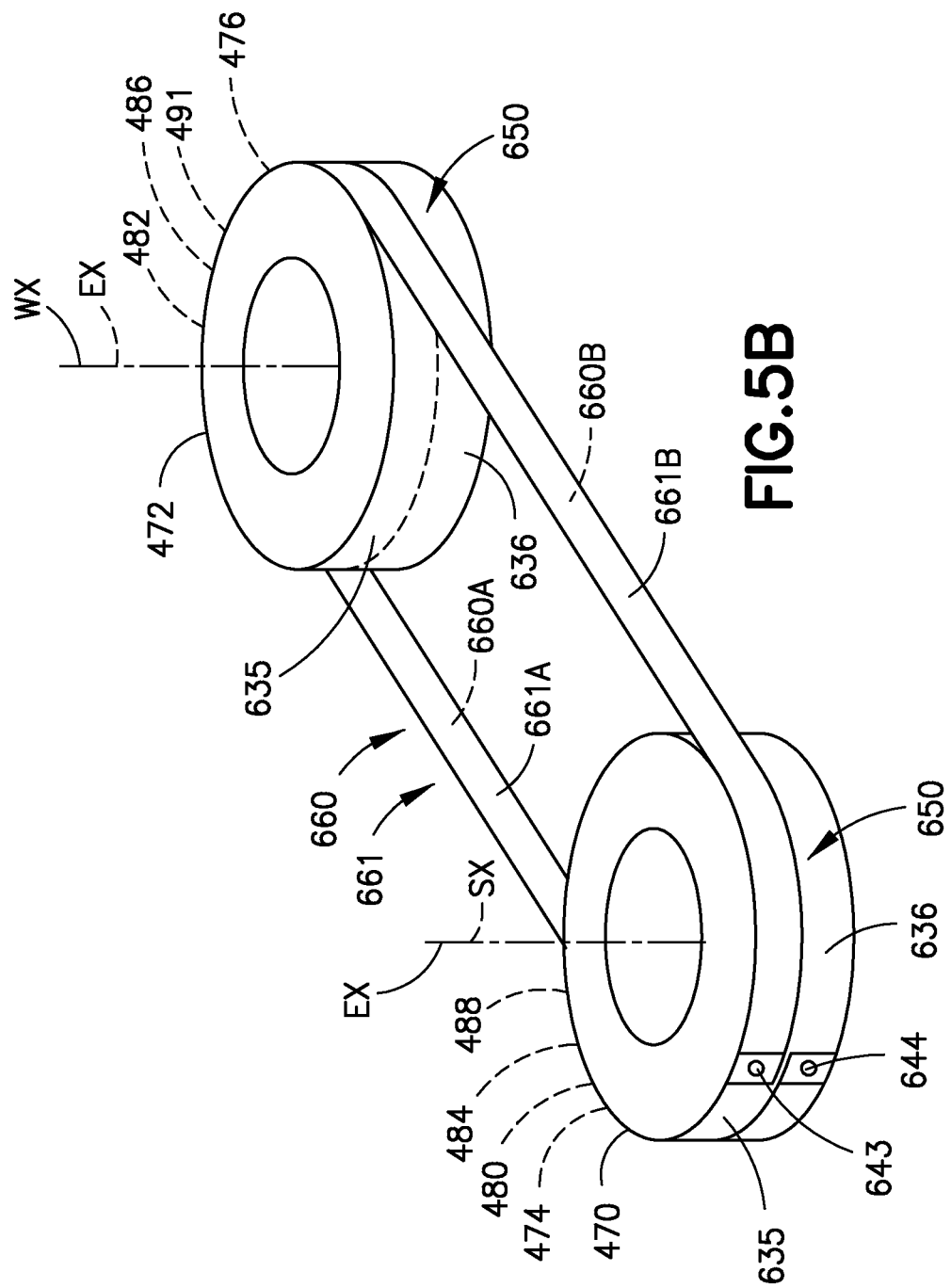

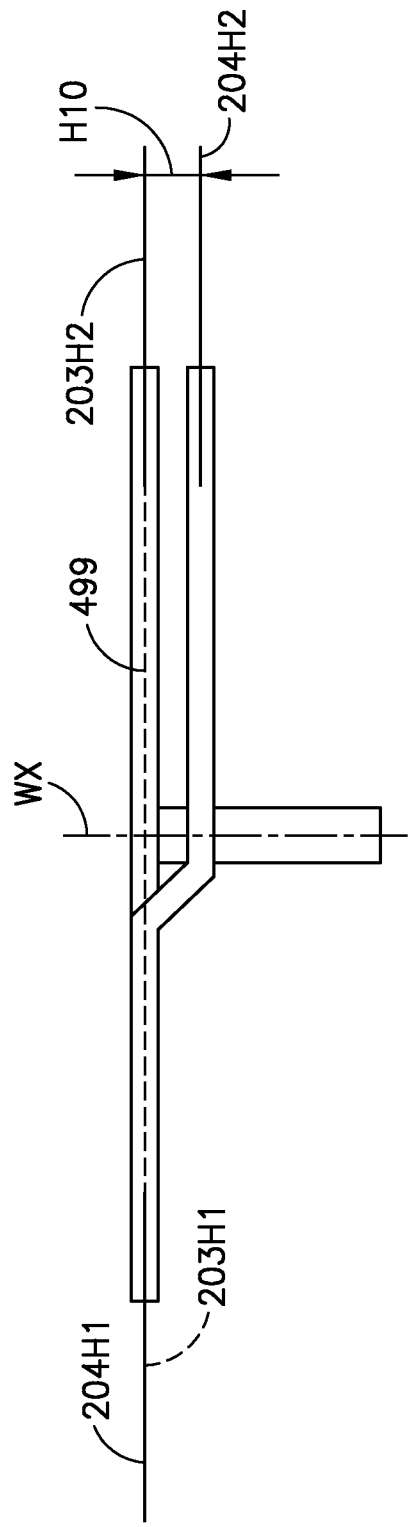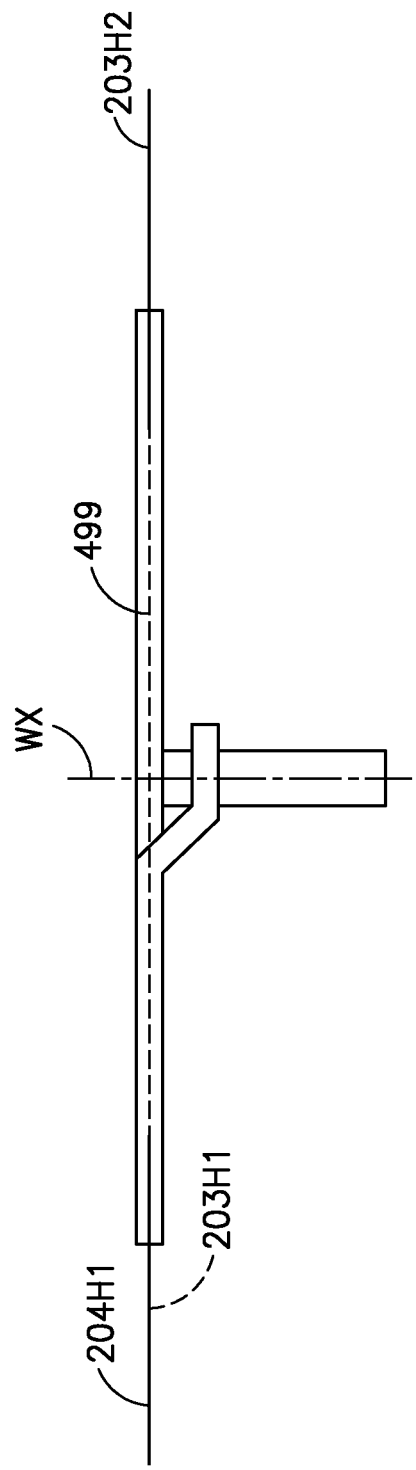

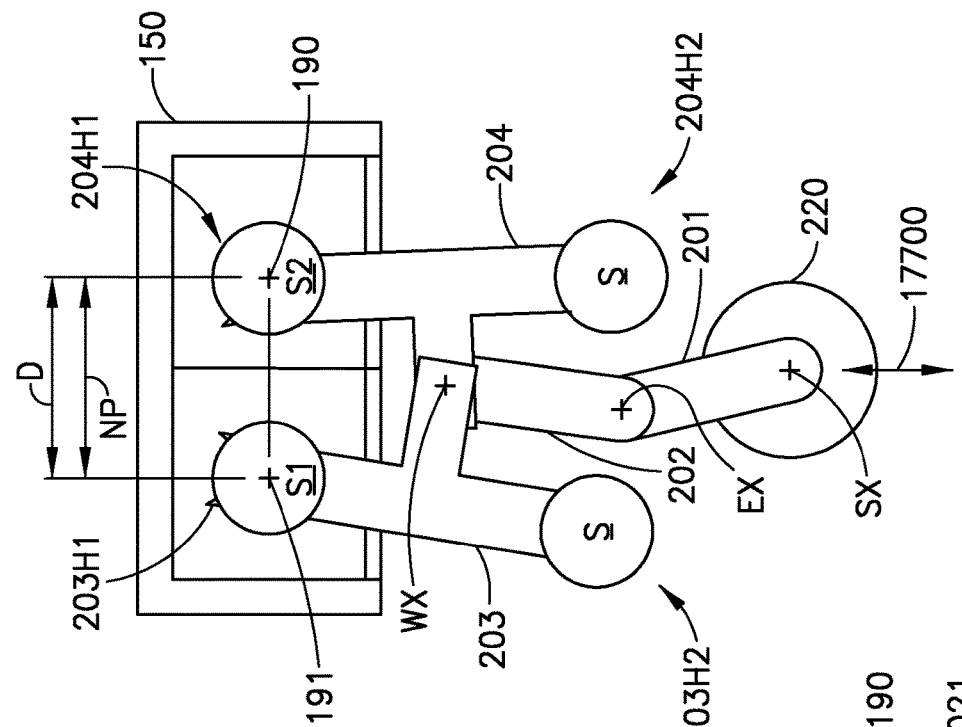
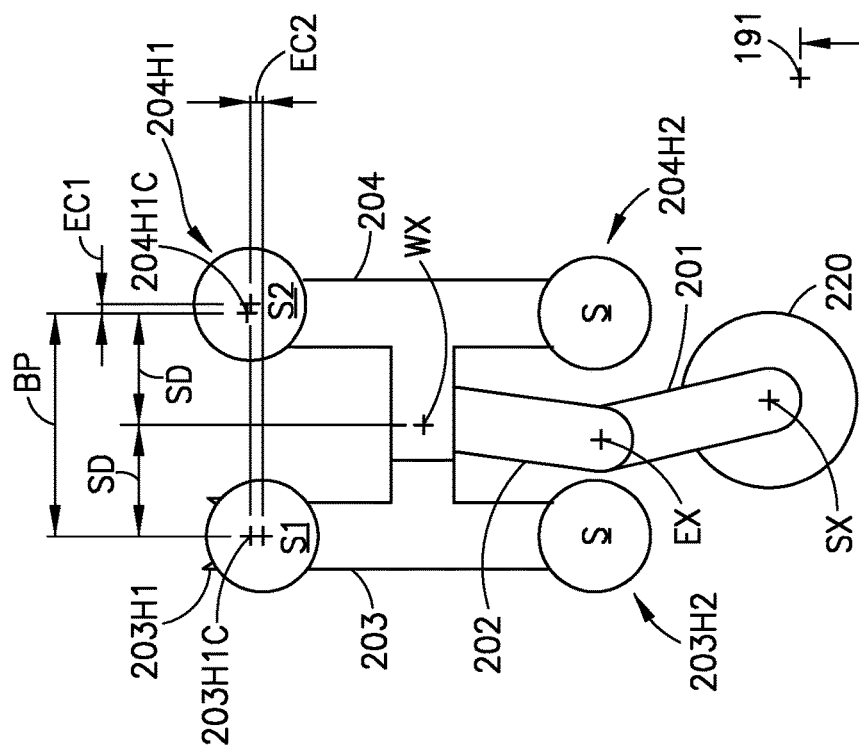
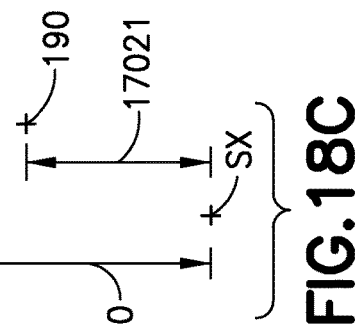
FIG.18B
FIG.18C
FIG.18A

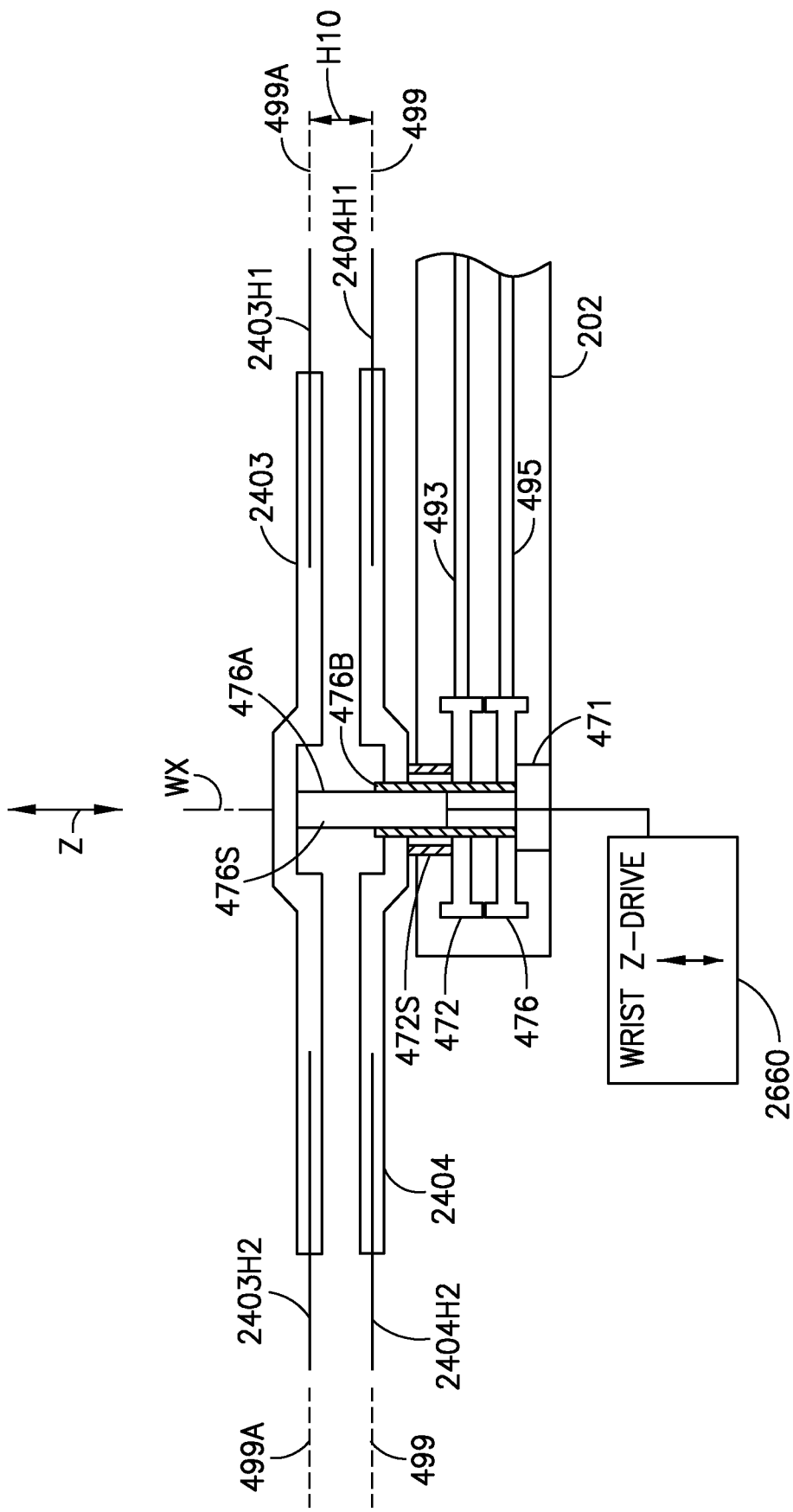

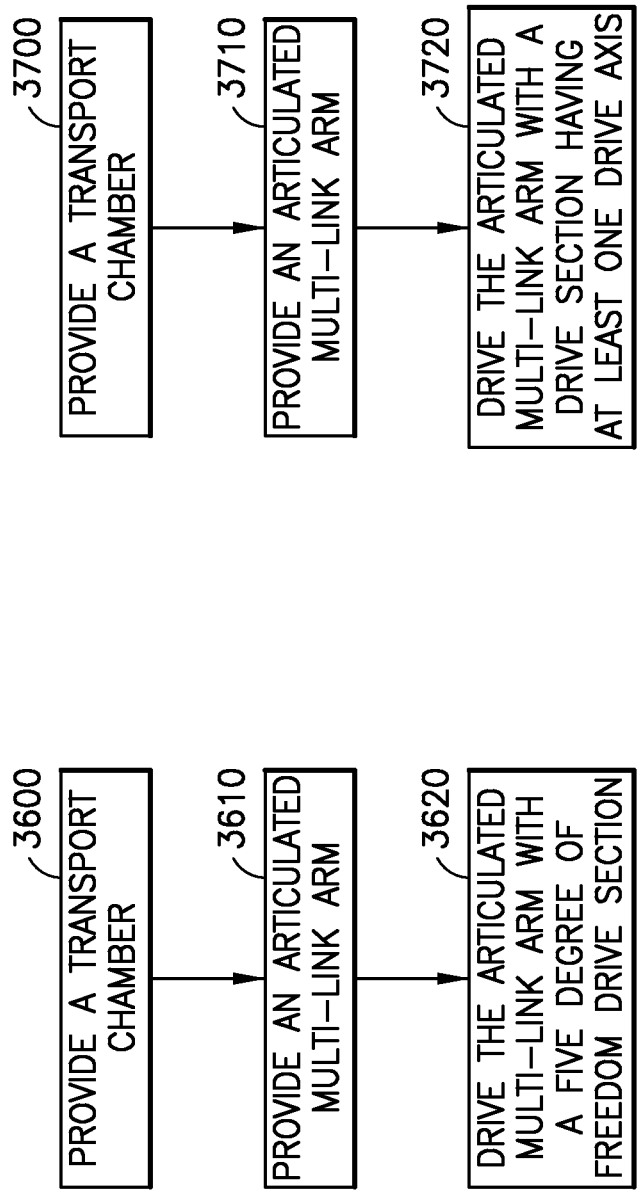

SUBSTRATE PROCESSING APPARATUS

CROSS-REFERENCE TO RELATED APPLICATIONS

This application is a non-provisional of and claims the benefit of the following U.S. provisional patent application Nos. 62/942,530, filed Dec. 2, 2019, 62/942,544, filed Dec. 2, 2019, and 63/081,186, filed Sep. 21, 2020, the disclosures of which are incorporated by reference herein in their entireties.

BACKGROUND

1. Field

The exemplary embodiments generally relate to substrate processing tools, and more particularly, to substrate transport apparatus.

2. Brief Description of Related Developments

Semiconductor fabrication facilities may utilize substrate processing systems that include twin process modules coupled to a common vacuum transport system. In some conventional systems semiconductor substrates (also referred to as substrates or wafers) are generally delivered to the twin process modules by transport apparatus that include side-by-side telescoping arms that can reach into side-by-side substrate holding stations of the twin process modules. In other conventional systems long reach "yaw" type transfer apparatus (e.g., having an arm comprised of arm links that allow for a non-radially aligned substrate holder extension) are used to transfer substrates one at a time to each of the substrate holding stations of the twin process modules. The substrate swap time of these conventional transfer apparatus (e.g., the time it takes to remove a processed substrate from one or both of substrate holding stations of the twin process module and introduce an unprocessed substrate to the same one or both of substrate holding stations) may lead to a decreased throughput of the substrate processing system.

BRIEF DESCRIPTION OF THE DRAWINGS

The foregoing aspects and other features of the present disclosure are explained in the following description, taken in connection with the accompanying drawings, wherein:

FIG. 1A is a schematic illustration of an exemplary substrate processing apparatus incorporating aspects of the present disclosure;

FIGS. 1B and 1C are schematic illustrations of portions of the substrate processing apparatus of FIG. 1A in accordance with aspects of the present disclosure;

FIGS. 5A and 5B are schematic perspective illustrations of a portion of the substrate transport apparatus of FIGS. 2A, 2B, 2C, and 2D in accordance with aspects of the present disclosure;

FIG. 10 is a schematic side illustration of exemplary substrate holders for transport apparatus as described herein and incorporated features of the present disclosure;

FIG. 11 is a schematic side illustration of exemplary substrate holders for transport apparatus as described herein and incorporated features of the present disclosure;

FIGS. 18A-18C are exemplary schematic illustrations of multi-axis automatic wafer centering in accordance with aspects of the present disclosure;

FIGS. 26A, 26B, 26C, and 26D are schematic illustrations of a substrate transport apparatus of the substrate processing apparatus of FIG. 1 in accordance with aspects of the present disclosure;

FIG. 36 is a flow diagram of an exemplary method in accordance with aspects of the present disclosure;

FIG. 37 is a flow diagram of an exemplary method in accordance with aspects of the present disclosure.

DETAILED DESCRIPTION

Figure 2A:
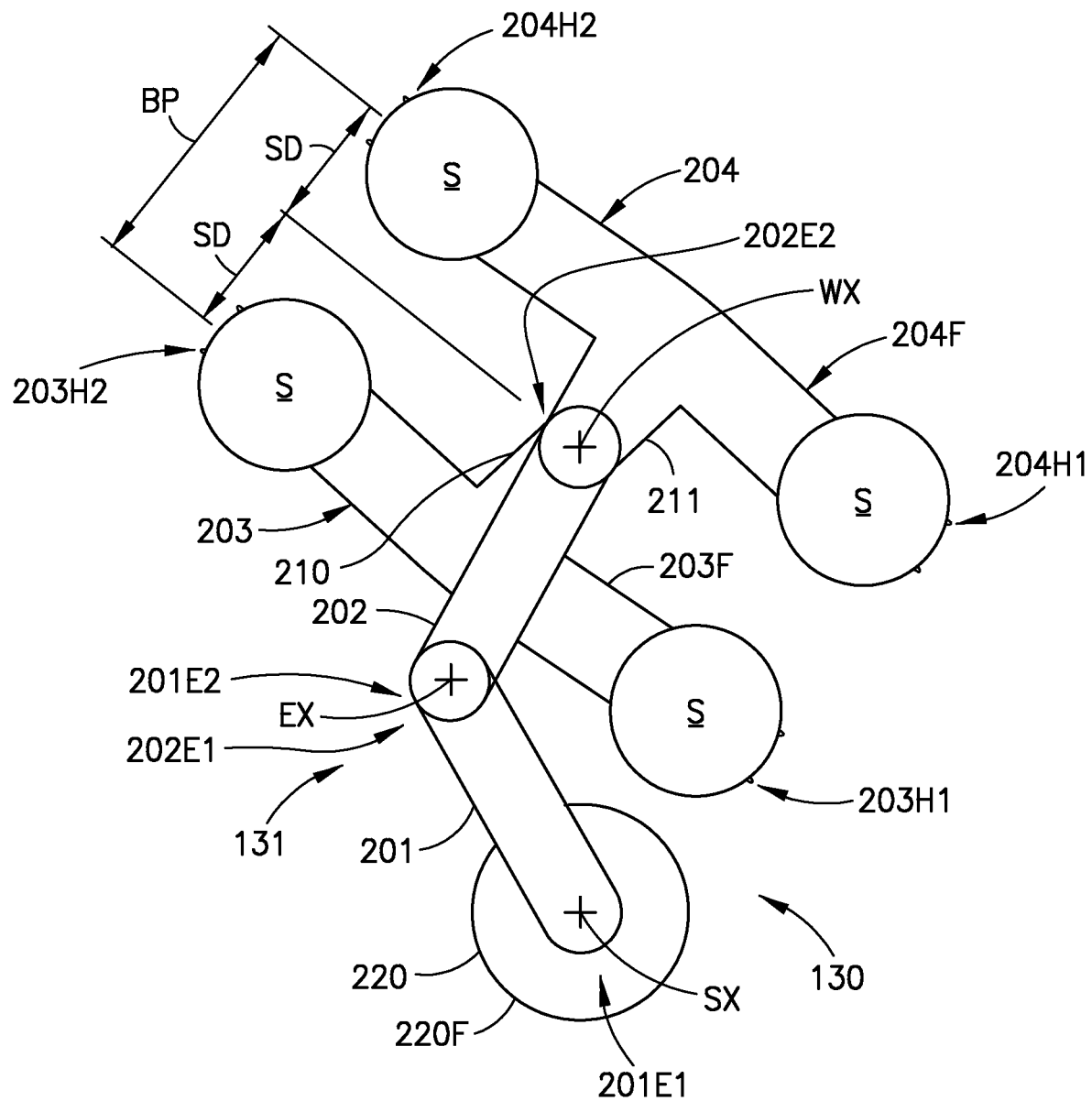
FIGS. 2A, 2B, 2C, and 2D are schematic illustrations of a substrate transport apparatus of the substrate processing apparatus of FIG. 1 in accordance with aspects of the present disclosure.

FIG. 1A illustrates an exemplary substrate processing apparatus 100 in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

The aspects of the present disclosure provide for a substrate processing apparatus 100 that includes a substrate transport apparatus 130. The substrate transport apparatus includes an arm 131 having at least two arm links and end effectors (also referred to herein as substrate holders) rotatably joined to each other, and in one aspect having a shoulder joint/axis SX in a fixed location. The substrate transport apparatus 130 is configured to pick (and/or place) substrates substantially simultaneously to side-by-side substrate processing (or other holding) stations 190-191, 192-193, 194-195, 196-197 while providing a fast swapping of substrates S. The substrate transport apparatus 130 configuration enables picking substrates substantially simultaneously to each side-by-side substrate processing station on each side of a transfer chamber 125, 125A (as described herein) with independent automatic wafer centering for each substrate coincident with substrate transfer by the substrate transport apparatus 130. It is noted, with brief reference to FIGS. 7E-7J) that the fast swapping of substrates S is the removal of substrates S (S1, S2) substantially simultaneously from one set or pair of side-by-side substrate processing stations (e.g., such as substrate processing stations 190-191) with the substrate transport apparatus 130 and placement of other different substrates S (S3, S4) substantially simultaneously to the same side-by-side substrate processing stations (i.e., substrate processing stations 188-189) with the substrate transport apparatus 130, where the removal and placement occurs in rapid succession without any intervening placement of the removed substrates S (S1, S2) (i.e., with the removed substrates S (S1, S2) being held by the substrate transport apparatus). In other aspects, the fast swapping of substrates occurs substantially without intervening Z axis motion between the picking and placement of substrate(s). In other words, there is substantially no intervening Z axis motion of the substrate transport apparatus 130 other than to lift (pick) or lower (place) a substrate to a substrate holding station. For example, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, as will be described further herein.

Also referring to FIG. 2, in accordance with aspects of the present disclosure, the arm 131 includes at least two substrate holders or end effectors 203, 204. In one aspect the substrate holders 203, 204 are dual end of dual pan substrate holders, where each substrate holder has two longitudinally separated ends with at least one substrate holding station or pan at each end; however, in other aspects, the substrate holders have any suitable configuration, such as those configurations described herein. The at least two substrate holders 203, 204 rotate independent of and relative to each other about a wrist axis WX of the substrate transport apparatus 130 so as to effect one or more of automatic wafer centering and accommodation of varying pitch between the side-by-side substrate processing stations 190-191, 192-193, 194-195, 196-197.

Referring again to FIG. 1A, the substrate processing apparatus 100, such as for example a semiconductor tool station, is shown in accordance with an aspect of the present disclosure. Although a semiconductor tool station is shown in the drawings, the aspects of the present disclosure described herein can be applied to any tool station or application employing robotic manipulators. In one aspect the substrate processing apparatus 100 is shown as having clustered arrangement (e.g. having substrate processing stations 190-197 connected to a central or common chamber) while in other aspects the processing apparatus may be a linearly arranged tool, however the aspects of the present disclosure may be applied to any suitable tool station. The substrate processing apparatus 100 generally includes an atmospheric front end 101, two or more vacuum load locks 102A, 102B and a vacuum back end 103. The two or more vacuum load locks 102A, 102B may be coupled to any suitable port(s) or opening(s) of the front end 101 and/or back end 103 in any suitable arrangement. For example, in one aspect the two or more vacuum load locks 102A, 102B (and the respective openings in the transport chamber wall 125W) may be arranged in a common horizontal plane in a side by side arrangement as can be seen in FIG. 1B. In other aspects the two or more vacuum load locks 102A, 120B may be arranged in a grid format such that the two or more vacuum load locks 102A, 102B, 102C, 102D (and the respective openings in the transport chamber wall 125W) are arranged in rows (e.g. having spaced apart horizontal planes) and columns (e.g. having spaced apart vertical planes) as shown in FIG. 1C.

It should be understood that while the two or more vacuum load locks 102A, 102B are illustrated on end 100E1 of a transport chamber 125 in other aspects the two or more vacuum load locks 102A, 102B may be arranged on any number of sides 100S1, 100S2 and/or ends 100E1, 100E2 of the transport chamber 125. Each of the two or more vacuum load locks 102A, 102B, 102C, 102D may also include one or more wafer/substrate resting planes WRP (FIGS. 1B and 1C) in which substrates are held on suitable supports within the respective vacuum load lock 102A, 102B, 102C, 102D. In other aspects, the substrate processing apparatus 100 may have any suitable configuration.

The components of each of the front end 101, the two or more vacuum load locks 102A, 102B, and back end 103 may be connected to a controller 110 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although two load port modules 105 are shown in FIG. 1A, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates S between the substrate cassettes C and the mini-environment 106. The mini-environment 106 generally includes any suitable transfer robot 108 which may incorporate one or more aspects of the present disclosure described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The two or more vacuum load locks 102A, 102B (and 102C, 120D) may be located between and connected to the mini-environment 106 and the back end 103. In other aspects the load ports 105 may be coupled substantially directly to the at least one load lock 102A, 102B or the transport chamber 125 where the substrate carrier C is pumped down to a vacuum of the transport chamber 125 and substrates S are transferred directly between the substrate carrier C and the respective load lock 102A, 120B or transfer chamber 125. In this aspect, the substrate carrier C may function as a load lock such that a processing vacuum of the transport chamber extends into the substrate carrier C. As may be realized, where the substrate carrier C is coupled substantially directly to the vacuum load lock 102A, 120B through a suitable load port any suitable transfer apparatus may be provided within the load lock or otherwise have access to the carrier C for transferring substrates S to and from the substrate carrier C. It is noted that the term vacuum as used herein may denote a high vacuum such as $10^{-5}$ Torr or below in which the substrates S are processed. The two or more vacuum load locks 102A, 102B generally includes atmospheric slot/slit valves ASV and vacuum slot/slit valves VSV (generally referred to herein as slot valves SV). The slot valves SV of the load locks 102A, 102B (as well as for the substrate station modules 150) may provide the environmental isolation employed to evacuate the load locks 102A, 120B after loading a substrate S from the atmospheric front end 101 and to maintain the vacuum in the transport chamber 125 when venting the load lock 102A, 120B with an inert gas such as nitrogen. The slot valves SV of the processing apparatus 100 may be located in the same plane or different vertically stacked planes (as described above with respect to the vacuum load locks 102A, 102B, 120C, 120D) to accommodate transfer of substrates to and from at least the substrate station modules 150 and load locks 102A, 102B coupled to the transport chamber 125. The two or more load locks 102A, 102B (and/or the front end 101) may also include an aligner 109 for aligning a fiducial of the substrate S to a desired position for processing or any other suitable substrate metrology equipment. In other aspects, the two or more vacuum load locks 102A, 120B may be located in any suitable location of the processing apparatus and have any suitable configuration.

The vacuum back end 103 generally includes a transport chamber 125, one or more substrate station modules 150 and any suitable number of substrate transport apparatus 130 that may include one or more aspects of the present disclosure described herein. The substrate transport chamber 125 is configured to hold an isolated atmosphere therein, and has a side wall 125W with more than one substrate transport openings (such as slot valves SV, or openings corresponding thereto such as shown in FIGS. 1B and 1C in the wall 125W to which the slot valves are coupled to sealingly close the openings) separate and juxtaposed with respect to each other along the side wall 125W on a common level (FIG. 1B), or in other aspects in rows and columns (FIG. 1C). The transport chamber 125 may have any suitable shape and size that, for example, complies with SEMI standard E72 guidelines. The substrate transport apparatus 130 will be described below and may be located at least partly within the transport chamber 125 to transport substrates between the two or more vacuum load locks 102A, 102B (or between a cassette C located at a load port) and the various substrate station modules 150. In one aspect the substrate transport apparatus 130 may be removable from the transport chamber 125 as a modular unit such that the substrate transport apparatus 130 complies with SEMI standard E72 guidelines.

Figure 7A:
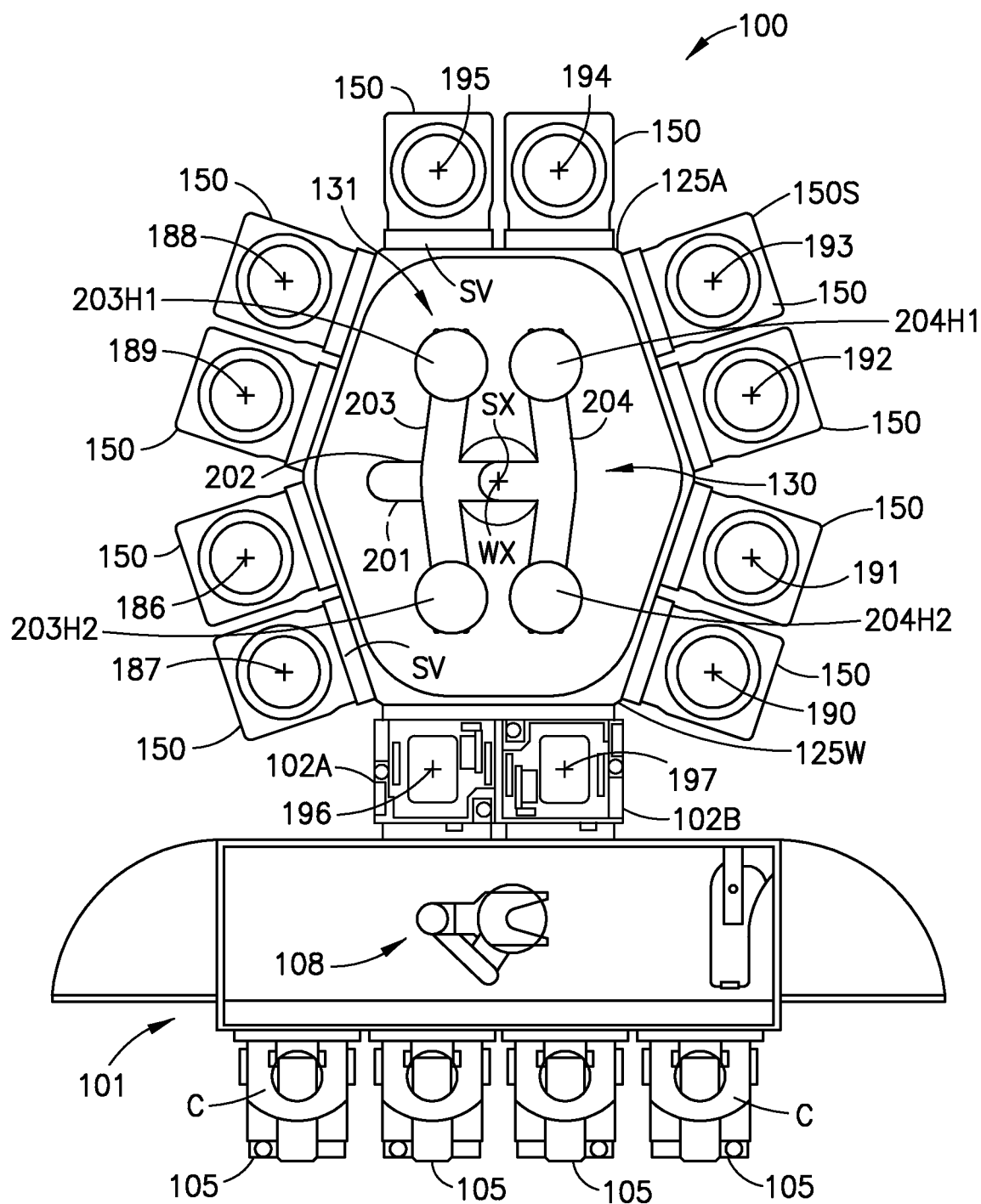
FIGS. 7A-7L are schematic illustrations of an exemplary substrate processing apparatus incorporating the substrate transport apparatus of FIGS. 2A, 2B, 2C, and 2D in accordance with aspects of the present disclosure.

The substrate station modules 150 may be arranged side-by-side on a common side or facet of the transfer chamber 125 and/or a single substrate station module 150 may be disposed on a single side or facet of the transfer chamber 125; however, in other aspects the substrate station modules may be single substrate station modules 150S (FIG. 8), triple substrate station modules 150T (FIG. 12), and/or a substrate station module having any suitable number of substrate processing/holding station(s) located within a single housing or otherwise arranged side-by-side on a common side/facet of the transport chamber 125. In one aspect, the side-by-side substrate processing stations are arranged within a common (i.e., the same) process module housing 150H (FIG. 1A) to form what may be referred to as twin or tandem substrate processing modules 150D; while in other aspects the side-by-side substrate processing stations are single substrate processing stations 150S that are separate from one another and do not share a common housing (FIG. 7A). It should be understood that twin substrate station modules 150D, the single substrate station modules 150S, the triple substrate station modules 150T, and any other substrate station module having any suitable number of substrate processing stations may be coupled to the same (i.e., a common) transfer chamber 125 in any suitable combination (see, e.g., FIG. 8 where single and twin substrate station modules are coupled to the same transfer chamber).

Referring to FIG. 1A and the substrate station module 150 on side 100S1 of the transfer chamber 125 for example, substrate processing stations 190, 191 are arranged side by side in a common housing 150H and may be accessible from the within the transfer chamber 125 through a single slot valve (see, e.g., substrate processing stations 192, 193) that is common to both substrate processing stations or each substrate processing station may have a respective independently operable slot valve (see, e.g., substrate processing stations 190, 191). The side-by-side substrate processing stations, such as 190, 191 for example, are separated or spaced from one another by any suitable distance or pitch D, which as will be described herein, may be accommodated by varying a distance between substrate processing stations of the at least two dual ended substrate holders 203, 204 of the substrate transport apparatus 130.

The substrate station modules 150 may operate on the substrates S through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The substrate station modules 150 are communicably connected to the transport chamber 125 in any suitable manner, such as through slot valves SV, to allow substrates to be passed from the transport chamber 125 to the substrate station modules 150 and vice versa. The slot valves SV of the transport chamber 125 may be arranged to allow for the connection of the twin process modules.

It is noted that the transfer of substrates to and from the substrate station modules 150 and the load locks 102A, 102B (or cassette C) coupled to the transfer chamber 125 may occur when at least a portion of the at least two dual ended substrate holders 203, 204 of the substrate transport apparatus 130 are aligned with a respective substrate processing station of a predetermined set or pair of side-by side substrate processing stations 190-191, 192-193, 194-195, 196-197. In accordance with aspects of the present disclosure two substrates S may be transferred to a respective predetermined substrate station module 150 substantially simultaneously (e.g. such as when substrates are picked/placed from the twin processing modules in the manner described herein).

The substrate transport apparatus 130 is generally described herein as having at least one articulated multi-link arm 131 with a drive section 220, 200A, 220B, 220C connected to the transport chamber 125 at a fixed location; however, in other aspects the substrate transport apparatus 130 may be mounted on a boom arm or linear carriage such as that described in U.S. patent application Ser. No. 15/103,268 titled "Processing Apparatus" and filed on Oct. 16, 2014 and International patent application number PCT/US13/25513 entitled "Substrate Processing Apparatus" and filed on Feb. 11, 2013, the disclosures of which are incorporated herein by reference in their entireties. The at least one articulated multi-link arm 131 has an upper arm 201 and a forearm 202 located in the transport chamber 125. A proximate end 201E1 of the upper arm 201 being rotatably joined to the drive section 220, 220A, 220B, 220C at the fixed location. The forearm 202 is rotatably joined to the upper arm 201 at a distal end 201E2 of the upper arm 201 and the upper arm 201 is a substantially rigid unarticulated link between the proximate end 201E1 and the distal end 201E2.

In the aspects, of the present disclosure described herein, at least one end effector link (as will be described herein) is rotatably joined to a joint (e.g., wrist joint or axis WX) at an end of the forearm 202 so that the at least one end effector link rotates relative to the forearm 202 about a common axis of rotation at the joint, the at least one end effector link has more than one substrate holding station (as will be described herein) dependent therefrom juxtaposed along a common plane 499 (see, e.g., FIGS. 2D, 10, and 11) with respect to each other and configured so that rotation of the at least one end effector link about the common axis of rotation rotates the more than one substrate holding station about the common axis of rotation. As will be described herein, the drive section 220, 220A, 220B, 220C of the substrate transport apparatus 130 is configured to at least extend and retract the multi-link arm 131 (and the at least one effector coupled thereto) along a non-radial linear path, relative to the fixed location, so the more than one juxtaposed substrate holding station each traverse linearly along the non-radial path, with extension and retraction of the arm 131, and pass substantially simultaneously through separate corresponding openings of the more than one juxtaposed substrate transport openings (such as slot valves SV, or openings corresponding thereto such as shown in FIGS. 1B and 1C in the wall 125W to which the slot valves are coupled to sealingly close the openings) on the common level. In other aspect, the drive section 220, 220A, 220B, 220C of the substrate transport apparatus 130 is configured to extend and retract the multi-link arm 131 along one or both a radial linear path and a non-radial linear path, relative to the fixed location, for transporting substrates as described herein.

Still referring to FIG. 1A and also to FIGS. 2A-2D, the substrate transport apparatus 130 includes a frame 220F, a drive section 220 connected to the frame 220F, and at least one articulated multi-link arm 131 (a single arm is illustrated for exemplar purposes only). In one aspect, the arm 131 is a selective compliant articulated robot arm (referred to herein as a "SCARA arm") but in other aspects the arm may have any suitable configuration. For example, the arm 131 includes an upper arm link 201, a forearm link 202, and at least one end effector link 203, 204 (i.e., a dual link SCARA with at least one end effector); although in other aspects the arm 131 may have any suitable number of arm links and substrate holders. The upper arm link 201 is a substantially rigid link (i.e., the upper arm link 201 is unarticulated between longitudinal ends 201E1, 201E2). The upper arm link 201 is rotatably coupled to the drive section 220 at one longitudinal end 201E1 (forming what may be referred to as a shoulder joint or axis SX) so as to rotate about the shoulder axis SX of the arm 131. In one aspect, the shoulder joint or axis SX is at a fixed location (shown in the Figs. along an axis of symmetry of the transport chamber, though in other aspects may be offset from the axis of symmetry of the transport chamber). The forearm link 202 is a substantially rigid link (i.e., the forearm link 202 is unarticulated between longitudinal ends 202E1, 202E2). Longitudinal end 202E1 of the forearm link 202 is rotatably coupled to the longitudinal end 201E2 of the upper arm link 201 so that the forearm link 202 rotates about an elbow axis EX of the arm 131. Here, the forearm link 202 and upper arm link 201 are of a similar length (e.g., from joint center to joint center), although in other aspects the forearm link 202 and upper arm link 201 may have different lengths (e.g., from joint center to joint center).

In one aspect the at least one end effector link 203, 204 (also referred to herein as a substrate holder) comprises two dual (ended) substrate holders 203, 204; however, in other aspects, as described herein, the at least one substrate holder may have any suitable configuration. The dual substrate holders 203, 204 are separate and distinct from each other. Each of the dual substrate holders 203, 204 is rotatably and separately joined to a joint at a common end of the forearm link 202 so that each end substrate holder 203, 204 rotates relative to the forearm link 202 about the joint, or a common axis of rotation formed thereby (see, e.g., the wrist axis or joint WX). Each of the dual substrate holders 203, 204 has a corresponding at least one substrate holding station 203H1, 203H2, 204H1, 204H2 dependent therefrom, and extending from the joint so that the more than one substrate holders 203, 204 are juxtaposed along a common plane 499 (see FIGS. 2D, 4, 10, and 11) with respect to each other. The common plane 499 is determined by at least three of the substrate holding stations 203H1, 203H2, 204H1, 204H2 of more than one substrate holders 203, 204, where two substrate holding stations (e.g., substrate holding stations 203H1, 203H2 or 204H1, 204H2) of the at least three substrate holding stations 203H1, 203H2, 204H1, 204H2, correspond to a common substrate holder 203, 204 of the more than substrate holders 203, 204. As described herein, the two substrate holding stations (e.g., substrate holding stations 203H1, 203H2 or 204H1, 204H2) are disposed one each at opposite ends of the common substrate holder 203, 204.

The corresponding at least one substrate holding station 203H1, 203H2, 204H1, 204H2 dependent from at least one substrate holder 203, 204 includes one substrate holding station 203H1, 203H2, 204H1, 204H2 at opposite ends of the at least one substrate holder 203, 204. The at least one substrate holder 203, 204 being substantially rigid and unarticulated between the opposite ends, and the substrate holding station 203H1, 203H2, 204H1, 204H2 at one of the opposite ends is substantially coplanar with the corresponding at least one substrate holding station 203H1, 203H2, 204H1, 204H2 of each other separate and distinct substrate holder 203, 204. In one aspect, the substrate holding station (see substrate holding stations 203H1, 203H2 of substrate holder 203 and substrate holding stations 204H1, 204H2 of substrate holder 204) at opposite ends of the at least one substrate holder 203, 204 are substantially coplanar with each other. In other aspects, the substrate holding station (see substrate holding stations 203H1, 203H2 or 204H1, 204H2) at opposite ends of the at least one substrate holder (see one of substrate holder 203 or 204) are substantially coplanar with the corresponding at least one substrate holding station (see the other of substrate holding stations 203H1, 203H2 or 204H1, 204H2) of each other separate and distinct end effector link (see the other of substrate holder 203 or 204). In still other aspects, the corresponding at least one substrate holding station (see substrate holding stations 203H1, 203H2, 204H1, 204H2) of each separate and distinct substrate holder (see each of substrate holders 203, 204) includes one substrate holding station at opposite ends of the at least one substrate holder 203, 204, and each of the separate and distinct substrate holders 203, 204 is substantially rigid and unarticulated between opposite ends.

Referring still to FIGS. 2A-2D the dual substrate holders 203, 204 will be described in greater detail. For example, in one aspect, each of the dual substrate holders 203, 204 includes a longitudinally extended frame 203F, 204F (FIG. 2A) having respective substrate holding stations 203H1, 203H2, 204H1, 204H2 disposed at opposite longitudinal ends of the frame 203F, 204F. In one aspect, the two substrate holding stations (e.g., substrate holding stations 203H1, 203H2 or 204H1, 204H2) at opposite ends of a common substrate holder are substantially coplanar with each other; while in other aspects the two substrate holders may be in different stacked planes (see, e.g., FIG. 10). As noted above, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. Each of the frames 203F, 204F forms a substantially rigid link from respective substrate holding station 203H1, 204H1 to respective substrate holding station 203H2, 204H2 (i.e., the dual ended substrate holders 203, 204 are unarticulated between their respective longitudinally separated substrate holding stations 203H1, 203H2, 204H1, 204H2). Each of the dual ended substrate holders 203, 204 includes an offset mounting protrusion 210, 211 that extends laterally from frame 203F, 204F. The offset mounting protrusion 210, 211 of the dual ended substrate holders 203, 204 is rotatably coupled to the upper arm 202 about a wrist axis WX so that each of the dual ended substrate holders 203, 204 rotate independent of each other about the wrist axis WX.

The offset mounting protrusion 210, 211 may have any suitable length that sets or otherwise defines any suitable base pitch BP (between the side-by side substrate holding stations 203H1-204H1 and (such as to be commensurate with the base pitch BP) between the side-by side substrate holding stations 203H2-204H2) and/or any suitable substrate holder offset distance SD of each of the substrate holdings locations 203H1, 203H2, 204H1, 204H2 relative to the wrist axis WX. In one aspect, the base pitch BP may be substantially equal to the pitch D between side-by-side substrate processing stations, such as 190, 191 for example (see FIG. 1A). In other aspects, as described herein automatic wafer centering is effected by varying the base pitch BP (e.g., the distance between the side-by side substrate holding stations 203H1-204H1, 203H2-204H2 may be increased or decreased) to accommodate variances in the pitch D and/or to effect automatic wafer centering for placing wafers at the substrate processing stations 190-197. For example, one or more of the substrate holders 203, 204 may be independently rotated about the wrist axis WX so as to increase or decrease (or otherwise change) a respective offset distance SD and make a corresponding change in the base pitch BP as described herein. In one aspect, the drive section 220 is configured, as described herein, to independently align a corresponding at least one substrate holding station 203H1, 203H2, 204H1, 204H2 of each of the substrate holders 203, 204 relative to the corresponding substrate holding station(s) 203H1, 203H2, 204H1, 204H2 of another of the substrate holders 203, 204.

Figure 2B:
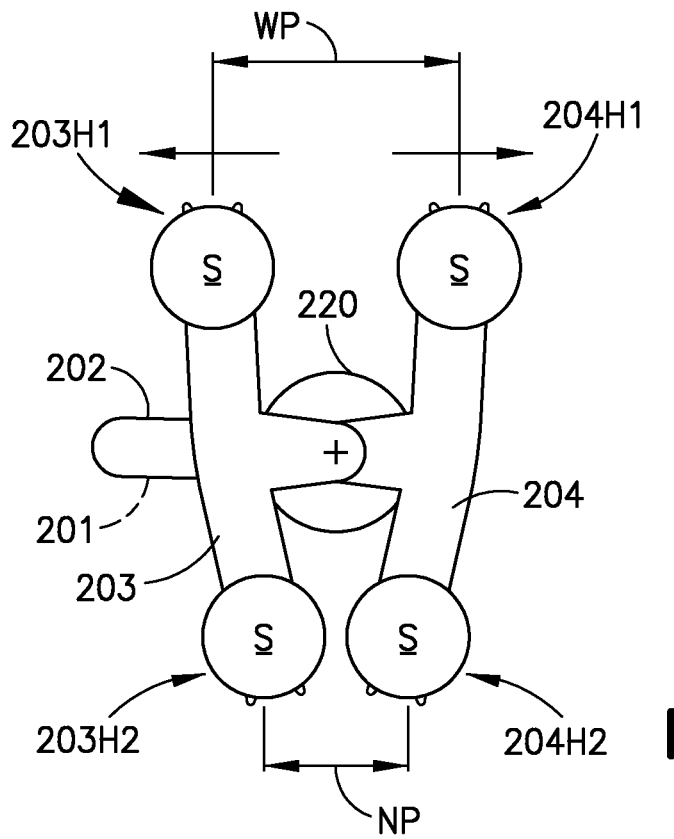
Figure 2C:
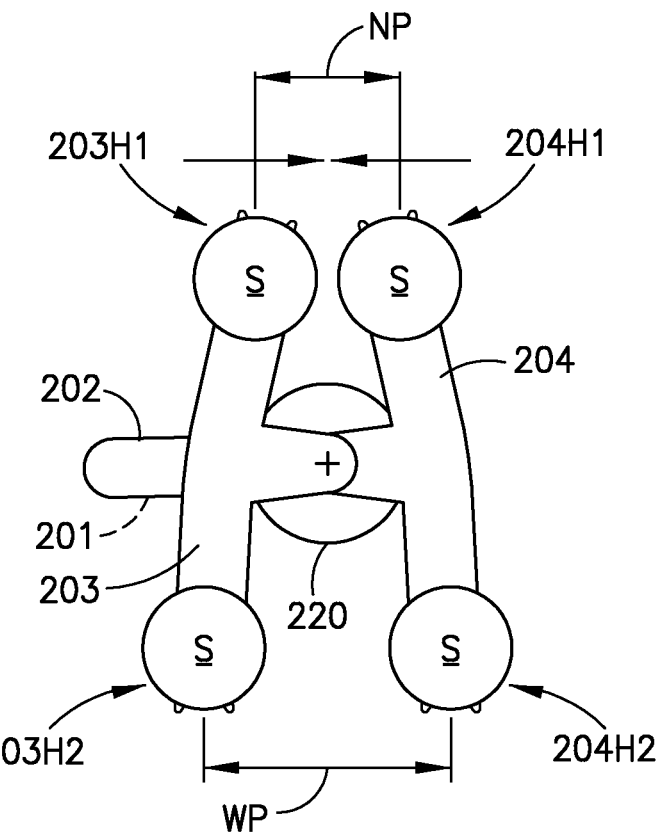
Figure 2D:
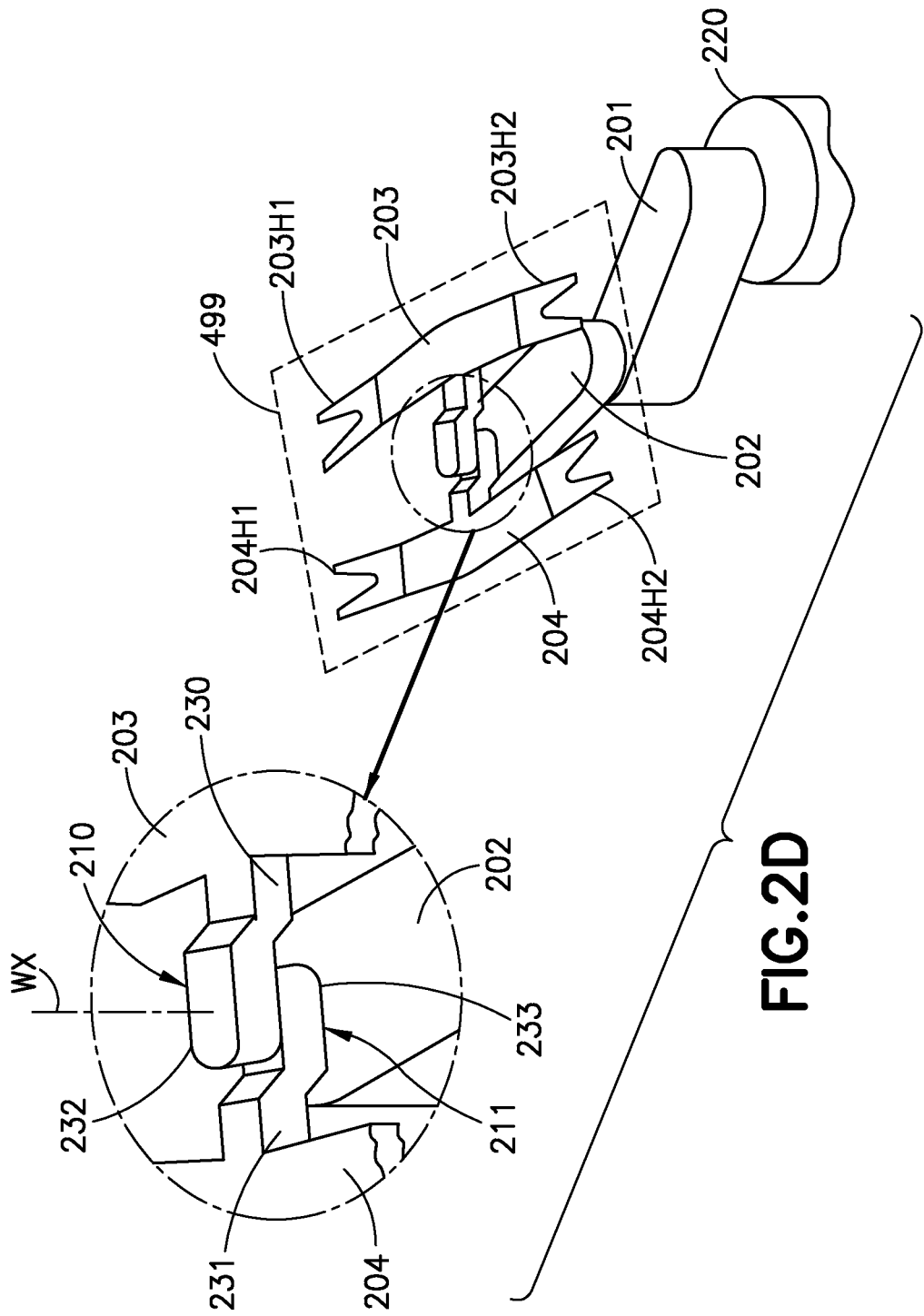
Figure 4:
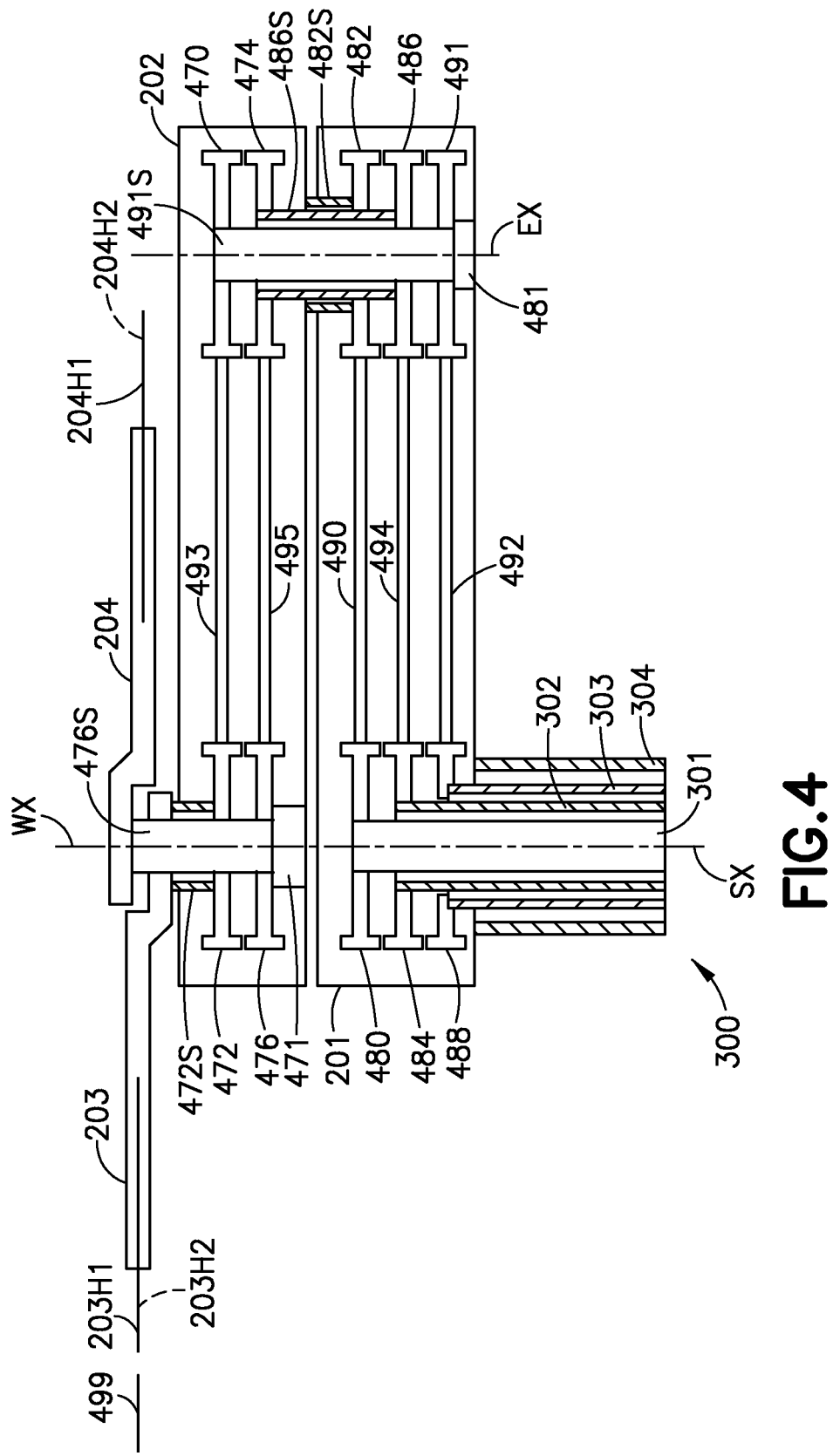
FIG. 4 is a schematic cross-section illustration of a portion of the substrate transport apparatus of FIGS. 2A, 2B, 2C, and 2D in accordance with aspects of the present disclosure.

The dual ended substrate holders 203, 204 are configured in any suitable manner so that the substrate holding stations 203H1, 203H2, 204H1, 204H2 are disposed in a common plane 499 (see FIGS. 2D and 4). For example, the offset mounting protrusions 210, 211 may each include a first portion 230, 231 that is substantially coplanar with a respective frame 203F, 204F. The offset mounting protrusions 210, 211 may each include a second portion 232, 233 that is offset so as to extend outside of a plane define by the respective frame 203F, 204F. The offset of the second portions 232, 233 is such that the substrate holding stations 203H1, 203H2, 204H1, 204H2 are disposed in the common plane 499 when the second portions are stacked one above the other (see FIG. 2D) and rotatably coupled to the forearm 202 about the wrist axis WX.

The dual substrate holders 203, 204 are disposed so that radial extension and retraction of the arm 131 effects substantially simultaneous extension and retraction of the corresponding at least one substrate holding station 203H1, 203H2, 204H1, 204H2 of each substrate holder 203, 204 through respective separate openings (see slot valves SV) in a transport chamber wall 125W (FIG. 1A) that are juxtaposed with respect to each other at a substantially common level (see the one or more wafer/substrate resting planes WRP in FIGS. 1B and 1C). In other aspects, the substrate holders 203, 204 may extend through openings in the transport chamber wall that are stacked in different planes.

Figure 7B:
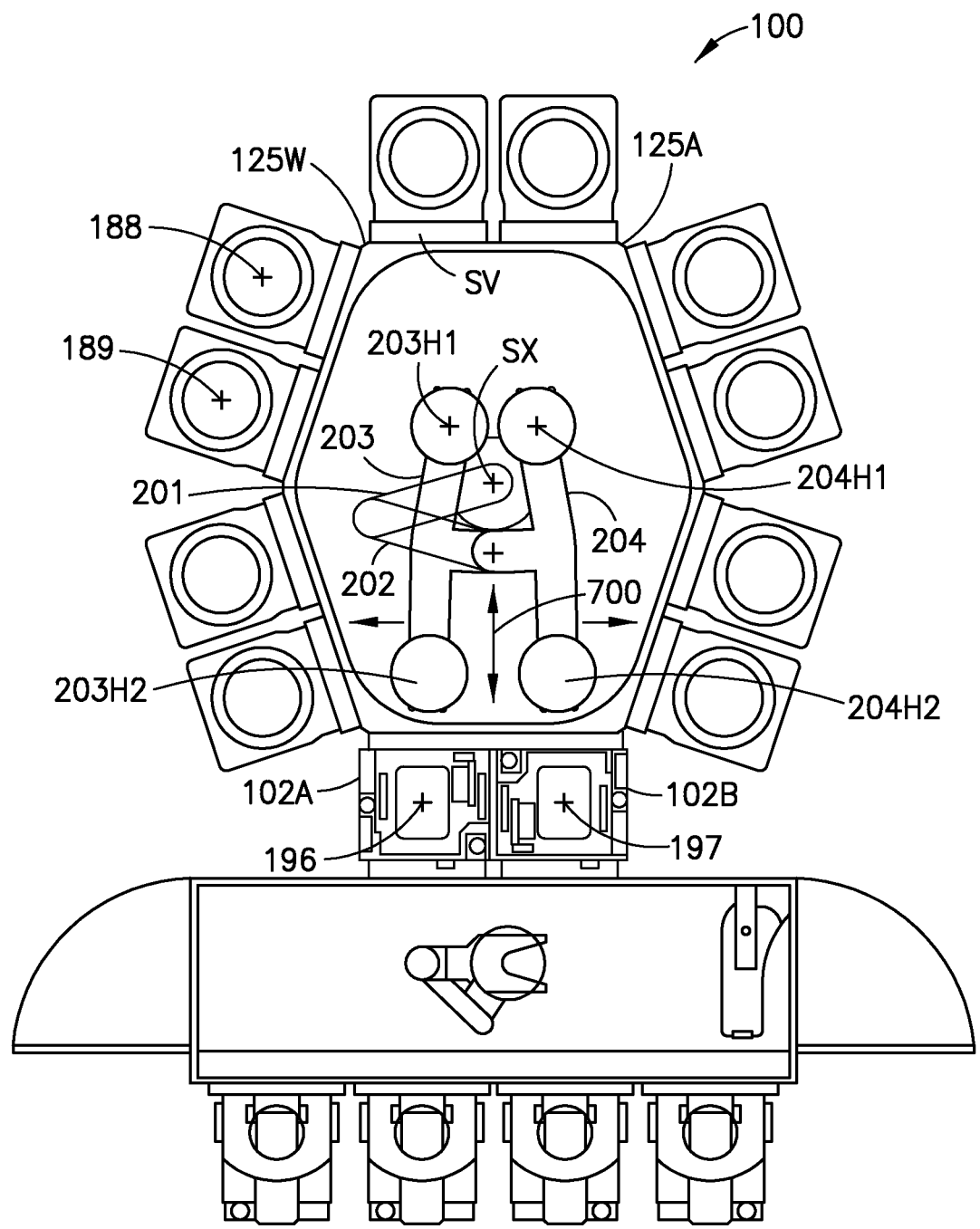
Figure 7C:
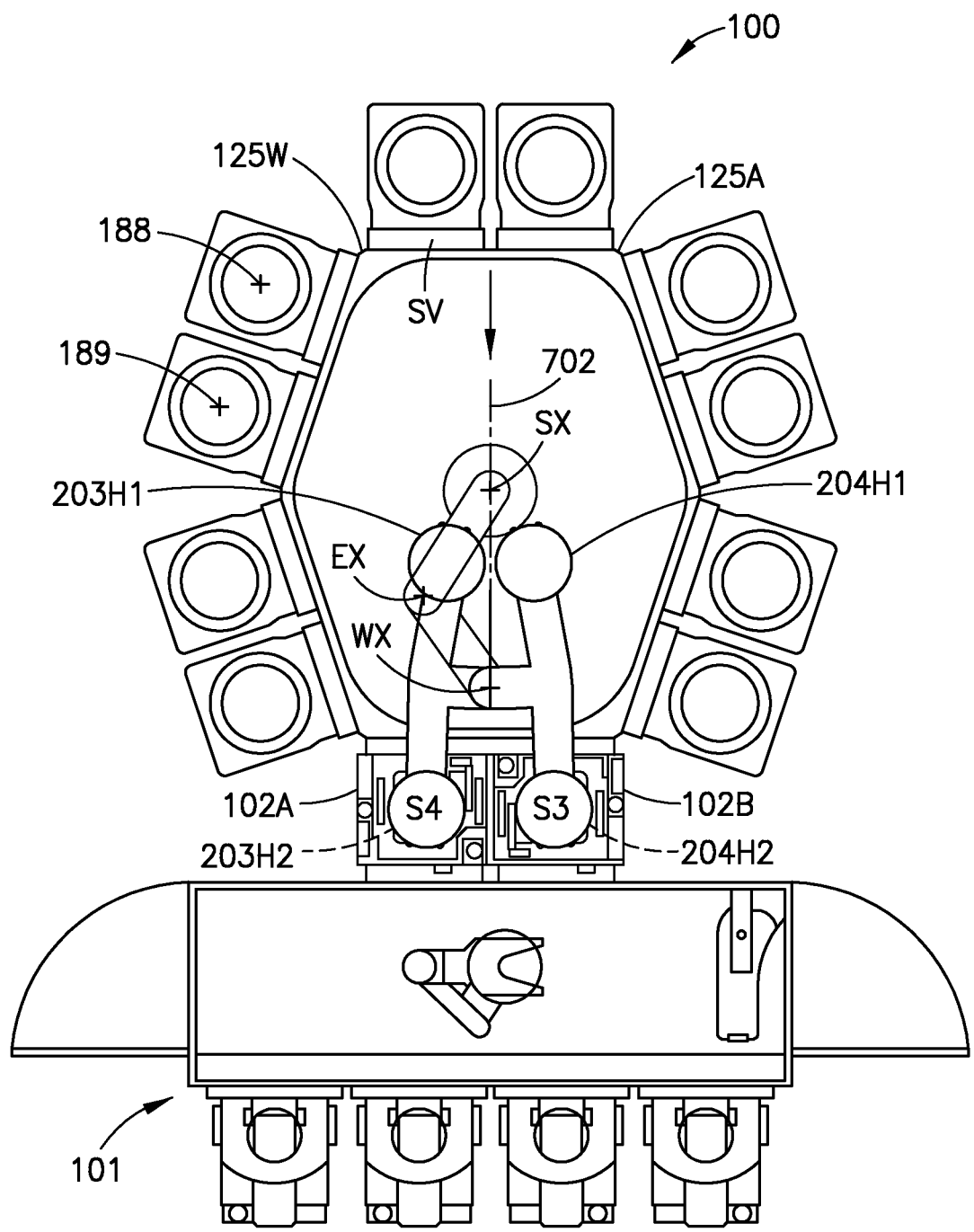
Figure 7D:
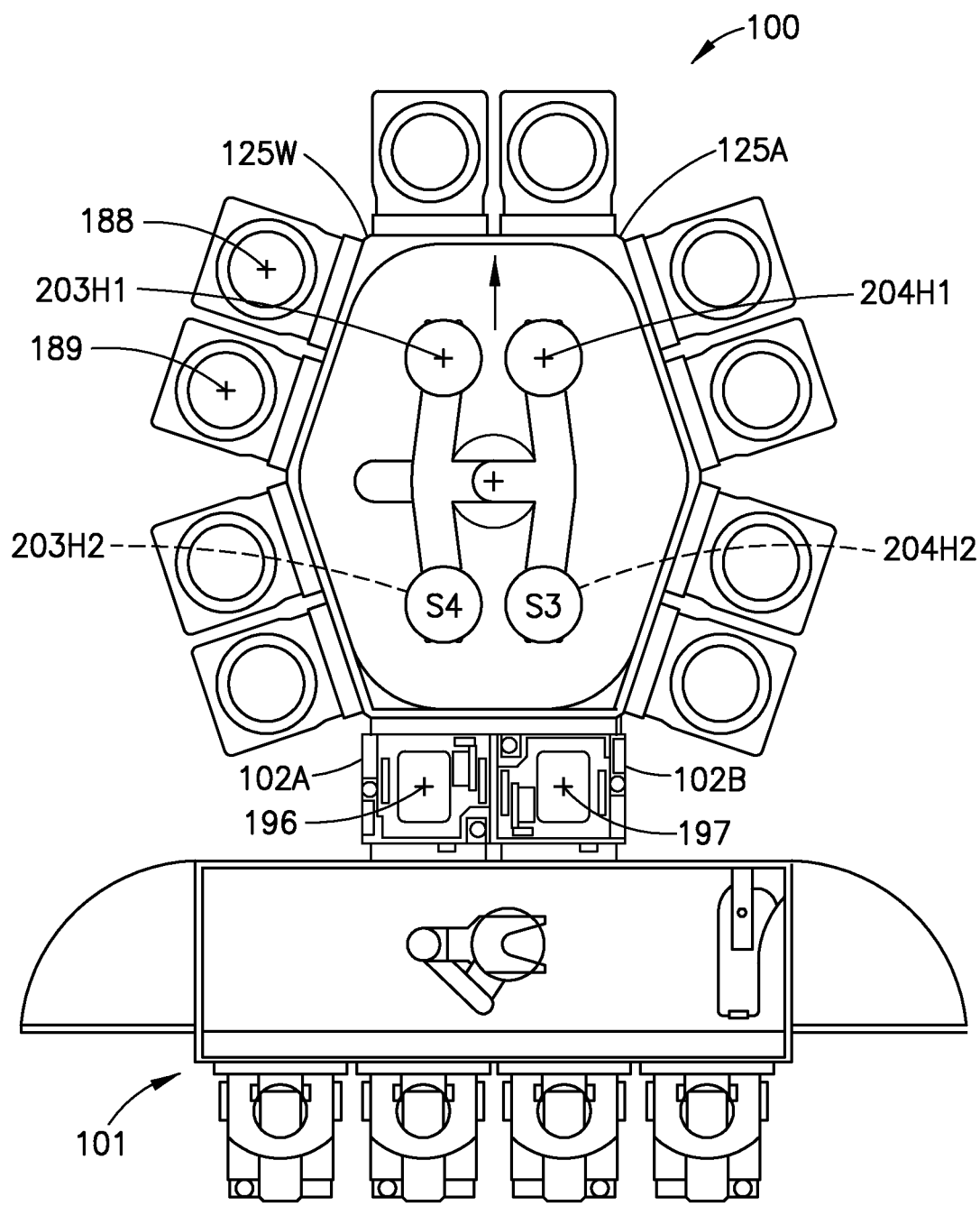

Referring now to FIG. 2A-3A, an exemplary drive section 220 is shown in accordance with aspects of the present disclosure. In one aspect, the drive section 220 is configured to extend (and retract) the arm 131 in a radial extension where movement of the wrist axis WX is maintained along an axis or path of radial extension/retraction 700 that extends through the shoulder axis SX (FIG. 7B) so that the substrate holding stations 203H1, 203H2, 204H1, 204H2 (that are offset from the radial axis) pick and place substrates S from the side-by-side substrate processing stations. In another aspect, the drive section 220 is configured to extend (and retract) the arm 131 in a non-radial extension where movement of the wrist travels along a path 701 (FIG. 7F) that is offset and/or angled from the axis of radial extension/retraction 700 (i.e., the path 701 does not pass through or radiate from the shoulder axis SX—it is noted that FIG. 7C illustrates a radial path of extension 702 where the wrist axis WX moves along a path of movement that extends through or radiates from the shoulder axis SX). In still other aspects, the drive section 220 is configured to extend the arm along both radial and non-radial paths (see FIGS. 7A-7L).

In one aspect the drive may have a coaxial drive arrangement, while in other aspects the drive section may have any suitable drive arrangement including but not limited to side-by-side motors, harmonic drives, switched or variable reluctance motors, etc. Suitable examples of drive section arrangements are described in U.S. Pat. Nos. 6,485,250; 5,720,590; 5,899,658; 5,813,823; 8,283,813; 8,918,203; and 9,186,799, the disclosures of which are incorporated by reference herein in their entireties. In this aspect, the drive section 220 includes a housing 310 for at least partially housing a quad-coaxial drive shaft assembly 300 (see also FIG. 4) having four drive shafts 301-304 and four motors 342, 344, 346, 348 (e.g. a four-degree of freedom motor). In other aspects of the present disclosure the drive section 220 may have any suitable number of drive shafts and motors, such as for example, two or three coaxial motors or more than four coaxial motors and associated drive shafts. The drive section 220 may also include a Z-axis drive 312 configured to, e.g., raise and lower the arm 131 for picking and placing substrates S; however, in other aspects the substrate processing stations coupled to the transfer chamber in which the arm 131 is located may include Z-axis drives for lifting and lowering the substrates from and to the arm 131 in lieu of or in addition to the Z-drive axis 312 of the drive section 220.

In one aspect, the drive section 220 is a multi-axis drive section that defines an independent degree of freedom for at least one substrate holder 203, 204 relative to the other substrate holder 203, 204; while in other aspects there is an independent degree of freedom for at least one substrate holder of multiple substrate holders; while in still other aspects, there is an independent degree of freedom for each substrate holder. The independent degree of freedom for each substrate holder 203, 204 enables independent automatic wafer centering at the corresponding at least one substrate holding station 203H1, 203H2, 2034H1, 204H2 of each one of the dual substrate holders 203, 204. In one aspect, the drive section 220 is a multi-axis drive section configured to effect independent automatic wafer centering at the corresponding at least one substrate holding station 203H1, 203H2, 2034H1, 204H2 of each one of the dual substrate holders 203, 204 substantially coincident with substantially simultaneous extension of the corresponding at least one substrate holding station 203H1, 203H2, 2034H1, 204H2 of each of the dual substrate holders 203, 204 through respective separate openings (see slot valves SV) in the transport chamber wall 125W.

Figure 3:
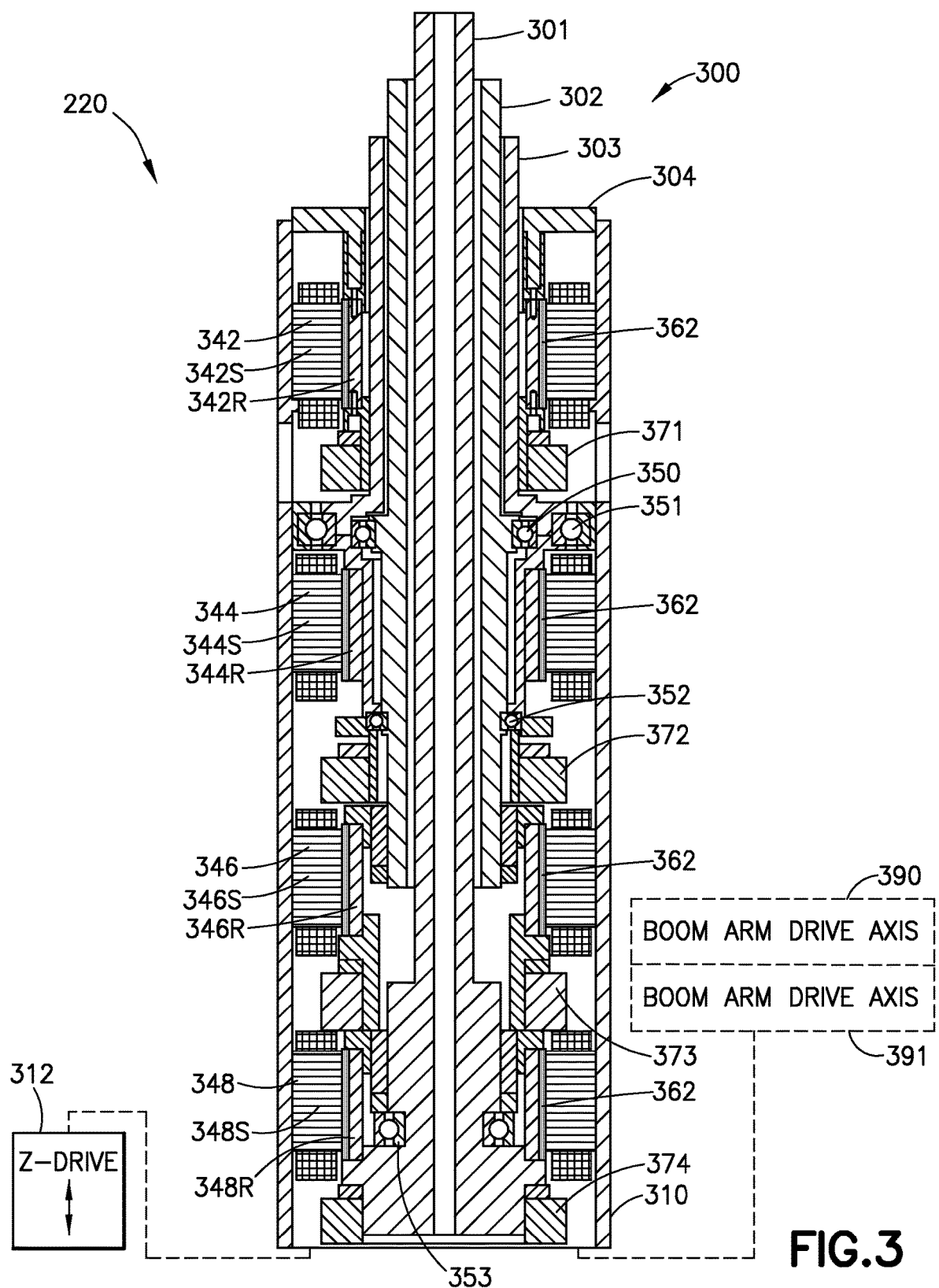
FIG. 3 is a schematic cross-sectional illustration of an exemplary drive section of a substrate transport apparatus in accordance with aspects of the present disclosure.
Figure 3A:
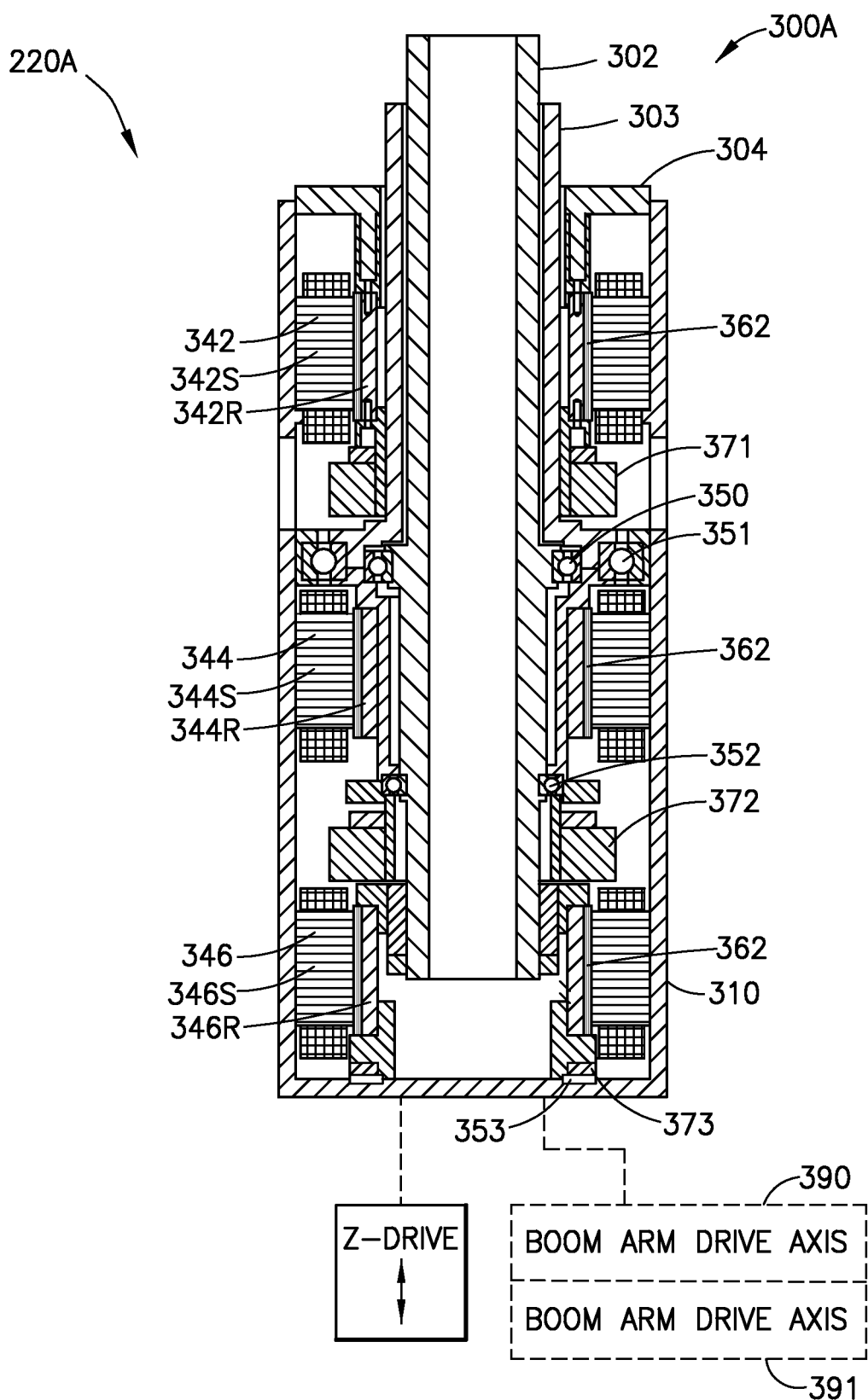
FIG. 3A is a schematic cross-sectional illustration of an exemplary drive section of a substrate transport apparatus in accordance with aspects of the present disclosure.

Referring to FIG. 3A, the drive section includes at least 5 motors 342, 344, 346, 348. The first motor 342 of the drive section 220 includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to the fourth or inner shaft 301. The four stators 342S, 344S, 346S, 348S are stationarily attached to the housing 310 at different vertical heights or locations within the housing. Each stator 342S, 344S, 346S, 348S generally comprises an electromagnetic coil. Each of the rotors 342R, 344R, 346R, 348R generally comprises permanent magnets, but may alternatively comprise a magnetic induction rotor that does not have permanent magnets. In still other aspects, the motors 342, 344, 346, 348 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346, 348 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R, 3418R and the stators 342S, 344S, 346S, 348S so that the coaxial drive shaft assembly 300 is located in the sealed environment and the stators are located outside the sealed environment. It should be realized that the sleeves 362 need not be provided if the substrate transport apparatus 130 is only intended for use in an atmospheric environment, such as within the atmospheric section 105 of the substrate processing apparatus 100 (FIG. 1).

The fourth or inner shaft 301 extends from the bottom or fourth stator 348S and includes the rotor 348R, which is substantially aligned with the stator 348S. The shaft 302 extends from the third stator 346S and includes rotor 346R, which is substantially aligned with the stator 346S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings 350-353 are provided about the shafts 301-304 and the housing 310 to allow each shaft 301-304 to be independently rotatable relative to each other and the housing 310. It is noted that each shaft may be provided with a position sensor 371-374. The position sensors 371-374 may be used to provide a signal to any suitable controller, such as controller 170, regarding the rotational position of a respective shaft 301-304 relative to each other and/or relative to the housing 310. The sensors 371-374 may be any suitable sensors, such as for non-limiting exemplary purposes, optical or induction sensors.

Referring to FIG. 3A, in other aspects, the exemplary drive section 220A, which is substantially similar to drive section 220, includes a housing 310 for at least partially housing a tri-coaxial drive shaft assembly 300A having three drive shafts 302-304 and three motors 342, 344, 346 (e.g. a three-degree of freedom motor). The drive section 220A may also include a Z-axis drive 312 configured to, e.g., raise and lower the arm (such as those described herein) of the substrate transport apparatus 130 for picking and placing substrates S; however, in other aspects the substrate holding stations coupled to the transfer chamber in which the arm is located may include Z-axis drives for lifting and lowering the substrates from and to the arm in lieu of or in addition to the Z-drive axis 312 of the drive section 220.

The first motor 342 of the drive section 220A includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The three stators 342S, 344S, 346S are stationarily attached to the housing 310 at different vertical heights or locations within the housing. Each stator 342S, 344S, 346S generally comprises an electromagnetic coil. Each of the rotors 342R, 344R, 346R generally comprises permanent magnets, but may alternatively comprise a magnetic induction rotor that does not have permanent magnets. In still other aspects, the motors 342, 344, 346 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R and the stators 342S, 344S, 346S so that the coaxial drive shaft assembly 300A is located in the sealed environment and the stators are located outside the sealed environment. It should be realized that the sleeves 362 need not be provided if the substrate transport apparatus 130 is only intended for use in an atmospheric environment, such as within the atmospheric section 105 of the substrate processing apparatus 100 (FIG. 1).

The shaft 302 extends from the third stator 346S and includes rotor 346R, which is substantially aligned with the stator 346S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings 350-353 are provided about the shafts 302-304 and the housing 310 to allow each shaft 302-304 to be independently rotatable relative to each other and the housing 310. It is noted that each shaft may be provided with a position sensor 371-373. The position sensors 371-373 may be used to provide a signal to any suitable controller, such as controller 170, regarding the rotational position of a respective shaft 302-304 relative to each other and/or relative to the housing 310. The sensors 371-373 may be any suitable sensors, such as for non-limiting exemplary purposes, optical or induction sensors.

Figure 3B:
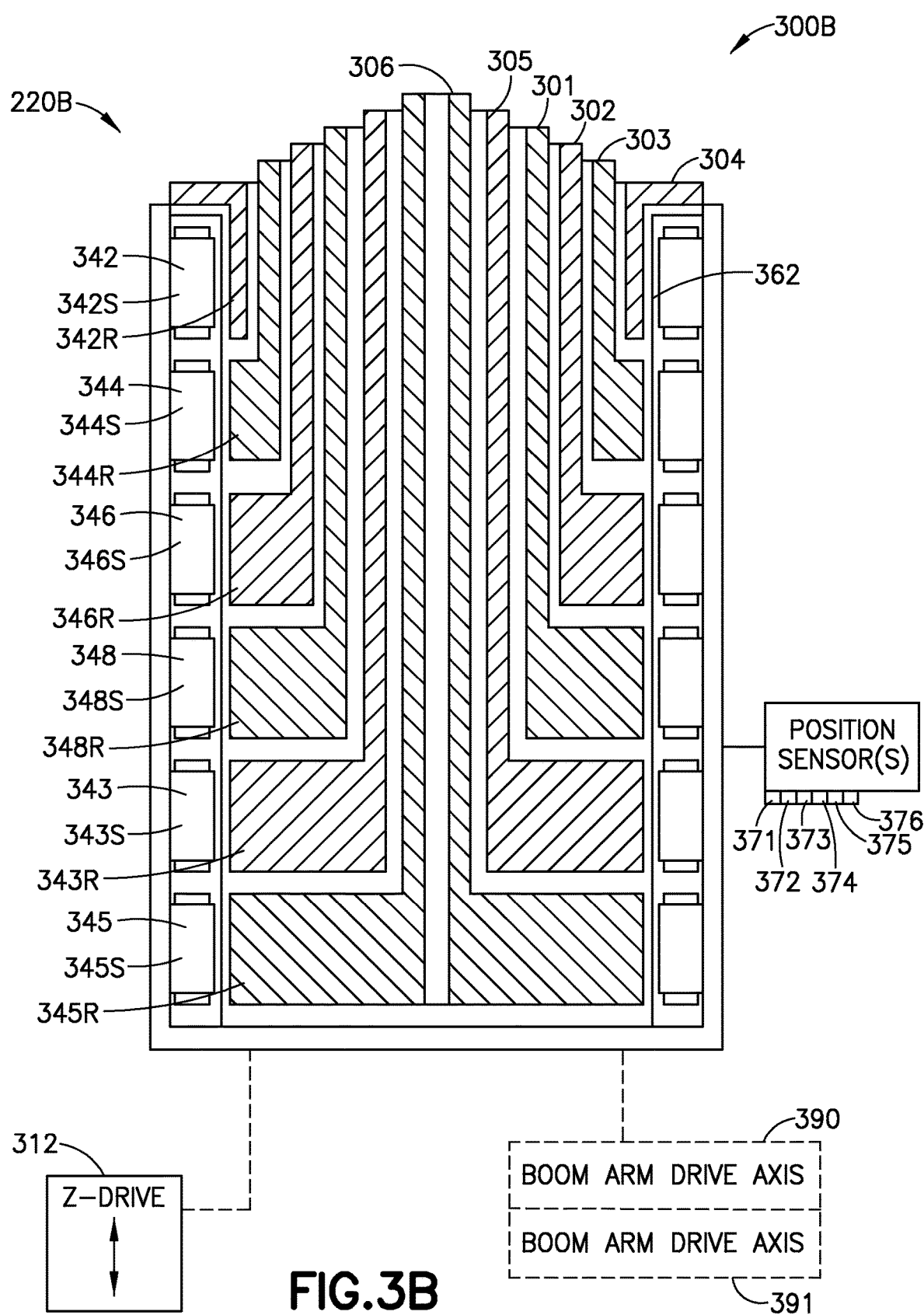
FIG. 3B is a schematic cross-sectional illustration of an exemplary drive section of a substrate transport apparatus in accordance with aspects of the present disclosure.

Referring to FIG. 3B, in other aspects, the exemplary drive section 220B, which is substantially similar to drive section 220, includes a housing 310 for at least partially housing a sextuple-coaxial drive shaft assembly 300B having six drive shafts 301-306 and six motors 342, 344, 346, 348, 343, 345 (e.g. a six-degree of freedom motor). The drive section 220B may also include a Z-axis drive 312 configured to, e.g., raise and lower the arm (such as those described herein) of the substrate transport apparatus 130 for picking and placing substrates S; however, in other aspects the substrate holding stations coupled to the transfer chamber in which the arm is located may include Z-axis drives for lifting and lowering the substrates from and to the arm in lieu of or in addition to the Z-drive axis 312 of the drive section 220.

The first motor 342 of the drive section 220A includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to shaft 301. The fifth motor 343 includes a stator 343S and a rotor 343R connected to shaft 305. The sixth motor 345 includes a stator 345S and a rotor 345R connected to shaft 306. The six stators 342S, 344S, 346S, 348S, 343S, 345S are stationarily attached to the housing 310 at different vertical heights or locations within the housing. Each stator 342S, 344S, 346S, 348S, 343S, 345S generally comprises an electromagnetic coil. Each of the rotors 342R, 344R, 346R, 348R, 343R, 345R generally comprises permanent magnets, but may alternatively comprise a magnetic induction rotor that does not have permanent magnets. In still other aspects, the motors 342, 344, 346, 348, 343, 345 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346, 348, 343, 345 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R, 348R, 343R, 345R and the stators 342S, 344S, 346S, 348S, 343S, 345S so that the coaxial drive shaft assembly 300B is located in the sealed environment and the stators are located outside the sealed environment. It should be realized that the sleeves 362 need not be provided if the substrate transport apparatus 130 is only intended for use in an atmospheric environment, such as within the atmospheric section 105 of the substrate processing apparatus 100 (FIG. 1).

The shaft 306 extends from the sixth stator 345S and includes rotor 345R, which is substantially aligned with the stator 345S. The shaft 305 extends from the fifth stator 343S and includes rotor 343R, which is substantially aligned with the stator 343S. The shaft 302 extends from the third stator 346S and includes rotor 346R, which is substantially aligned with the stator 346S. The shaft 301 extends from the fourth stator 348S and includes rotor 348R, which is substantially aligned with the stator 348S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings (such as those described above) are provided about the shafts 301-306 and the housing 310 to allow each shaft 301-306 to be independently rotatable relative to each other and the housing 310. It is noted that each shaft may be provided with a position sensor 371-376. The position sensors 371-376 may be used to provide a signal to any suitable controller, such as controller 170, regarding the rotational position of a respective shaft 301-306 relative to each other and/or relative to the housing 310. The sensors 371-376 may be any suitable sensors, such as for non-limiting exemplary purposes, optical or induction sensors.

Figure 3C:
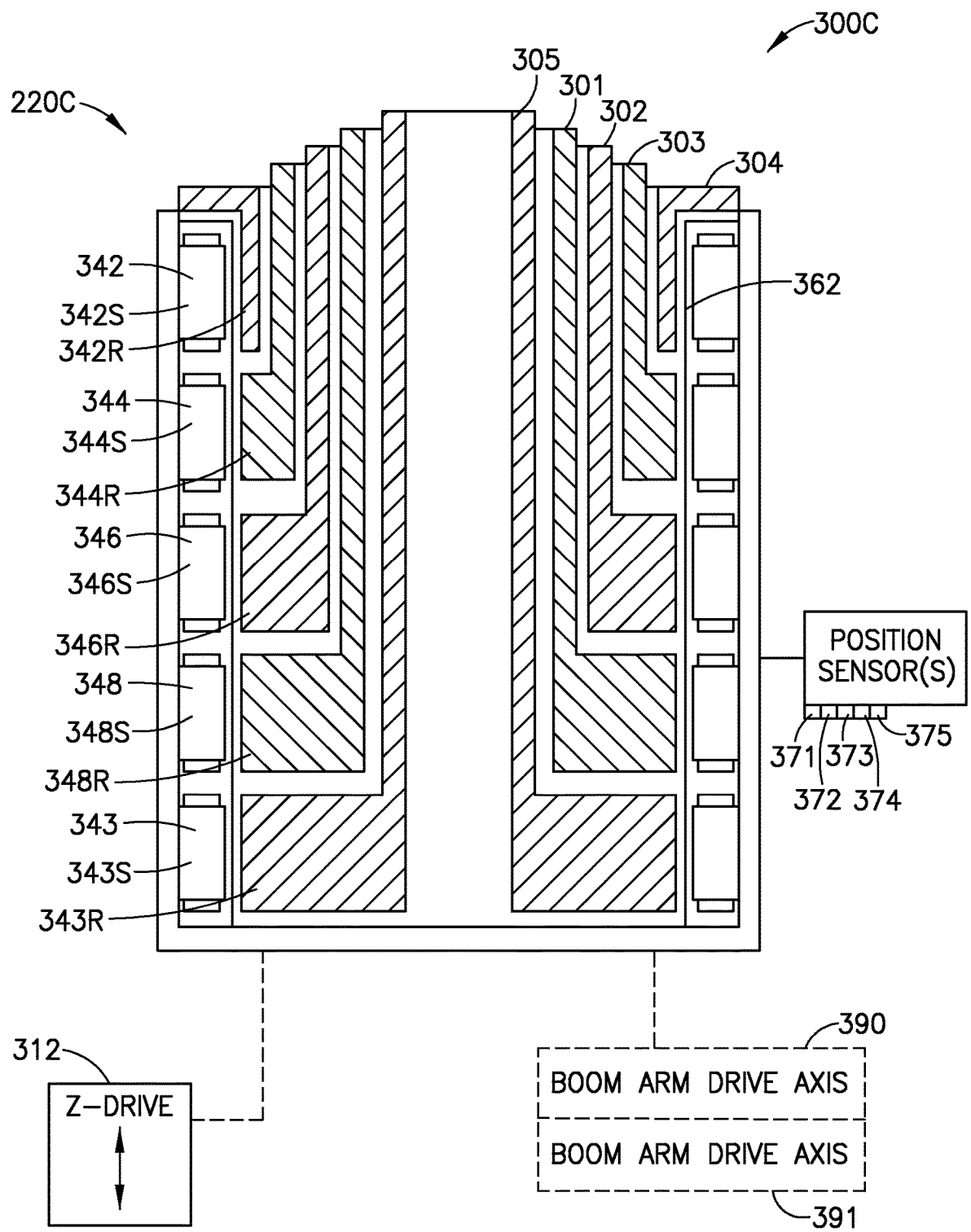
FIG. 3C is a schematic cross-sectional illustration of an exemplary drive section of a substrate transport apparatus in accordance with aspects of the present disclosure.

Referring to FIG. 3C, in other aspects, the exemplary drive section 220C, which is substantially similar to drive section 220, includes a housing 310 for at least partially housing a quintuple-coaxial drive shaft assembly 300C having five drive shafts 301-305 and five motors 342, 344, 346, 348, 343 (e.g. a five-degree of freedom motor). The drive section 220C may also include a Z-axis drive 312 configured to, e.g., raise and lower the arm (such as those described herein) of the substrate transport apparatus 130 for picking and placing substrates S; however, in other aspects the substrate holding stations coupled to the transfer chamber in which the arm 131 is located may include Z-axis drives for lifting and lowering the substrates from and to the arm in lieu of or in addition to the Z-drive axis 312 of the drive section 220.

The first motor 342 of the drive section 220A includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to shaft 301. The fifth motor 343 includes a stator 343S and a rotor 343R connected to shaft 305. The five stators 342S, 344S, 346S, 348S, 343S are stationarily attached to the housing 310 at different vertical heights or locations within the housing. Each stator 342S, 344S, 346S, 348S, 343S generally comprises an electromagnetic coil. Each of the rotors 342R, 344R, 346R, 348R, 343R generally comprises permanent magnets, but may alternatively comprise a magnetic induction rotor that does not have permanent magnets. In still other aspects, the motors 342, 344, 346, 348, 343 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346, 348, 343 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R, 348R, 343R and the stators 342S, 344S, 346S, 348S, 343S so that the coaxial drive shaft assembly 300C is located in the sealed environment and the stators are located outside the sealed environment. It should be realized that the sleeves 362 need not be provided if the substrate transport apparatus 130 is only intended for use in an atmospheric environment, such as within the atmospheric section 105 of the substrate processing apparatus 100 (FIG. 1).

The shaft 305 extends from the fifth stator 343S and includes rotor 343R, which is substantially aligned with the stator 343S. The shaft 302 extends from the third stator 346S and includes rotor 346R, which is substantially aligned with the stator 346S. The shaft 301 extends from the fourth stator 348S and includes rotor 348R, which is substantially aligned with the stator 348S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings (such as those described above) are provided about the shafts 301-305 and the housing 310 to allow each shaft 301-305 to be independently rotatable relative to each other and the housing 310. It is noted that each shaft may be provided with a position sensor 371-375. The position sensors 371-375 may be used to provide a signal to any suitable controller, such as controller 170, regarding the rotational position of a respective shaft 301-306 relative to each other and/or relative to the housing 310. The sensors 371-375 may be any suitable sensors, such as for non-limiting exemplary purposes, optical or induction sensors.

As described herein, the drive section 220, 220A, 220B, 220C is configured to extend and retract at least one multi-link arm 131 along the non-radial linear path and substantially simultaneously pass the at least one corresponding substrate holding station of each end effector link (e.g., substrate holder) respectively through the separate substrate transport openings (such as shown in FIGS. 1B and 1C) juxtaposed along the side wall of, e.g., the transfer chamber 125, and to independently align the at least one corresponding substrate holding station relative to another of the more than one end effector links (e.g., substrate holders).

Referring to FIGS. 2A, 3A, and 4, as described above the substrate transport apparatus 130 includes at least one arm 131 having two dual ended substrate holders 203, 204. It is noted that the two dual ended substrate holders 203, 204 of the substrate transfer robot 130 described herein may allow for substantially simultaneous picking and placing of substrates (e.g. the two dual ended substrate holders 203, 204 are extended and retracted to and from respective substrate processing stations of the side-by-side substrate processing stations 190-191, 192-193, 194-195, 196-197 at substantially the same time for substantially picking and/or placing substrates) described herein.

In one aspect of the present disclosure, the upper arm link 201 is driven in rotation about the shoulder axis SX by outer shaft 304, the forearm link 202 is driven in rotation about the elbow axis EX by inner shaft 301, dual ended substrate holder 203 is driven in rotation about the wrist axis WX by shaft 303, and dual ended substrate holder 204 is driven in rotation about the wrist axis WX by shaft 302. For example, the upper arm link 201 is fixedly attached to the outer shaft 304 such that the upper arm link 201 rotates with the shaft 304 as a unit on a center axis of rotation (e.g. shoulder axis SX).

The forearm link 202 is coupled to the inner shaft 301 by any suitable transmission. For example, a pulley 480 is fixedly attached to the shaft 301. The upper arm link 201 includes a post 481. A pulley 482 is rotatably mounted to or otherwise supported by the post 481. The post 481 is stationarily mounted to an inner surface of the upper arm link 201. A first set of transmission members 490 extend between the pulley 480 and pulley 482. It should be realized that any suitable type of transmission members may be used to couple the pulleys 480, 482, such as for example, belts, bands or chains. It should also be realized that while two transmission members are shown (see FIGS. 5A and 5B) coupling the pulleys 480, 482, in other aspects any suitable number of transmission members may be used to couple the pulleys 480, 482 (e.g. more or less than two). A shaft 482S is fixedly coupled to the pulley 482 so that the shaft 482S rotates with the pulley 482 about elbow axis EX. The shaft 482S may be rotatably supported on the post 481 in any suitable manner. The forearm link 202 is fixedly mounted to the shaft 482S so that the forearm link 202 rotates with the shaft 482S as a unit about elbow axis EX.

The dual ended substrate holder 203 is coupled to shaft 303 by any suitable transmission. For example, pulley 488 is fixedly coupled to shaft 303 so that the pulley 488 rotates with the shaft 303 as a unit about the shoulder axis SX. Pulley 491 is rotatably coupled to or otherwise supported on post 481. A second set of transmission members 492 (substantially similar to transmission members 490) extend between the pulley 488 and pulley 491. A shaft 491S is fixedly coupled to the pulley 491 so that the shaft 491S rotates with the pulley 491 as a unit about elbow axis EX. The shaft 491S may be rotatably supported on the post 481 in any suitable manner. The forearm link 202 includes pulley 470 that is fixedly mounted to a top end of the shaft 491S so that the pulley 470 rotates with the shaft 491S (and the pulley 491) as a unit about elbow axis EX. The forearm link 202 also includes a post 471 and a pulley 472 rotatably mounted to or otherwise supported by the post 471. A third set of transmission members 493 (substantially similar to transmission members 490) extends between and couples the pulleys 470, 472. The dual ended substrate holder 203 is fixedly mounted to the pulley 472 through shaft 472S so that the pulley 472 and dual ended substrate holder 203 rotate as a unit about wrist axis WX.

The dual ended substrate holder 204 is coupled to shaft 302 by any suitable transmission. For example, pulley 484 is fixedly coupled to shaft 302 so that the pulley 484 rotates with the shaft 302 as a unit about the shoulder axis SX. Pulley 486 is rotatably coupled to or otherwise supported on post 481. A fourth set of transmission members 494 (substantially similar to transmission members 490) extend between the pulley 484 and pulley 486. A shaft 486S is fixedly coupled to the pulley 486 so that the shaft 486S rotates with the pulley 486 as a unit about elbow axis EX. The shaft 486S may be rotatably supported on the post 481 in any suitable manner. The forearm link 202 includes pulley 474 that is fixedly mounted to a top end of the shaft 486S so that the pulley 474 rotates with the shaft 486S (and the pulley 486) as a unit about elbow axis EX. The forearm link 202 also includes a pulley 476 rotatably mounted to or otherwise supported by the post 471. A fifth set of transmission members 495 (substantially similar to transmission members 490) extends between and couples the pulleys 474, 476. The dual ended substrate holder 204 is fixedly mounted to the pulley 476 through shaft 476S so that the pulley 476 and dual ended substrate holder 204 rotate as a unit about wrist axis WX.

Figure 32A:
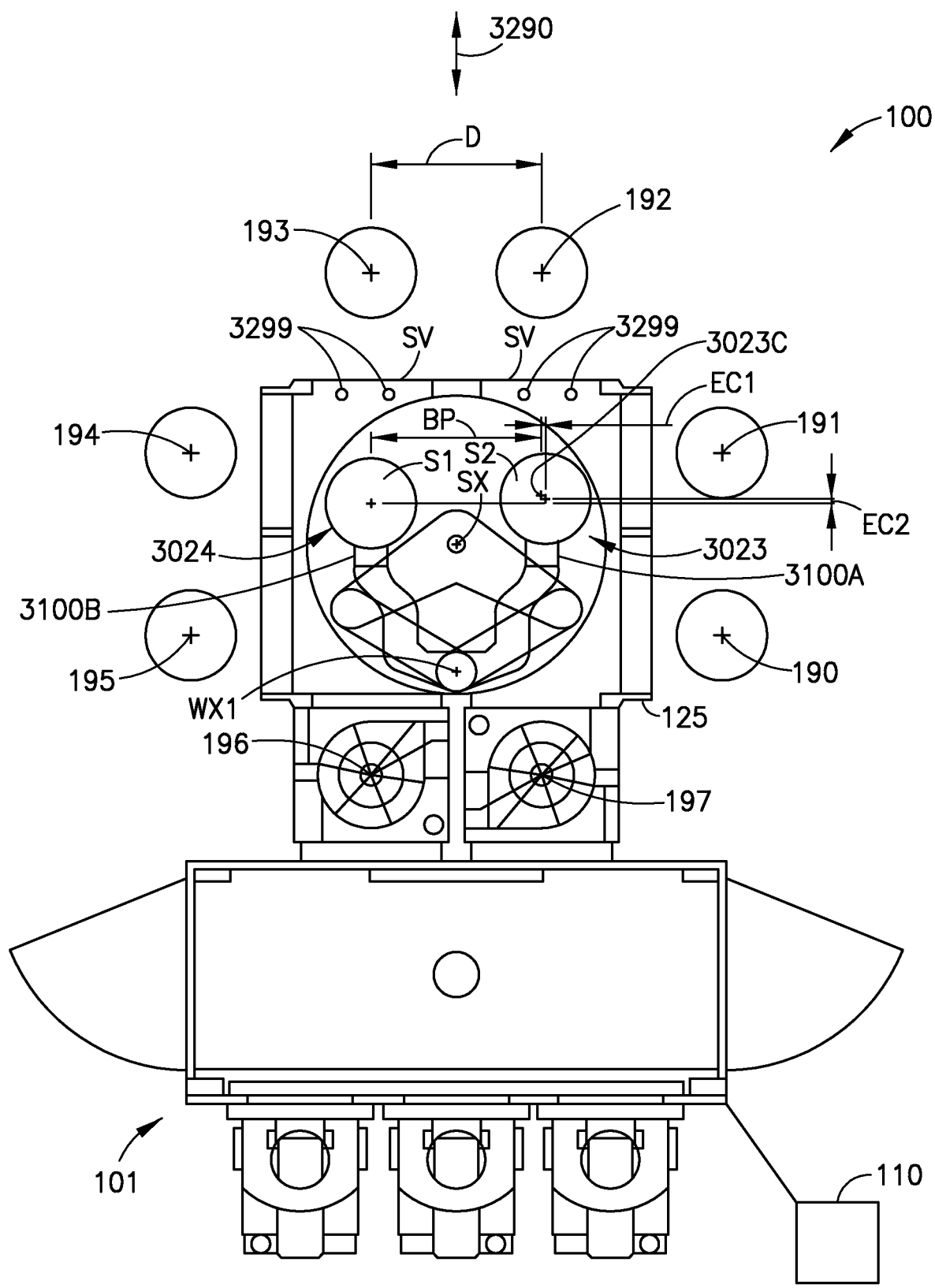
FIGS. 32A-32F are schematic illustrations of a substrate processing apparatus incorporating the portion of the substrate transport apparatus of FIGS. 30A and 30B in accordance with aspects of the present disclosure.

Referring to FIGS. 2A-2C, 3A, and 4, as may be realized, each of the upper arm link 201, the forearm link 204, the dual ended substrate holder 203, and the dual ended substrate holder 204 are independently driven in rotation about the respective axes (e.g., shoulder axis SX, elbow axis AX, and wrist axis WX) by the respective drive motor 342, 344, 346, 348. Independent rotation of each dual ended substrate holder 203, 204 about the wrist axis WX provides independent automatic wafer centering at each of the substrates S at each of the substrate holding stations 203H1, 204H1, 203H2, 204H2 substantially coincident with transport of the substrates through openings (see FIGS. 1B, 1C) of respective juxtaposed substrate processing stations by the dual ended substrate holders 203, 204. The automatic wafer centering described herein may be performed with any suitable sensors (such as for example, sensors 3299—FIG. 32A) disposed in/on the transport chamber 125, 125A, on a slot valve SV, on the transport arm 130, etc. in manners similar to those described in U.S. patent application Ser. No. 16/257,595 filed on Jan. 25, 2019 and titled "Automatic Wafer Centering Method and Apparatus", U.S. Pat. No.

10,134,623 issued on Nov. 20, 2018 and titled "On The Fly Automatic Wafer Centering Method and Apparatus", U.S. Pat. No. 9,514,974 issued on Dec. 6, 2016 and titled "Process Apparatus with On-The-Fly Substrate Centering", U.S. Pat. No. 7,792,350 issued on Sep. 7, 2010 and titled "Wafer Center Finding", U.S. Pat. No. 8,934,706 issued on Jan. 13, 2015 and titled "Wafer Center Finding with Kalman Filter", and U.S. Pat. No. 7,925,378 issued on Apr. 12, 2011 and titled "Process Apparatus with On-The-Fly Workpiece Centering", the disclosures of which are incorporated herein by reference in their entireties. Correspondingly automatic wafer centering is effected by varying of the base pitch BP between the side-by-side substrate holding stations 203H1, 204H1 and between the side-by-side substrate holding stations 203H2, 204H2. For example by rotating shafts 203, 303 in opposite directions, the dual ended substrate holder 203, 204 are caused to rotate in opposite directions about the wrist axis WX. For example, shafts 302, 303 may be driven in opposite directions to increase the distance (FIG. 2B) between the side-by-side substrate holding stations 203H1, 204H1 so as to effect any suitable increased pitch WP between the side-by-side substrate holding stations 203H1, 204H1 (and any suitable corresponding decreased pitch NP between substrate holding stations 203H2, 204H2). Shafts 302, 303 may also be driven in opposite directions to decrease the distance (FIG. 2C) between the side-by-side substrate holding stations 203H1, 204H1 so as to effect any suitable decrease pitch NP between the side-by-side substrate holding stations 203H1, 204H1 (and any suitable corresponding increased pitch WP between substrate holding stations 203H2, 204H2). Rotation of the shafts 302, 303 in the same direction, substantially at the same rotational rate, rotates the dual ended substrate holder 203, 204 as a unit about the wrist axis WX to effect fast swapping of the substrates S. As such, the transmissions 490, 492, 493, 494, 495 are configured so that the dual ended substrate holder 203, 204 rotate as a unit about the wrist axis WX by an amount that is at least 180° (degrees) of rotation. Again, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement.

It is noted that the pulleys 480, 484, 488, 470, 474 may be referred to as "drive" pulleys while pulleys 482, 486, 491, 472, 476 may be referred to as "driven" or "idler" pulleys. Referring to FIGS. 4 and 5A-5F, the third and fifth set of transmission members 493, 495 located, at least in part, within the forearm link 202 will be described.

The idler pulley 472 has an end effector interface where a surface of the idler pulley 472 is seated against the respective dual ended substrate holder 203, or in other aspects the end effector interface is formed by shaft 472S as described above. The idler pulley 472 is coupled to a respective elbow drive pulley 470 by a respective segmented transmission loop 661 (i.e., the third set of transmission members 493). The segmented transmission loop 661 includes separate band segments 661A, 661B or any other suitable transmission link such as cable segments) coupled to both the idler pulley 472 and the elbow drive pulley 470 effecting rotation of the idler pulley 472.

The idler pulley 472 includes a perimeter edge 650 that forms band wrap surfaces 635, 636 that interface with respective bands 661A, 661B of the segmented transmission loop 661. Band anchor points 643, 644 (FIG. 5A) join each of the separate band segments 661A, 661B to the idler pulley 472. For example, the perimeter edge 650 forms an upper band wrap surface 635 around which the band 661B is wrapped. The perimeter edge 652 forms a lower band wrap surface 636 around which the band 661A is wrapped. The upper and lower band wrap surfaces 635, 636 are disposed at different heights on the idler pulley 472 so that the bands 661A, 661B are disposed in different planes relative to each other (i.e., one band does not wrap over the other band). Referring to FIG. 5B, the elbow drive pulley 470 is substantially similar to the idler pulley 472 described above.

Similarly, the idler pulley 476 has an end effector interface where a surface of the idler pulley 476 is seated against the respective dual ended substrate holder 204, or in other aspects the end effector interface is formed by shaft 476S as described above. The idler pulley 476 is coupled to a respective elbow drive pulley 474 by a respective segmented transmission loop 660 (i.e., the fifth set of transmission members 495). The segmented transmission loop 660 includes separate band segments 660A, 660B or any other suitable transmission link such as cable segments) coupled to both the idler pulley 476 and the elbow drive pulley 474 effecting rotation of the idler pulley 476.

The idler pulley 476 includes a perimeter edge 650 that forms band wrap surfaces 635, 636 that interface with respective bands 660A, 660B of the segmented transmission loop 660. Band anchor points 643, 644 (FIG. 5A) join each of the separate band segments 660A, 660B to the idler pulley 476. For example, the perimeter edge 650 forms an upper band wrap surface 635 around which the band 660B is wrapped. The perimeter edge 652 forms a lower band wrap surface 636 around which the band 660A is wrapped. The upper and lower band wrap surfaces 635, 636 are disposed at different heights on the idler pulley 476 so that the bands 660A, 660B are disposed in different planes relative to each other (i.e., one band does not wrap over the other band). Referring to FIG. 5B, the elbow drive pulley 474 is substantially similar to the idler pulley 476 described above.

Referring to FIGS. 4 and 5A-5F, the location of each band anchor point 643, 644 on the respective idler pulley 472, 476 (and/or drive pulley 470, 474) defines a band engagement arc B1, B2, B11, B12 with the respective idler pulley 472, 476 so that the included angle of rotation $\theta1$, $\theta2$, $\theta11$, $\theta12$, between the band engagement arc B1, B2, B11, B12 and a tangent point TT1, TT2, TT11, TT12 at which the band anchor point 643, 644 forms a tangent between the respective band segment 660A, 660B, 661A, 661B and the respective idler pulley 472, 474, is about 90 degrees or less.

In one aspect the idler pulley 472, 476 and the respective elbow drive pulley 470, 474 to which the idler pulley 472, 476 is coupled by the segmented transmission loops 660, 661 have any suitable drive ratio that provides sufficient rotation of the respective dual ended substrate holder 203, 204 to rotate at least about ±90° and to extend and retract the arm 131 (FIG. 2A) for picking and placing (and fast swapping) substrates from and to predetermined substrate processing stations/locations arranged a predetermined distance away from the shoulder axis SX. For example, the ratio between the elbow drive pulley 470, 474 and the respective idler pulley 472, 476 is configured so that the band anchor point 643, 644 location on the idler pulley 472, 476 is so that the angle of rotation of the respective dual ended substrate holder 203, 204 relative to the forearm link 202 for the arm 131 extension motion (i.e. the drive axis rotation to effect idler pulley 472, 476 rotation for full extension and retraction of the arm 131—see, e.g., FIGS. 7A-7J) results in at least one arc (e.g. arcs B1, B2, B11, B12) on the idler pulley 472, 476 so that a band anchor point 643, 644 of one band segment 660A, 660B, 661A, 661B at one end EE1 of the arc B1, B2, B11, B12 on one perimeter portion 651, 652 of the respective idler pulley 472, 476 is no more than coincident with the band anchor point 643, 644 of an opposing band segment 660A, 660B, 661A, 661B on another perimeter portion 651, 652 of the respective idler pulley 472, 476. For example, as illustrated in FIG. 5A band anchor points 643, 644 for opposing band segments 661A, 661B are located substantially one above the other and band anchor points 643, 644 of opposing band segments 660A, 660B are located substantially one above the other. In other aspects, the band anchor points 643, 644 of one band segment 660A, 660B, 661A, 661B may be circumferentially separated from the band anchor point 643, 644 of the respective opposing band segment 660A, 660B, 661A, 661B by any suitable amount.

Figure 5D:
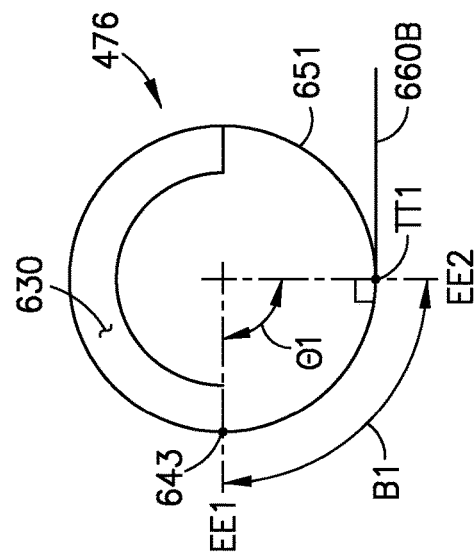
FIGS. 5C, 5D, 5E, and 5F are schematic illustrations of portions of the substrate transport apparatus of FIGS. 2A, 2B, 2C, and 2D in accordance with aspects of the present disclosure.
Figure 5F:
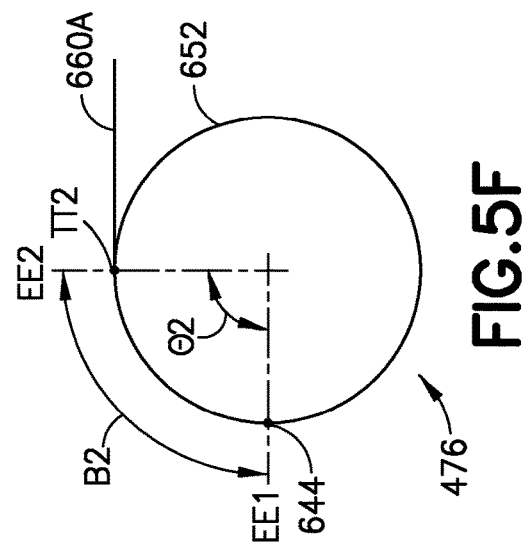
Figure 5C:
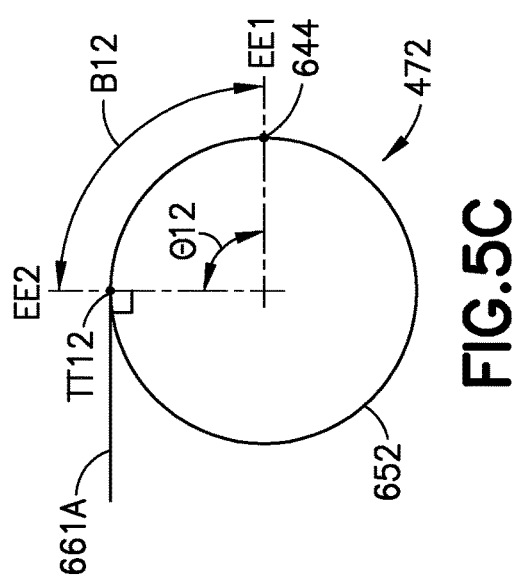
Figure 5E:
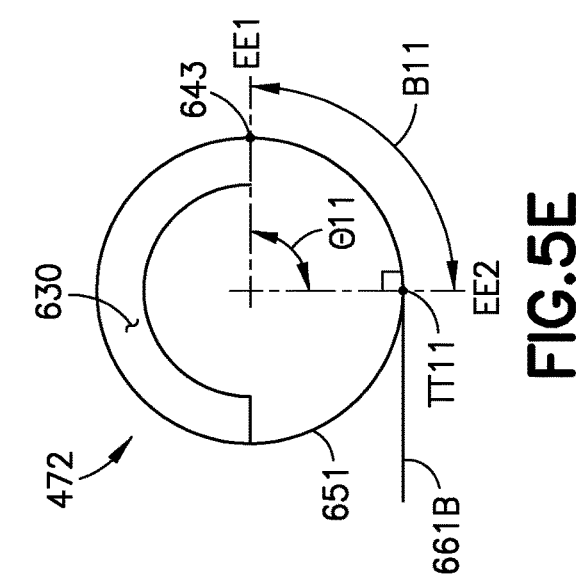

As can also be seen in FIG. 5A, the band anchor points 645, 646 of the band segments 660A, 660B, 661A, 661B that couple the band segments 660A, 660B, 661A, 661B to the respective elbow drive pulley 470, 474 are located one above the other. As such, in the example shown in FIGS. 5A-5F (noting the diameter ratio between elbow drive pulley 470, 474 and the respective idler pulley 472, 476 is about 1:1, although in other aspects any suitable ratio may be provided) the band anchor points 645, 646 are spaced on the elbow drive pulley 470, 474 and the band anchor points 643, 644 are spaced on the idler pulley 472, 476 so that about ±90° rotation of the elbow drive pulley 470, 474 results in about a ±90° rotation of the respective idler pulley 472, 476 (noting that the 0° configuration of the band pulley transmission is illustrated in FIGS. 5A-5F with the band anchor points 643, 644 facing substantially directly away from the elbow drive pulley 470, 474) but in other aspects, where the drive ratio of the elbow drive pulley 470, 474 to the idler pulleys 472, 476 is greater than about 1:1 the relative location between the band anchor points along the circumference of the elbow drive pulley 470, 474 and/or the idler pulley 472, 476 may be different than that described above.

On the other end EE2 of the arc B1, B2, B11, B12 the band anchor point 643, 644 is positioned so that the included angle of rotation θ1, θ2, θ11, θ12, between the end EE1 of the band engagement arc B1, B2, B11, B12 and the tangent point TT1, TT2, TT11, TT12 is about 90° or less (i.e. the band segment 660A, 660B, 661A, 661B is tangent to the respective idler pulley 472, 476 and is in pure tension with no bending of the band segment 660A, 660B, 661A, 661B around the respective idler pulley 472, 476).

Figure 6A:
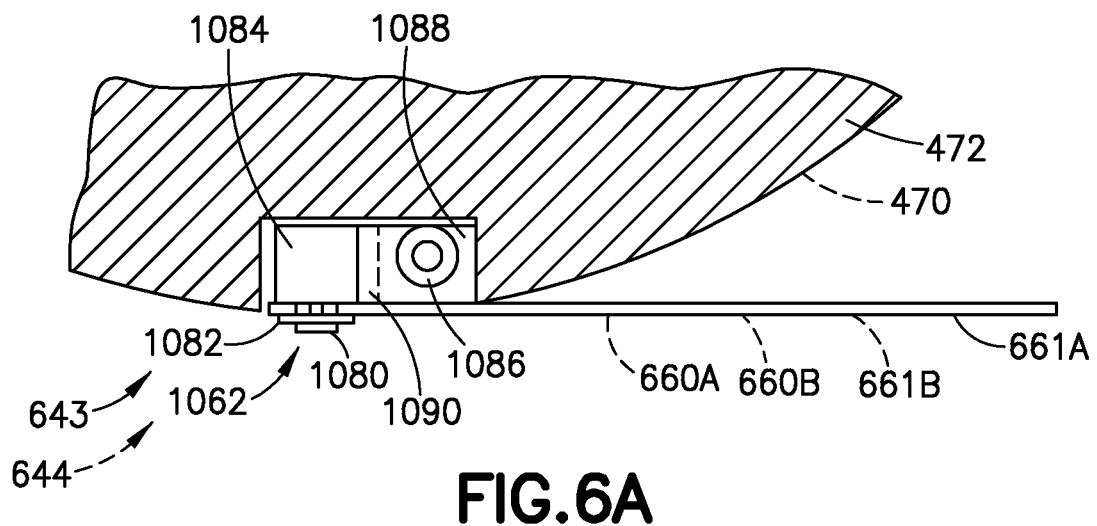
FIGS. 6A and 6B are schematic illustrations of portions of the substrate transport apparatus of FIGS. 2A, 2B, 2C, and 2D in accordance with aspects of the present disclosure.
Figure 6B:
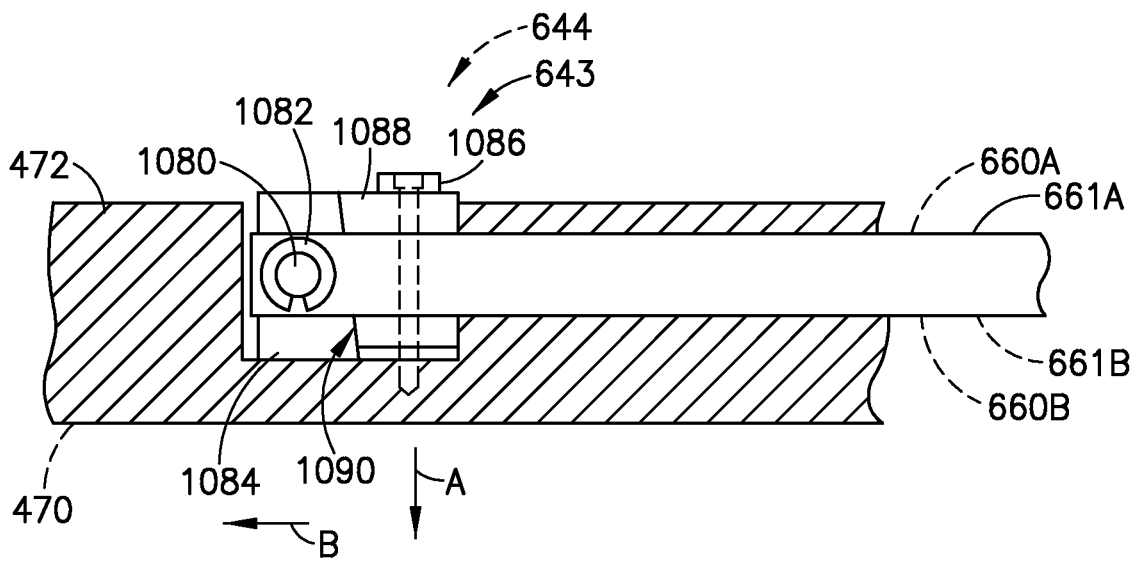

Referring to FIGS. 6A and 6B, the band anchor points 643, 644 (only band anchor point 643 is illustrated but it should be understood that the other band anchor points, including band anchor point 644, are substantially similar to that described with respect to band anchor point 643) will be described with respect to pulleys 470, 472 and the third set of transmission members 493. While the band anchor points are described with respect to pulleys 470, 472 and the third set of transmission members 493 it should be understood that band anchor points 643, 644 for the pulleys 474, 476 480, 482, 484, 486, 488, 491 are substantially similar. The band anchor points 643, 644 couple the respective band segments 661A, 661B to the respective pulleys 470, 472. For example, in one aspect, each band anchor point 643 includes a base 1084 to which a pin 1062 is mounted. The ends of each band segment 661A, 661B include a hole through which a spoke 1080 of the pin 1062 projects. A retaining spring clip 1082, or other suitable retainer, is attached to the spoke 1080 to secure the band segment 661A, 661B to the spoke 1080. The spoke 1080 projects from the base 1084 to provide an attachment location for the band segment 661A, 661B. In other aspects, the spoke 1080 could project directly from a circumferential edge or side of the pulley 472. In one aspect the hole in the band segment 661A, 661B is slightly larger than the spoke 1080 and the retaining clip 1082 does not hold the band segment 661A, 661B tightly so that the band segment 661A, 661B is free to pivot around the spoke 1080. In one aspect, the base 1084 is an adjustable base that provides for location adjustment of the pin 1062 to thereby adjust the tension of the band segment 661A, 661B. For example, a screw 1086 passes into a threshold opening in the pulley 472 and holds a tightening wedge 1088 adjacent the pulley 572. One face of the tightening wedge 1088 engages a diagonal face 1090 of the base 1084. To increase the tension in the band segment 661A, 661B, screw 1086 is tightened, pushing tightening wedge 1088 down in the direction of arrow A. This pushes wedge 1088 against diagonal surface 1090, thereby forcing base 1084 to slide in the direction of arrow B. Conversely, to decrease the tension in the band segment 661A, 661B, screw 1086 is loosened. In other aspects, the band segments 661A, 661B may be coupled to the pulley 472 in any suitable manner. Suitable examples of band anchor points may be found in U.S. Pat. No. 5,778,730 issued on Jul. 14, 1998, the disclosure of which is incorporated herein by reference in its entirety.

The first set of transmission members 490, the second set of transmission members 492, fourth set of transmission members 494, the shoulder drive pulleys 480, 484, 488 and the elbow idler pulleys 482, 486, 491 are substantially similar to that described above with respect to the idler pulleys 472, 476, the drive pulleys 470, 474, and the segmented transmission loops 660, 661 (see FIGS. 5A and 5B). As noted above the band anchor points for the first set of transmission members 490, the second set of transmission members 492, fourth set of transmission members 494 are substantially similar to those described above with respect to band anchor point 643.

Figure 8:
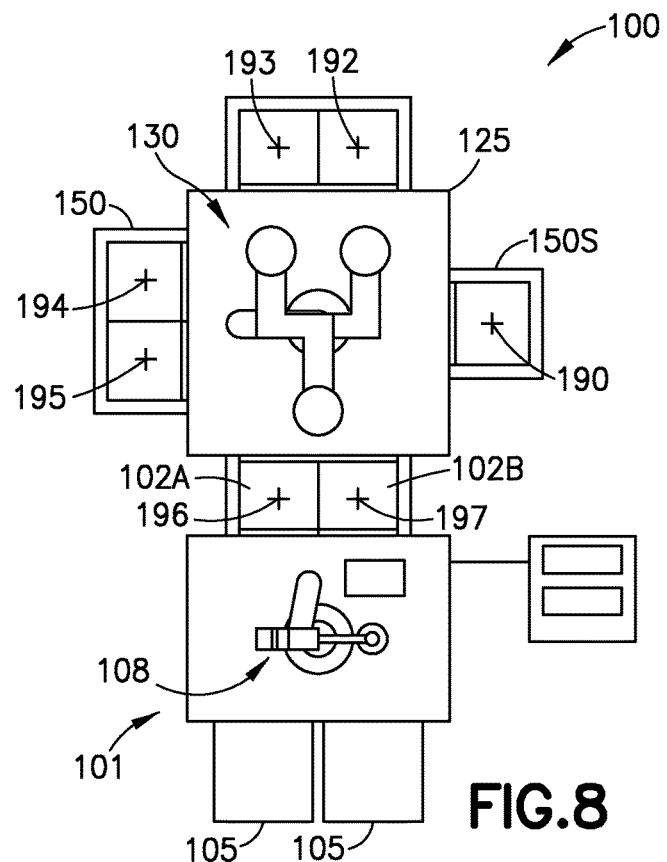
FIG. 8 is a schematic illustration of a substrate processing apparatus incorporating a substrate transport apparatus in accordance with aspects of the present disclosure.
Figure 9:
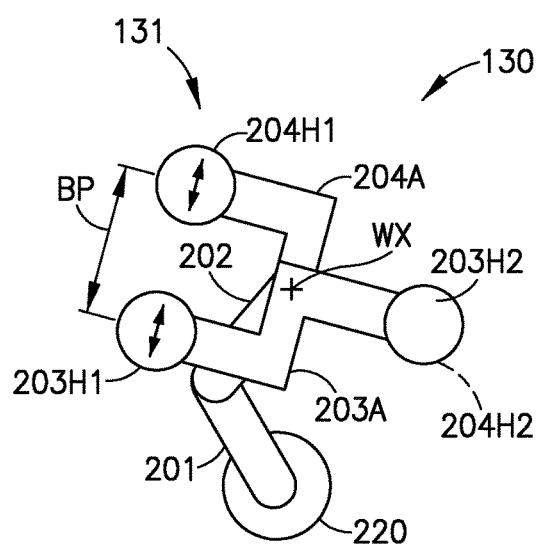
FIG. 9 is a schematic illustration of a substrate transport apparatus incorporating features of the present disclosure.

While the substrate transport apparatus 130 was described above with dual pan substrate holders 203, 204 in other aspects the substrate holders may have any suitable configuration. For example, referring to FIGS. 8, 9, and 10, each of more than one end effector link (e.g., substrate holder) has more than one corresponding substrate holding station, of more than one juxtaposed (e.g., side-by-side) substrate holding station, dependent therefrom and is respectively a substantially rigid unarticulated link between the more than one corresponding substrate holding station dependent from the respective end effector link (e.g., substrate holder). For example, the substrate transport apparatus 130 includes dual pan substrate holders 203A, 204A that are substantially similar to those described above; however, in this aspect the substrate holding stations 203H1, 204H1 are disposed side-by-side in a common plane (separated by the base pitch BP) while the substrate holding stations 203H2, 204H2 are located in different planes and stacked one over the other (separated by any suitable height H10 that may correspond to a distance between stacked holding stations of stacked substrate processing stations 150, stacked vacuum load locks 102A, 102B, 102C, 102D, or any other suitable stacked substrate holding locations—see FIG. 1C). Here, the transport chamber openings to the substrate processing stations may be at different planes/levels (See FIG. 1C), where each plane corresponds with the planes/levels of juxtaposed substrate holding stations 203H1-204H1, 203H2-204H2 of both dual/double ended substrate holders 203, 204. In still other aspects, as shown in FIG. 11, the substrate holding stations 203H1, 204H1 are disposed side-by-side in a common plane (separated by the base pitch BP) while only one of the substrate holders 203A, 204A is configured as a dual pan substrate holder (in this example, substrate holder 203A includes dual substrate holding stations 203H1, 203H2 whole substrate holder 204A includes the single substrate holding station 204H1). Again, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. The automatic wafer centering, such as with the aspects of the present disclosure illustrated in FIGS. 8, 9, and 10, is effected by varying the base pitch BP between the substrate holding stations 203H1, 204H1 (e.g., may be increased or decreased) in a manner substantially similar to that described above. As may be realized, the substrate holder(s) 203H2, 204H2 may also be independently rotated about the wrist axis WX to effect automatic wafer centering for substrate holding station 203H2 independent of substrate holding station 204H2 and/or automatic wafer centering for substrate holding station 204H2 independent of substrate holding station 203H2.

Figure 12:
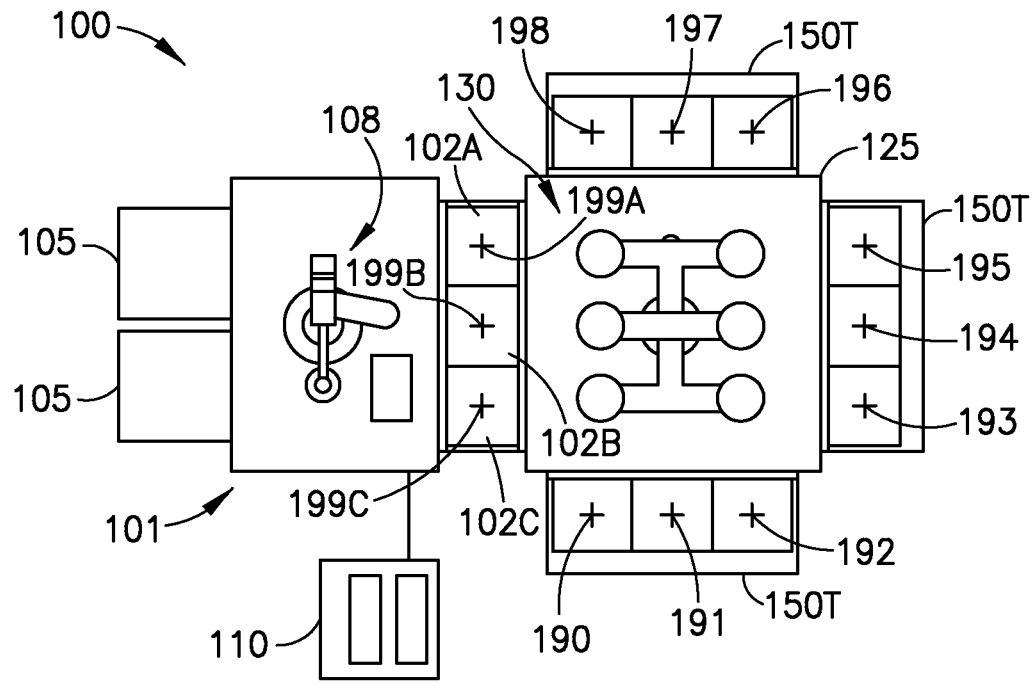
FIG. 12 is a schematic illustration of a substrate processing apparatus incorporating a substrate transport apparatus in accordance with aspects of the present disclosure.
Figure 13:
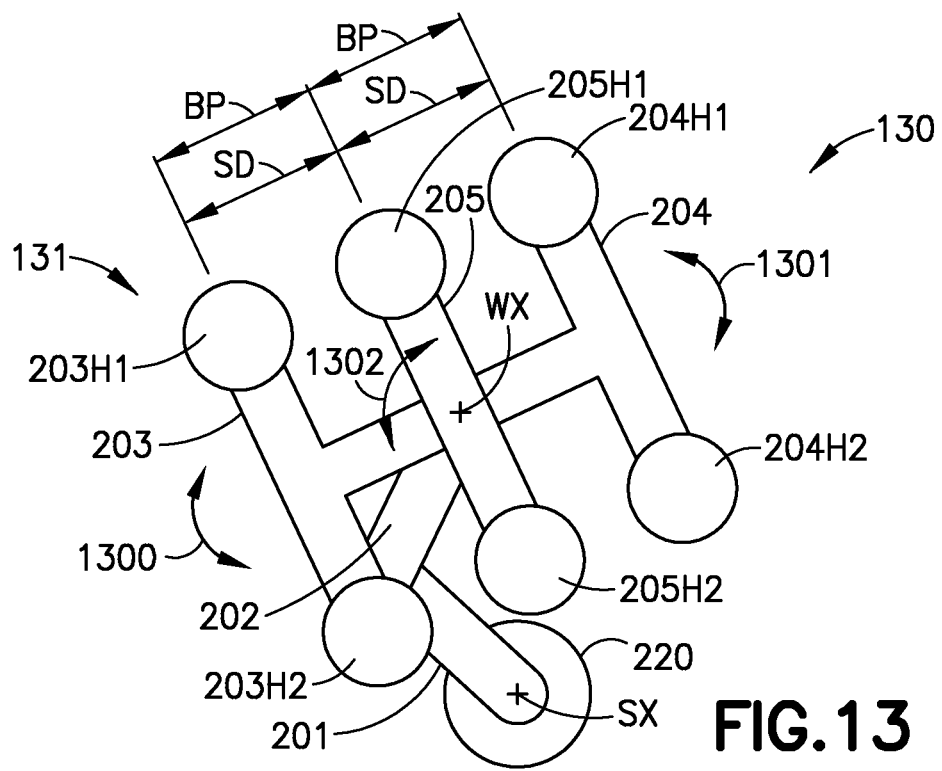
FIG. 13 is a schematic illustration of a substrate transport apparatus incorporating features of the present disclosure.

Referring to FIGS. 12 and 13, the substrate transport apparatus 130 is illustrated, in this aspect, as including three dual pan substrate holders. For example, the substrate transport apparatus 130 includes the substrate holders 203, 204 (as described above) as well as substrate holder 205. The substrate holders 203, 204 are driven by the drive section 220 in the manner described above to pivot about the wrist axis WX in directions 1300, 1301 relative to each other and to substrate holder 205. In this example, the drive section includes an additional drive axis (e.g., a five degree of freedom drive) to independently rotate substrate holder 205 about the wrist axis WX in direction 1302 relative to each of the substrate holders 203, 204; while in other aspects the substrate holder 205 may be slaved to any suitable portion of the substrate transport apparatus 130 such as, for example, the upper arm 201 to as to remain aligned with a radial extension axis that passes through the shoulder axis SX. Again, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. In this example, automatic wafer centering is effected such that the base pitch BP between substrate holder 203 and substrate holder 204 may be increased or decreased, the base pitch BP between substrate holder 203 and substrate holder 205 may be increased or decreased, the base pitch BP between substrate holder 204 and substrate holder 205 may be increased or decreased, etc. to effect the automatic wafer centering for any one or more of substrate holding stations 203H1, 204H1, 205H1, 203H2, 204H2, 205H2 with respect to side by side substrate processing stations 190-198 and 199A-199C (see FIG. 12). In other aspects, the substrate holding stations 203H2-205H2 (or 203H1-205H1) may be stacked one above the other in a manner similar to that shown in FIG. 10. In still other aspects, one or more of the substrate holders 203-205 may be a single pan substrate holder in a manner similar to that shown in FIG. 11.

Figure 19:
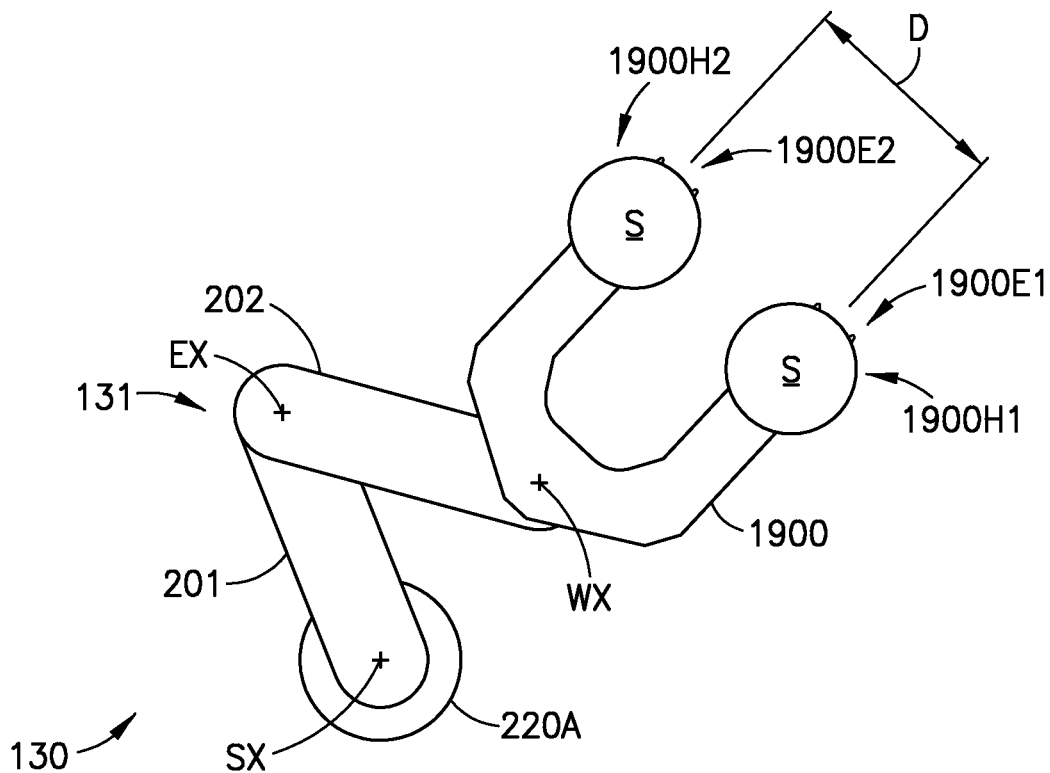
FIG. 19 is a schematic illustration of a substrate transport apparatus of the substrate processing apparatus of FIG. 1 in accordance with aspects of the present disclosure.

In still other aspects, the substrate transport apparatus 130 may have substrate holders with any suitable configuration for transporting substrates to and from single substrate stations, any suitable number of substrate stations arranged side-by-side, any suitable number of substrate stations arranged in a stack one above the other, etc. The combination of side-by-side substrate holders and multiple stacked (or a single) substrate holder(s) on opposite sides of the wrist axis WX may be employed such as where a combination of twin, single, triple, etc. (see FIGS. 1A, 8, and 12) substrate station modules are coupled to the transfer chamber 125. For example, referring to FIG. 19, the substrate transport apparatus 130 includes one double (side-by-side) substrate holder 1900 rotatably coupled to the arm 131 in a manner similar to that described above. In this aspect, the arm 131 and substrate holder 1900 may be driven in rotation and/or extension (e.g., along radial and/or non-radial linear paths) by the three-axis drive section 220A (FIG. 3A), where one drive axis rotates upper arm 201 about the shoulder axis SX, one drive axis rotates the forearm 201 about the elbow axis EX, and one drive axis rotates the substrate holder 1900 about the wrist axis WX. Each of the upper arm 201, forearm 202, and substrate holder 1900 may be coupled to the three axis drive section 220A (FIG. 3A) by any suitable transmissions such as by band and pulley transmissions substantially similar to those described above with respect to FIG. 4. Here the substrate holder 1900 includes (i.e., is common to) two side-by-side substrate hold stations 1900H1, 1900H2 that are substantially similar to those described above. A distance between the side-by-side substrate holding stations 1900H1, 1900H2 may be substantially the same as the pitch D between side-by-side substrate processing stations 190-197 (FIG. 1A). The substrate holder 1900 has a first end 1900E1, a second end 1900E2 and is a substantially rigid unarticulated link between the first end 1900E1 and second end 1900E2. The substrate holder 1900 is rotatably coupled to the forearm 202 about the wrist axis WX at a location that is between the first end 1900E1 and second end 1900E2. As described above, the substrate holding stations 1900H1, 1900H2 are disposed on a common plane (substantially similar to plane 499 as described above with respect to FIGS. 2D, 10, and 11). The substrate holder 1900 may be extended by the transport arm 131 and drive section 220A along a non-radial linear path and or a radial linear path in a manner substantially similar to that described herein for substantially simultaneously picking and/or placing substrates to side-by-side substrate station modules along the common plane 499.

Figure 20:
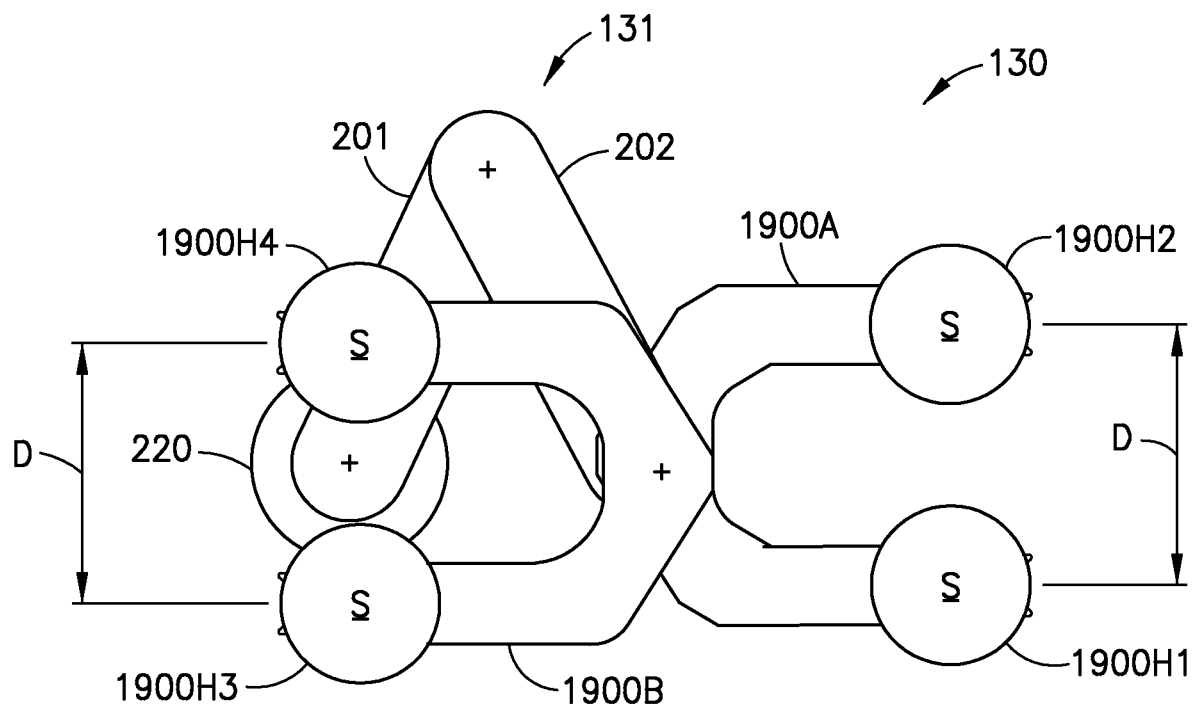
FIG. 20 is a schematic illustration of a substrate transport apparatus of the substrate processing apparatus of FIG. 1 in accordance with aspects of the present disclosure.

Referring to FIG. 20, the substrate transport apparatus 130 is substantially similar to that described above with respect to FIG. 19; however, in this aspect the substrate transport apparatus 130 includes two substrate holders 1900A and 1900B rotatably coupled to the arm 131 about the wrist axis WX. Each of the substrate holders 1900A, 1900B is substantially similar to substrate holder 1900. Here the arm 131 and substrate holders 1900A, 1900B are driven in rotation and/or extension (along a non-radial linear path and/or a radial linear path) by, for example, the four axis drive section 220 (FIG. 3) where one drive axis rotates upper arm 201 about the shoulder axis SX, one drive axis rotates the forearm 201 about the elbow axis EX, one drive axis rotates the substrate holder 1900A about the wrist axis WX, and one drive axis rotates the substrate holder 1900B about wrist axis WX. Each of the upper arm 201, forearm 202, and substrate holders 1900A, 1900B may be coupled to the four axis drive section 220 (FIG. 3) by any suitable transmissions such as by band and pulley transmissions substantially similar to those described above with respect to FIG. 4. In this aspect, substrate holder 1900A includes substrate holding stations 1900H1, 1900H2 and substrate holder 1900B includes substrate holding station 1900H3, 1900H4. In a manner similar to that described above, the substrate holding stations 1900H1, 1900H2, 1900H3, 1900H4 are disposed on a common plane (substantially similar to plane 499 as described above with respect to FIGS. 2D, 10, and 11). The substrate holders 1900A, 1900B may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. The arm 131 and/or substrate holders 1900A, 1900B may also be driven in rotation to fast swap the substrate holders 1900A, 1900B (and substrates picked or placed thereby) in a manner substantially similar to that described herein.

Figure 21:
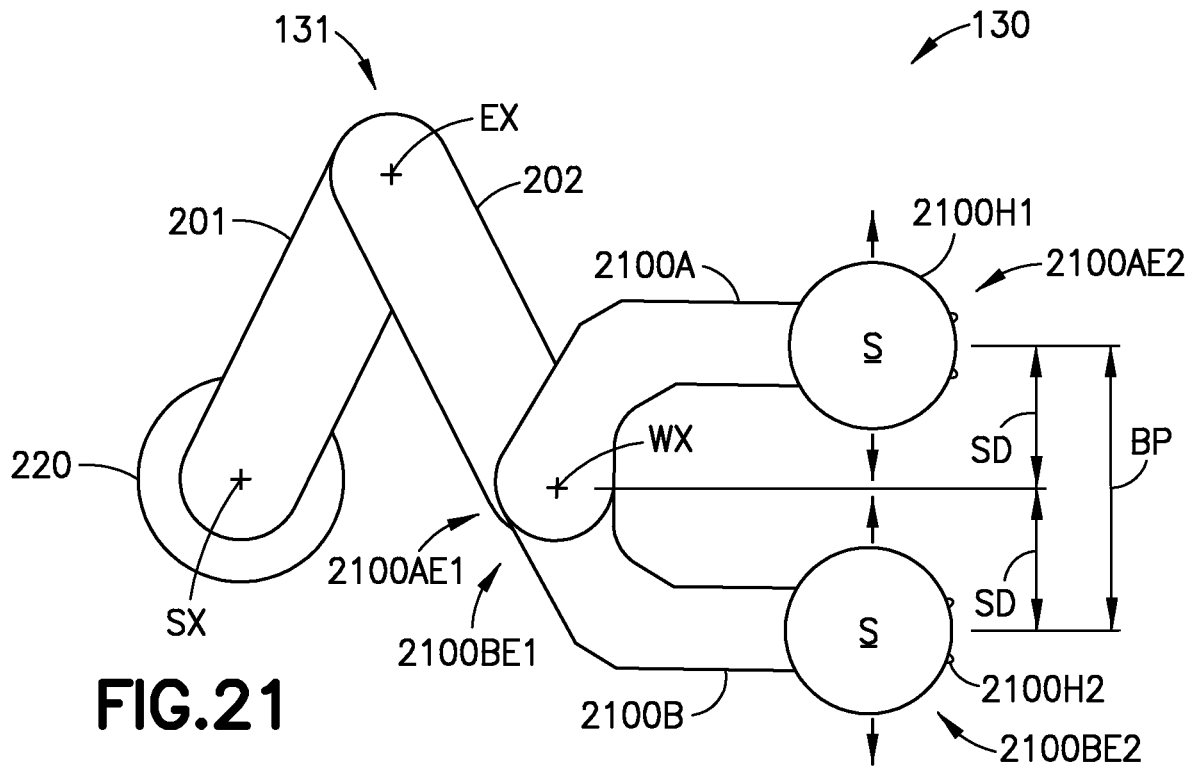
FIG. 21 is a schematic illustration of a substrate transport apparatus of the substrate processing apparatus of FIG. 1 in accordance with aspects of the present disclosure.

Referring to FIG. 21, the substrate transport apparatus 130 is substantially similar to that described above with respect to FIG. 19; however, in this aspect the substrate transport apparatus 130 includes two single sided substrate holders 2100A and 2100B rotatably coupled to the arm 131 about the wrist axis WX. Each of the substrate holders 2100A, 2100B has a respective first end 2100AE1, 2100BE1 coupled to the forearm 202 about the wrist axis and a respective second end 2100AE2, 2100BE2 at which a respective substrate holding station 2100H1, 2100H2 is located. Here the arm 131 and substrate holders 2100A, 2100B are driven in rotation and/or extension (along a non-radial linear path and/or a radial linear path) by, for example, the four axis drive section 220 (FIG. 3) where one drive axis rotates upper arm 201 about the shoulder axis SX, one drive axis rotates the forearm 201 about the elbow axis EX, one drive axis rotates the substrate holder 2100A about the wrist axis WX, and one drive axis rotates the substrate holder 2100B about wrist axis WX. Each of the upper arm 201, forearm 202, and substrate holders 2100A, 2100B may be coupled to the four axis drive section 220 (FIG. 3) by any suitable transmissions such as by band and pulley transmissions substantially similar to those described above with respect to FIG. 4. In this aspect, substrate holder 2100A includes substrate holding station 2100H1, and substrate holder 2100B includes substrate holding station 2100H2. In a manner similar to that described above, the substrate holding stations 2100H1, 2100H2 are disposed on a common plane (substantially similar to plane 499 as described above with respect to FIGS. 2D, 10, and 11).

The substrate holders 2100A, 2100B may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2100A, 2100B about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A).

Figure 22:
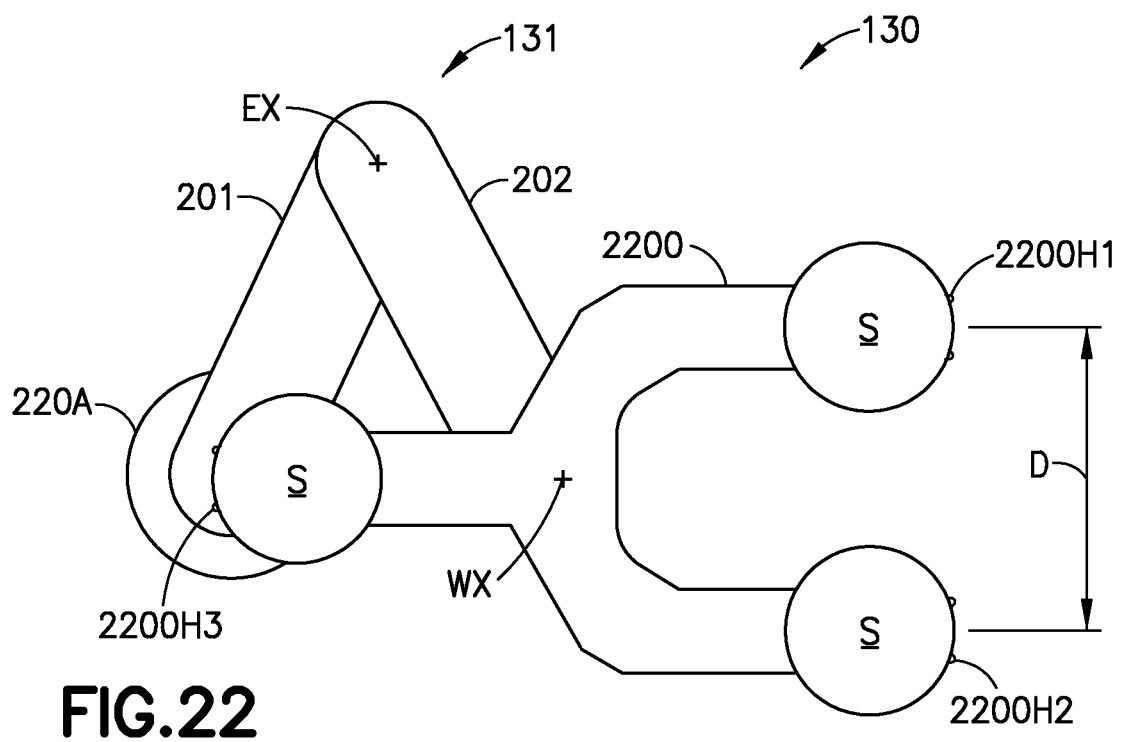
FIG. 22 is a schematic illustration of a substrate transport apparatus of the substrate processing apparatus of FIG. 1 in accordance with aspects of the present disclosure.

Referring to FIG. 22, the substrate transport apparatus 130 includes a substrate holder 2200 that is rotatably coupled to the arm 131 in a manner similar to that described above. In this aspect, the arm 131 and substrate holder 2200 may be driven in rotation and/or extension (e.g., along radial and/or non-radial linear paths) by the three-axis drive section 220A (FIG. 3A), where one drive axis rotates upper arm 201 about the shoulder axis SX, one drive axis rotates the forearm 201 about the elbow axis EX, and one drive axis rotates the substrate holder 2200 about the wrist axis WX. Each of the upper arm 201, forearm 202, and substrate holder 2200 may be coupled to the three axis drive section 220A (FIG. 3A) by any suitable transmissions such as by band and pulley transmissions substantially similar to those described above with respect to FIG. 4. Here the substrate holder 2200 includes (i.e., is common to) two side-by-side substrate hold stations 2200H1, 2200H2 and one opposing substrate holding station 2200H3 that are substantially similar to those described above and, the substrate holder 2200 is a substantially rigid unarticulated link between the substrate holding stations 2200H1, 2200H2, 2200H3. A distance between the two side-by-side substrate holding stations 2100H1, 2100H2 may be substantially the same as the pitch D between side-by-side substrate processing stations 190-197 (FIG. 1A).

The side-by-side substrate holding stations 2100H1, 2100H2 provide for substantially simultaneous picking and placing of substrates S from and to the side-by-side substrate processing stations 190-197 (FIG. 1) while the opposing substrate holding station 2200H3 provides for the picking and placing of a single substrate to a single substrate processing station (which may be one of the side-by-side substrate processing stations 190-197 (FIG. 1A) or substrate processing station 150S (FIG. 8)) in a manner substantially similar to that described above with respect to FIGS. 8 and 9. The substrate holder 2200 is rotatably coupled to the forearm 202 about the wrist axis WX at a location that is between the substrate holding stations 2200H1, 2200H2, 2200H3. In one aspect, the three substrate holding stations 2200H1, 2200H2, 2200H3 are disposed in the common plane 499 in a manner substantially similar to that described above with respect to FIGS. 2D, 10, and 11; while in other aspects, one or more of the substrate holding stations 2200H1, 2200H2, 2200H3 may be disposed in different stacked planes. The substrate holder 2200 may be extended by the transport arm 131 and drive section 220A along a non-radial linear path and or a radial linear path in a manner substantially similar to that described herein for substantially simultaneously picking and/or placing substrates, with the side-by-side substrate holding stations 2200H1, 2200H2, to side-by-side substrate station modules 150 along the common plane 499 or picking and/or placing a substrate to and from a substrate station module 150, 150S with the substrate holding station 2200H3. In one aspect, the arm 131 and/or end effector 2200 may also be driven in rotation to fast swap (in a manner substantially similar to that described herein) a substrate using the opposing substrate holding station 2200H3 and one of the side-by-side substrate holding stations 2200H1, 2200H2, such as where substrate are picked by the side-by-side substrate holding stations 2200H1, 2200H2 and a substrate is placed by the opposing substrate holding station 2200H3 in one of the locations a substrate was just picked by the side-by-side substrate holding stations 2200H1, 2200H2.

Figure 23:
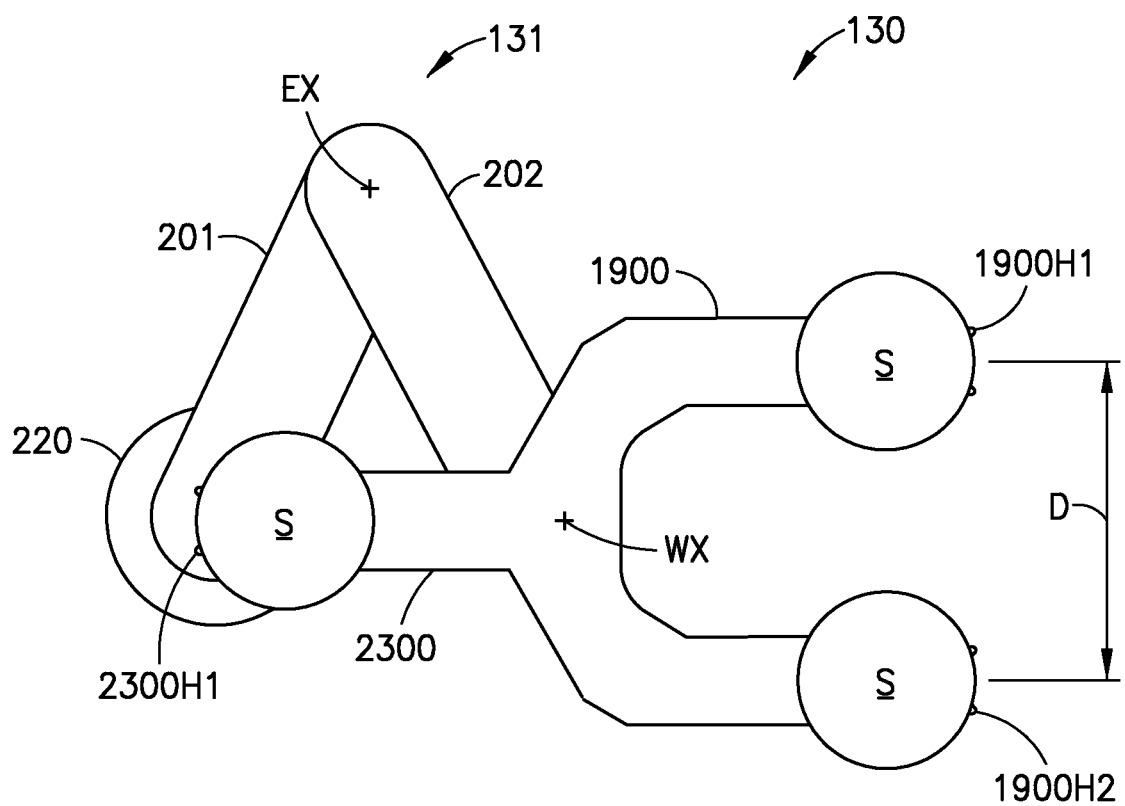
FIG. 23 is a schematic illustration of a substrate transport apparatus of the substrate processing apparatus of FIG. 1 in accordance with aspects of the present disclosure.

Referring to FIG. 23, the substrate transport apparatus 130 includes substrate holders 1900, 2300 that are rotatably coupled to the arm 131 in a manner similar to that described above. In this aspect, the arm 131 and substrate holders 1900, 2300 may be driven in rotation and/or extension (e.g., along radial and/or non-radial linear paths) by the four-axis drive section 220 (FIG. 3), where one drive axis rotates upper arm 201 about the shoulder axis SX, one drive axis rotates the forearm 201 about the elbow axis EX, one drive axis rotates the substrate holder 1900 about the wrist axis WX, and one drive axis rotates the substrate holder 2300 about the wrist axis WX. Each of the upper arm 201, forearm 202, and substrate holders 1900, 2300 may be coupled to the four axis drive section 220 (FIG. 3) by any suitable transmissions such as by band and pulley transmissions substantially similar to those described above with respect to FIG. 4. Here the substrate holder 1900 includes two side-by-side substrate hold stations 1900H1, 1900H2 as described above. The substrate holder 2300 is an opposing substrate holder (i.e., opposes substrate holder 1900 in a manner substantially similar to that described above with respect to FIGS. 8, 9, and 22) having a single substrate holding station 2300H1. The substrate holding station 2300H1 is substantially similar to those described above. The substrate holder 2300 has a first (or proximate) end coupled to the forearm 202 at the wrist axis WX and an opposite (or distal) end at which the substrate holding station 2300H1 is disposed. The substrate holder 2300 is a substantially rigid unarticulated link between the proximate and distal ends. As described above, the distance or between the two side-by-side substrate holding stations 2100H1, 2100H2 may be substantially the same as the pitch D between side-by-side substrate processing stations 190-197 (FIG. 1A).

As noted above, the side-by-side substrate holding stations 1900H1, 1900H2 provide for substantially simultaneous picking and placing of substrates S from and to the side-by-side substrate processing stations 190-197 (FIG. 1) while the opposing substrate holding station 2300H1 provides for the picking and placing of a single substrate to a single substrate processing station (which may be one of the side-by-side substrate processing stations 190-197 (FIG. 1A) or substrate processing station 150S (FIG. 8)) in a manner substantially similar to that described above with respect to FIGS. 8 and 9.

Figure 23A:
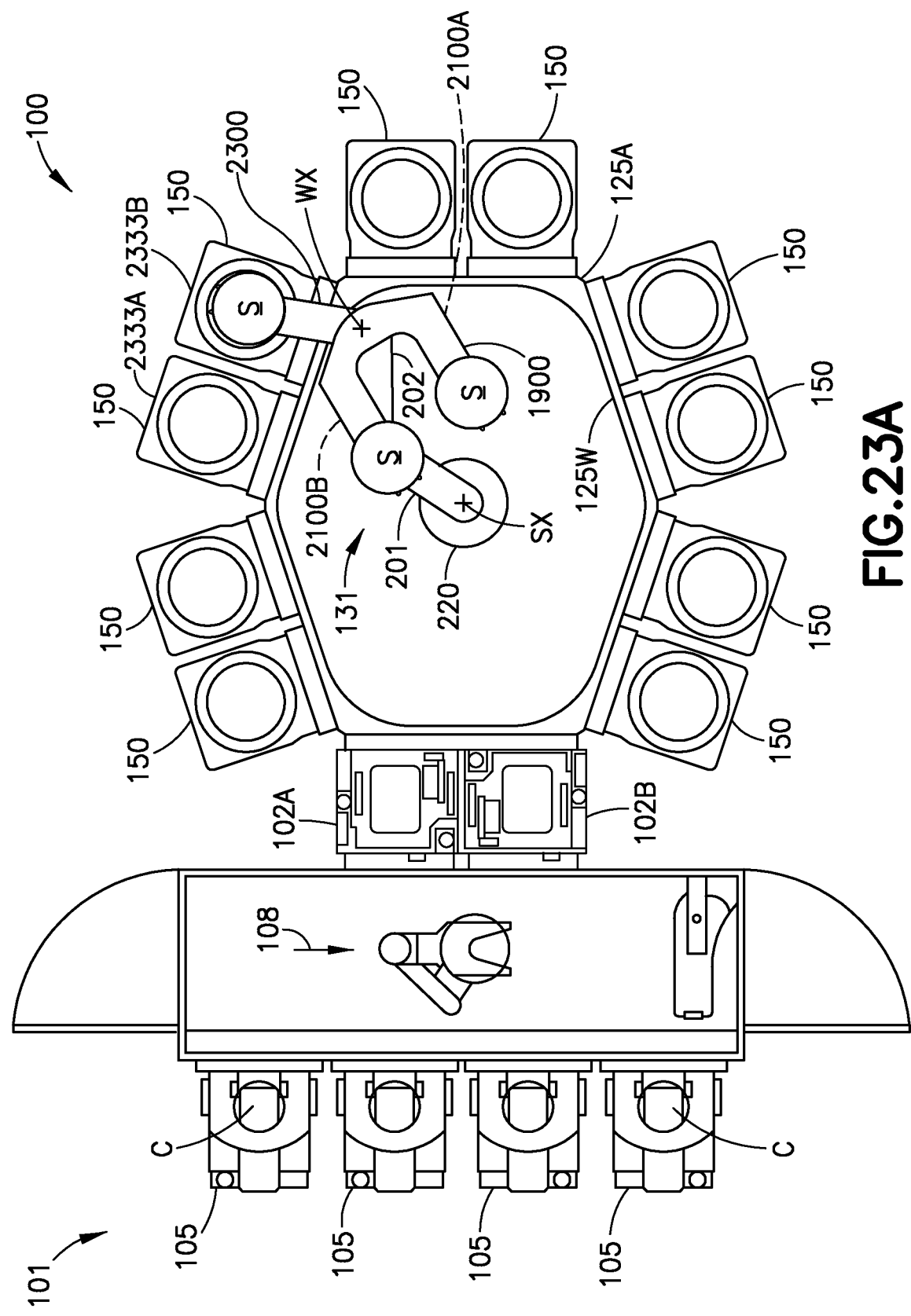
FIG. 23A is a schematic illustration of an exemplary substrate processing apparatus incorporating the substrate transport apparatus of FIG. 23 in accordance with aspects of the present disclosure.

Independent rotation of the substrate holder 2300 provides for automatic wafer centering (as described herein) of substrates held by the substrate holding station 2300H1 during pick/place operations. Independent rotation of the substrate holders 1900, 2300 may also provide for substrate holder conformance of the substrate transport apparatus 130 to a shape (e.g., of the interior side walls 125W) of the transfer chamber 125A. For example, referring also to FIG. 23A, the substrate holders 1900, 2300 may be rotated by the drive section 220 so that the single substrate holder 2300 is rotated, with arm extension movement, so as to extend into the substrate processing station 150 while the substrate holder 1900 is rotated to maintain clearance between the substrate holder 1900 and the walls 125W of the transfer chamber 125A. While the six-sided transfer chamber 125A is illustrated in FIG. 23A, in other aspects, the transfer chamber may have any suitable number of sides and the substrate holders 1900, 2300 may be rotated by the drive section to conform to a shape of the walls of the transfer chamber in any suitable manner.

In one aspect, the three substrate holding stations 1900H1, 1900H2, 2300H1 are disposed in the common plane 499 in a manner substantially similar to that described above with respect to FIGS. 2D, 10, and 11; while in other aspects, one or more of the substrate holding stations 1900H1, 1900H2, 2300H1 may be disposed in different stacked planes. The substrate holders 1900, 2300 may be extended by the transport arm 131 and drive section 220 along a non-radial linear path and or a radial linear path in a manner substantially similar to that described herein for substantially simultaneously picking and/or placing substrates, with the side-by-side substrate holding stations 1900H1, 1900H2, to side-by-side substrate station modules 150 along the common plane 499 or picking and/or placing a substrate to and from a substrate station module 150, 150S with the substrate holding station 2300H1. In one aspect, the arm 131 and/or end effector 2200 may also be driven in rotation to fast swap (in a manner substantially similar to that described herein) a substrate using the opposing substrate holding station 2300H1 and one of the side-by-side substrate holding stations 1900H1, 1900H2, such as where substrates are picked by the side-by-side substrate holding stations 1900H1, 1900H2 and a substrate is placed by the opposing substrate holding station 2300H1 in one of the locations a substrate was just picked by the side-by-side substrate holding stations 1900H1, 1900H2.

Figure 24:
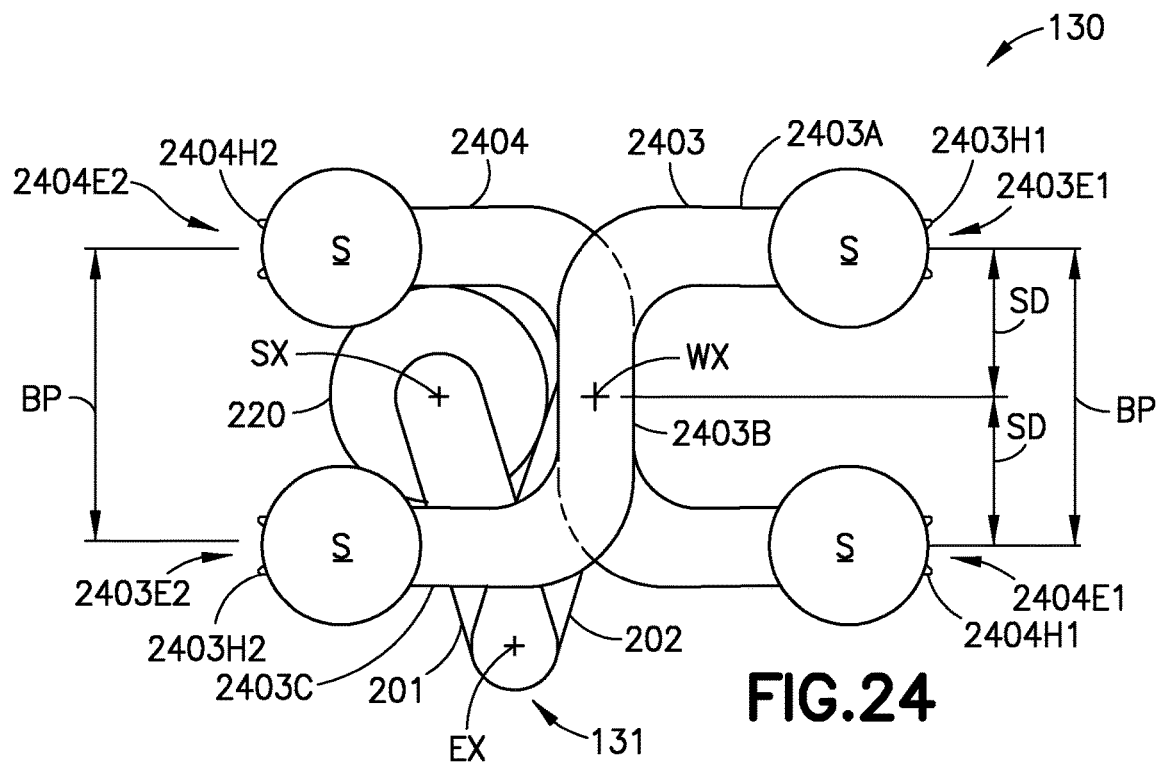
FIG. 24 is a schematic illustration of a substrate transport apparatus of the substrate processing apparatus of FIG. 1 in accordance with aspects of the present disclosure.

Referring to FIG. 24, the substrate transport apparatus 130 is substantially similar to that described above with respect to FIG. 2A-2D; however, in this aspect substrate holders 2403, 2404 have an "S" shaped configuration and cross over one another. For example, substrate holder 2403 has a first portion 2403A, a second portion 2403B that has a longitudinal axis disposed substantially orthogonally to a longitudinal axis of the first portion 2403A, and a third portion that has a longitudinal axis disposed substantially parallel with the longitudinal axis of the first portion 2403A so as to form a substantially "S" shaped substrate holder. A distal end of the first portion forms a first end 2403E1 of the substrate holder 2403 and a distal end of the third portion 2403C forms a second end 2403E2 of the substrate holder 2403. The second portion 2403B is coupled to the forearm 202 about the wrist axis WX, where the substrate holder 2403 is a substantially rigid unarticulated link between the first end 2403E1 and the second end 2403E2. The configuration of substrate holder 2404 is substantially similar, but opposite in hand, to substrate holder 2403.

Here the arm 131 and substrate holders 2403, 2404 are driven in rotation and/or extension (along a non-radial linear path and/or a radial linear path) by, for example, the four axis drive section 220 (FIG. 3) where one drive axis rotates upper arm 201 about the shoulder axis SX, one drive axis rotates the forearm 201 about the elbow axis EX, one drive axis rotates the substrate holder 2403 about the wrist axis WX, and one drive axis rotates the substrate holder 2404 about wrist axis WX. Each of the upper arm 201, forearm 202, and substrate holders 2100A, 2100B may be coupled to the four axis drive section 220 (FIG. 3) by any suitable transmissions such as by band and pulley transmissions substantially similar to those described above with respect to FIG. 4. In this aspect, substrate holder 2403 includes substrate holding stations 2403H1, 2403H2 and substrate holder 2404 includes substrate holding stations 2404H1, 2404H2. In a manner similar to that described above, the substrate holding stations 2403H1, 2403H2, 2404H1, 2404H2 are disposed on a common plane (substantially similar to plane 499 as described above with respect to FIGS. 2D, 10, and 11). The substrate holders 2403H1, 2403H2, 2404H1, 2404H2 may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2403, 2404 about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). In one aspect, the arm 131 and/or end effectors 2403, 2404 may also be driven in rotation to fast swap substrates (in a manner substantially similar to that described herein) in a manner similar to that described above with respect to FIGS. 7A-7L.

Figure 25:
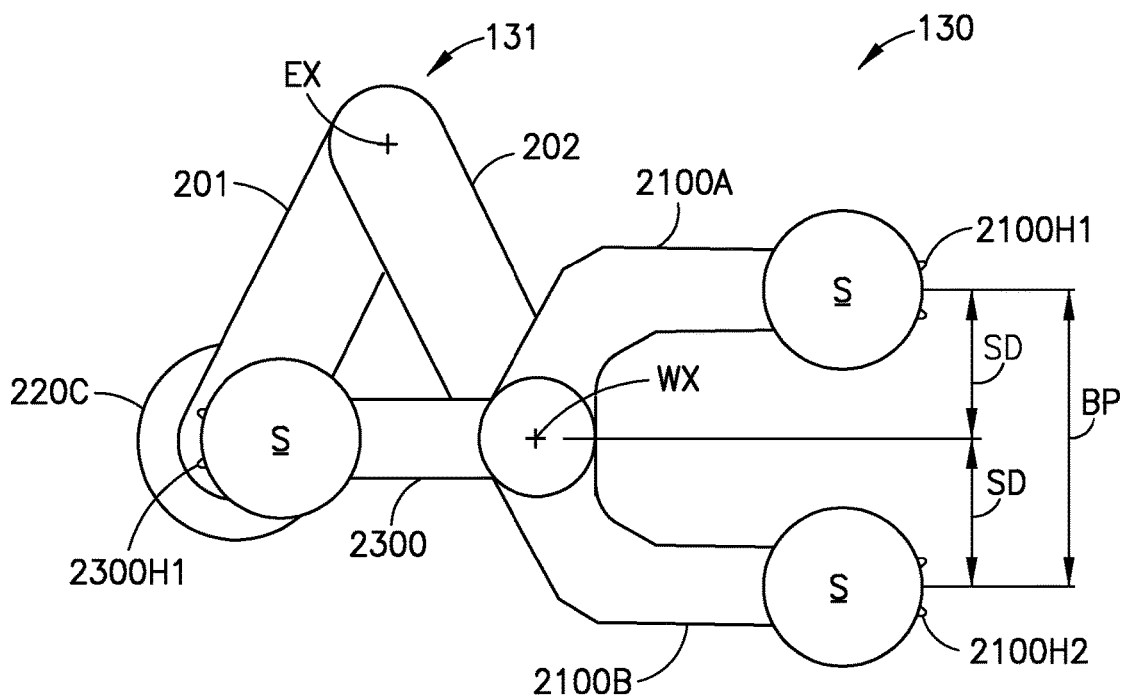
FIG. 25 is a schematic illustration of a substrate transport apparatus of the substrate processing apparatus of FIG. 1 in accordance with aspects of the present disclosure.

Referring to FIG. 25, the substrate transport apparatus 130 is substantially similar to that described above with respect to FIG. 21; however, in this aspect substrate the substrate transport apparatus also include opposing substrate holder 2300 similar to that described above with respect to FIG. 23. Here the arm 131 and substrate holders 2100A, 2100B, 2300 are driven in rotation and/or extension (along a non-radial linear path and/or a radial linear path) by, for example, the five axis drive section 220C (FIG. 3C) where one drive axis rotates upper arm 201 about the shoulder axis SX, one drive axis rotates the forearm 201 about the elbow axis EX, one drive axis rotates the substrate holder 2100A about the wrist axis WX, one drive axis rotates the substrate holder 2100B about wrist axis WX, and one drive axis rotates substrate holder 2300 about wrist axis WX. Each of the upper arm 201, forearm 202, and substrate holders 2100A, 2100B, 2300 may be coupled to the five axis drive section 220C (FIG. 3C) by any suitable transmissions such as by band and pulley transmissions substantially similar to those described above with respect to FIG. 4. In this aspect, substrate holder 2100A includes substrate holding station 2100H1, substrate holder 2100B includes substrate holding station 2100H2, and substrate holder 2300 includes substrate holding station 2300H1. In a manner similar to that described above, the substrate holding stations 2100H1, 2100H2, 2300H1 are disposed on a common plane (substantially similar to plane 499 as described above with respect to FIGS. 2D, 10, and 11). The substrate holders 2100H1, 2100H2, 2300H1 may be extended by the transport arm 131 and drive section 220C along a non-radial linear path and or a radial linear path in a manner substantially similar to that described herein for substantially simultaneously picking and/or placing substrates to side-by-side substrate station modules along the common plane 499.

It is noted that the independent rotation of the substrate holders 2100H1, 2100H2 about the wrist axis WX provides for automatic wafer centering for picking/placement of substrates S in side-by-side substrate station modules 150 by varying the base pitch BP (e.g., the distance between the side-by-side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). It is further noted that the opposing substrate holding station 2300H1 provides for the picking and placing of a single substrate to a single substrate processing station (which may be one of the side-by-side substrate processing stations 190-197 (FIG. 1A) or substrate processing station 150S (FIG. 8)) in a manner substantially similar to that described above with respect to FIGS. 8 and 9. Independent rotation of the substrate holder 2300 provides for further automatic wafer centering (as described herein) of substrates held by the substrate holding station 2300H1 during pick/place operations. In one aspect, the arm 131 and/or end effectors 2100A, 2100B, 2300 may also be driven in rotation to fast swap (in a manner substantially similar to that described herein) a substrate using the opposing substrate holding station 2300H1 and one of the side-by-side substrate holding stations 2100H1, 2100H2, such as where substrates are picked by the side-by-side substrate holding stations 2100H1, 2100H2 and a substrate is placed by the opposing substrate holding station 2300H1 in one of the locations a substrate was just picked by the side-by-side substrate holding stations 2100H1, 2100H2.

In one aspect, independent rotation of the substrate holders 2100A, 2100B, 2300 may also provide for substrate holder conformance of the substrate transport apparatus 130 to a shape (e.g., of the interior walls 125W) of the transfer chamber 125A in a manner similar to that described above with respect to FIG. 23A. However, in this aspect, one or more of the substrate holders 2100A, 2100B may be rotated by the drive section 220C to maintain clearance between the respective substrate holder 2100A, 2100B and the walls 125W of the transfer chamber 125A.

Referring to FIGS. 26A, 26B, 26C, and 26D, the substrate transport apparatus 130 is substantially similar to that described above with respect to FIG. 24; however, in this aspect at least one of the substrate holders 2403, 2404 is movable in the Z direction so that the substrate holders 2403, 2404 (and the respective substrate holding stations 2403H1, 2404H1, 2403H2, 3404H2) pass over one another. For example, a wrist Z-drive 2660 (in addition to or in lieu of the Z-drive 312—see FIGS. 3-3C) is provided in or coupled to the forearm 202. The wrist Z-drive 2660 is configured to move one or more of the substrate holders 2403, 2404 in the Z direction relative to the other one of the substrate holders 2403, 2404. In the example illustrated in FIG. 26C the wrist Z-drive 2660 is configured to move substrate holder 2403 in the Z direction relative to substrate holder 2404 and forearm 202; however, in other aspects both substrate holders may be movable in the Z direction relative to the forearm 202 and/or each other. The wrist Z-drive 2660 may have any suitable configuration for effecting Z movement including but not limited to one or more of a linear actuator, a jack screw, and a magnetic levitation lift. In this aspect, the pulley 476 is coupled to shaft 476S, where shaft 476S includes an outer shaft portion 476B and an inner shaft portion 476A. The inner shaft portion 476A and the outer shaft portion 476B are configured so that the inner shaft portion 476A is movable relative to the outer shaft portion 476B in the Z-direction while rotating with the outer shaft portion 476B as a unit. For example, the inner shaft portion 476B includes an internal spline and the outer shaft portion 476A includes an external spline configured to mate with the internal spline. While an exemplary configuration of the wrist Z-drive 2660 and shaft 276S is provided, in other aspects the wrist Z-drive 2660 and shaft 276S may have any suitable configuration to effect Z-axis movement of substrate holder 2403.

Figure 26A:
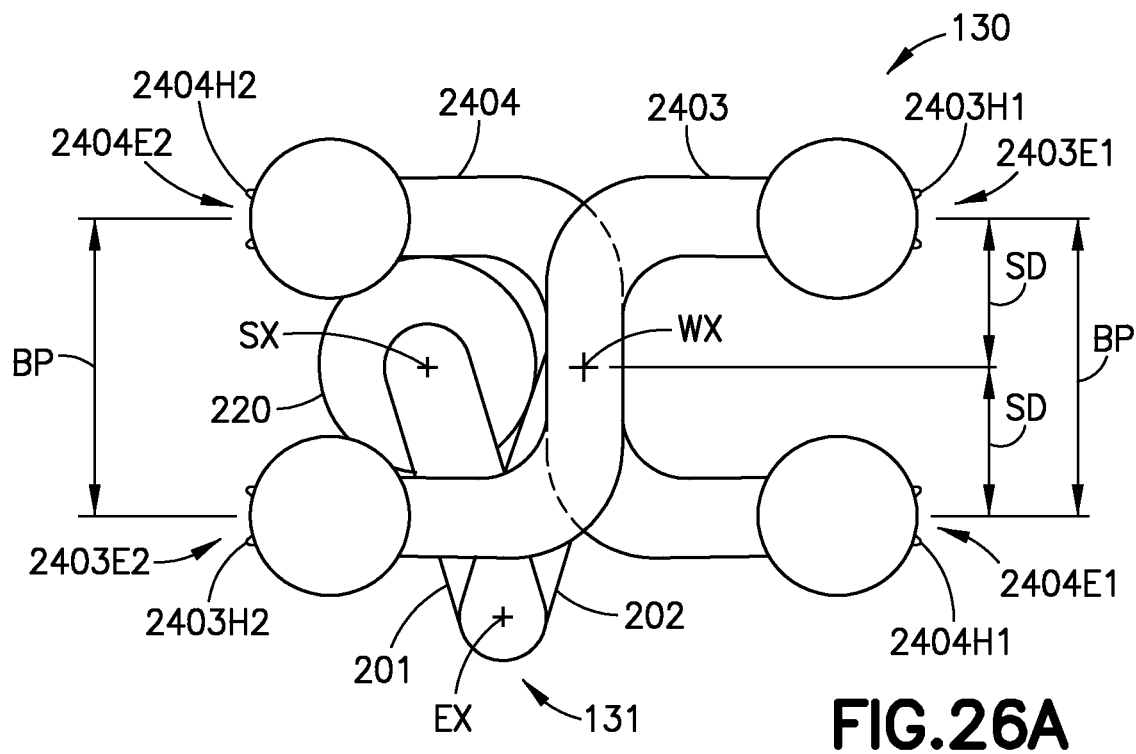
Figure 26B:
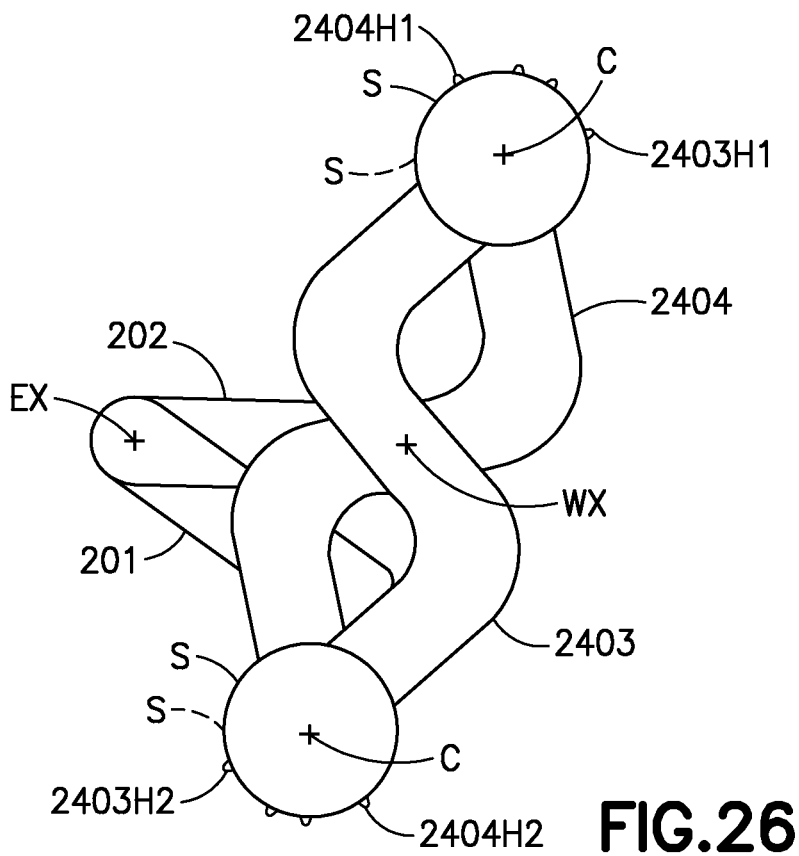
Figure 26C:
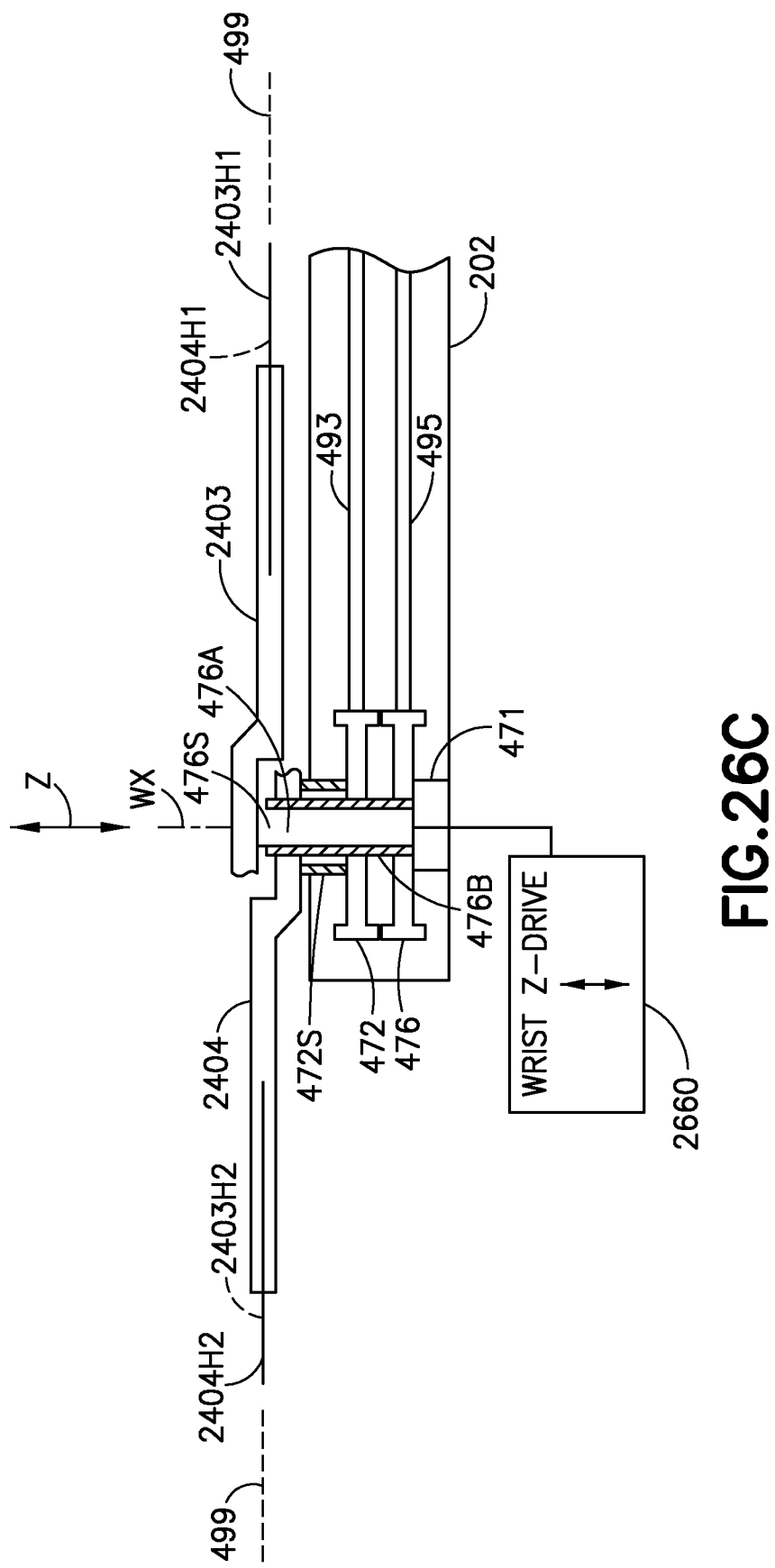

The wrist Z-drive 2660 is configured to raise and lower the substrate holder 2403 so that, in a manner similar to that described above, the substrate holding stations 2403H1, 2403H2, 2404H1, 2404H2 are disposed on a common plane (substantially similar to plane 499 as described above with respect to FIGS. 2D, 10, and 11) as illustrated in FIG. 26C for picking/placing substrates to side-by-side substrate station modules 150. As noted above, the substrate holders 2403H1, 2403H2, 2404H1, 2404H2 may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2403, 2404 about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). In one aspect, the arm 131 and/or end effectors 2403, 2404 may also be driven in rotation to fast swap (in a manner substantially similar to that described herein) in a manner similar to that described above with respect to FIGS. 7A-7L.

The wrist Z-drive 2660 is also configured to raise and lower the substrate holder 2403 so that the substrate holding stations 2403H1, 2403H3 of substrate holder 24033 are disposed in a different plane than the substrate holding stations 2404H1, 2404H2 of substrate holder 2404 as can be seen in FIG. 26D. Here, the substrate holding stations 2403H1, 2403H2 are disposed in plane 499A while substrate holding stations 2404H1, 2404H2 are disposed in plane 499. The planes 499, 499A may be separated by the distance or height H10 described above. With the substrate holders 2403, 2404 located in different planes 499, 499A, the substrate holders 2403, 2404 may be rotated about the wrist axis WX relative to each other so that the centers C of substrates S held by each of the substrate holding stations 2403H1, 2404H1 (or 2403H2, 2404H2) are substantially coincident with each other along the Z-direction as shown in FIG. 26B.

Referring also to FIG. 1C the substrate holders 2403, 2404 may be independently rotated about the wrist axis and one or more of the substrate holders 2403, 2404 may be moved in the Z-direction by the wrist Z-drive 2660 to effect picking substrates from various stacked and/or side-by-side substrate holding locations. For example in one aspect, the substrate holding stations 2403H1, 2404H1 (or 2403H2, 2404H2) are disposed along a common plane such as for substantially simultaneously picking/placing substrates from side-by-side load locks 102A, 102B or side-by-side load locks 102C, 102D (or other substrate holding location)). In one aspect, the substrate holding stations 2403H1, 2404H1 (or 2403H2, 2404H2) are disposed one above the other (see FIG. 26B as described above) in stacked planes such as for substantially simultaneously picking/placing substrates from stacked load locks 102A, 102C or from stacked load locks 102B, 102D (or other substrate holding location). In still other aspects, the substrate holding stations 2403H1, 2404H1 (or 2403H2, 2404H2) are disposed in different planes and horizontally offset such as for substantially simultaneously picking/placing substrates from stacked and horizontally offset load locks 102A, 102D (or other substrate holding location).

Figure 27A:
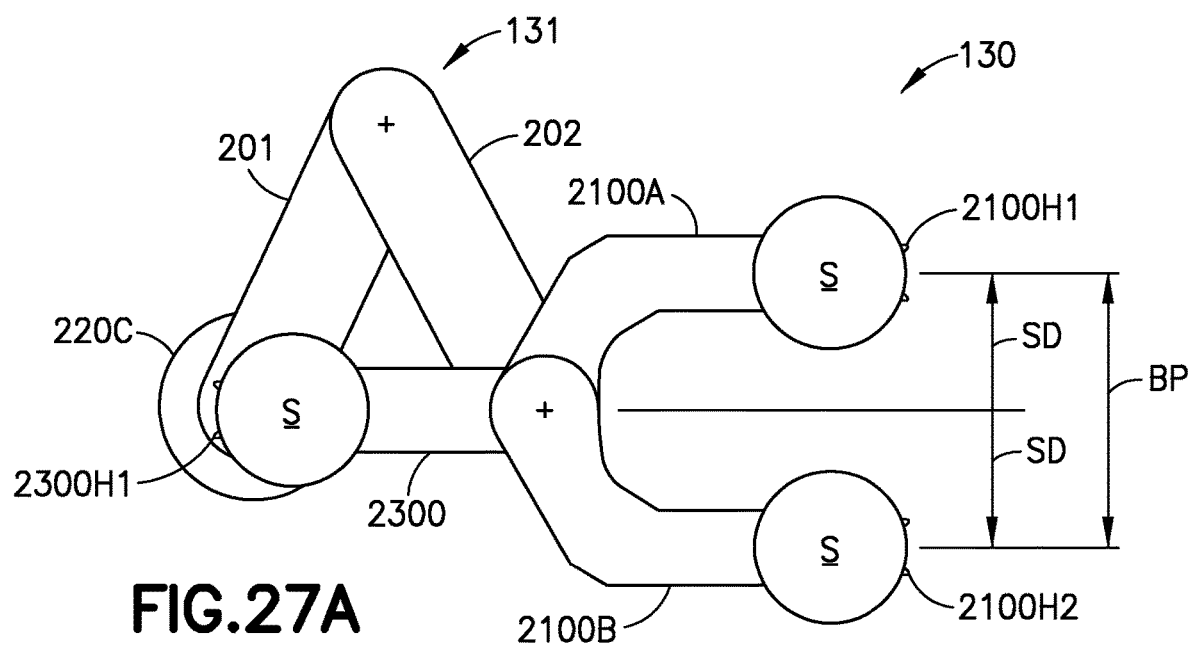
FIGS. 27A, 27B, and 27C are schematic illustrations of a substrate transport apparatus of the substrate processing apparatus of FIG. 1 in accordance with aspects of the present disclosure.
Figure 27B:
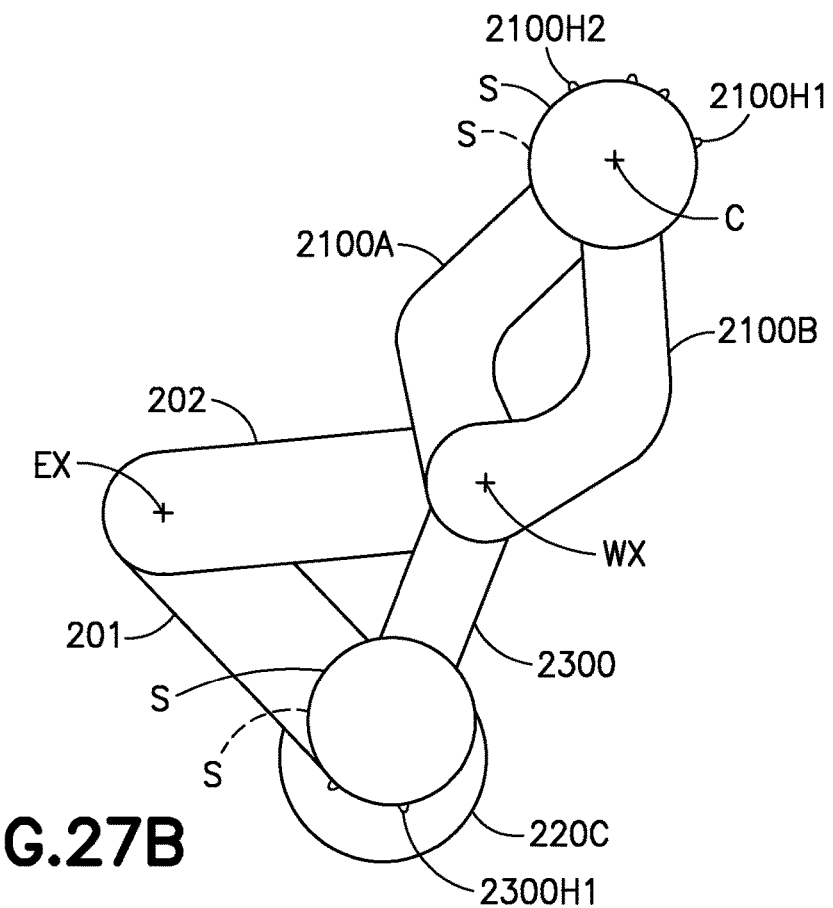
Figure 27C:
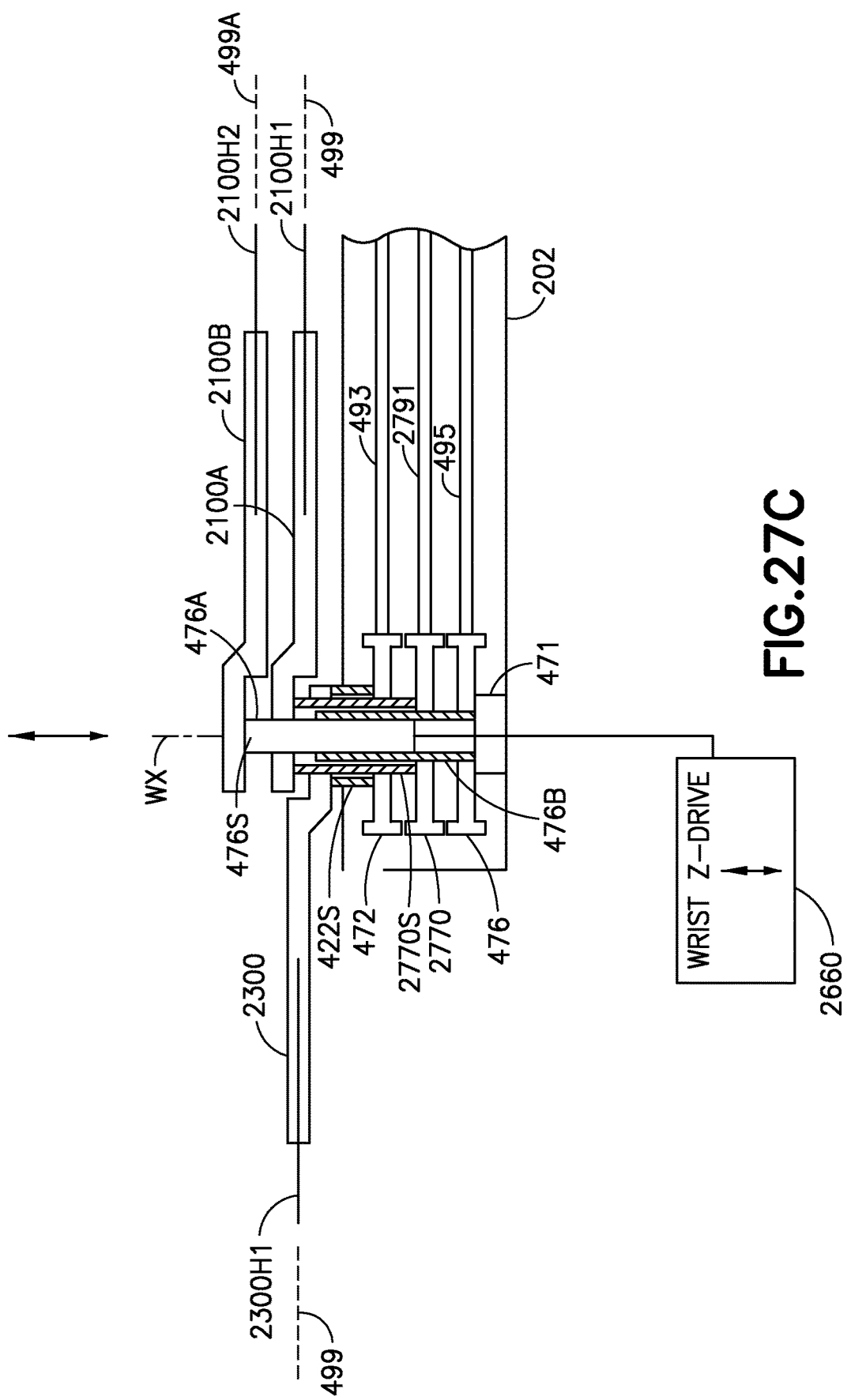

Referring to FIGS. 27A, 27B, and 27C, the substrate transport apparatus 130 is substantially similar to that described above with respect to FIG. 25; however, in this aspect at least one of the substrate holders 2100A, 2100B, 2300 is movable in the Z direction so that the substrate holders 2100A, 2100B, 2300 (and the respective substrate holding stations 2100H1, 2100H2, 2300H1) pass over one another. For example, the wrist Z-drive 2660 (in addition to or in lieu of the Z-drive 312—see FIGS. 3-3C) is provided in or coupled to the forearm 202. The wrist Z-drive 2660 is configured to move one or more of the substrate holders 2100A, 2100B, 2300 in the Z direction relative to the other substrate holders 2100A, 2100B, 2300. In the example illustrated in FIG. 27C the wrist Z-drive 2660 is configured to move substrate holder 2100B in the Z direction relative to substrate holders 2100A, 2300 and forearm 202; however, in other aspects both substrate holders 2100A, 2100B or all three substrate holders 2100A, 2100B, 2300 may be movable in the Z direction relative to the forearm 202 and/or each other. It is noted that pulley 2770, shaft 2770S, and transmission members 2791 are illustrated for driving rotation of substrate holder 2100A about the wrist axis WX, where the pulley 2770 is coupled to the drive section 220C through transmissions similar to those illustrated in FIG. 4 and described above.

The wrist Z-drive 2660 is configured to raise and lower the substrate holder 2100B so that, in a manner similar to that described above, the substrate holding stations 2100H1, 2100H2, 2300H1 are disposed on a common plane (substantially similar to plane 499 as described above with respect to FIGS. 2D, 10, and 11) for picking/placing substrates as described above with respect to FIGS. 8, 9, and 25. The wrist Z-drive 2660 is also configured to raise and lower the substrate holder 2100B so that the substrate holding station 2100H2 of substrate holder 2100B is disposed in a different plane than the substrate holding stations 2100H1, 2300H1 of substrate holders 2100A, 2300 as can be seen in FIG. 26C. Here, the substrate holding station 2100H2 is disposed in plane 499A while substrate holding stations 2100H1, 2300H1 are disposed in plane 499. The planes 499, 499A may be separated by the distance or height H10 described above. With the substrate holders 2100A, 2100B located in different planes 499, 499A, the substrate holders 2100A, 2100B may be rotated about the wrist axis WX relative to each other so that the centers C of substrates S held by each of the substrate holding stations 21000H1, 2100H2 are substantially coincident with each other along the Z-direction as shown in FIG. 27B.

As noted above, the substrate holders 2100A, 2100B, 2300 may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2100A, 2100B about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). As described above, independent rotation of the substrate holder 2300 also provides for automatic wafer centering of substrates held by the substrate holding station 2300H1 during pick/place operations. As also described above, in one aspect the arm 131 and/or end effector 2200 may also be driven in rotation to fast swap (in a manner substantially similar to that described herein) a substrate using the opposing substrate holding station 2300H1 and one of the side-by-side substrate holding stations 2100H1, 2100H2, such as where substrates are picked by the side-by-side substrate holding stations 2100H1, 2100H2 and a substrate is placed by the opposing substrate holding station 2300H1 in one of the locations a substrate was just picked by the side-by-side substrate holding stations 2100H1, 2100H2.

Referring also to FIG. 1C the substrate holders 2100A, 2100B may be independently rotated about the wrist axis and one or more of the substrate holders 2100A, 2100B may be moved in the Z-direction by the wrist Z-drive 2660 to effect picking substrates from various stacked and/or side-by-side substrate holding locations. For example in one aspect, the substrate holding stations 2100H1, 2100H2 are disposed along a common plane such as for substantially simultaneously picking/placing substrates from side-by-side load locks 102A, 102B or side-by-side load locks 102C, 102D (or other substrate holding location)). In one aspect, the substrate holding stations 2100H1, 2100H2 are disposed one above the other (see FIGS. 27B, 27C as described above) in stacked planes such as for substantially simultaneously picking/placing substrates from stacked load locks 102A, 102C or from stacked load locks 102B, 102D (or other substrate holding location).

It should be understood that while the wrist Z-drive 2660 is illustrated and described with respect to FIGS. 26A-26D and 27A-27C, in other aspects the wrist Z-drive may be incorporated into any of the arm configurations described herein, where more than one substrate holder is employed, in a manner substantially similar to that illustrated in FIGS. 26C, 26D, and 27C so that substrates may be transferred to side-by-side substrate station modules 150 in a common plane or to stacked substrate station modules 150 (see FIG. 1C) in stacked planes as described herein.

Figure 29:
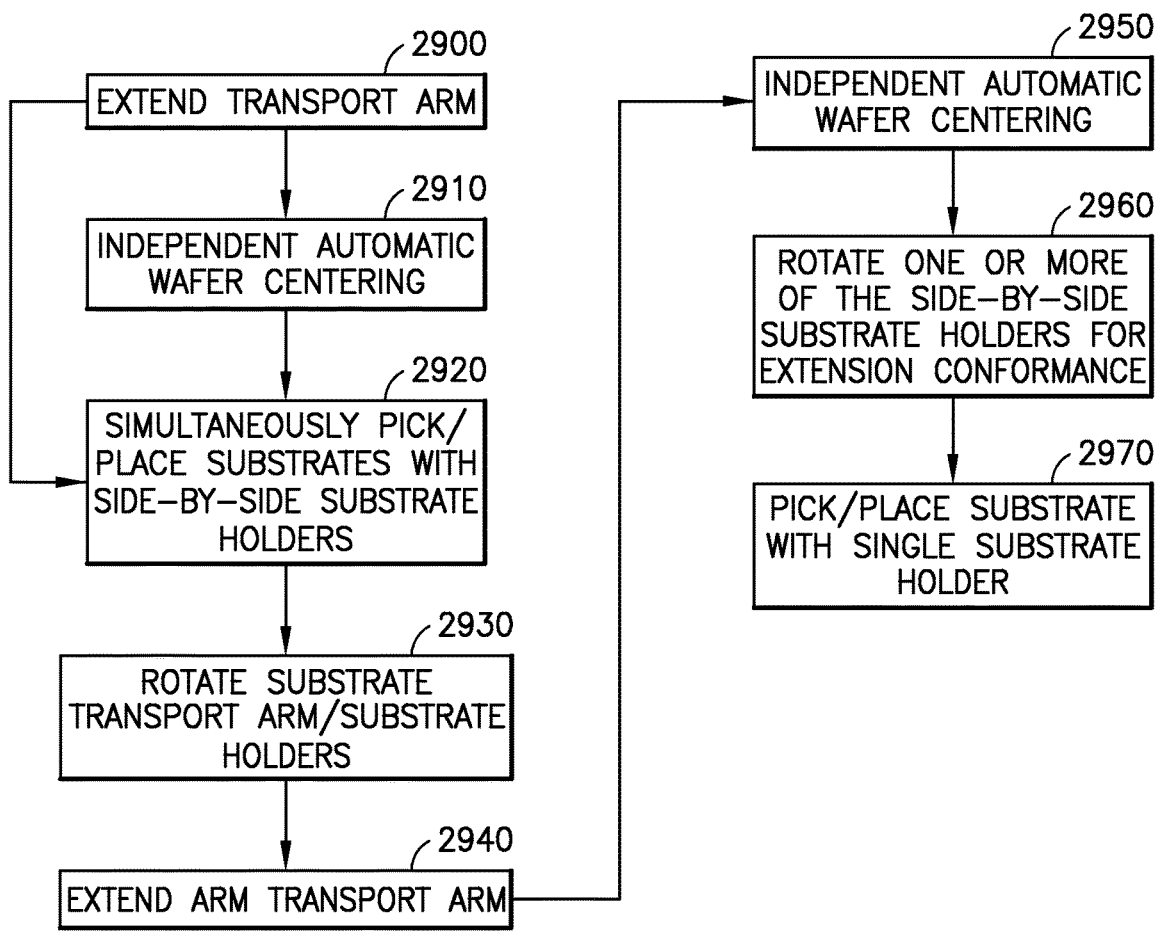
FIG. 29 is a flow diagram of an exemplary method in accordance with aspects of the present disclosure.

In one aspect, similar to that described above with respect to FIGS. 23 and 25, independent rotation of the substrate holders 2100A, 2100B, 2300 may also provide for substrate holder conformance of the substrate transport apparatus 130 to a shape (e.g., of the interior walls 125W) of the transfer chamber 125A in a manner similar to that described above with respect to FIG. 23A. However, in this aspect, one or more of the substrate holders 2100A, 2100B may be rotated by the drive section 220C to maintain clearance between the respective substrate holder 2100A, 2100B and the walls 125W of the transfer chamber 125A. For example, referring also to FIG. 29 as well as FIGS. 23, 23A, and 25 the substrate transport apparatus 130 may be positioned as shown in FIG. 23A so that the substrate holding stations of substrate holder 1900 (or substrate holders 2100A, 2100B) are aligned for picking/placing substrates from a respective one of substrate processing stations 2333A, 2333B. The transport arm 131 is extended (FIG. 29, Block 2900). In one aspect (such as with independently rotatably substrate holders 2100A, 2100B), independent automatic wafer centering is provided (FIG. 29, Block 2910) in a manner similar to that described herein so that the substrate holding stations of the substrate holders 2100A, 2100B are centered under substrates to be picked or substrates to be placed are centered at the substrate processing stations 2333A, 2333B. Substrates are simultaneously picked or placed by the substrate holder 1900 (or substrate holders 2100A, 2100B) from or to the substrate processing stations 2333A, 2333B (FIG. 29, Block 2920). The substrate transport arm 131 is retracted and the substrate transport arm 131 and/or substrate holders 1900 (or 2100A, 2100B) and substrate holder 2300 are rotated (FIG. 29, Block 2930) so as to align the (single) substrate holder 2300 with, for example, substrate processing station 2333B. The transport arm 131 is extended (FIG. 29, Block 2940) and automatic wafer centering may be provided (FIG. 29, Block 2950) for picking or placing a substrate with the substrate holder 2300. As can be seen in FIG. 23A, to extend the single substrate holder 2300 into substrate processing station 2333B, the substrate holder 1900 (or one or more of substrate holders 2100A, 2100B) (e.g., the side-by-side substrate holding stations) are rotated (FIG. 29, Block 2960) to provide clearance between the substrate holder 1900 (or one or more of substrate holders 2100A, 2100B) and the interior side wall 125W of the transfer chamber 125 to effect extension of the substrate holder 2300 into substrate holding station 2333B. With the substrate holder 1900 (or one or more of the substrate holders 2100A, 2100B) rotated to provide the above-noted clearance a substrate is picked or placed from or to the substrate processing station 2333B with the single substrate holder 2300. (FIG. 29, Block 2970).

Figure 28:
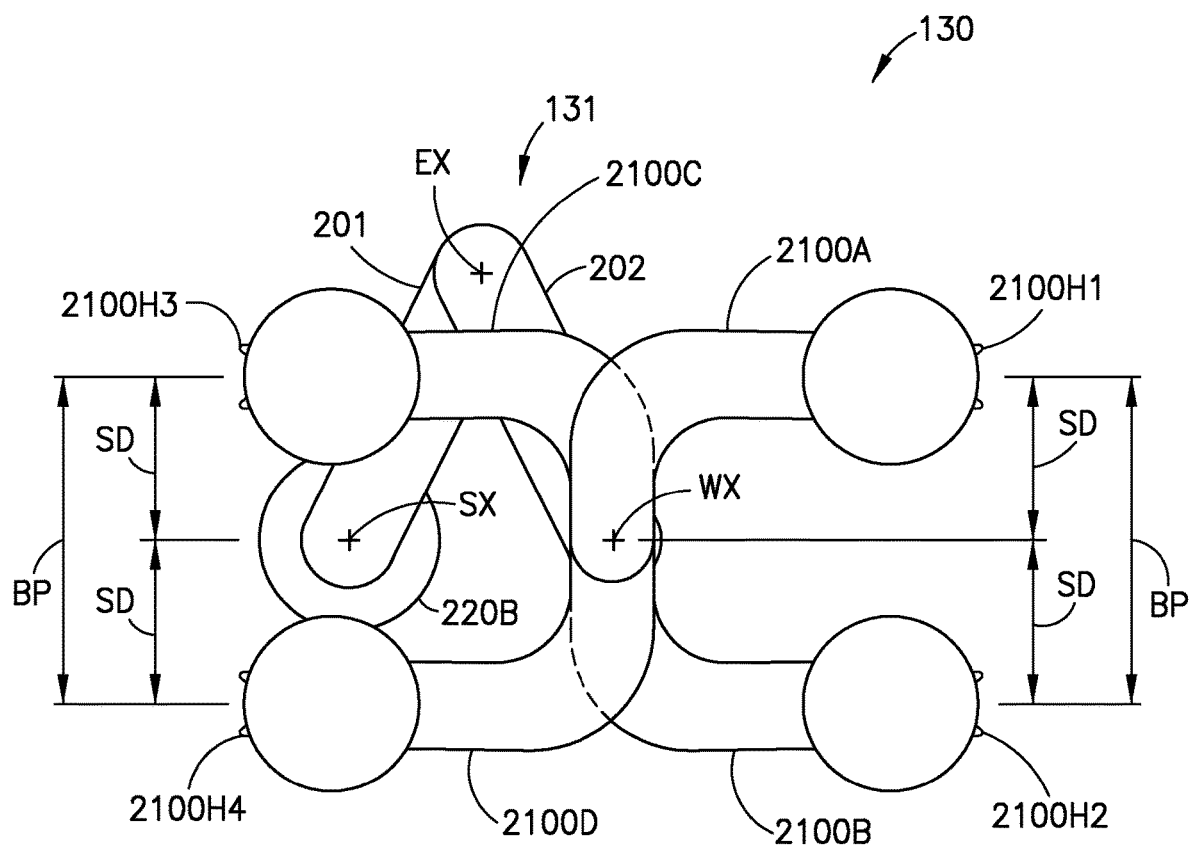
FIG. 28 is a schematic illustration of a substrate transport apparatus of the substrate processing apparatus of FIG. 1 in accordance with aspects of the present disclosure.

Referring to FIG. 28, the substrate transport apparatus 130 is substantially similar to that described above with respect to FIG. 21; however, in this aspect the substrate transport apparatus 130 includes two opposing single sided substrate holders 2100C and 2100D rotatably coupled to the arm 131 about the wrist axis WX in an opposing relationship with respect to substrate holders 2100A, 2100B. The substrate holders 2100C, 2100D are substantially similar to substrate holders 2100A, 2100B and include respective substrate holding stations 2100H3, 2100H4. Here the arm 131 and substrate holders 2100A, 2100B, 2100C, 2100D are driven in rotation and/or extension (along a non-radial linear path and/or a radial linear path) by, for example, the six axis drive section 220B (FIG. 3B) where one drive axis rotates upper arm 201 about the shoulder axis SX, one drive axis rotates the forearm 201 about the elbow axis EX, one drive axis rotates the substrate holder 2100A about the wrist axis WX, one drive axis rotates the substrate holder 2100B about wrist axis WX, one drive axis rotates the substrate holder 2100C about wrist axis WX, and one drive axis rotates the substrate holder 2100D about wrist axis WX. Each of the upper arm 201, forearm 202, and substrate holders 2100A, 2100B, 2100C, 2100D may be coupled to the six axis drive section 220B (FIG. 3B) by any suitable transmissions such as by band and pulley transmissions substantially similar to those described above with respect to FIG. 4. In this aspect, substrate holder 2100A includes substrate holding station 2100H1, substrate holder 2100B includes substrate holding station 2100H2, substrate holder 2100C includes substrate holder 2100H3, and substrate holder 2100D includes substrate holder 2100H4. In a manner similar to that described above, the substrate holding stations 2100H1, 2100H2, 2100H3, 2100H4 are disposed on a common plane (substantially similar to plane 499 as described above with respect to FIGS. 2D, 10, and 11); while in other aspects, one o more of the substrate holding stations may be moveable in the Z-direction by a wrist Z-drive in a manner similar to that described above.

The substrate holders 2100A, 2100B, 2100C, 2100D may be extended by the transport arm 131 and drive section 220B along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2100A, 2100B and/or substrate holders 2100C, 2100D about the wrist axis WX provides for automatic wafer centering by varying the base pitch BP (e.g., the distance between the side-by-side substrate holding stations 2100H1, 2100H2 or 2100H3, 2100H4 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). In one aspect, the arm 131 and/or end effectors 2403, 2404 may also be driven in rotation to fast swap substrates (in a manner substantially similar to that described herein) in a manner similar to that described above with respect to FIGS. 7A-7L.

Referring to FIGS. 19, 20, 22, and 23, in one aspect, more than one juxtaposed (e.g., side-by-side) substrate holding station are dependent from a common end effector link (e.g., substrate holder) that is a substantially rigid unarticulated link between the more than one juxtaposed substrate holding station.

Referring to FIGS. 2A-2D, 8-9, 20, 21, 23, 24, 25, 26A-26D, 27A-27C, and 28, at least one end effector link (e.g., substrate holder) comprises more than one end effector link (e.g. substrate holder) joined to the distal end 202E2 of the forearm 202 to rotate relative to the forearm 202 about the common axis of rotation (e.g., wrist axis WX), and each of the more than one end effector link (e.g., substrate holder) has at least one corresponding substrate holding station, of more than one juxtaposed (e.g., side-by-side) substrate holding station, dependent therefrom.

Referring to FIGS. 2A-2D, 8, 9, 21, 24, 25, 26A-26D, 27A-27C, and 28, at least one end effector link (e.g., substrate holder) comprises more than one end effector link joined to the distal end 202E2 of the forearm 202 to rotate relative to the forearm 202 about the common axis of rotation (e.g., wrist axis WX), wherein the drive section 220, 220A, 220B, 220C is configured so that each of the more than one end effector link respectively rotates independent of another of the more than one end effector link about the common axis of rotation, and each respective one of the more than one end effector link has at least one corresponding substrate holding station, of the more than one juxtaposed (e.g., side-by-side) substrate holding station, dependent therefrom.

Referring to FIGS. 23, 23A, 25, and 27A-27C, in one aspect, the multi-link arm 131 has at least one substrate holder (e.g., end effector link) 1900, 2100A, 2100B, 2300 rotatably joined to a joint (e.g., the wrist joint/axis WX) at an end of the forearm 202 so that the at least one substrate holder 1900, 2100A, 2100B, 2300 rotates relative to the forearm 202 about a common axis of rotation at the wrist joint/axis WX. The at least one substrate holder 1900, 2100A, 2100B, 2300 has more than one substrate holding station 1900H1, 1900H2, 2100H1, 2100H2, 2300H1 dependent therefrom and disposed on a common plane (e.g., plane 499—see e.g., FIGS. 2D and 4) with respect to each other and configured so that rotation of the at least one substrate holder 1900, 2100A, 2100B, 2300 about the wrist axis WX of rotation rotates each of the more than one substrate holding station 1900H1, 1900H2, 2100H1, 2100H2, 2300H1 about the wrist axis WX. Here, the drive section 220, 220C is configured to at least extend and retract the multi-link arm 131 along a radial or non-radial linear path, relative to the shoulder axis SX (fixed location), so at least two juxtaposed substrate holding stations 1900H1, 1900H2 or 2100H1, 2100H2, of the more than one substrate holding station, each traverse linearly along the radial or non-radial path, with extension and retraction of the arm 131, and pass substantially simultaneously through separate corresponding openings (see. e.g., FIGS. 1B and 1C) of the more than one juxtaposed substrate transport openings on the common level, and so at least another of the more than one substrate holding station 2300H1, different from each of the two juxtaposed substrate holding stations 1900H1, 1900H2 or 2100H1, 2100H2, is rotatable about the wrist axis WX independent of the at least two juxtaposed substrate holding stations 1900H1, 1900H2 or 2100H1, 2100H2.

Still referring to FIGS. 23, 23A, 25, and 27A-27C, the at least two juxtaposed substrate holding stations 1900H1, 1900H2 or 2100H1, 2100H2 and the at least another substrate holding station 2300H1 are disposed on the at least one substrate holder 1900, 2100A, 2100B, 2300 so that the at least two juxtaposed substrate holding stations 1900H1, 1900H2 or 2100H1, 2100H2 and the at least another substrate holding station 2300H1 are arranged on opposite sides of the wrist axis WX. In one aspect, as can be seen in FIG. 23A, the at least two juxtaposed substrate holding stations 1900H1, 1900H2 or 2100H1, 2100H2 and the at least another substrate holding station 2300H1 are disposed on the at least one substrate holder 1900, 2100A, 2100B, 2300 to rotate about the wrist axis WX, with extension and retraction of the arm 131 along the radial or non-radial path, to selectably conform a position of the at least one substrate holder to another side wall 125W of the transport chamber 125 different than the side wall 125W on which openings of the of the transport chamber are located and which the at least one of the more than one substrate holding stations 1900H1, 1900H2, 2100H1, 2100H2, 2300H1 of the at least one substrate holder 1900, 2100A, 2100B, 2300 pass through with extension and retraction of the arm.

Referring to FIG. 23, the at least two juxtaposed substrate holding stations 1900H1, 1900H2 are disposed on the at least one substrate holder 1900 operably connected to the drive section 220 and arranged so that the at least one substrate holder 1900 rotates the at least two juxtaposed substrate holding stations 1900H1, 1900H2 about the wrist axis WX of rotation with a common independent degree of freedom.

Referring to FIGS. 25 and 27A-27C, the at least two juxtaposed substrate holding stations 2100H1, 2100H2 are disposed on the at least one substrate holder 2100A, 2100B operably connected to the drive section 220C and arranged so that the at least one substrate holder 2100A, 2100B rotates each of the at least two juxtaposed substrate holding stations 2100H1, 2100H2 about the wrist axis WX of rotation with a different respective independent degree of freedom so that each of the at least two juxtaposed substrate holding stations 2100H1, 2100H2 is independently rotated with respect to each other about the wrist axis WX of rotation.

Referring to FIGS. 26A-26D and 27A-27C, in one aspect, the multi-link arm 131 has at least one substrate holder 2403, 2404 or 2100A, 2100B rotatably joined to a joint (e.g., wrist axis WX) at an end of the forearm 202 so that the at least one substrate holder 2403, 2404 or 2100A, 2100B rotates relative to the forearm 202 about a common axis of rotation at the wrist axis WX, the at least one substrate holder 2403, 2404 or 2100A, 2100B has more than one substrate holding station 3403H1, 3403H2, 3404H1, 2404H2, 2100H1, 2100H2 dependent therefrom juxtaposed along different planes 499, 499A (FIGS. 26D, 27C), offset in height with respect to each other, and configured so that rotation of the at least one substrate holder 2403, 2404 or 2100A, 2100B about the wrist axis WX of rotation rotates each of the more than one substrate holding station 3403H1, 3403H2, 3404H1, 2404H2, 2100H1, 2100H2 about the wrist axis WX of rotation. The drive section 220, 220C is configured to at least extend and retract the multi-link arm 131 along a radial or non-radial linear path, relative to the shoulder axis SX (e.g., fixed location), so at least two juxtaposed substrate holding stations 2403H1, 2404H1 or 2403H2, 2404H2 or 2100H1, 2100H2 of the more than one substrate holding station 3403H1, 3403H2, 3404H1, 2404H2, 2100H1, 2100H2, each traverse linearly along the radial or non-radial path, with extension and retraction of the arm, and are each rotatable about the wrist axis WX of rotation independent of each other so as to pass separately through a respective (or in other aspects a common) opening (see FIGS. 1B and 1C) of the more than one juxtaposed substrate transport openings on the common level 499, and at least another of the more than one substrate holding station 2403H1, 2404H1 or 2403H2, 2404H2 or 2300H1, different from each of the two juxtaposed substrate holding stations 2403H1, 2404H1 or 2403H2, 2404H2 or 2100H1, 2100H2, is disposed on the at least one substrate holder 2403, 2404, 2300 substantially opposite each of the at least two juxtaposed substrate holding stations 2403H1, 2404H1 or 2403H2, 2404H2 or 2100H1, 2100H2. Here, the drive section 220, 220C includes a wrist Z-drive 2660 that is configured to move the more than one substrate holding station of the at least one end effector link in height with respect to each other so as to place the more than one substrate holding station on the common level juxtaposed to one another.

Figure 15:
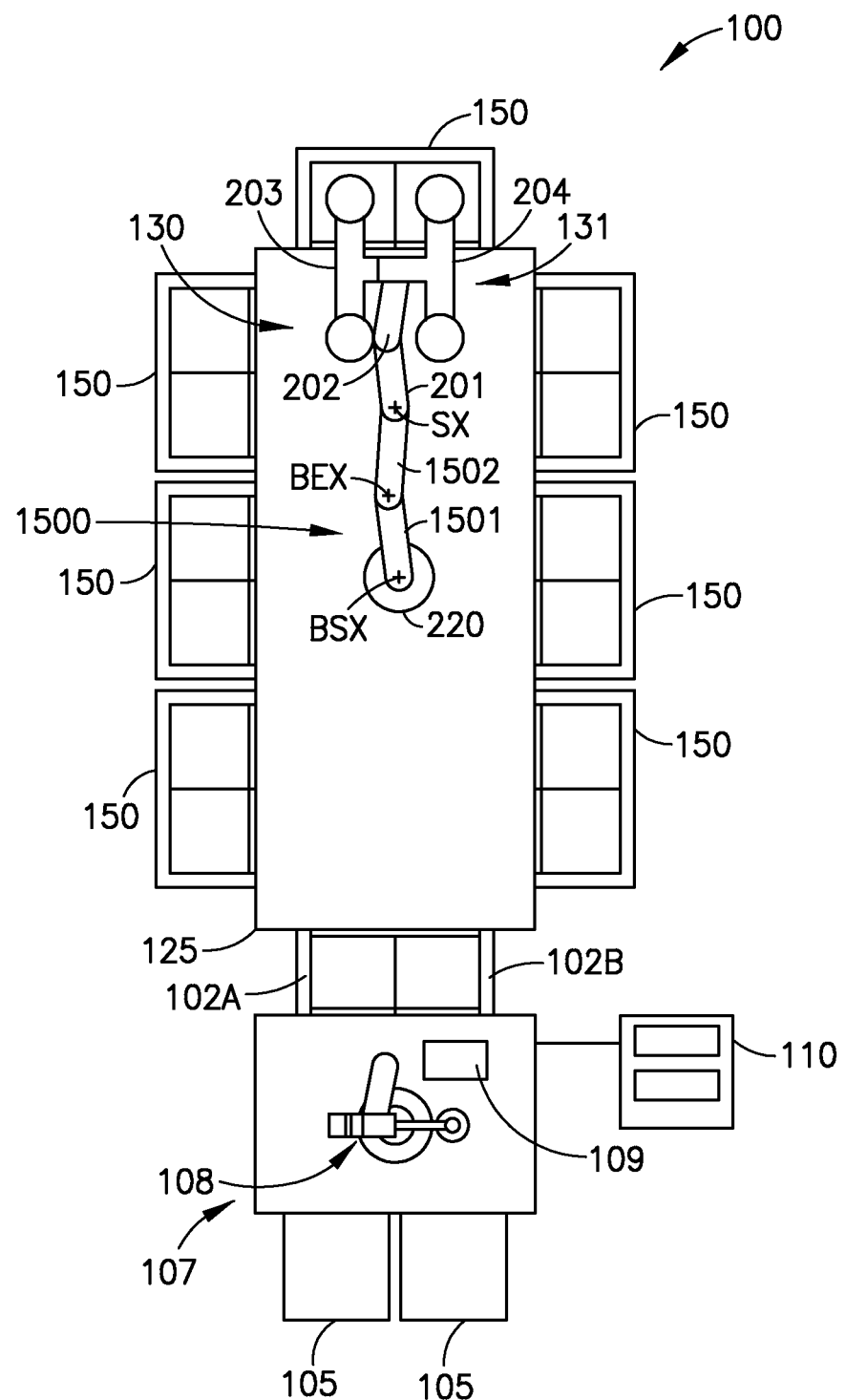
FIG. 15 is a schematic illustration of a substrate processing apparatus incorporating a substrate transport apparatus in accordance with aspects of the present disclosure.
Figure 16:
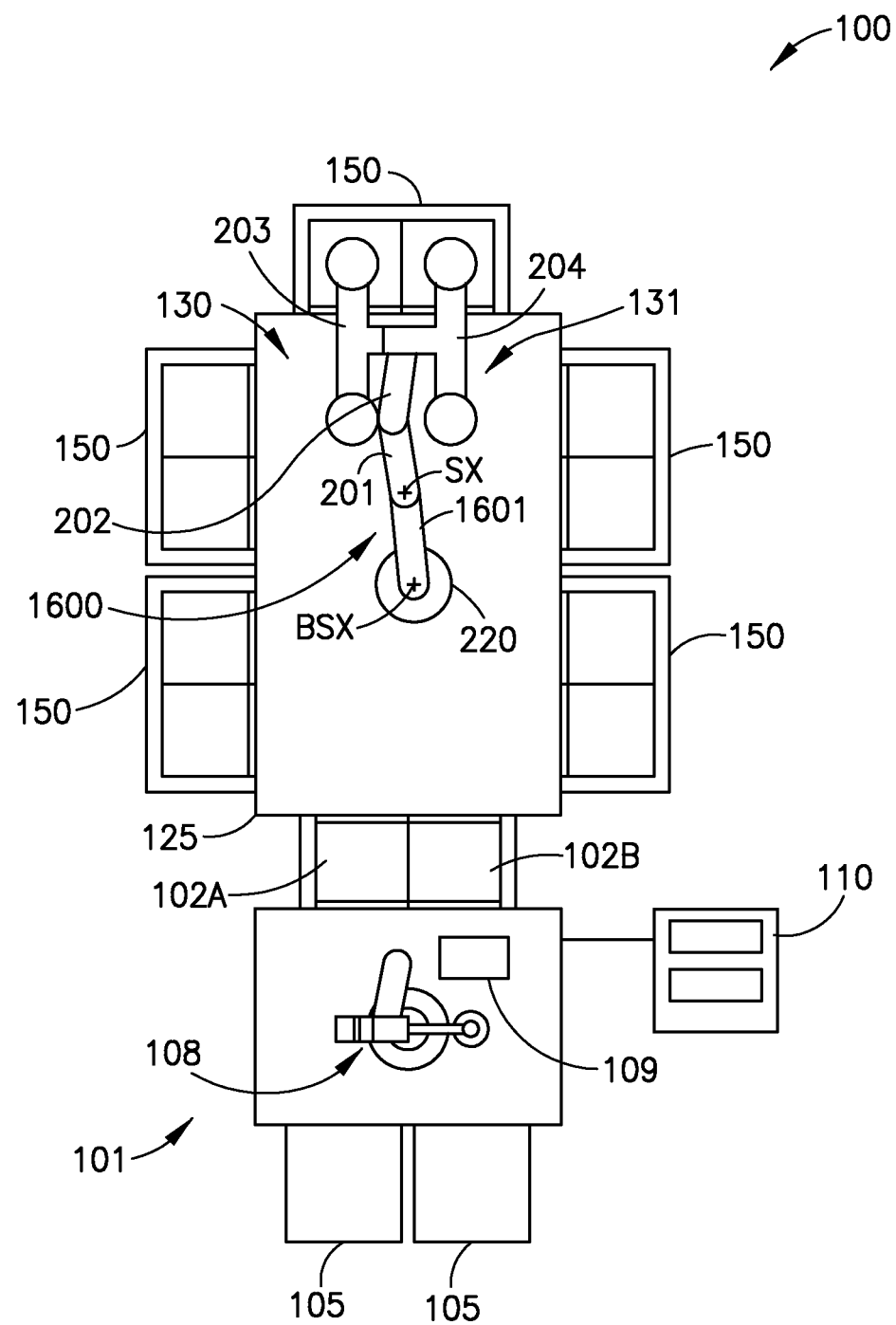
FIG. 16 is a schematic illustration of a substrate processing apparatus incorporating a substrate transport apparatus in accordance with aspects of the present disclosure.

As described above, the substrate transport apparatus 130 (with any suitable end effector(s) such as those described herein) may be mounted on a boom arm. For exemplary purposes, FIG. 15 illustrates the arm 131 mounted to a two link boom arm 1500. The two link boom arm 1500 includes an upper link 1501 and a forearm link 1502. A first end of the upper link 1501 is rotatably coupled to a drive section (such as drive section 220 described herein) about a boom shoulder axis BSX. A first end of the forearm link 1502 is rotatably coupled to a second end of the upper link 1501 about a boom elbow axis BEX. The arm 131 is rotatably coupled to a second end of the forearm link 1502 about arm shoulder axis SX. Each of the upper link 1501 and the forearm link 1502 are substantially rigid and unarticulated between the respective ends. In another aspect, FIG. 16 illustrates the arm 131 mounted to a single link boom arm 1600. The single link boom arm 1600 includes boom link 1601. A first end of the boom link 1601 is rotatably coupled to a drive section (such as drive section 220 described herein) about a boom shoulder axis BSX. The arm 131 is rotatably coupled to a second end of the boom link 1601 about arm shoulder axis SX. The boom link 1601 is substantially rigid and unarticulated between the two ends of the boom link 1601. While a single link boom arm 1600 and a two link boom arm 1500 are illustrated it should be understood that the boom arm may have any suitable number of links.

Referring also to FIG. 3, for rotating the boom arm 1500, 1600, the drive section 220, 220A, 220B, 220C may include at least one boom arm drive axis (or motor) 390, 391. For example, a single boom arm drive axis 390 may be provided where, for example, the single link boom arm 1600 is employed. A single boom arm drive axis 390 may also be provided where rotation of the forearm link 1502 of the two link boom arm 1500 about the boom elbow axis BEX is slaved to, for example the housing 310. In other aspects, two boom arm drive axes 390, 391 may be provided where the upper link 1501 and forearm link 1502 of the two link boom arm 1500 are independently rotated about the respective boom shoulder axis BSX and the boom elbow axis BEX. The boom arm drive axis 390, 391 may be coaxially arranged with the motors 342, 344, 346, 348; while in other aspects, the boom arm drive axis 390, 391 may have any suitable configuration such as a side-by-side motor configuration; while in still other aspects, the boom arm drive axis 390, 391 may be arranged at the boom arm shoulder axis BEX while the drive motors 342, 344, 346, 348 are arranged at the shoulder axis SX of the arm 131. Any suitable transmissions (e.g., which in one aspects are substantially similar to the band and pulley transmissions shown in FIGS. 4-6B) are provided to couple the link(s) of the boom arm 1500, 1600 to the drive axis/axes 390, 391.

Referring to FIGS. 18A and 18B, the automatic wafer centering provided by the aspects of the present disclosure may provide for substantially simultaneous placement (or pick) of dual substrates S regardless of a relative eccentricity between each of the dual substrates S and a respective substrate holding station(s) 203H1, 203H2, 204H1, 204H2. For example, with the substrate holding stations 203H1, 204H1 at the base pitch BP automatic wafer centering may determine that an eccentricity EC2 of substrate S1 is closer to the shoulder axis SX than a center 203H1C of the substrate holding station 203H1, and an eccentricity EC1 of substrate S2 is to, e.g., the right (noting the direction term "right" is used here for convenience of explanation only) of a center 204H1C of the substrate holding station 204H1. Accordingly, to place the substrates S1, S2 at, for example, substrate processing stations 190, 191 the position of each the substrate S1, S2 is not only independently adjusted, via automatic wafer centering, with respect to the distance D between substrate processing stations 190, 191 but also independently in the direction of extension/retraction 17700 to accommodate both eccentricities EC1, EC2. For example, the substrate holders 203, 204 are each independently rotated about the wrist axis WX (where the wrist axis positioned along an axis of radial extension 700 (see FIG. 7B) or a non-radial path 701 of extension (see FIG. 7F)) to effect independent automatic wafer centering of the substrates S1, S2 at the respective substrate processing stations 190, 191. Similarly, referring to FIG. 18C, automatic wafer centering may also effect placement of the substrates at substrate processing stations 190, 191 having different radial distances 17020, 17021 from, for example, the shoulder axis SX of the substrate transport apparatus 130, where independent rotation of each substrate holding station 203H1, 203H2, 204H1, 204H2 about the wrist axis and/or placement of the wrist axis effects an increased extension distance (relative to the shoulder axis) of one of the side-by-side substrate holding stations 203H1-204H1, 203H2, 204H2 relative to another of the side-by-side substrate holding stations 203H1-204H1, 203H2, 204H2.

Referring to FIGS. 2A-2D, 7A-7L, and 15, an exemplary method of transporting substrates with the substrate transport apparatus 130 will be described. In the example described, the substrate processing apparatus 100 includes a transfer chamber 125A that has six sides but is otherwise substantially similar to that described above with respect to FIG. 1; however in other aspects the transfer chamber may have any suitable number of sides where side-by-side substrate station modules are coupled to respective sides of the transfer chamber in a manner similar to that illustrated in FIGS. 1A, 7A, 8, 12, 15, and 16. Further, in the example described the arm 131 includes dual substrate holders 203, 204, each of which has substrate holding stations 203H1, 203H2, 204H1, 204H2 at opposite ends of the respective substrate holders 203, 204; however, it should be understood that the method described herein is equally applicable to arm 131 and aspects of the present disclosure illustrated in and described with respect to FIGS. 8-16.

As will be described below, the controller 110 is operably coupled to the drive section 220 and configured to extend the arm 131 for substantially simultaneously picking or placing dual first substrates (see, e.g., substrates S1, S2) with the corresponding at least one substrate holding stations (e.g., substrate holding stations 203H1, 204H1 or 203H2, 204H2) of the dual substrate holders 203, 204 through the respective separate openings (see slot valves SV) in the transport chamber wall 125W. As will also be described below, the controller 110 is configured to substantially simultaneously fast swap the dual first substrates with at least one second substrate (see, e.g., substrates S3, S4) held on the corresponding at least one substrate holding stations (e.g., substrate holding stations 203H1, 204H1 or 203H2, 204H2) of the dual substrate holders 203, 204, through the respective separate openings in the transfer chamber wall 125W, with the dual first substrates S1, S2 held simultaneously on the corresponding at least one substrate holding stations (e.g., substrate holding stations 203H1, 204H1 or 203H2, 204H2) of the dual substrate holders 203, 204. In some aspects, the drive section, under control of controller 110, is configured to independently align at least one of the corresponding substrate holding station 203H1, 203H2, 204H1, 204H2 relative to another of the substrate holder(s).

Figure 17:
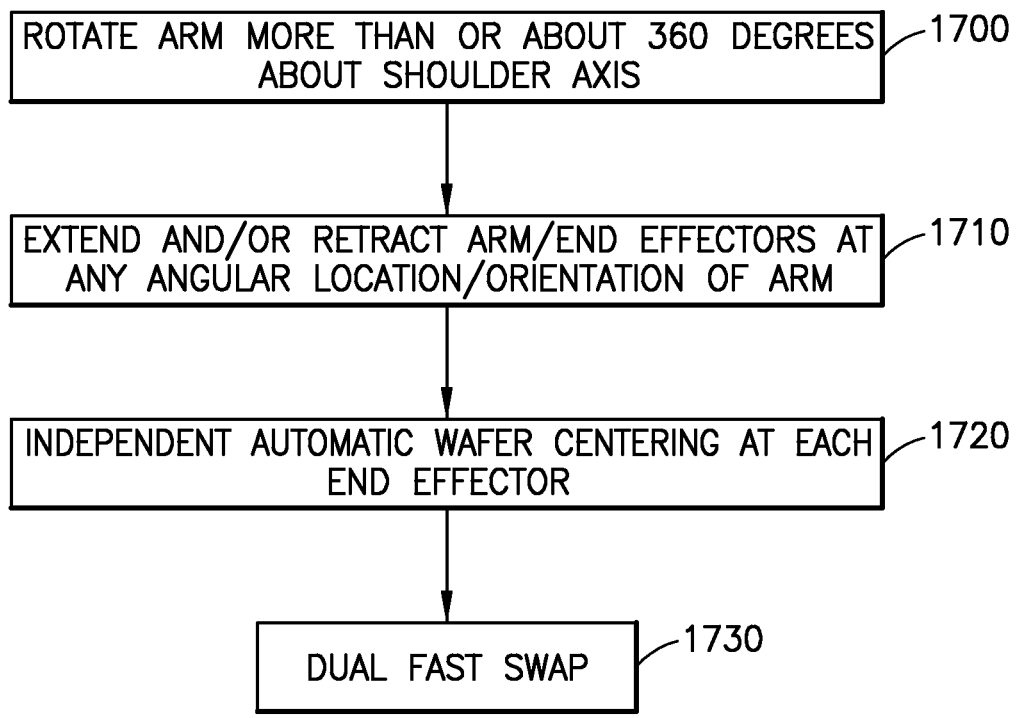
FIG. 17 is a flow diagram of an exemplary method in accordance with aspects of the present disclosure.

In accordance with aspects of the present disclosure, the dual link SCARA with at least one end effector (and/or the other arm configurations as described herein) fulfills greater than or about a 360° SCARA arm rotation θ about the shoulder axis SX (see, e.g., FIGS. 1A and 7A) (FIG. 17, Block 1700) with extension and retraction of the arm 131 and end effectors 203, 204 thereon (i.e., at/from any angular θ location/orientation of the dual SCARA arm) throughout the interior space of the transfer chamber (FIG. 17, Block 1710). The dual link SCARA with the at least one end effector, as described herein (and/or the other arm configurations as described herein) provides for independent automatic wafer centering at each end effector common with extension of the arm 131 and end effector 203, 204 (FIG. 17, Block 1720) as described below. As also described herein, the dual link SCARA with the at least one end effector provides for dual "fast swap" without Z axis movement (as described herein with the substrate holding stations 203H1, 203H2, 204H1, 204H2 of the end effectors 203, 204, in one aspect, on the common plane 499 (see, e.g., FIGS. 2D and 11), and in other aspects, with the substrate holding stations 203H1, 203H2, 204H1, 204H2 of the end effectors 203, 204 on different planes 499, 499A (see, e.g., FIG. 10)) (FIG. 7, Block 1730), where the end effectors 203, 204 have side-by-side substrate holding stations and at least one of the end effectors 203, 204 is a double sided end effector (e.g., has at least one substrate holding station located at opposite longitudinally spaced ends of the end effector).

Figure 14:
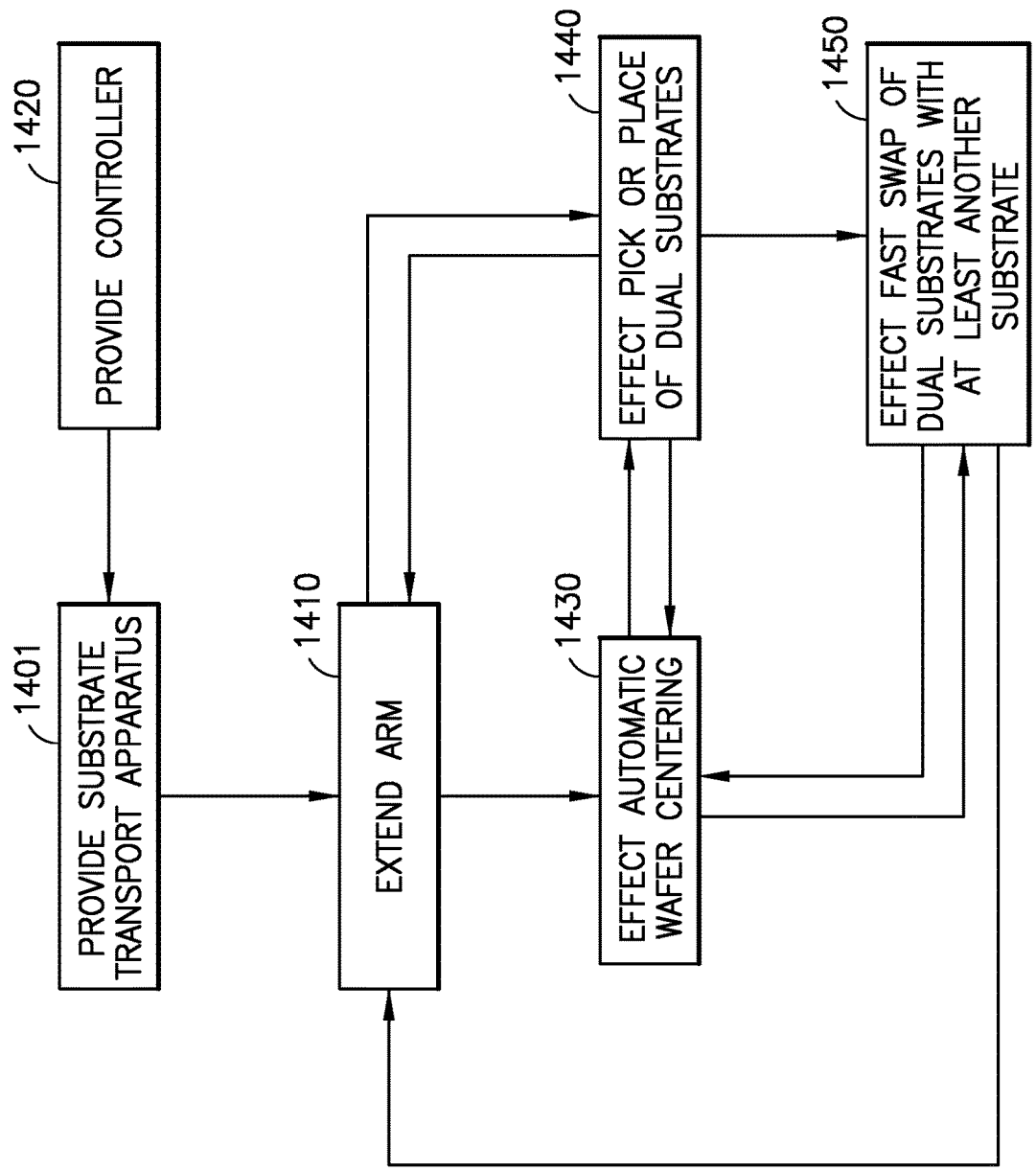
FIG. 14 is a flow diagram of an exemplary method in accordance with aspects of the present disclosure.

In the exemplary method, the substrate transport apparatus 130 described herein is provided (FIG. 14, Block 1401). The controller 110 may also be provided (FIG. 14, Block 1420) and connected to the substrate transport apparatus 130. The controller is configured to extend the at least one arm 131 of the substrate transport apparatus 130 so that the substrate holders 203, 204 (and in the case of FIG. 13, substrate holder 205) extend through a side wall 125W of the transport chamber 125, 125A. For example, FIG. 7A illustrates the arm 131 of the substrate transport 130 in a home or retracted configuration relative to the shoulder axis SX. In this example the retracted configuration is where the arm links 201, 202 are located one above the other and substantially aligned with each other; while in other aspects the retracted configuration is where the wrist axis WX is disposed substantially above the shoulder axis SX, such as when the upper link 201 and forearm link 202 have substantially the same length from joint center to joint center. The controller 110 is configured to effect motion of the drive section 220 to effect independent automatic wafer centering of each substrate where the base pitch BP of the substrate holding stations 203H2, 204H2 is increased (FIG. 2B) or decreased (FIG. 2C) to effect the automatic wafer centering (in this case centering of the substrates S3, S4 on the respective substrate holding stations 203H2, 204H2) so that the distance between substrate holding stations 203H2, 204H2 substantially matches the pitch between substrate processing stations 196, 197. As noted above, the automatic wafer centering may be effect along more than one axis (e.g., along an axis corresponding to the spacing between the substrate processing stations and along an axis corresponding to an extension direction of the substrate holders). The controller 110 is further configured to effect motion of the drive section 220 so that the wrist axis WX moves, in one aspect, in radial direction 700 and the substrate holding stations 203H2, 204H2 extend, through openings in the wall 125W of the transport chamber 125A, into load locks 102A, 102B (see FIGS. 7B and 7C).

In one aspect, the controller 110 may effect actuation of the Z-axis drive 312 to lift the substrate holding stations 203H2, 204H2 (while in other aspects the Z-motion may be provided at least in part by the substrate processing stations 196, 197) for picking dual substrates S3, S4 substantially simultaneously from substrate processing stations 196, 197 of the load locks 102A, 102B. With the substrates S3, S4 held on the substrate holding stations 203H2, 204H2, the controller 110 effects motion of the drive section 220 to retract the arm 131 to, for example, the retracted configuration so that the substrates S3, S4 are removed from the load locks 102A, 102B (see FIG. 7D). The arm 131 is rotated in direction 777 so as to position the substrate holding stations 203H1, 204H1 adjacent any suitable substrate processing stations (such as processing stations 188, 189) from which another set of dual substrates S1, S2 are to be picked.

Figure 7E:
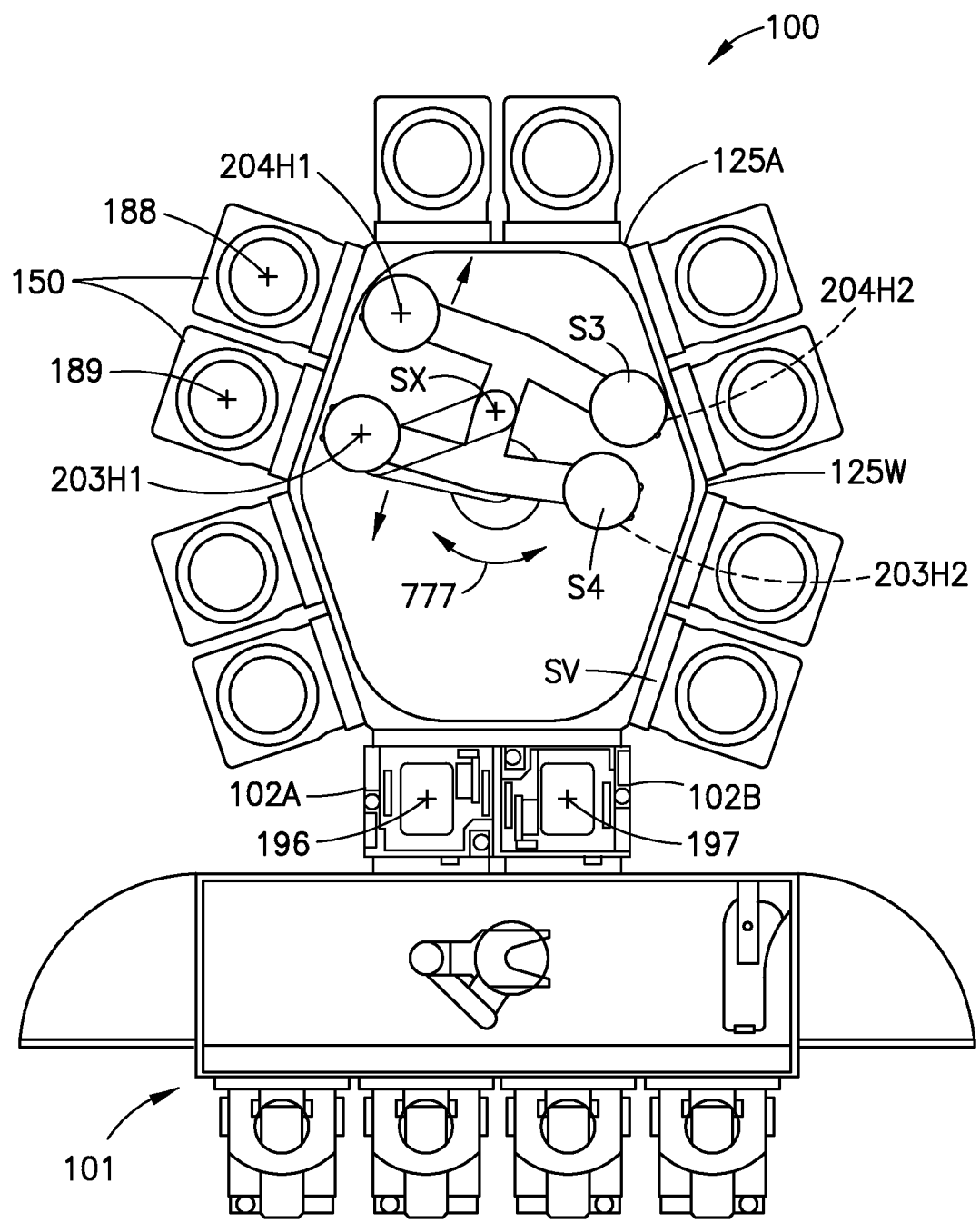
Figure 7F:
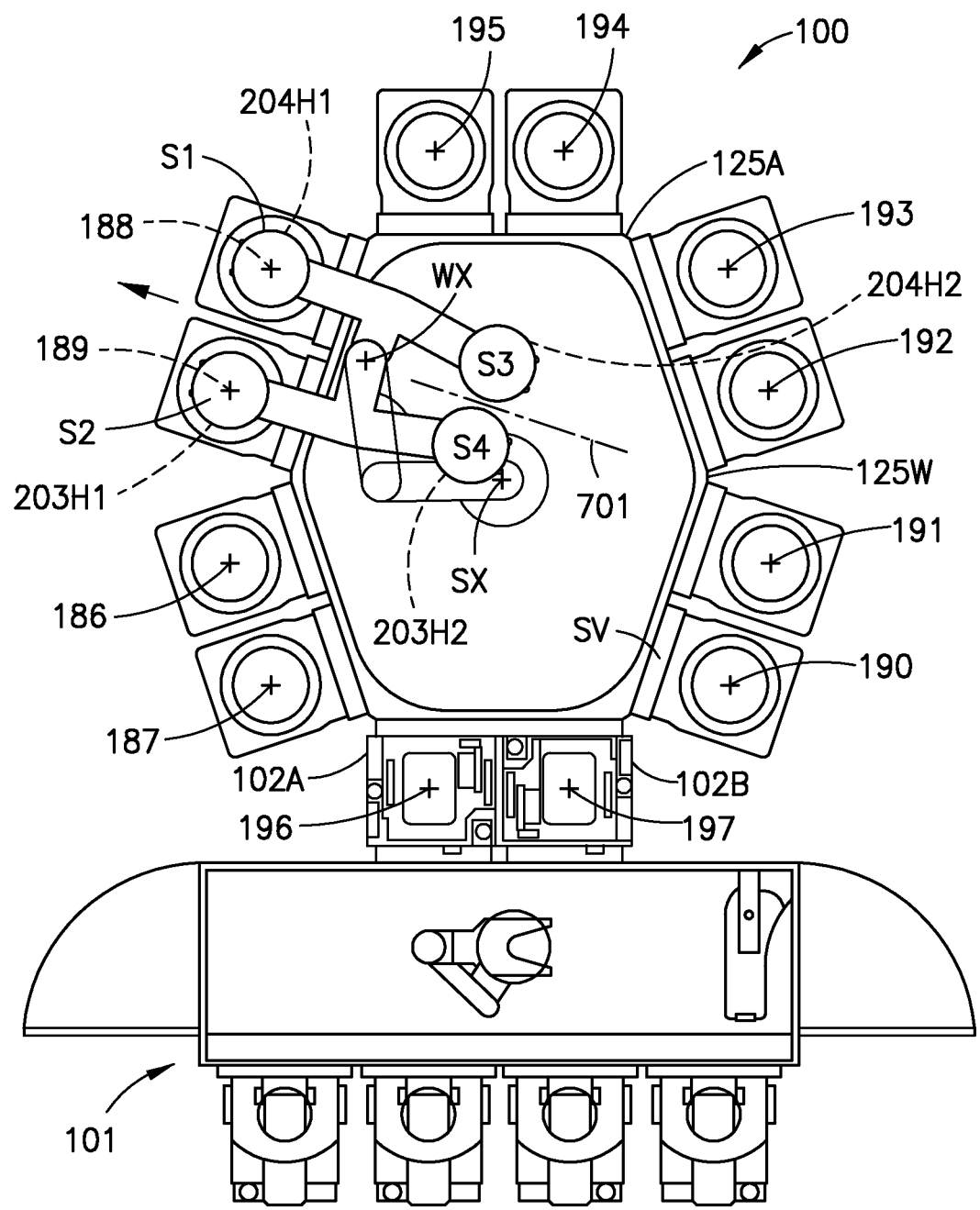
Figure 7G:
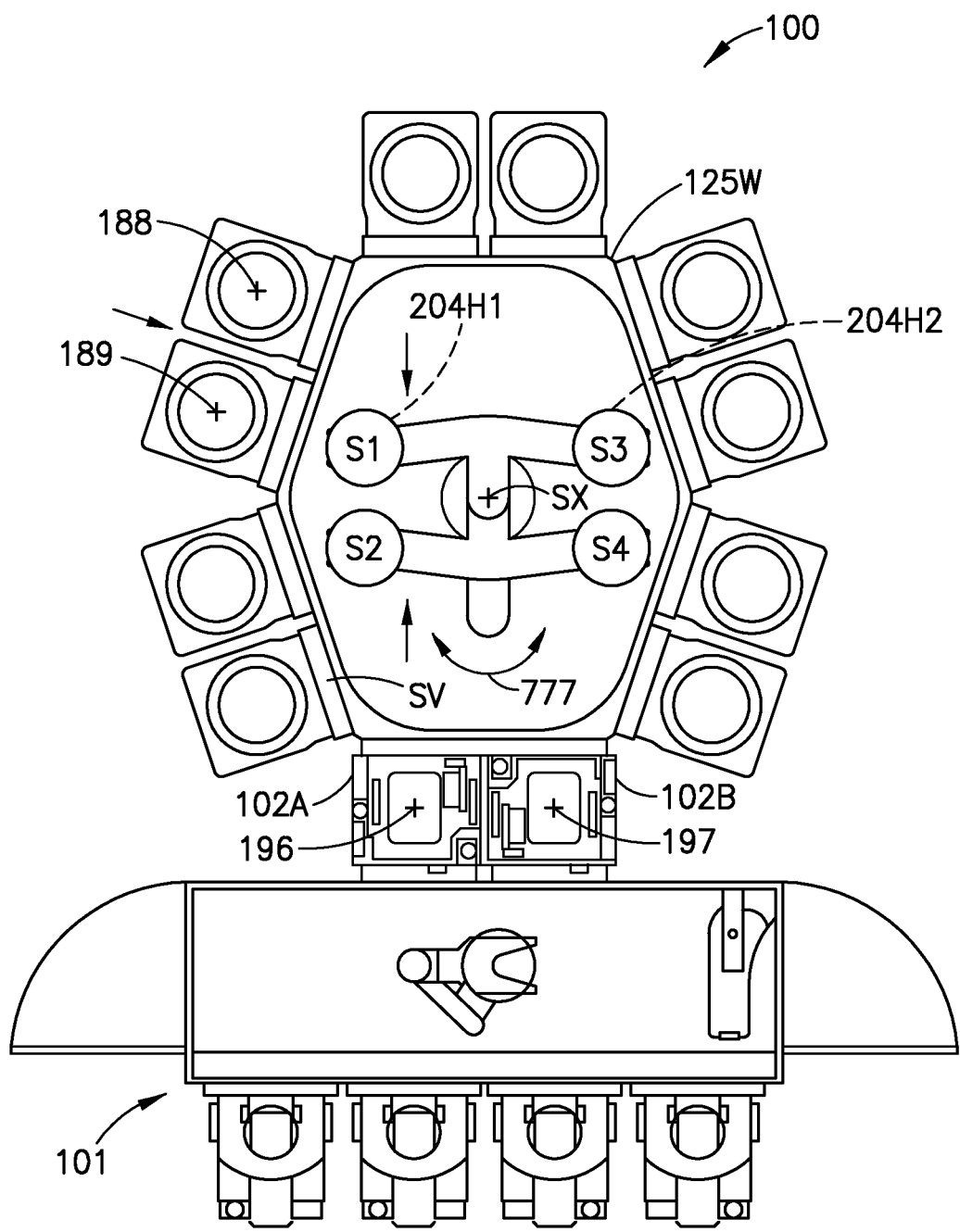
Figure 7H:
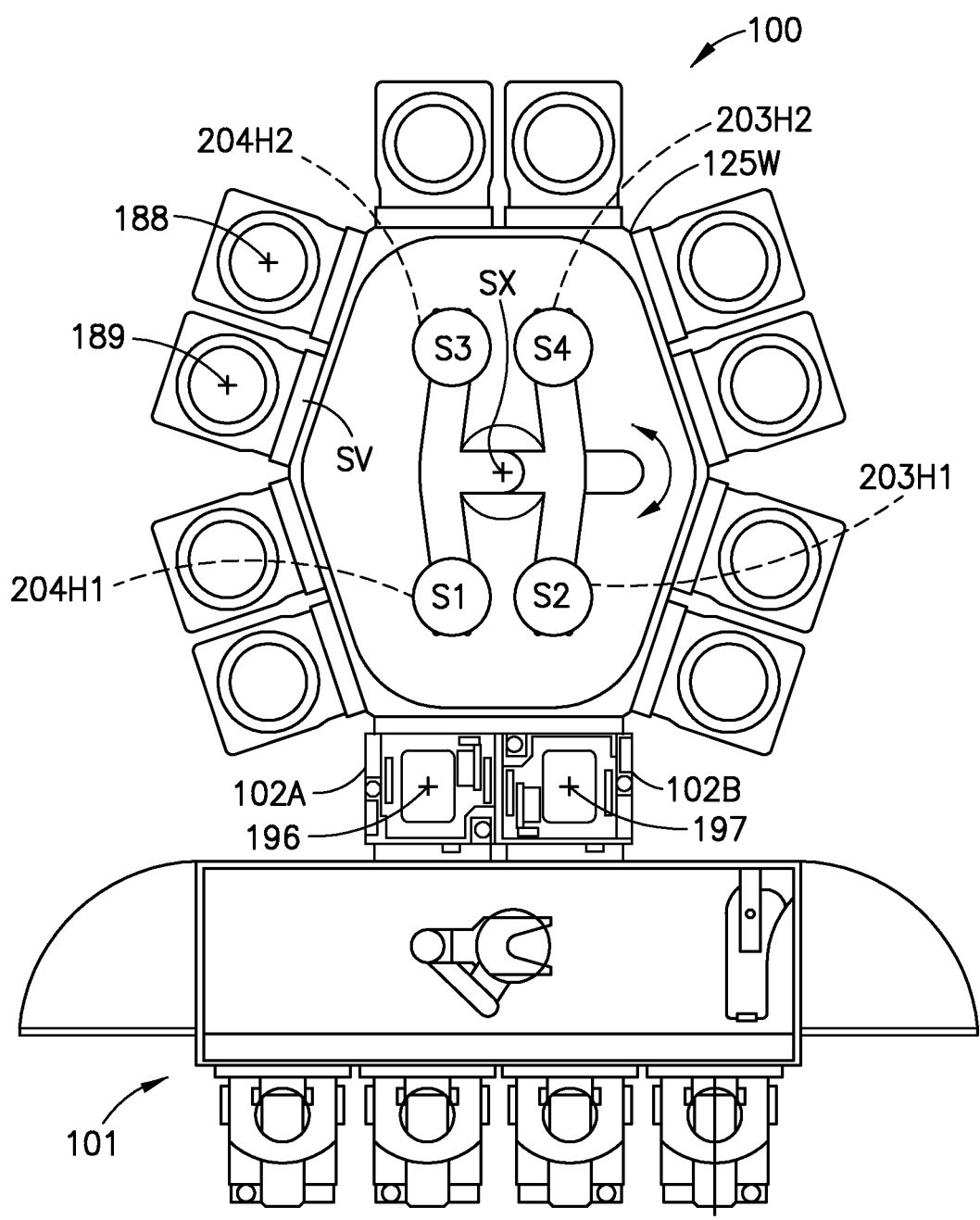
Figure 7I:
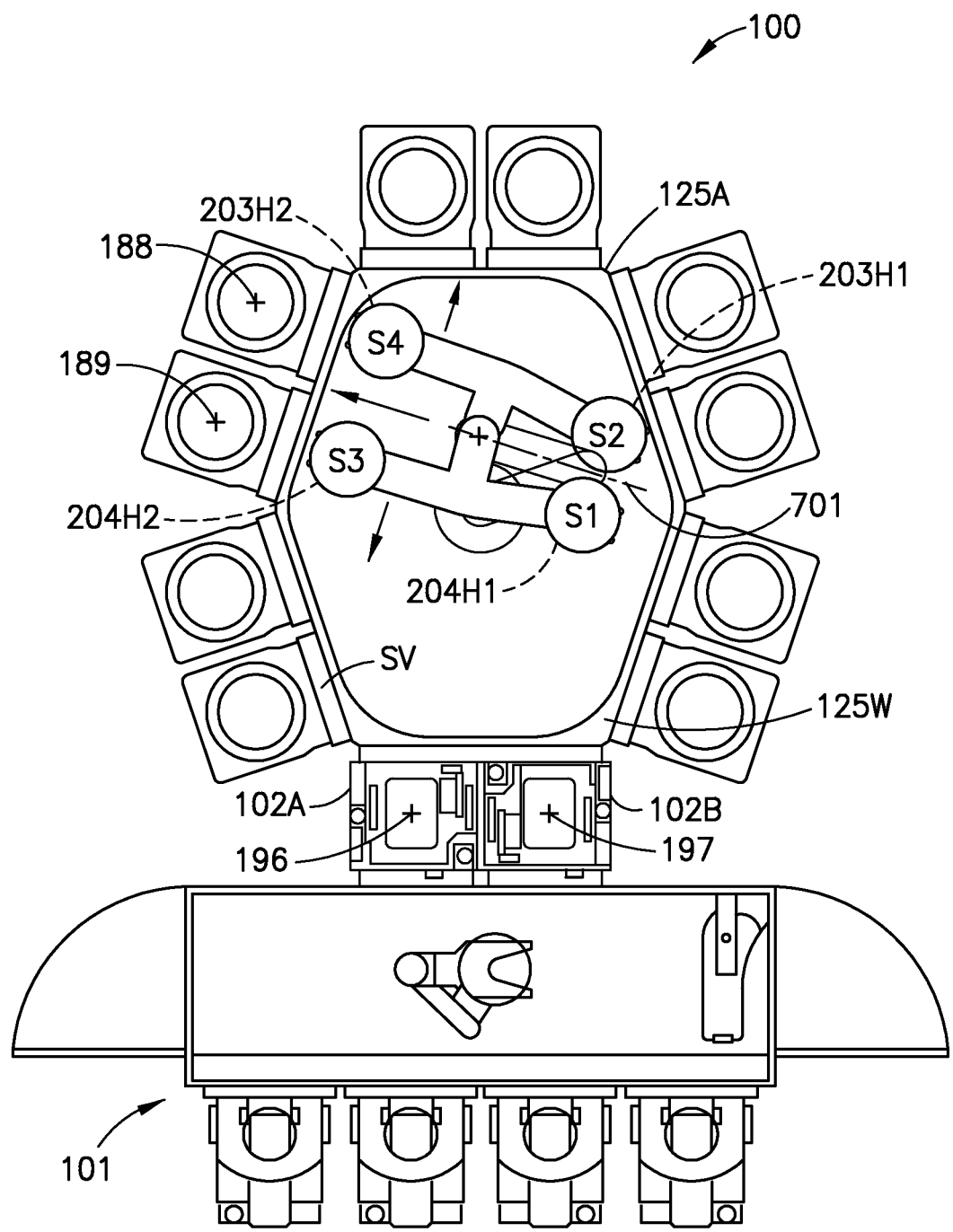

In a manner similar to that described above, the controller 110 is configured to effect motion of the drive section 220 to extend the arm 131 (FIG. 14, Block 1410) and so that the base pitch BP of the substrate holding stations 203H1, 204H1 is increased (FIG. 2B) or decreased (FIG. 2C) to effect automatic wafer centering (FIG. 14, Block 1430—in this case centering of the substrates S1, S2 on the respective substrate holding stations 203H1, 204H1) so that the distance between substrate holding stations 203H1, 204H1 substantially matches the pitch between substrate processing stations 188, 189 (see FIG. 7E). It is noted that automatic wafer centering (e.g., increasing or decreasing of the base pitch BP) may be performed substantially simultaneously with arm extension/retraction or with the arm 131 substantially in the retracted configuration prior to extension of the arm 131. To pick/place substrates from substrate processing stations 188, 189 the controller 110 is configured to effect motion of the drive section 220 so that the wrist axis WX moves in non-radial extension where movement of the wrist WX travels along, in one aspect, the path 701 (FIG. 7F) that is offset and/or angled from the axis of radial extension/retraction (i.e., the path 701 does not pass through or radiate from the shoulder axis SX). Movement of the wrist WX along path 701 extends the substrate holding stations 203H1, 204H1, through openings in the wall 125W of the transport chamber 125A, into substrate processing stations 188, 189. In one aspect, the controller 110 may effect actuation of the Z-axis drive 312 to lift the substrate holding stations 203H1, 204H1 (while in other aspects the Z-motion may be provided at least in part by the substrate processing stations 188, 189) for picking the dual substrates S1, S2 (FIG. 14, Block 1440) substantially simultaneously from substrate processing stations 188, 189 of the side-by-side substrate station modules 150. With the substrates S1, S2 held on the substrate holding stations 203H1, 204H1, the controller 110 effects motion of the drive section 220 to retract the arm 131 to, for example, the retracted configuration so that the substrates S1, S2 are removed from the side-by-side substrate station modules 150 (see FIG. 7G). The base pitch BP of the substrate holding stations 203H1, 204H1 may be restored during (substantially simultaneous with) retraction of the arm 131 from the substrate processing stations 188, 189 or with the arm substantially in the retracted configuration (see FIG. 7G).

Figure 7J:
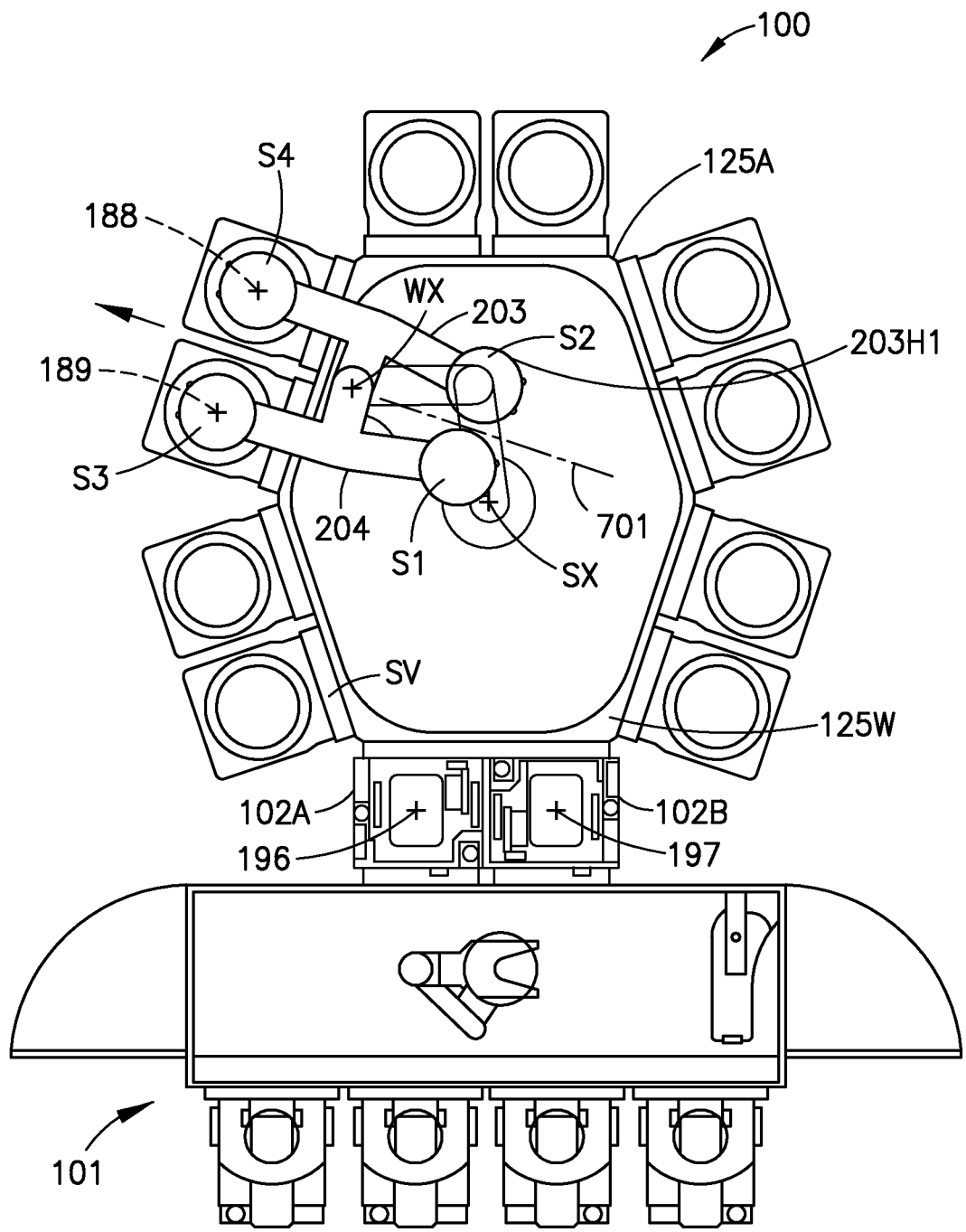
Figure 7K:
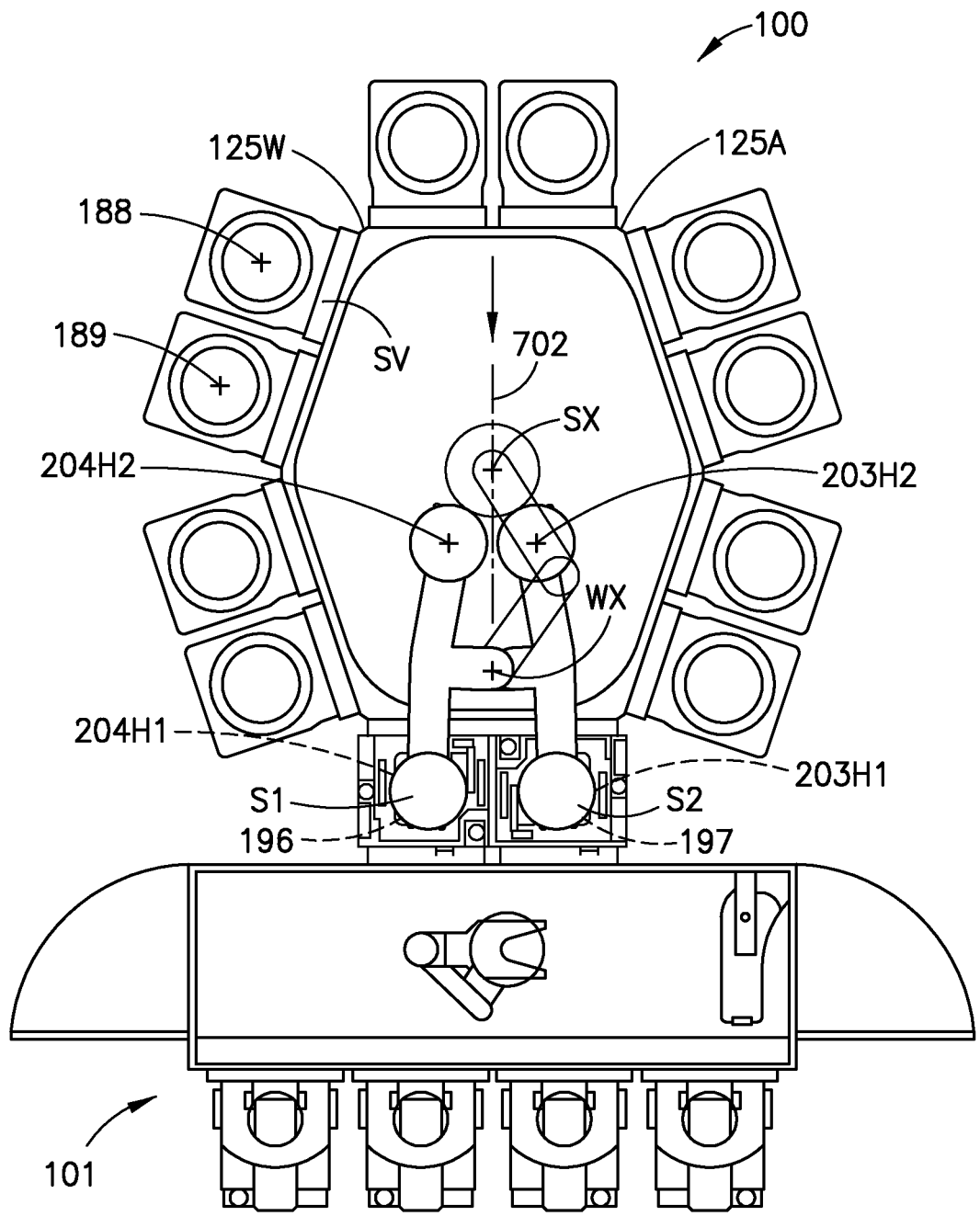
Figure 7L:
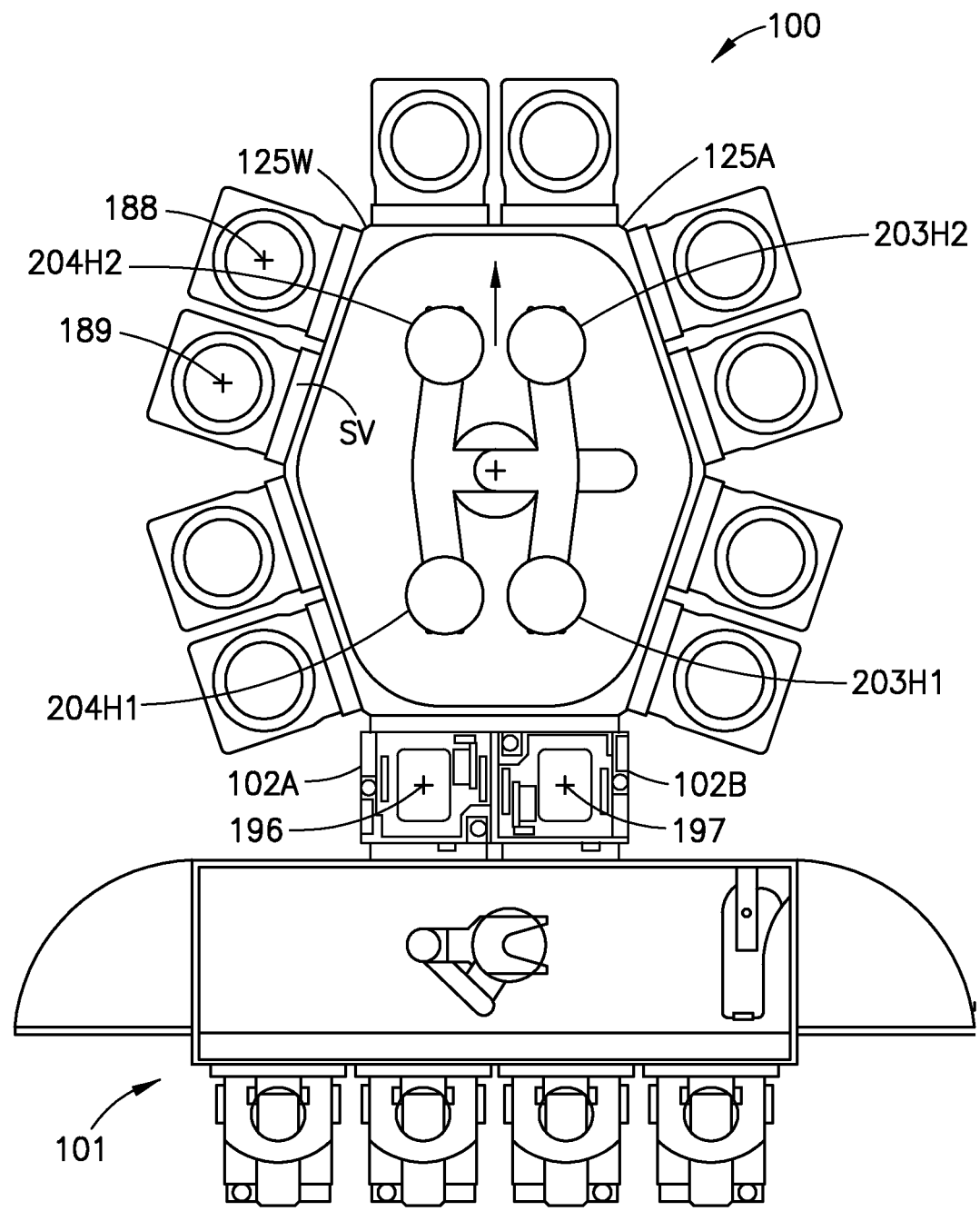

In one aspect a fast swapping of the substrates S1, S2 with substrates S3, S4 is effected (FIG. 14, Block 1450) in the manner descried above where each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. For example, the arm 131 is rotated in direction 777 (see FIGS. 7G-7I) so as to position the substrate holding stations 203H2, 204H2 (with substrates S1-S4 held by the arm 131), adjacent processing stations 188, 189 from which substrates S1, S2 were removed and to which dual substrates S3, S4 are to be placed. The controller 110 effects motion of the drive section 220 to extend the arm 131 (FIG. 14, Block 1410) and so that the base pitch BP of the substrate holding stations 203H2, 204H2 is increased (FIG. 2B) or decreased (FIG. 2C) to effect automatic wafer centering (FIG. 14, Block 1430—in this case centering of the substrates S3, S4 at the respective substrate processing stations 188, 189) so that the distance between substrate holding stations 203H2, 204H2 substantially matches the pitch between substrate processing stations 188, 189 (see FIG. 7I). It is noted that automatic wafer centering (e.g., increasing or decreasing of the base pitch BP) may be performed substantially simultaneously with arm extension/retraction or with the arm 131 substantially in the retracted configuration prior to extension of the arm 131. To place the substrates S3, S4 to the respective substrate processing stations 188, 189 the controller 110 is configured to effect motion of the drive section 220 so that the wrist axis WX moves in the non-radial extension along the path 701 (FIG. 7J). Movement of the wrist WX along path 701 extends the substrate holding stations 203H2, 204H2, through openings in the wall 125W of the transport chamber 125A, into substrate processing stations 188, 189.

In one aspect, the controller 110 may effect actuation of the Z-axis drive 312 to lower the substrate holding stations 203H2, 204H2 (while in other aspects the Z-motion may be provided at least in part by the substrate processing stations 188, 189) for placing the dual substrates S3, S4 (FIG. 14, Block 1440) substantially simultaneously to substrate processing stations 188, 189 of the side-by-side substrate station modules 150. The controller 110 effects motion of the drive section 220 to retract the arm 131 to, for example, the retracted configuration so that the substrate holding stations 203H2, 204H2 are removed from the side-by-side substrate station modules 150. The base pitch BP of the substrate holding stations 203H1, 204H1 may be restored during (substantially simultaneous with) retraction of the arm 131 from the substrate processing stations 188, 189 or with the arm substantially in the retracted configuration. While fast swapping of the substrates S1, S2 with substrates S3, S4 is described, it should be understood that in other aspects, the substrates S3, S4 may be placed in another location different from where substrates S1, S2 were picked.

The controller 110 may effect operation of the drive section 220 so that the arm 131 extends into load locks 102A, 102B, in the manner described above, so as to place the dual substrates S1, S2 to the substrate processing stations 196, 197 (see FIG. 7K) in a manner substantially similar to that described above with respect to placement of substrates S3, S4 at substrate processing stations 188, 189. The arm 131 is retracted from the load locks 102A, 102B to, for example, the retracted configuration (see FIG. 7L) for further picking/placing of substrates.

Referring now to FIGS. 30A, 30B, 31, and 32A-32F an exemplary substrate transport apparatus 130 is illustrated in accordance with another aspect of the present disclosure. In this aspect, the substrate transport apparatus 130 includes an arm 131 which is, for example, an articulated multi-link arm that may be referred to as a dual SCARA arm. The arm 131 has a common upper arm 3001 pivotally mounted to drive section 220C (or any other suitable drive section), two forearms 3002A, 3002B (each forearm 3002A, 3002B being coupled to each end of the common upper arm 3001), and two substrate holders or end effectors 3100A, 3100B, 3100C, 3100D (also referred to as end effector links) coupled to each respective forearm 3002A, 3002B where each substrate holder 3100A, 3100B, 3100C, 3100D has a substrate holding location/station 3023, 3024, 3025, 3026.

Figure 33A:
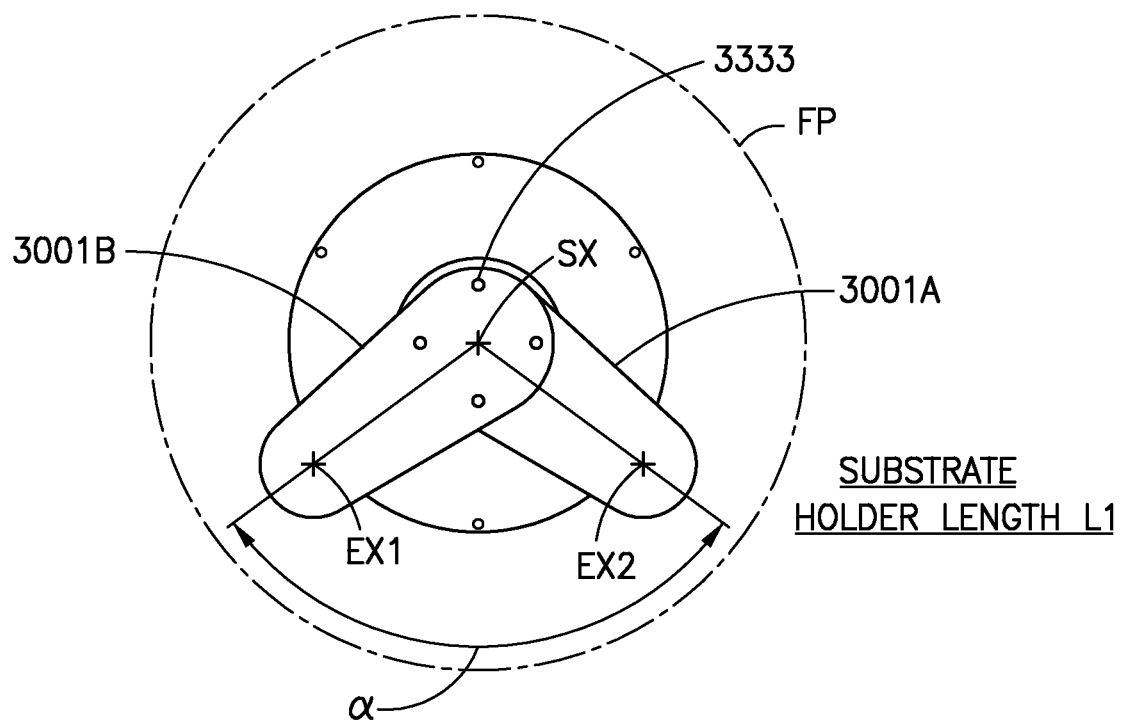
FIGS. 33A-33C are exemplary plan views of the portion of the substrate transport apparatus of FIGS. 30A and 30B (the forearm and substrate holders being omitted for clarity) and showing a footprint of the transport apparatus in accordance with aspects of the present disclosure.
Figure 33B:
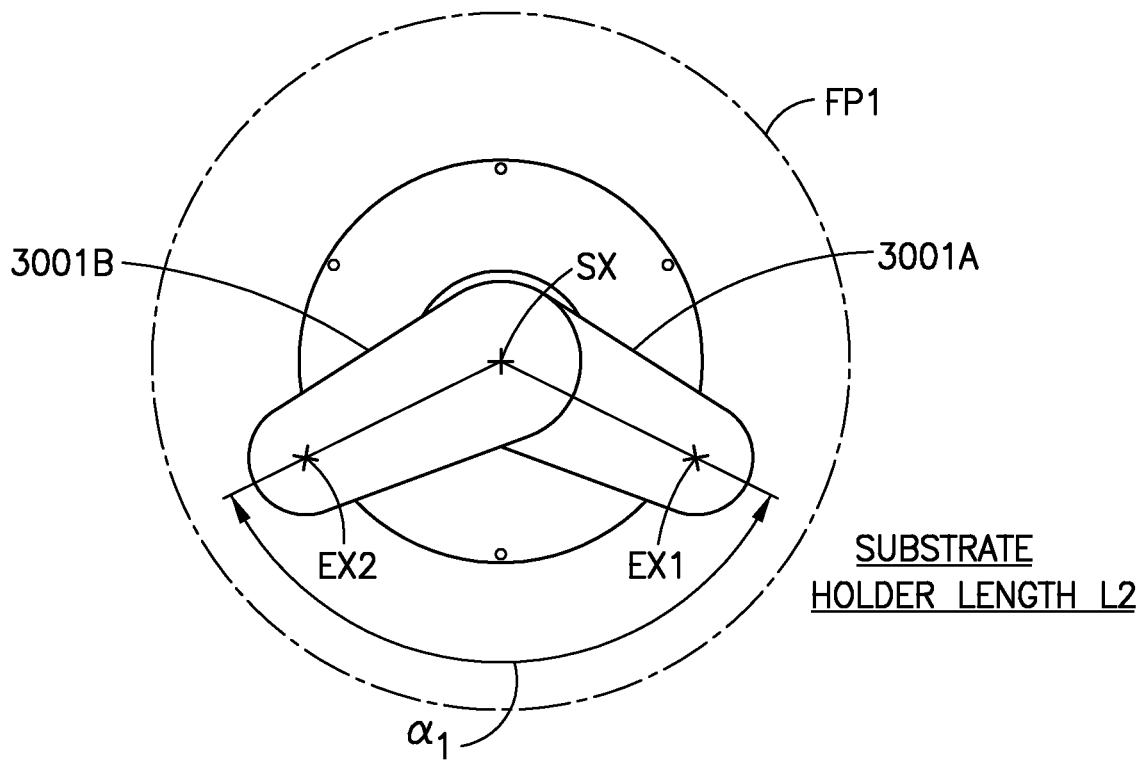
Figure 33C:
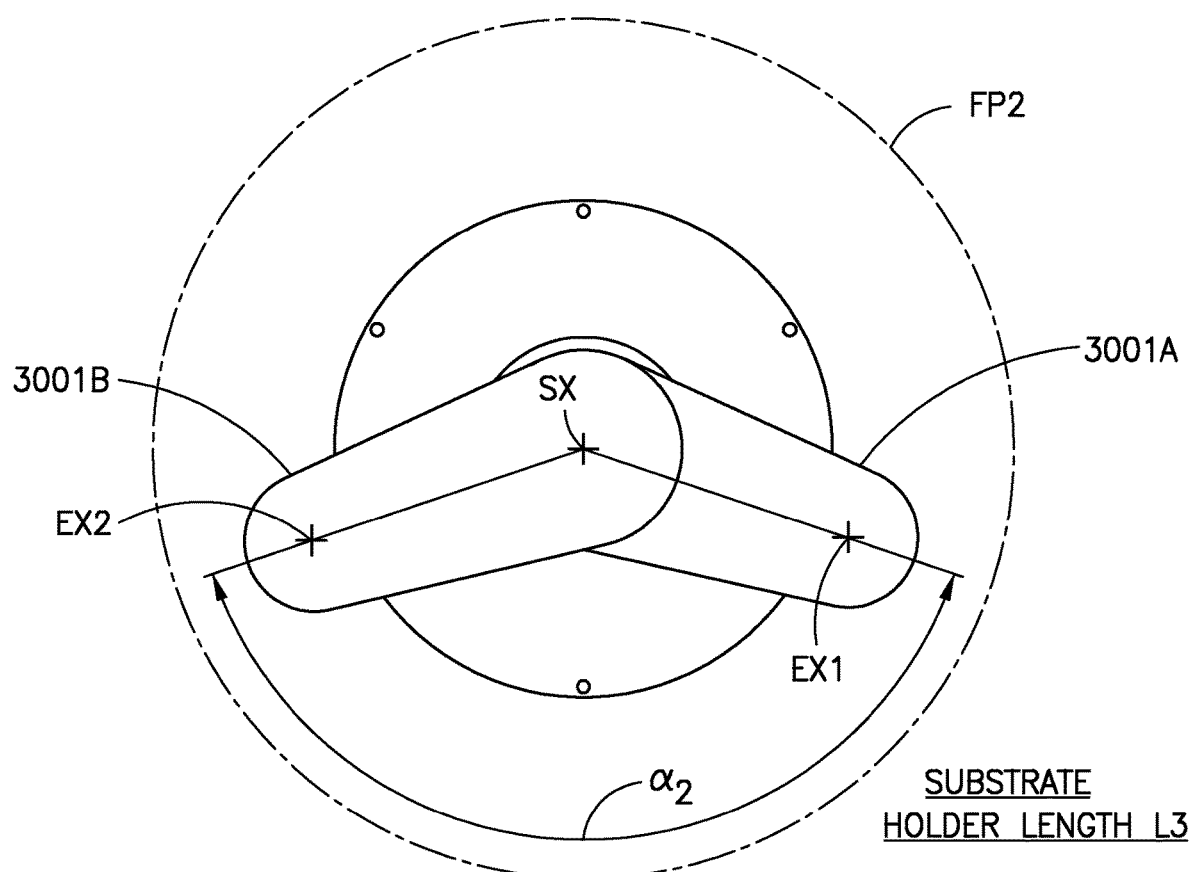

Here the common upper arm is shared by or is common to both of the forearms 3002A, 3002B and includes a shoulder axis SX, a first arm portion 3001A having a first end 3001E1, and a second arm portion 3001B having second end 3001E2, where the shoulder axis SX is located between the first and second ends 3001E1, 3001E2. In one or more aspects, the first and second arm portions 3001A, 3001B form a single unitary member (i.e., one piece) arm link with no articulating/adjustable joints there between the first and second ends 3001E1, 3001E2 and the common upper arm link 3001 is a substantially rigid unarticulated link between the shoulder axis SX (which is located at a fixed location relative to a frame of the substrate transfer chamber 125) and a respective joint EX1, EX2 of each of the two forearms 3002A, 3002B and the common upper arm link 3001. In other aspects, referring also to FIGS. 33A-33C, the first and second arm portions 3001A, 3001B are coupled to each other in an adjustable manner so that an inclusive angle α between the arm portions 3001A, 3001B is adjustable to accommodate different length L (see FIG. 30A) substrate holders while maintaining the most compact (i.e., minimum) footprint FP for a given substrate holder length in a manner substantially similar to that described in U.S. Pat. No. 8,376,685 issued on Feb. 19, 2013 and titled "Dual SCARA Arm", the disclosure of which is incorporated herein by reference in its entirety. For example, adjustment of the transport arm footprint FP, and optimal positioning of the substrate holders 3100A-3100D is effected as illustrated in FIGS. 33A-33C by adjusting the relative angular position of the opposing arm portions 3001A, 3001B of the common upper arm 3001. FIGS. 33A-33C respectively show the arm portions 3001A, 3001B in three different positions corresponding to substrate holders having length L1, L2, L3, where length L1 is greater than length L2 and length L2 is greater than length L3. Thus, in FIG. 33A the upper arm portions 3001A, 3001B are positioned relative to each other to form an inclusive angle α, in FIG. 33B the upper arm portions 3001A, 3001B are positioned relative to each other to form an inclusive angle α1, and in FIG. 33C the upper arm portions 3001A, 3001B are positioned relative to each other to form an inclusive angle α2. Angle α2 is shallower than angle α1 which in turn is shallower than angle α. Thus, as seen in FIGS. 33A-33C, the size of the inclusive angle between the upper arm portions 3001A, 3001B is decreased as the length L1, L2, L3 of the substrate holders increases. As the inclusive angle between the upper arm portions 3001A, 3001B is decreased, the arm portions 3001A, 3001B are rotated further back (opposite the direction of extension) when the arm assembly is in a registered position (e.g., a retracted or home position). This in turn moves the forearms and substrate holders back allowing for longer length end effectors to remain within the minimum footprint FP of the apparatus.

To move the opposing arm portions 3001A, 3001B relative to each other about the shoulder axis SX, the upper arm 3001 includes any suitable fasteners that when released allow relative movement between the arm portions 3001A, 3001B and when locked (or fastened) prevents relative movement between the arm portions 3001A, 3001B so that the common upper arm 3001 is a substantially rigid unarticulated arm link between the ends 3001E1, 3001E2 (or elbow axes EX1, EX2) of the upper arm 3001. For example, the common upper arm 3001 includes bolts 3333 (see FIG. 33A) that lock the arm portions 3001A, 3001B together. When the bolts 3333 are released one or both arm portions 3001A, 3001B are allowed to pivot relative to the other arm portion 3001A, 3001B about the shoulder axis SX until a desired inclusive angle α, α1, α2 is achieved. The bolts 3333 are then reintroduced thereby again locking the arm sections to each other in the new position. After repositioning the upper arm portions 3001A, 3001B, that in turn repositions the forearms and substrate holders carried by the upper arm 3001, the controller 110 is programmed to set the register position of the drive motors of the drive 220C (as described in U.S. Pat. No. 8,376,685 previously incorporated by reference herein) where teaching/programming the transfer movements of the transport arm 131 is then accomplished in any suitable manner.

The forearm 3002A is rotatably coupled at one end to the first end 3001E1 of the common upper arm 3001 at an elbow axis EX1. The substrate holders 3100A, 3100B are rotatably coupled to the other end of the forearm 3002A about a common wrist axis WX1 (i.e., the wrist axis WX1 is common to or shared by the substrate holders 3100A, 3100B). The forearm 3002B is rotatably coupled at one end to the second end 3001E2 of the common upper arm 3001 at another elbow axis EX2. The substrate holders 3100C, 3100D are rotatably coupled to the other end of the forearm 3002B about another common wrist axis WX2 (i.e., the wrist axis WX2 is common to or shared by the substrate holders 3100C, 3100D). Here, each forearm 3002A, 3002B is disposed to resolve automated centering of each substrate S at substrate holding locations/stations 3023, 3024, 3025, 3026 of the two end effectors of the respective forearm 3002A, 3002B independent from each other forearm 3002A, 3002B. Each forearm 3002A, 3002B is disposed to respectively resolve, independent from each other forearm 302A, 3002B, automated centering of each substrate S at the substrate holding locations 3023, 3024, 3025, 3026 of the two end effectors 3100A, 3100B, 3100C, 3100D of the respective forearm 3002A, 3002B so as to effect fast swap of substrates S through the more than one substrate transport openings (such as slot valves SV) along the side wall of, for example, the transfer chamber 125. In this aspect, the configuration of the arm 131 is advantageous over conventional transport arms where the forearms are linked by a common drive, because the fast swapping of the substrates Scan be effected, primarily by resolving the automatic wafer centering with the forearms 3002A, 3002B, each independently (i.e. on extension). Here the cross coupled rotational motion of substrate holders 3100A, 3100C and 3100B, 3100D (as described herein) on the different forearms 3002A, 3002B (i.e., substrate holder cross coupling/sharing of one degree of freedom) on different independently rotatable forearms 3002A, 3002B also causes minimal/minimized inertial coupling to the substrate S on the substrate holders 3100A-3100D of the retracted arm (e.g., in FIG. 30B the retracted arm is comprised of arm portion 3001B of the common upper arm 3001, forearm 3002B and end effectors 3100C, 3100D) because the substrates S held by the retracted arm are near center of rotation of the SCARA arm (e.g., the shoulder axis SX), though the angular velocity of coupled end effectors 3100A, 3100C and 3100B, 3100D is the same as described herein.

The substrate holders 3100A, 3100B coupled to the forearm 3002A may have any suitable length L and shape (e.g., configuration) that, at least in part, sets or otherwise defines any suitable base pitch BP between the side-by side substrate holding locations (also referred to as substrate holding stations) 3023, 3024 of the substrate holders 3100A, 3100B. Similarly, the substrate holders 3100C, 3100D coupled to the forearm 3002B may have any suitable length L and shape (e.g., configuration) that, at least in part, sets or otherwise defines any suitable base pitch BP between the side-by side substrate holding locations 3025, 3026 of the substrate holders 3100C, 3100D. The base pitches BP between the substrate holding locations 3023, 3024 and between the substrate holding locations 3025, 3026 are commensurate with each other and/or any suitable substrate holder offset distance SD of each of the substrate holdings locations 2023-2026 relative to the respective wrist axis WX1, WX2 in a manner similar to that described above. In one aspect, the base pitch BP may be substantially equal to the pitch D between side-by-side substrate processing stations, such as 190, 191 for example (see FIGS. 1A and 32A). In other aspects, as described herein automatic wafer centering is effected by varying the base pitch BP (e.g., the distance between the side-by side substrate holding stations 3023-3024, 3025-3026 may be increased or decreased) or the substrate holder offset distance SD of each respective substrate holder to accommodate variances in the pitch D and/or to effect automatic wafer centering for placing wafers at the substrate processing stations 190-197. For example, one or more of the substrate holders 3100A, 3100B, 3100C, 3100D may be independently rotated relative to the one or more of the other substrate holders 3100A, 3100B, 3100C, 3100D about the respective wrist axis WX1, WX2 so as to increase or decrease (or otherwise change) a respective offset distance SD and make a corresponding change in the base pitch BP as described herein. In one aspect, the drive section 300C is configured, as described herein, to independently align a corresponding at least one substrate holding station 3023, 3024, 3025, 3026 of each of the substrate holders 3100A, 3100B, 3100C, 3100D relative to the corresponding substrate holding station(s) 3023, 3024, 3025, 3026 of another of the substrate holders 3100A, 3100B, 3100C, 3100D.

Figure 30A:
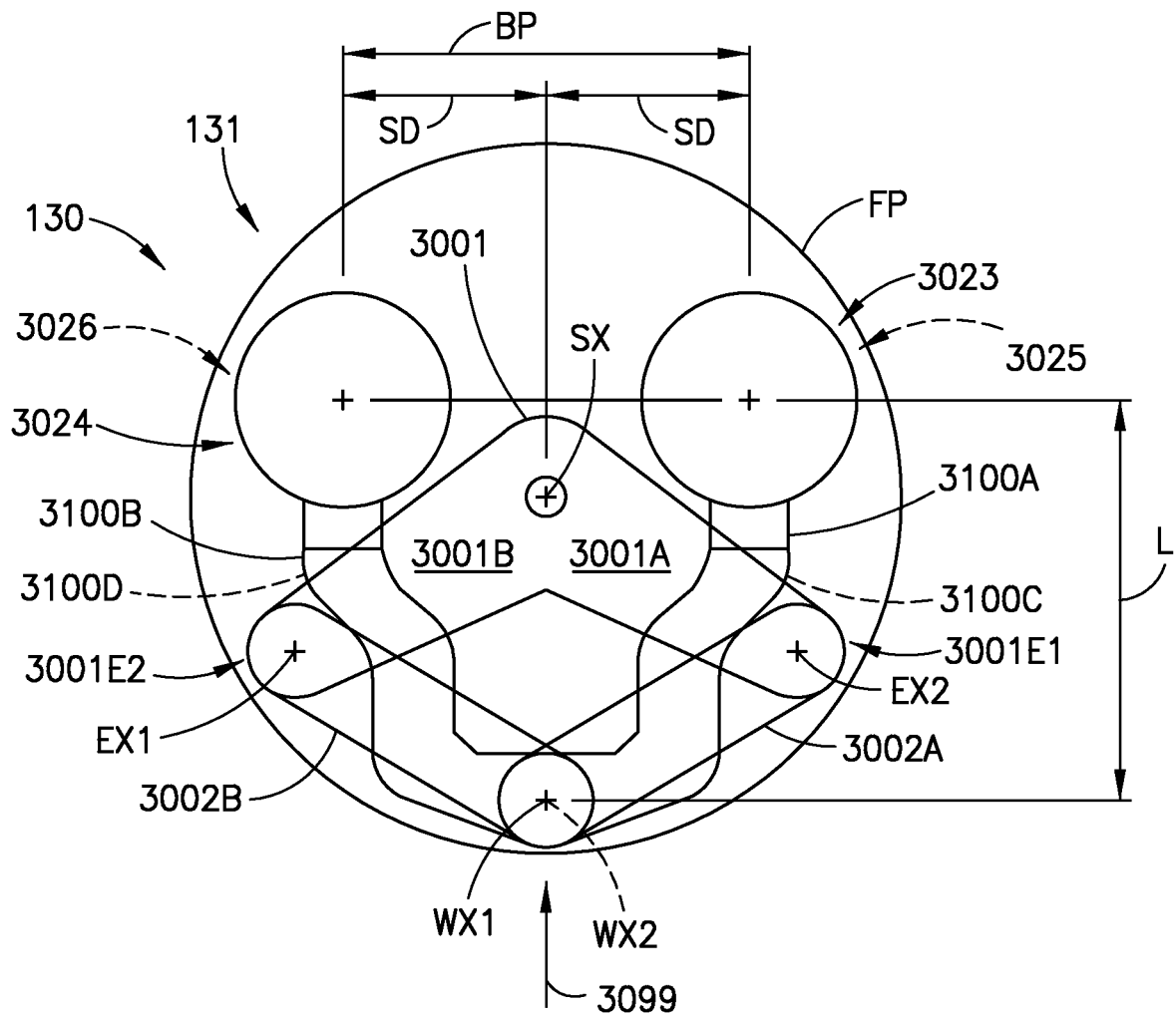
FIGS. 30A and 30B are exemplary illustrations of a portion of a substrate transport apparatus in accordance with aspects of the present disclosure.
Figure 30B:
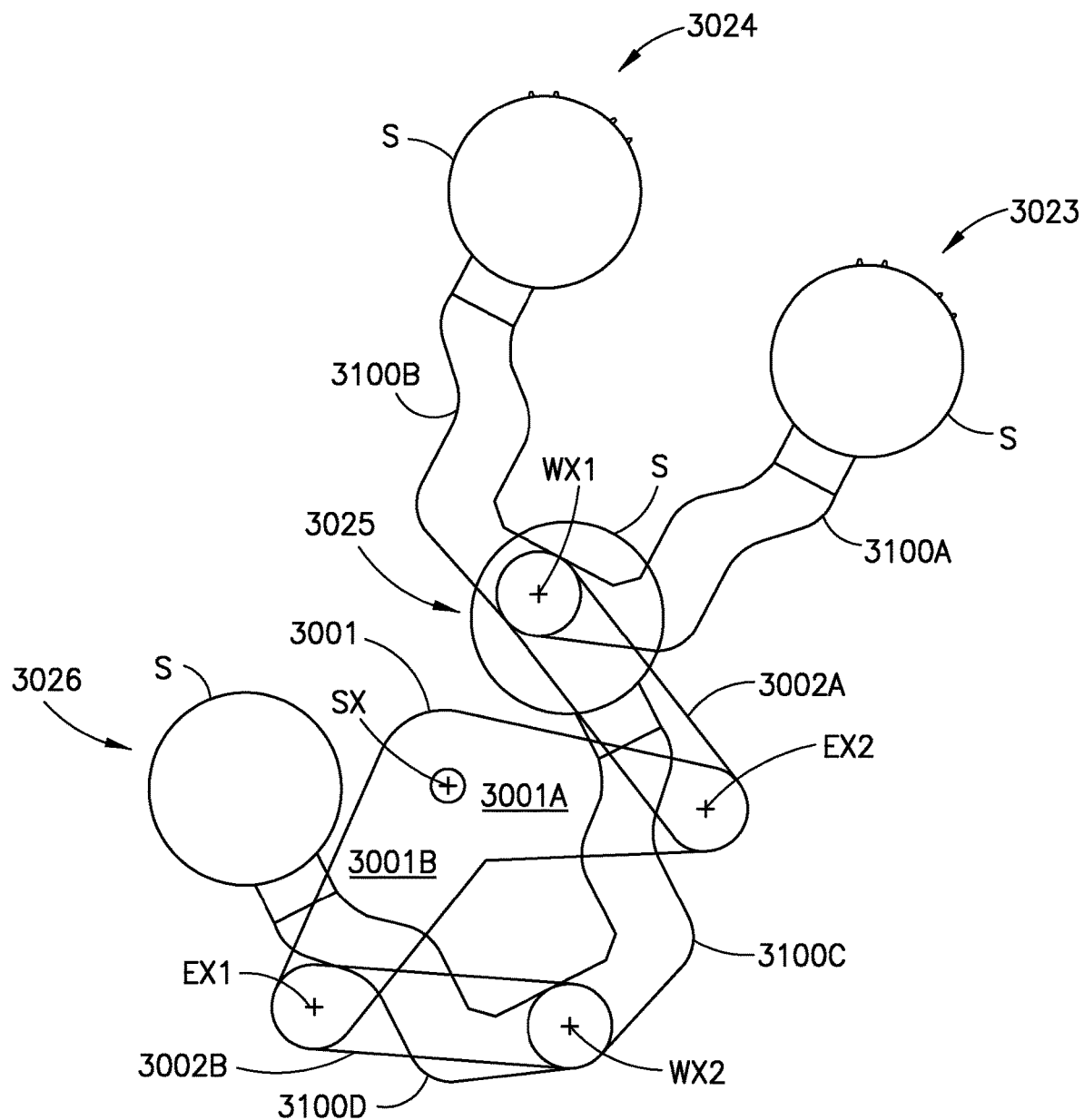
Figure 31:
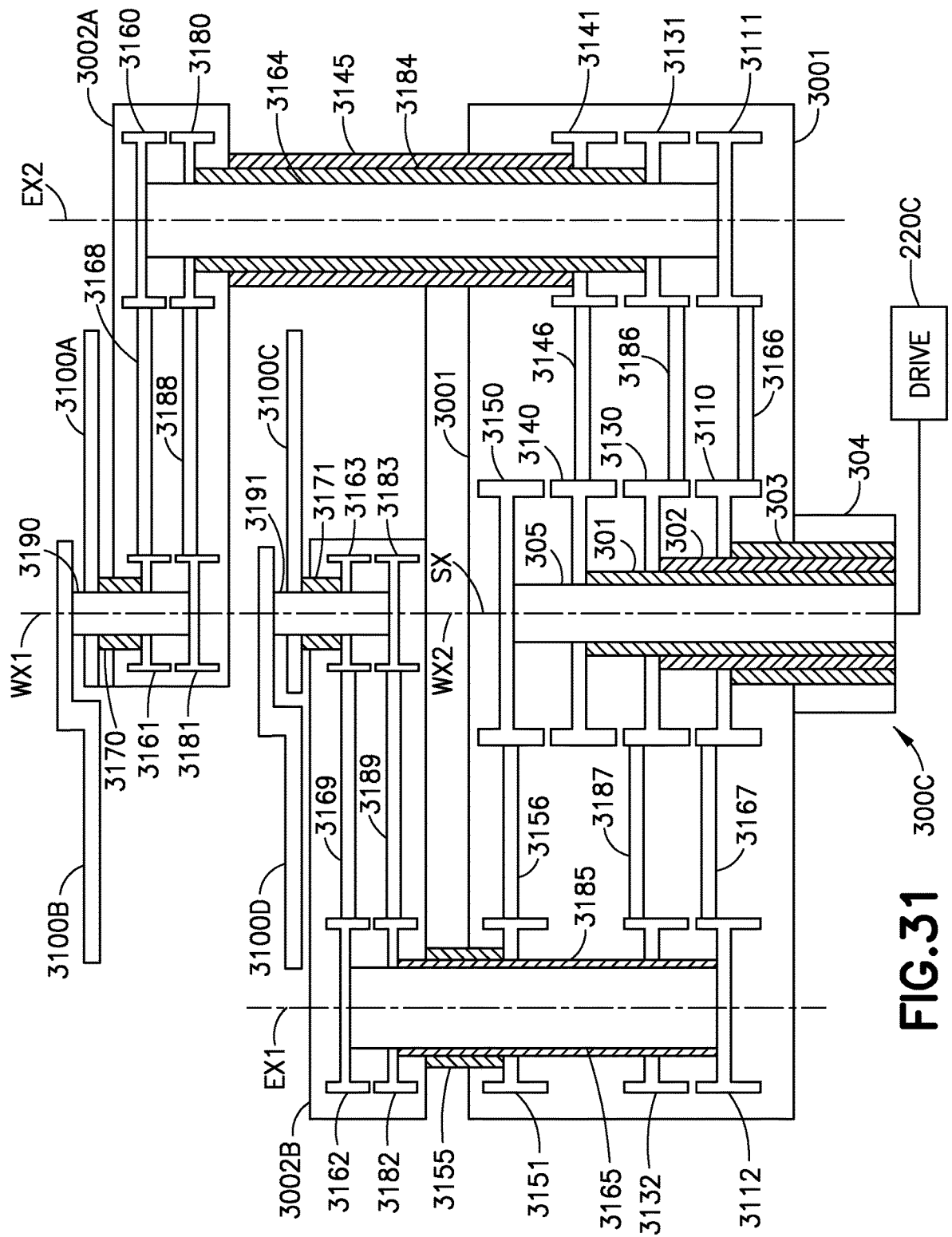
FIG. 31 is a schematic sectional illustration of the portion of the substrate transport apparatus of FIGS. 30A and 30B in accordance with aspects of the present disclosure.

Referring to FIGS. 30A, 30B, and 31, the transport arm 131 in this aspect is configured as a unidirectional extension dual SCARA arm so that the substrate holders 3100A, 3100B, 3100C, 3100D extend in the same extension direction 3099 without rotation of the substrate transport arm 131 as a unit (e.g., in a retracted configuration) about the shoulder axis SX, and without substantially a 180° rotation of the substrate holders 3100A, 3100B, 3100C, 3100D about the respective wrist axis WX1, WX2. Extension of each set of substrate holders (i.e., substrate holders 3100A, 3100B are extended and retracted together while substrate holders 3100C, 3100D are extended and retracted together) without rotation of the transport arm 131 as a unit about the shoulder axis SX and without rotation of the substrate holders 3100A-3100B, 3100C-3100D as their respective units about the respective wrist axis WX1, WX2 effects a fast swapping of substrates where substrate holders 3100A-3100B pick substrate from respective holding locations and substrate holders 3100C, 3100D, in immediate succession to the picking, place substrates in the same substrate holding locations (and/or vice versa).

In this aspect, rotation of substrate holders 3100A and 3100C about their respective wrist axis WX1, WX2 is coupled so that the substrate holders 3100A, 3100C are driven by a common (e.g., by a single) drive axis or motor. Similarly, rotation of substrate holders 3100B and 3100D about their respective wrist axis WX1, WX2 is coupled so that the substrate holders 3100B, 3100D are driven by a common (e.g., by a single) drive axis or motor. Each forearm 3002A, 3002B is driven in rotation about a respective elbow axis EX1, EX2 by a respective drive axis and the upper arm 3001 is driven in rotation about the shoulder axis SX by a respective drive axis. As such, extension, retraction, rotation of the arm 131 as a unit about the shoulder axis SX, and independent rotation of each substrate holder 3100A, 3100B, 3100C, 3100D about the respective wrist axis is provided with but a five degree of freedom drive (drive section 220C having the quintuple-coaxial drive shaft assembly 300C having five drive shafts 301-305 and five motors 342, 344, 346, 348, 343 described herein).

In one or more aspects, the drive section 220C has at least one drive axis configured to at least extend and retract the articulated multi-link arm 131 along a linear path (e.g., along arrow 3099—FIG. 30A) relative to the fixed location of the drive section 220C (and shoulder axis SX as described herein), with each respective forearm 3002A, 3002B being independently pivotable relative to the common upper arm link 3001. Here, each respective forearm 3002A, 3002B has an end effector link 3100A, 3100B, 3100C, 3100D, of two end effector links 3100A, 3100B and 3100C, 3100D mounted to the one end of the respective forearm 3002A, 3002B, operably coupled to a common drive axis (see FIG. 31 as described herein), of the at least one drive axis, that defines a common degree of freedom for two end effector links 3100A, 3100C (or 3100B, 3100D), one on each respective forearm 3002A, 3002B, rotating the end effector links 3100A, 3100C (or 3100B, 3100D) relative to the respective forearm 3002A, 3002B, and at least another of the two end effector links 3100A, 3100C (or 3100B, 3100D) at the one end of at least one forearm 3002A, 3002B, of the two forearms 3002A, 3002B, has another degree of freedom rotating the other end effector link 3100A, 3100C (or 3100B, 3100D) about the at least one forearm 3002A, 3002B independent from the common degree of freedom.

In one or more aspects, the at least one drive axis of the drive section 220C is configured to at least extend and retract the articulated multi-link arm 131 along a linear path relative to the fixed location as described above. Here, a first end effector link 3100A, 3100C (or 3100B, 3100D), of the two end effector links 3100A, 3100B (or 3100C, 3100D) corresponding to a first forearm 3002A, 3002B, of the two forearms 3002A, 3002B, and a first end effector link 3100A, 3100C (or 3100B, 3100D), of the two end effector links 3100A, 3100B (or 3100C, 3100D) corresponding to a second forearm 3002A, 3002B, of the two forearms 3002A, 3002B, are operably coupled to a common drive axis, of the at least one drive axis of the drive 220C, that defines a common degree of freedom for the first end effector link 3100A or 3100C of the first forearm 3002A or 3002B and the first end effector link 3100A or 3100C of the second forearm 3002A or 3002B rotating each respective first end effector link 3100A, 3100C (or 3100B, 3100D) relative to the corresponding first and second forearm 3002A, 3002B, and a second end effector link 3100A, 3100C (or 3100B, 3100D) of the first forearm 3002A or 3002B has another degree of freedom rotating the second end effector link 3100A, 3100C (or 3100B, 3100D) about the first forearm 3002A or 30022B independent from the common degree of freedom.

In accordance with one or more aspects, the five degree of freedom drive section 220C is configured so that the five degrees of freedom of the drive section 220C define at least extension and retraction of the articulated multi-link arm 131 along a linear path, relative to the fixed location (e.g., the shoulder axis SX is fixed in a manner similar to that described above relative to the transport chamber 125 frame), with each respective forearm 3002A, 3002B being independently pivotable relative to the common upper arm link 3001, and each of the two end effector links 3100A, 3100B, 3100C, 3100D at the one end of each of the respective forearm 3002A, 3002B being independently pivotable about the one end of the respective forearm 3002A, 3002B. The coupling of the substrate holder rotation (i.e., rotation of substrate holders 3100A and 3100C is coupled, and rotation of substrate holders 3100B and 3100D is coupled) as described herein decreases the number of drive axes needed to drive the transfer arm in extension, retraction, rotation as a unit, and independent rotation of each substrate holder (e.g., provides the equivalent of seven degrees of freedom arm movement with a five degree of freedom drive). In one or more aspects, a Z-axis drive is also provided in a manner similar to that described herein to provide the arm 131 with Z-axis motion.

As can be seen in FIG. 31, the common upper arm 3001 is coupled to and rotates as a unit about the shoulder axis SX with shaft 304. The forearm 3002A is coupled to shaft 301 by any suitable transmission, such as those described herein. For example, drive pulley 3140 is coupled to and rotates a unit about the shoulder axis SX with shaft 301. Driven pulley 3141 is rotatably mounted about elbow axis EX2 and is coupled to and rotates as a unit about the elbow axis EX2 with shaft 3145. The pulleys 3140, 3141 are coupled to each other by any suitable segmented transmission loop 3146 substantially similar to those described herein. The forearm 3002A is coupled to and rotates as unit about elbow axis EX2 with the shaft 3145.

The forearm 3002B is coupled to shaft 305 by any suitable transmission, such as those described herein. For example, drive pulley 3150 is coupled to and rotates a unit about the shoulder axis SX with shaft 305. Driven pulley 3151 is rotatably mounted about elbow axis EX1 and is coupled to and rotates as a unit about the elbow axis EX1 with shaft 3155. The pulleys 3150, 3151 are coupled to each other by any suitable segmented transmission loop 3156 substantially similar to those described herein. The forearm 3002B is coupled to and rotates as unit about elbow axis EX1 with the shaft 3155.

As noted above, the rotation of the substrate holder 3100A about wrist axis WX1 is coupled to the rotation of the substrate holder 3100C about wrist axis WX2. For example, as substrate holder 3100A rotates about wrist axis WX1 the substrate holder 3100C rotates about the wrist axis WX2 in the same direction and by the same amount of rotation. Here both substrate holders 3100A, 3100C are coupled to and driven by shaft 303. For example, drive pulley 3110 may be referred to in some aspects as a "splitting drive pulley" and is coupled to and rotates as a unit about the shoulder axis SX with shaft 303. Idler pulley 3111 (of the common upper arm 3001) and idler pulley 3160 (of the forearm 3002A) are rotatably mounted about elbow axis EX2 and are coupled to and rotate as a unit about the elbow axis EX2 with shaft 3164. The drive pulley 3110 is coupled to the idler pulley 3111 in any suitable manner such as by segmented transmission loop 3166 substantially similar to those described herein. The drive pulley 3110 is coupled to the idler pulley 3112 in any suitable manner such as by segmented transmission loop 3167 substantially similar to those described herein. In one aspect, the segmented transmission loops 3166, 3167 are located at different heights on the drive pulley 3110 while in other aspects at least a portion of the segmented transmission loops may share a common level of the drive pulley as described herein. A driven pulley 3161 is mounted to the forearm 3002A for rotation about the wrist axis WX1 and is coupled to the idler pulley 3160 by segmented transmission loop 3168 which is similar to those described herein. The driven pulley 3161 is coupled to and rotates as a unit about wrist axis WX1 with shaft 3170. The substrate holder 3100A is coupled to and rotates as a unit about the wrist axis WX1 with the shaft 3170. Idler pulley 3112 (of the common upper arm 3001) and idler pulley 3162 (of the forearm 3002A) are rotatably mounted about elbow axis EX1 and are coupled to and rotate as a unit about the elbow axis EX1 with shaft 3165, where the drive pulley 3110 is coupled to the idler pulley 3112 as noted above. A driven pulley 3163 is mounted to the forearm 3002B for rotation about the wrist axis WX2 and is coupled to the idler pulley 3162 by segmented transmission loop 3169 which is similar to those described herein. The driven pulley 3163 is coupled to and rotates as a unit about wrist axis WX2 with shaft 3171. The substrate holder 3100C is coupled to and rotates as a unit about the wrist axis WX2 with the shaft 3171.

In a manner similar to that described above, both substrate holders 3100B, 3100D are coupled to and driven by shaft 302 so that as substrate holder 3100B rotates about wrist axis WX1 the substrate holder 3100D rotates about wrist axis WX in the same direction and by the same amount of rotation. For example, drive pulley 3130 may in some aspects be referred to as a "splitting drive pulley" (as will be described further herein) and is coupled to and rotates as a unit about the shoulder axis SX with shaft 302. Idler pulley 3131 (of the common upper arm 3001) and idler pulley 3180 (of the forearm 3002A) are rotatably mounted about elbow axis EX2 and are coupled to and rotate as a unit about the elbow axis EX2 with shaft 3184. The drive pulley 3130 is coupled to the idler pulley 3131 in any suitable manner such as by segmented transmission loop 3186 substantially similar to those described herein. The drive pulley 3130 is coupled to the idler pulley 3132 in any suitable manner such as by segmented transmission loop 3187 substantially similar to those described herein. In one aspect, the segmented transmission loops 3186, 3187 are located at different heights on the drive pulley 3130 while in other aspects at least a portion of the segmented transmission loops may share a common level of the drive pulley as described herein. A driven pulley 3181 is mounted to the forearm 3002A for rotation about the wrist axis WX1 and is coupled to the idler pulley 3180 by segmented transmission loop 3188 which is similar to those described herein. The driven pulley 3181 is coupled to and rotates as a unit about wrist axis WX1 with shaft 3190. The substrate holder 3100B is coupled to and rotates as a unit about the wrist axis WX1 with the shaft 3190. Idler pulley 3132 (of the common upper arm 3001) and idler pulley 3182 (of the forearm 3002A) are rotatably mounted about elbow axis EX1 and are coupled to and rotate as a unit about the elbow axis EX1 with shaft

3185, where the drive pulley 3130 is coupled to the idler pulley 3132 as noted above. A driven pulley 3183 is mounted to the forearm 3002B for rotation about the wrist axis WX2 and is coupled to the idler pulley 3182 by segmented transmission loop 3189 which is similar to those described herein. The driven pulley 3183 is coupled to and rotates as a unit about wrist axis WX2 with shaft 3191. The substrate holder 3100D is coupled to and rotates as a unit about the wrist axis WX2 with the shaft 3191.

Figure 34A:
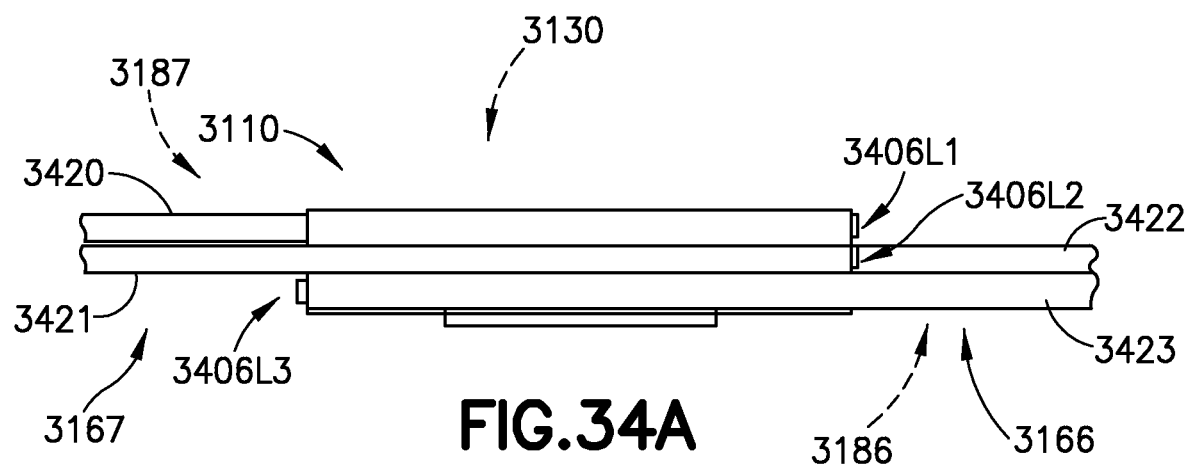
FIG. 34A is a schematic side view of portion of an exemplary drive transmission in FIG. 31 in accordance with aspects of the present disclosure.
Figure 34B:
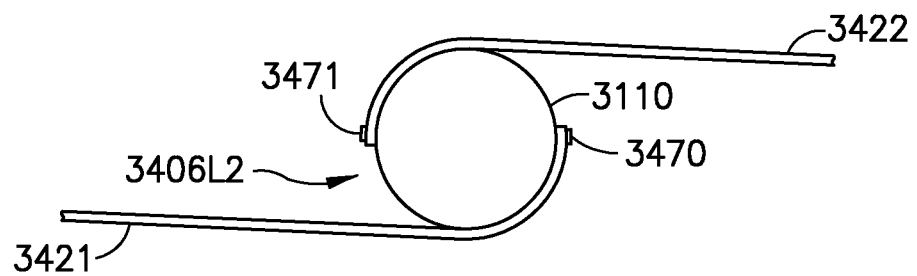
FIG. 34B is a schematic plan view of the portion of the exemplary drive transmission of FIG. 34A in accordance with aspects of the present disclosure.

As noted above, with reference to FIGS. 34A and 34B, the drive pulleys 3110, 3130 are, in one or more aspects, splitting drive pulleys substantially similar to that described in U.S. patent application Ser. No. 15/634,871 filed on Jun. 27, 2017 and titled "Substrate Processing Apparatus", the disclosure of which is incorporated herein by reference in its entirety. For example, each of the drive pulleys 3110, 3130 includes three band interface levels 3406L1, 3406L2, 3406L3 that accommodate the four band segments 3420, 3421 (of transmission loop 3167) and 3422, 3423 (of transmission loop 3166) (transmission loops 3187 and 3186 have similar band segments) of the respective segmented transmission loops 3186-3187 (for drive pulley 3130) and 3166-3177 (for drive pulley 3110). For exemplary purposes the coupling of the transmission loops 3167, 3166 to drive pulley 3110 will be described noting that transmission loops 3187, 3186 are coupled to drive pulley 3130 in a similar manner. Here, band segment 3420 of transmission loop 3167 is coupled to drive pulley 3110 at interface level 3406L1 while band segment 3421 of transmission loop 3167 is coupled to drive pulley 3110 at interface level 3406L2. Band segment 3422 of transmission loop 3166 is coupled to drive pulley 3110 at interface level 3406L2 while band segment 3423 of transmission loop 3166 is coupled to drive pulley 3110 at interface level 3406L3. As can be seen in FIG. 34, band segments 3421, 3422 share a common interface level (i.e., interface level 3406L2) where each band segment 3421, 3422 is wrapped around the drive pulley in a non-overlapping manner and coupled to the drive pulley at anchor points 3470, 3471 (similar to those described herein) that are substantially 180° apart with respect to a circumference of the drive pulley 3110. This band configuration provides for a reduced height pulley and transmission compared to conventional pulley and transmission configurations where each band is located on its own respective level of the pulley. The pulleys described above with respect to FIG. 31 may have any suitable drive/driven ratios such as, for example, 2:1 or any other suitable ratio to effect desired extension/retraction motion of the transport arm 131.

Referring now to FIGS. 30A and 32A-32F, the automatic wafer centering provided by the aspects of the present disclosure may provide for substantially simultaneous placement (or pick) of dual substrates S regardless of a relative eccentricity between each of the dual substrates S and a respective substrate holding station(s) 3023, 3024, 3025, 3026. For example, in manner substantially similar to that described above with respect to FIGS. 18A-18C, with the substrate holding stations 3023, 3024 at the base pitch BP, automatic wafer centering (such as effected with sensors 3299) may determine that an eccentricity EC2 of substrate S1 is closer to the shoulder axis SX than a center 203H1C of the substrate holding station 203H1, and an eccentricity EC1 of substrate S2 is to, e.g., the right (noting the direction term "right" is used here for convenience of explanation only) of a center 3023C of the substrate holding station 3023. Accordingly, to place the substrates S1, S2 at, for example, substrate processing stations 192, 193 the position of each the substrate S1, S2 is not only independently adjusted, via automatic wafer centering, with respect to the distance D between substrate processing stations 192, 193 but also independently in the direction of extension/retraction 3290 to accommodate both eccentricities EC1, EC2. For example, the substrate holders 3100A, 3100B are each independently rotated about the wrist axis WX1 (where the wrist axis is positioned along an axis of radial extension 3297 (see FIG. 32B) or a non-radial path of extension (e.g., in a manner similar to that of see FIG. 7F)) to effect independent automatic wafer centering of the substrates S1, S2 at the respective substrate processing stations 192, 193. Similarly, in a manner similar to that described above, with respect to FIG. 18C, automatic wafer centering may also effect placement of the substrates at substrate processing stations having different radial distances from, for example, the shoulder axis SX of the substrate transport apparatus, where independent rotation of each substrate holding station about the respective wrist axis and/or placement of the respective wrist axis effects an increased extension distance (relative to the shoulder axis) of one of the side-by-side substrate holding stations relative to another of the side-by-side substrate holding stations.

Figure 32B:
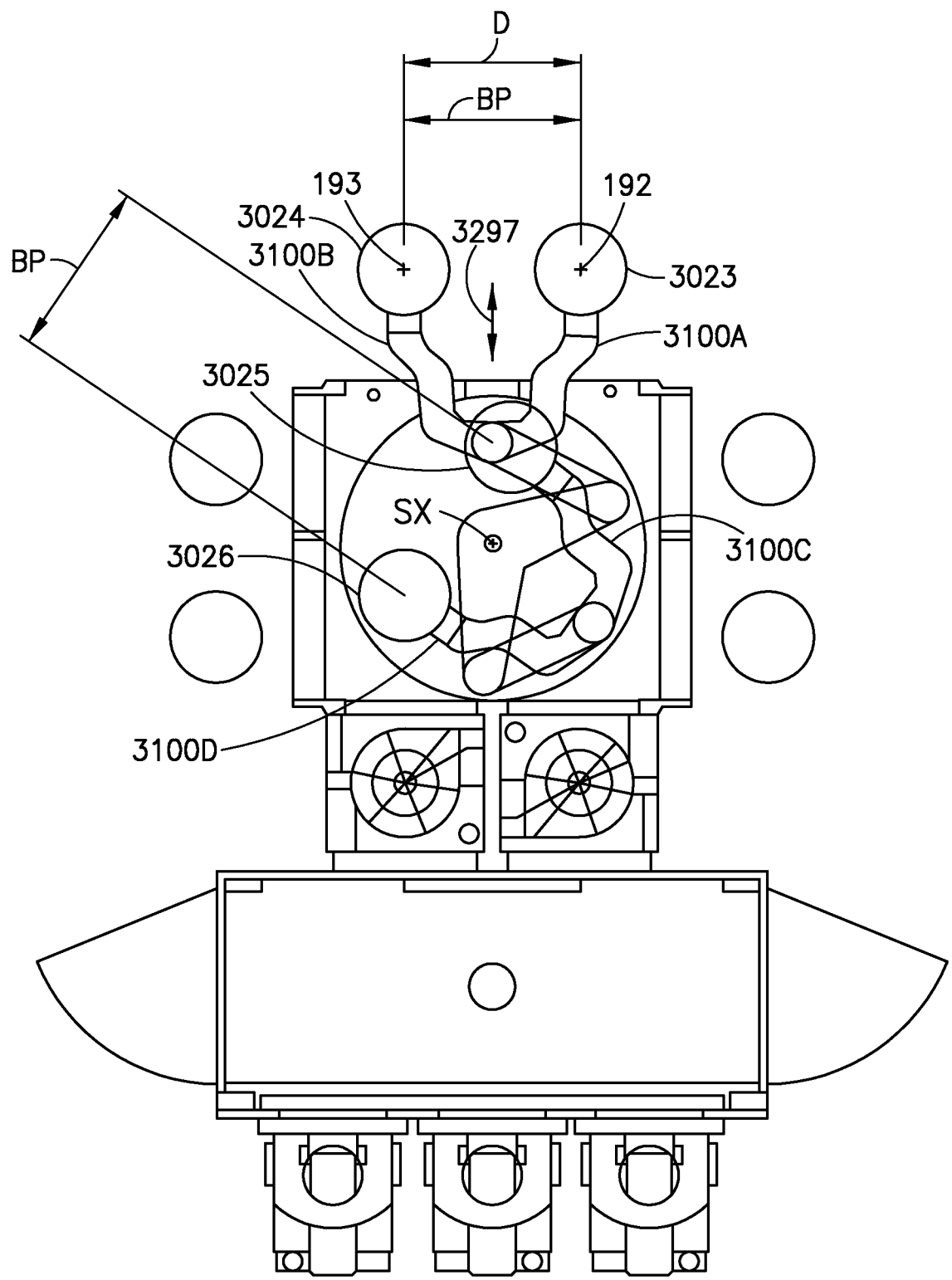

Still referring to FIGS. 32A-32F, various positional movements of the substrate holders 3100A-3100D are illustrated to exemplify the rotational coupling of the substrate holders 3100A, 3100C and the rotational coupling of the substrate holders 3100B, 3100D. For example, FIG. 32B illustrates extension of the substrate holders 3100A, 3100B to substrate processing stations 192, 193 where the base pitch BP between substrate holding locations 2032, 3024 of the substrate holders 3100A, 3100B is substantially equal to the distance D between substrate processing stations 192, 193. Here, because of the coupled rotation of the substrate holders 3100A-3100C and 3100B-3100D the distance between the substrate holding locations 3025, 3026 is also equal to the base pitch BP.

Figure 32C:
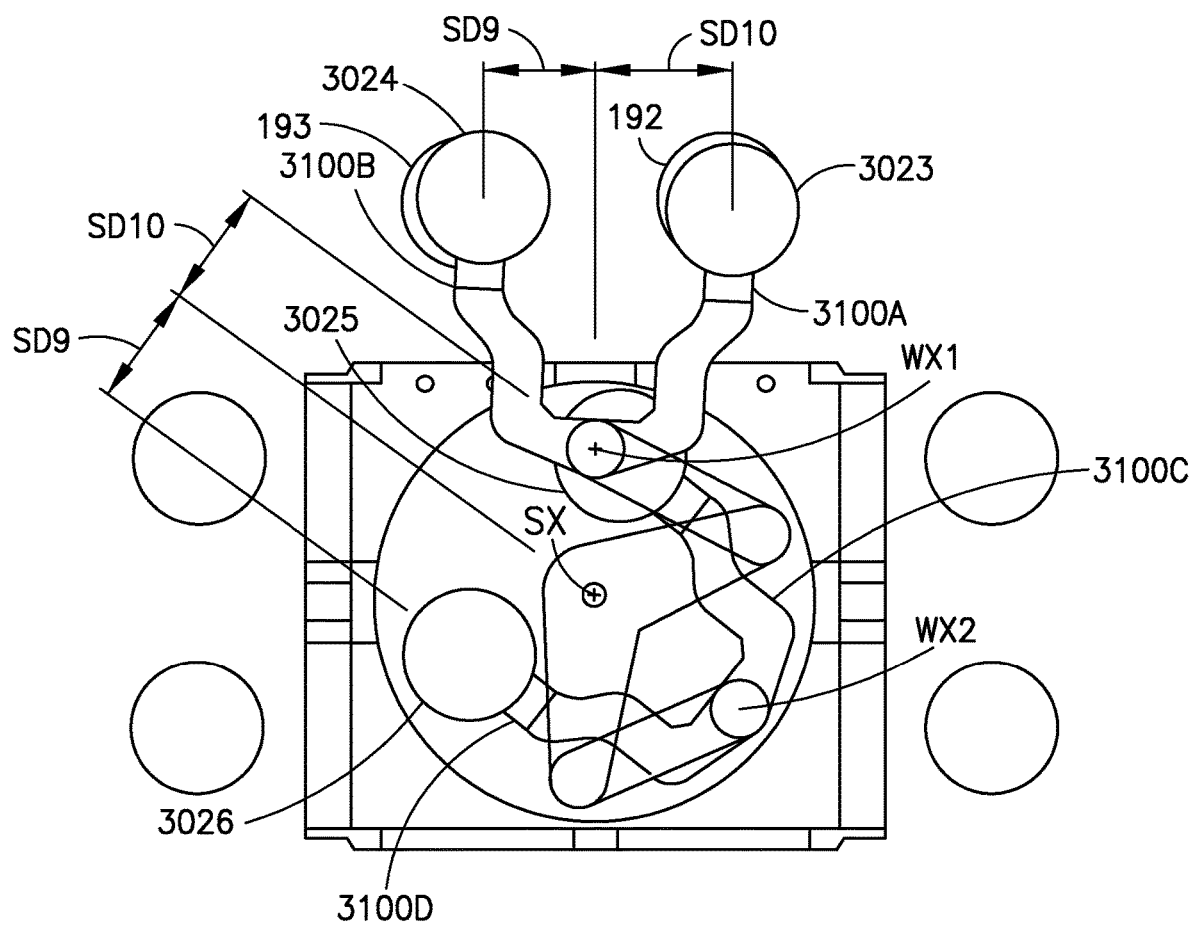
Figure 38A:
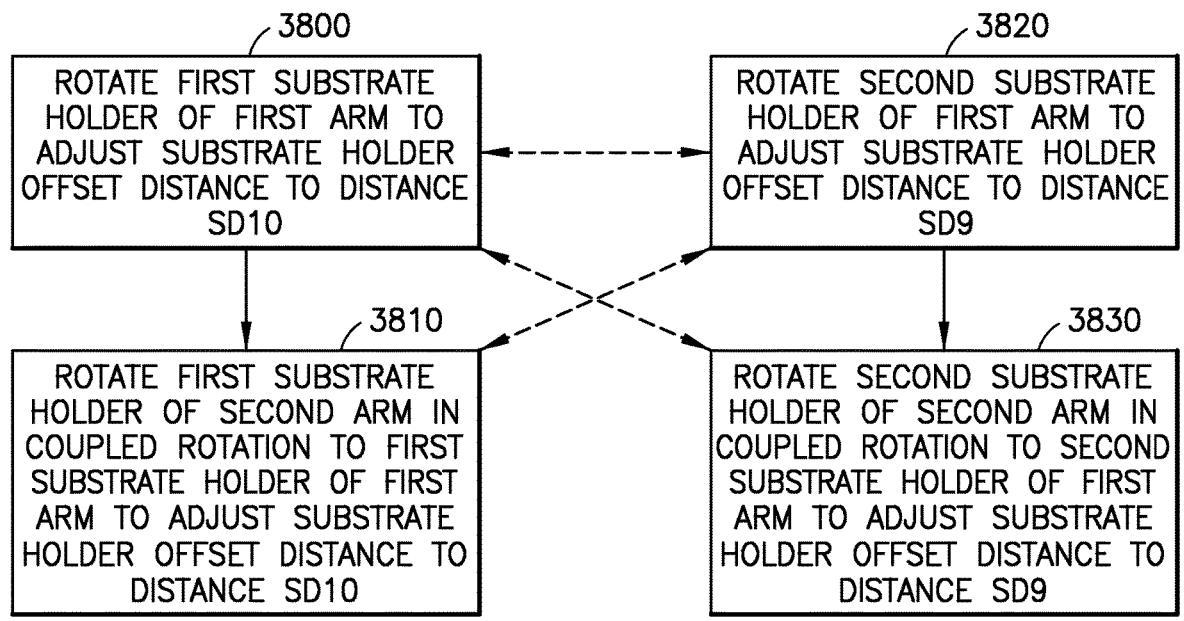
FIGS. 38A, 38B, 39A, 39B, 40A, 40B, 41A, and 41B are exemplary flow diagrams of substrate holder movements in accordance aspects of the present disclosure.
Figure 38B:
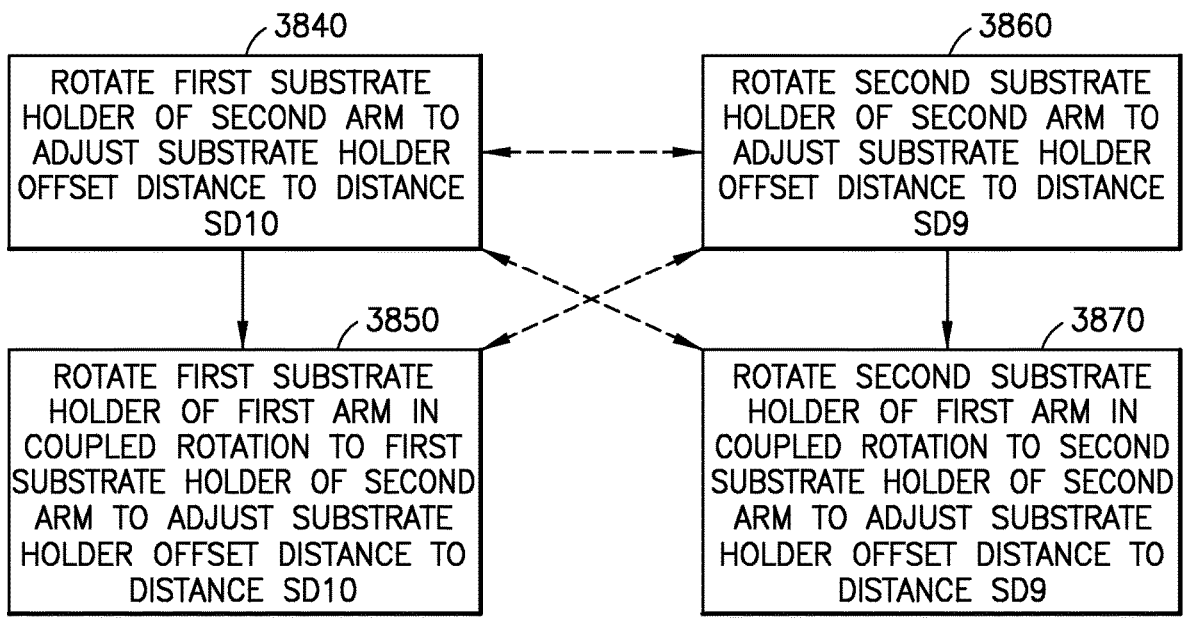

FIG. 32C is an exemplary illustration where substrate holders 3100A, 3100B are extended to substrate processing locations 192, 193 and one or more of substrate holders 3100A, 3100B is/are rotated independently (e.g., clockwise) about the wrist axis WX1 to a location that is to the right (the expression "right" is used for exemplary purposes only and any other spatial term may be used) of the respective substrate processing stations 192, 193. For example, substrate holder 3100A (e.g., the first substrate holder of the first arm—the first arm being upper arm portion 3001A, forearm 3002A, and substrate holders 3100A, 3100B) is rotated so that the distance between substrate holding location 3023 and the shoulder axis SX is increased from SD to SD10 (FIG. 38A, Block 3800) and substrate holder 3100B (e.g., the second substrate holder of the first arm) is rotated so that the distance between substrate holding location 3024 and the shoulder axis SX is decreased from SD to SD9 (FIG. 38A, Block 3820). Due to the rotational coupling of the first substrate holder 3100A of the first arm and the first substrate holder 3100C of the second arm (e.g., the second arm being upper arm portion 3001B, forearm 3002B, and substrate holders 3100C, 3100D) the distance between substrate holding location 3025 of the substrate holder 3100C and the shoulder axis SX is also increased from SD to SD10 (FIG. 38A, Block 3810). Due to the rotational coupling of the second substrate holder 3100B of the first arm and the second substrate holder 3100D of the second arm the distance between substrate holding location 3026 of the substrate holder 3100D and the shoulder axis SX is also decreased from SD to SD9 (FIG. 38A, Block 3830). A similar coupled operation of the substrate holders 3100A, 3100B of the first arm is provided in substantially the opposite manner to that described above such as where the second arm is extended into a substrate processing/holding location(s) and the substrate holders 3100C, 3100D of the second arm are rotated to effect automatic wafer centering (see FIG. 38B, Blocks 3840-3870).

Figure 32D:
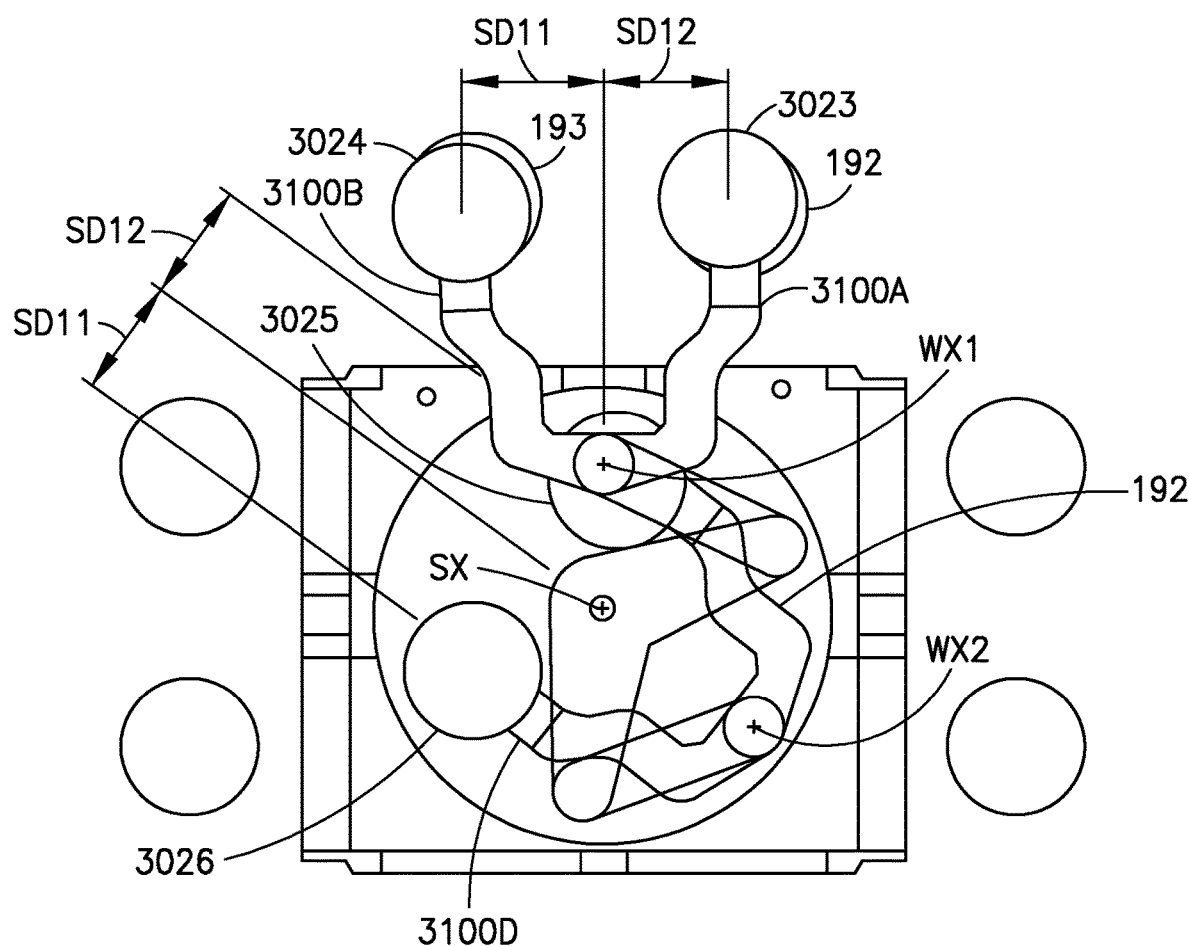
Figure 39A:
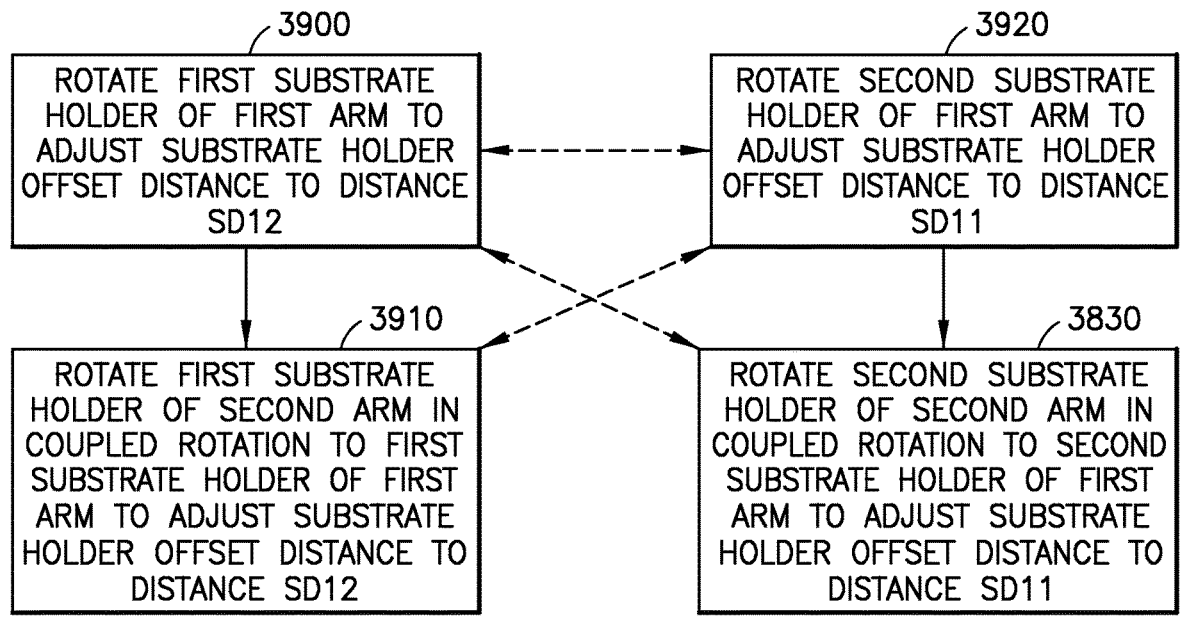
Figure 39B:
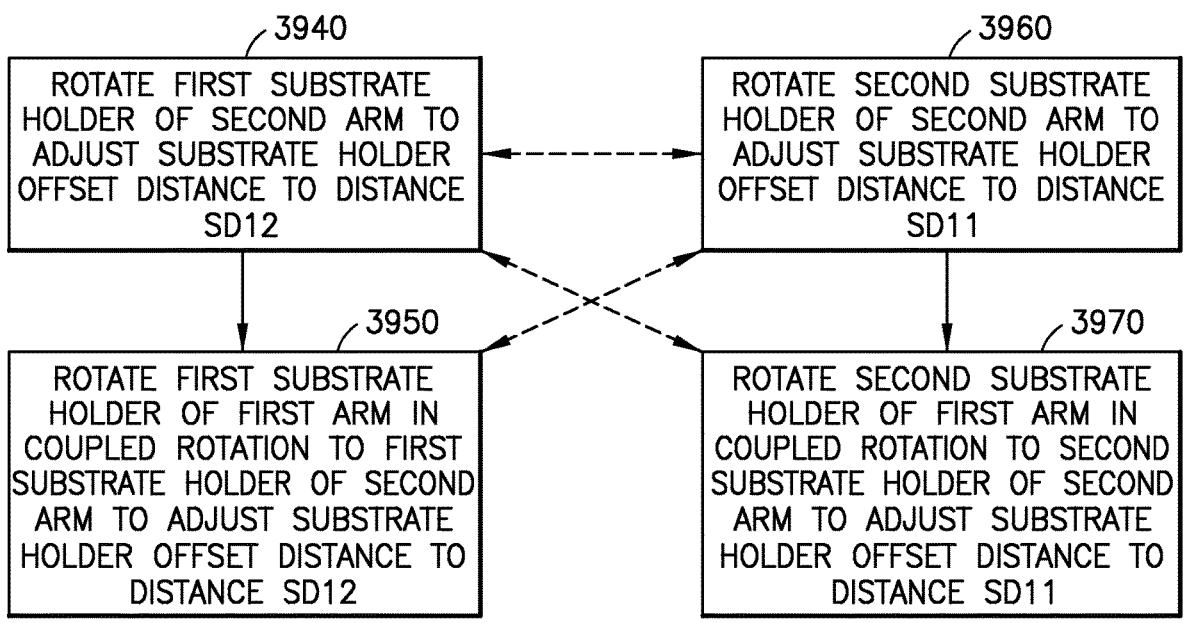

FIG. 32D is an exemplary illustration where substrate holders 3100A, 3100B are extended to substrate processing locations 192, 193 and one or more of substrate holders 3100A, 3100B is/are rotated independently (e.g., counter-clockwise) about the wrist axis WX1 to a location that is to the left (the expression "left" is used for exemplary purposes only and any other spatial term may be used) of the respective substrate processing stations 192, 193. For example, the first substrate holder 3100A of the first arm is rotated so that the distance between substrate holding location 3023 and the shoulder axis SX is decreased from SD to SD12 (FIG. 39A, Block 3900) and the second substrate holder 3100B of the first arm is rotated so that the distance between substrate holding location 3024 and the shoulder axis SX is increased from SD to SD11 (FIG. 39A, Block 3920). Due to the rotational coupling of the first substrate holders 3100A, 3100C the distance between substrate holding location 3025 of the first substrate holder 3100C of the second arm and the shoulder axis SX is also decreased from SD to SD12 (FIG. 39A, Block 3910). Due to the rotational coupling of second substrate holders 3100B, 3100D the distance between substrate holding location 3026 of the second substrate holder 3100D of the second arm and the shoulder axis SX is also increased from SD to SD11 (FIG. 39A, Block 3930). A similar coupled operation of the substrate holders 3100A, 3100B of the first arm is provided in substantially the opposite manner to that described above such as where the second arm is extended into a substrate processing/holding location(s) and the substrate holders 3100C, 3100D of the second arm are rotated to effect automatic wafer centering (see FIG. 39B, Blocks 3940-3970).

Figure 32E:
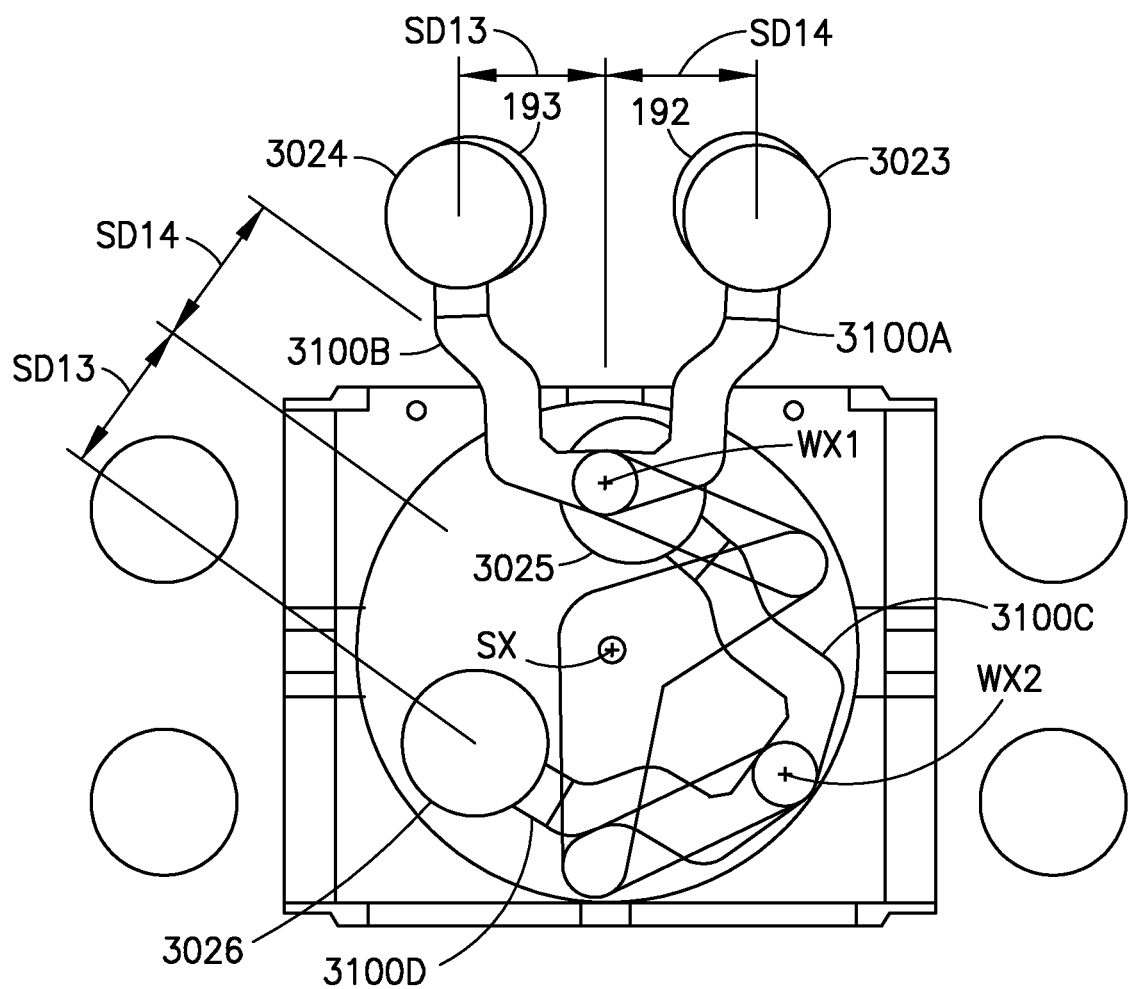
Figure 40A:
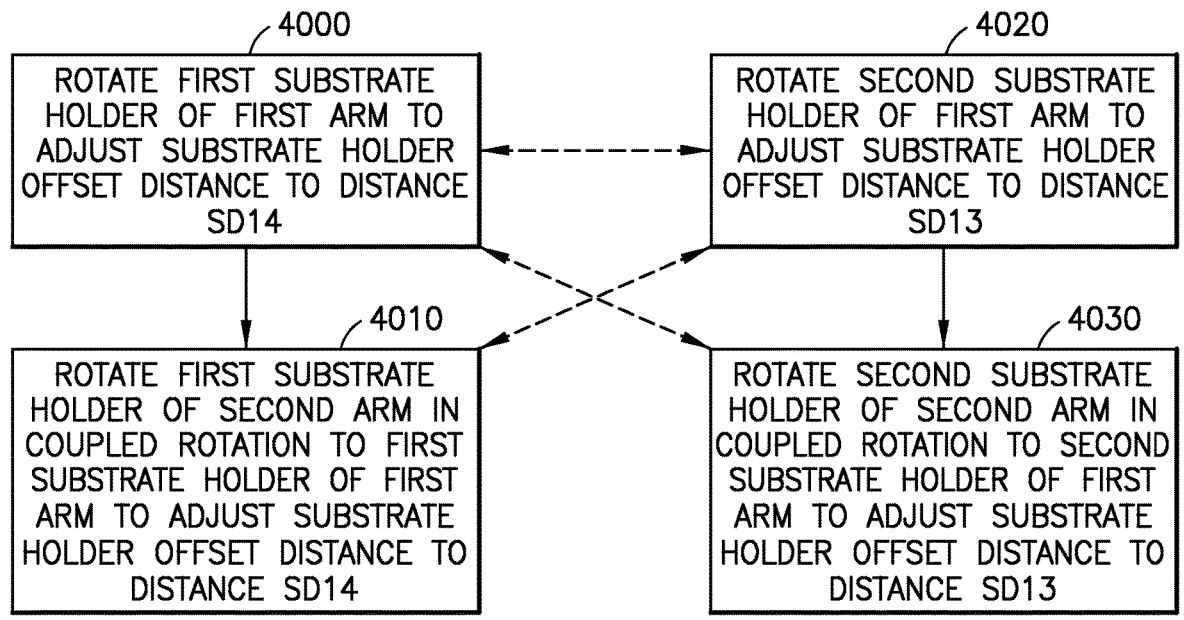
Figure 40B:
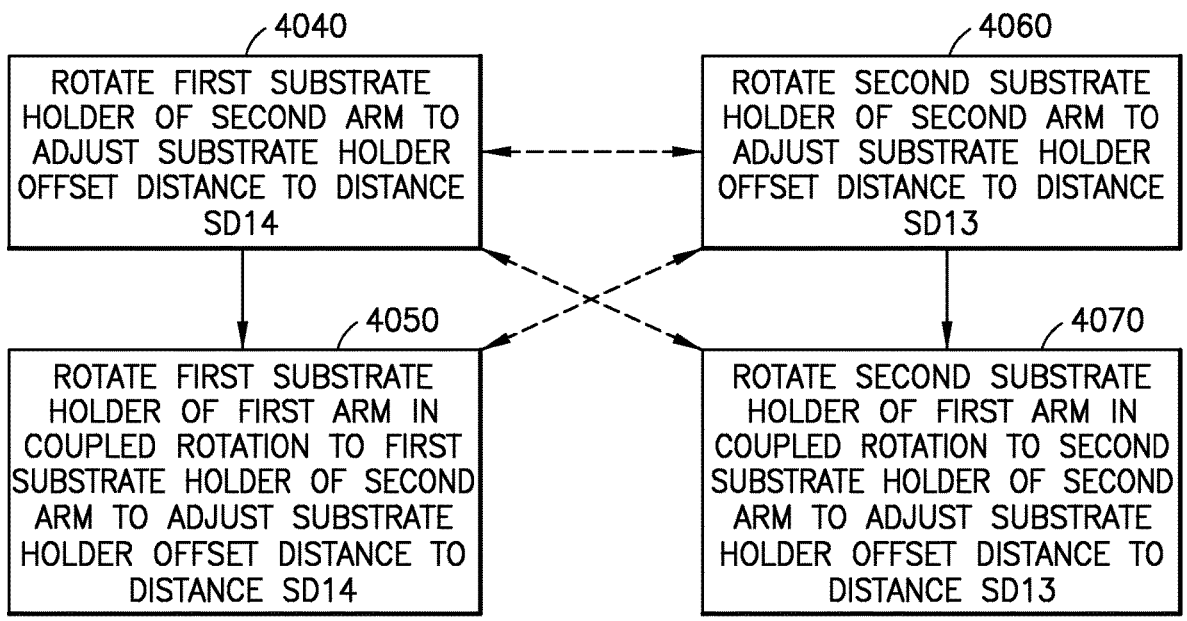

FIG. 32E is an exemplary illustration where substrate holders 3100A, 3100B are extended to substrate processing locations 192, 193 and one or more of substrate holder 3100A, 3100B is independently rotated. Here, first substrate holder 3100A is rotated about the wrist axis WX1 to a location that is to the right (the expression "right" is used for exemplary purposes only and any other spatial term may be used) of the respective substrate processing stations 192 while second substrate holder 3100B is independently rotated about the wrist axis WX1 to a location that is to the left (the expression "left" is used for exemplary purposes only and any other spatial term may be used) of the respective substrate processing stations 193. For example, first substrate holder 3100A of the first arm is rotated so that the distance between substrate holding location 3023 and the shoulder axis SX is increased from SD to SD14 (FIG. 40A, Block 4000) and second substrate holder 3100B of the first arm is rotated so that the distance between substrate holding location 3024 and the shoulder axis SX is increased from SD to SD13 (FIG. 40A, Block 4020). Due to the rotational coupling of first substrate holders 3100A, 3100C the distance between substrate holding location 3025 of the first substrate holder 3100C of the second arm and the shoulder axis SX is also increased from SD to SD14 (FIG. 40A, Block 4010). Due to the rotational coupling of the second substrate holders 3100B, 3100D the distance between substrate holding location 3026 of the second substrate holder 3100D of the second arm and the shoulder axis SX is also increased from SD to SD13 (FIG. 40A, Block 4030. A similar coupled operation of the substrate holders 3100A, 3100B of the first arm is provided in substantially the opposite manner to that described above such as where the second arm is extended into a substrate processing/holding location(s) and the substrate holders 3100C, 3100D of the second arm are rotated to effect automatic wafer centering (see FIG. 40B, Blocks 4040-4070).

Figure 32F:
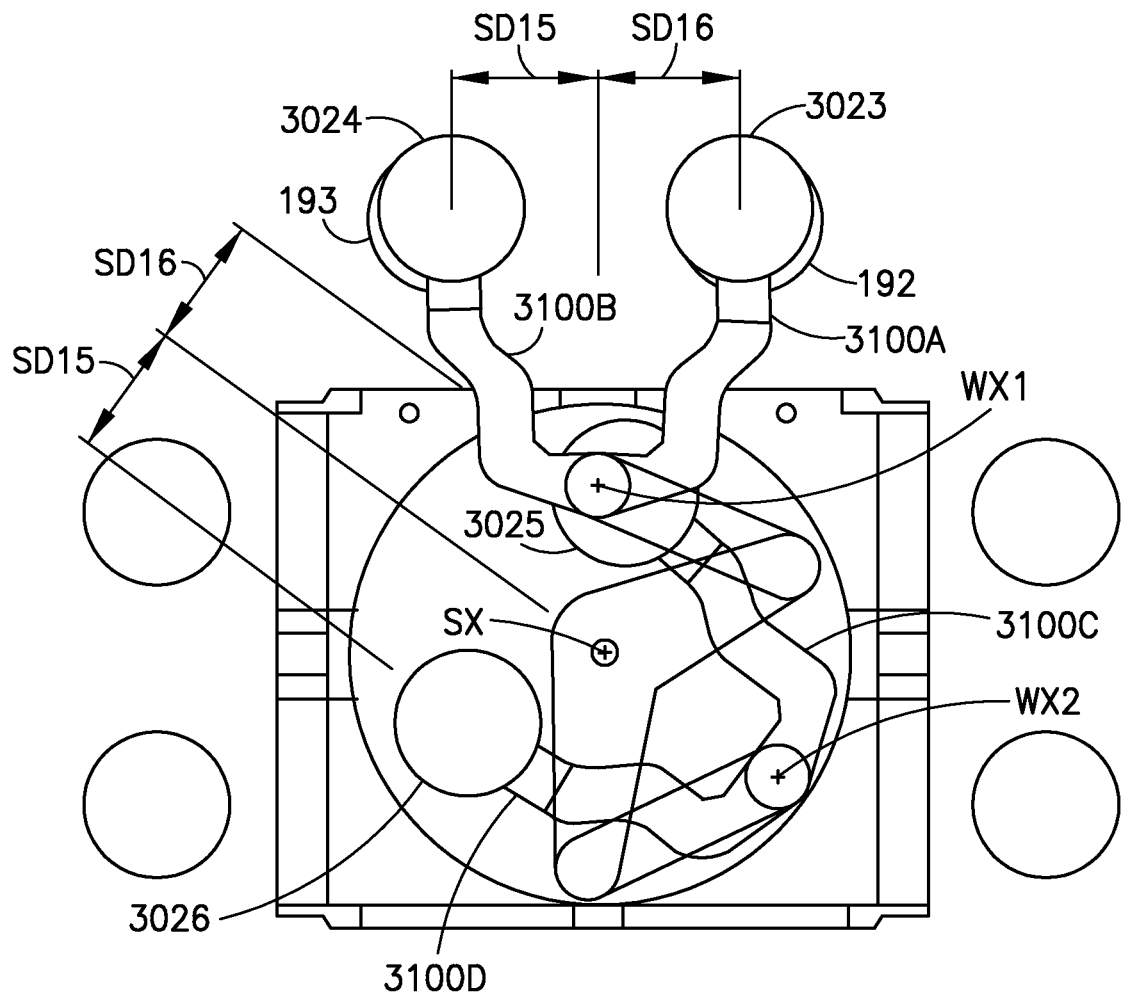
Figure 41A:
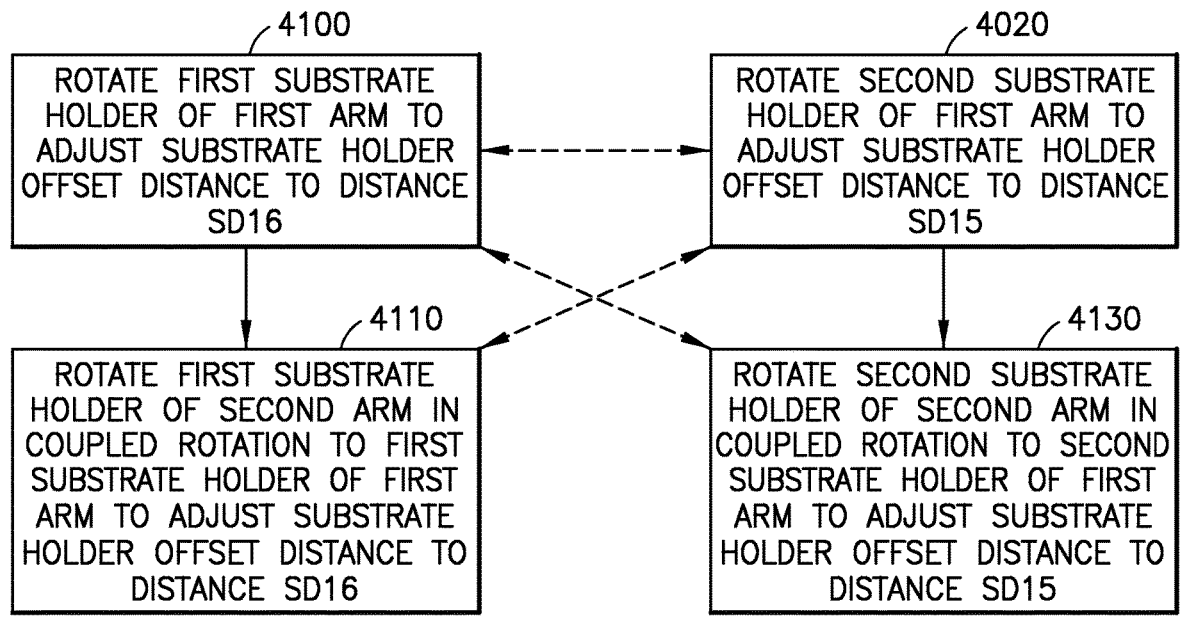
Figure 41B:
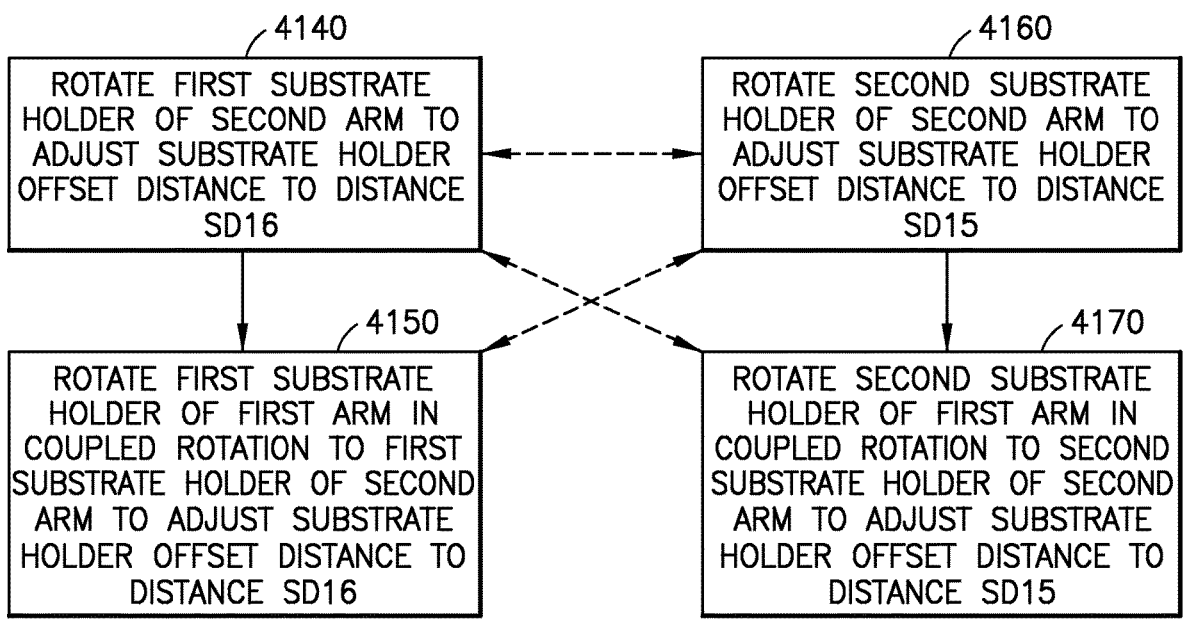

FIG. 32F is an exemplary illustration where substrate holders 3100A, 3100B are extended to substrate processing locations 192, 193 and one or more of substrate holder 3100A, 3100B is independently rotated. Here, first substrate holder 3100A is rotated about the wrist axis WX1 to a location that is to the left (the expression "left" is used for exemplary purposes only and any other spatial term may be used) of the respective substrate processing stations 192 while second substrate holder 3100B is independently rotated about the wrist axis WX1 to a location that is to the right (the expression "right" is used for exemplary purposes only and any other spatial term may be used) of the respective substrate processing stations 193. For example, first substrate holder 3100A of the first arm is rotated so that the distance between substrate holding location 3023 and the shoulder axis SX is decreased from SD to SD16 (FIG. 41A, Block 4100) and second substrate holder 3100B of the first arm is rotated so that the distance between substrate holding location 3024 and the shoulder axis SX is decreased from SD to SD15 (FIG. 41A, Block 4210). Due to the rotational coupling of first substrate holders 3100A, 3100C the distance between substrate holding location 3025 of the first substrate holder 3100C of the second arm and the shoulder axis SX is also decreased from SD to SD16 (FIG. 41A, Block 4110). Due to the rotational coupling of the second substrate holders 3100B, 3100D the distance between substrate holding location 3026 of the second substrate holder 3100D of the second arm and the shoulder axis SX is also decreased from SD to SD15 (FIG. 41A, Block 4130). A similar coupled operation of the substrate holders 3100A, 3100B of the first arm is provided in substantially the opposite manner to that described above such as where the second arm is extended into a substrate processing/holding location(s) and the substrate holders 3100C, 3100D of the second arm are rotated to effect automatic wafer centering (see FIG. 41B, Blocks 4140-4170).

As can be seen above, the substrate holders 3100A-3100D can be independently rotated to increase or decrease the respective substrate holder offset distance SD by any suitable amount, as determined by the automatic wafer centering, where the substrate holders 3100A-3100B, 3100C-3100D of the retracted forearm/upper arm portion rotate about the respective wrist axis WX1, WX2 in a corresponding manner to the respective one of the substrate holders 3100A-3100B, 3100C-3100D of the extended forearm/upper arm portion as illustrated in FIGS. 32B-32D. It is noted that while some exemplary movements/adjustments of the offset distances SD and base pitch BP have been described, the adjustments/movement are not limited thereto and any suitable combination of adjustments may be made. Here a variable pitch is provided between the pairs of substrate holders 3100A-3100B, 3100C-3100D and the dual SCARA arm arrangement of the transport arm 131 illustrated in FIGS. 30A-31 provides for a fast swapping of substrates (as described herein) with independent automatic wafer centering and the coupled substrate holders provides for a reduced number of drives while maintaining independent automatic wafer centering.

Figure 35:
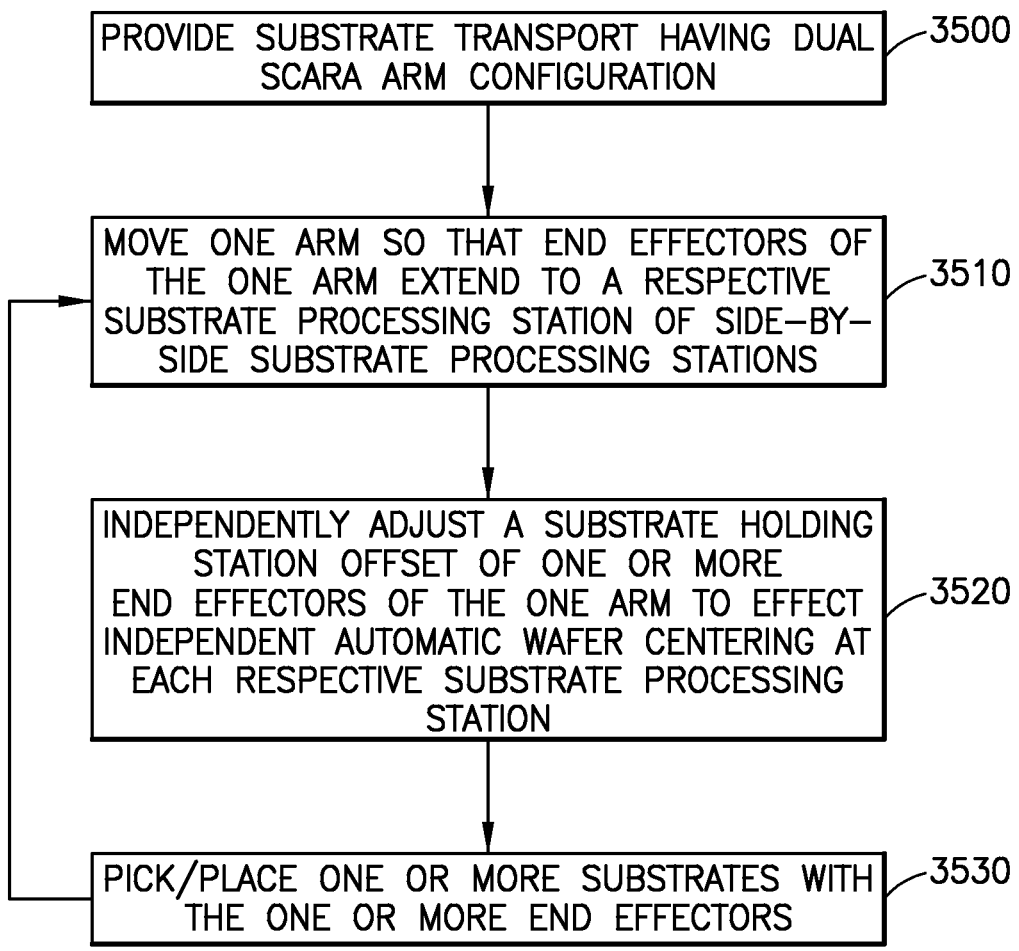
FIG. 35 is a flow diagram of an exemplary method in accordance with aspects of the present disclosure.

Referring to FIGS. 3C, 30A, 30B, 31, 32A, and 35 an exemplary method will be described in accordance with aspects of the present disclosure. In accordance with the method a substrate transport apparatus 130 having a transport arm 131 with the dual SCARA arm configuration of FIGS. 30A-31 is provided (FIG. 35, Block 3500). One transport arm (e.g., where one arm of the transport arm 131 comprises upper arm portion 3001A, forearm 3002A and substrate holders 3100A, 3100B while another arm of the transport arm 131 comprises upper arm portion 3001B, forearm 3002B and substrate holders 3100C, 3100D) of the substrate transport apparatus 130 is moved so that the substrate holders (e.g., end effectors) (either substrate holders 3100A-3100B of substrate holders 3100C-3100D depending on which arm is extended) of the arm being extended move or otherwise extend to a respective substrate processing station 192, 193 of side-by-side substrate processing stations (FIG. 35, Block 3510). As the substrate holders 3100A-3100B, 3100C-3100D are extended the sensors 3299 detect substrates S carried by the substrate holders 3100A-3100B, 3100C-3100D to effect, with the controller 110, automatic wafer centering in any suitable manner (such as described herein). Based on the automatic wafer centering information the controller 110 controls the drive section 220C to extend the one arm and independently adjust a substrate holding station offset SD of one or more of the substrate holders 3100A-3100D of the one arm to effect the independent automatic wafer centering at each respective substrate processing station 192, 193 (FIG. 35, Block 3520). As noted above, coupling rotation of substrate holders 3100A, 3100C about the respective wrist axes WX1, WX2 to a single drive axis and coupling rotation of substrate holders 3100B, 3100D about the respective wrist axes WX1, WX2 to another single drive axis provides for adjustment of the four substrate holders 3100A-3100D to effect automatic wafer centering with but two drive axes. With the substrates S1, S2 aligned with a respective substrate processing station 192, 193 the substrates are placed with the substrate holders (FIG. 35, Block 3530). The one arm is retracted and the other arm of the dual SCARA arm (or the same arm) is extended to pick or place substrates in the manner described above.

Referring to FIGS. 3C, 30A, 30B, 31, 32A, and 36 an exemplary method will be described in accordance with aspects of the present disclosure. The method includes providing a transport chamber 125 (FIG. 36, Block 3600) configured to hold an isolated atmosphere therein, and having a side wall with more than one substrate transport openings (such as slot valves SV) separate and juxtaposed with respect to each other along the side wall on a common level. An articulated multi-link arm 131 is provided (FIG. 36, Block 3610) and has at least one upper arm 3001 with a common upper arm link, pivotally mounted to a five degree of freedom drive section 220C, and two forearms 3002A, 3002B being pivotally mounted to ends of the common upper arm link, each of the two forearms 3002A, 3002B having respectively two end effector links 3100A, 3100B, 3100C, 3100D pivotally mounted at one end of the respective forearm 3002A, 3002B to rotate relative to the respective forearm 3002A, 3002B, each of the two end effector links 3100A, 3100B, 3100C, 3100D having a substrate holding station thereon 3023, 3024, 3025, 3026. The method includes driving the articulated multi-link arm 131 with the five degree of freedom drive section 220C (FIG. 36, Block 3620) that is connected to the transport chamber 125 at a fixed location, wherein the five degree of freedom drive section 220C defines at least extension and retraction of the articulated multi-link arm 131 along a linear path (e.g., in a direction of arrow 3099), relative to the fixed location, with each respective forearm 3002A, 3002B being independently pivotable relative to the common upper arm link 3001, and each of the two end effector links 3100A, 3100B, 3100C, 3100D at the one end of each of the respective forearm 3002A, 3002B being independently pivotable about the one end of the respective forearm 3002A, 3002B.

Referring to FIGS. 3C, 30A, 30B, 31, 32A, and 37 an exemplary method will be described in accordance with aspects of the present disclosure. The method includes providing a transport chamber 125 (FIG. 37, Block 3700) configured to hold an isolated atmosphere therein, and having a side wall with more than one substrate transport openings (e.g., slot valves SV) separate and juxtaposed with respect to each other along the side wall on a common level. The method also includes providing an articulated multi-link arm 131 (FIG. 37, Block 3710) having at least one upper arm 3001 with a common upper arm link, pivotally mounted to a drive section 220C (e.g., having at least one drive axis connected to the transport chamber at a fixed location), and two forearms 3002A, 3002B being pivotally mounted to ends of the common upper arm link 3001, each of the two forearms 3002A, 3002B having respectively two end effector links 3100A, 3100B, 3100C, 3100D pivotally mounted at one end of the respective forearm 3002A, 3002B to rotate relative to the respective forearm 3002A, 3002B, each of the two end effector links 3100A, 3100B, 3100C, 3100D having a substrate holding station thereon 3023, 3024, 3025, 3026. The method includes driving the articulated multi-link arm 131 with the drive section 220C having at least one drive axis connected to the transport chamber 125 (FIG. 37, Block 3720) at a fixed location.

In one aspect, the at least one drive axis of the drive section 220C is configured to at least extend and retract the articulated multi-link arm 131 along a linear path (e.g., in the direction of arrow 3099) relative to the fixed location, with each respective forearm 3002A, 3002B being independently pivotable relative to the common upper arm link 3001. Each respective forearm 3002A, 3002B has an end effector link 3100A, 3100B, 3100C, 3100D, of the two end effector links 3100A, 3100B, 3100C, 3100D mounted to the one end of the respective forearm 3002A, 3002B, operably coupled to a common drive axis, of the at least one drive axis, that defines a common degree of freedom for two end effector links 3100A, 3100C or 3100B, 3100D, one on each respective forearm 3002A, 3002B, rotating the end effector link 3100A, 3100B, 3100C, 3100D relative to the respective forearm 3002A, 3002BB, and at least another of the two end effector links 3100A, 3100B, 3100C, 3100D at the one end of at least one forearm 3002A, 3002B, of the two forearms 3002A, 3002B, has another degree of freedom rotating the other end effector link 3100A, 3100B, 3100C, 3100D about the at least one forearm 3002A, 3002B independent from the common degree of freedom.

In another aspect, the at least one drive axis of the drive section 220C is configured to at least extend and retract the articulated multi-link arm 131 along a linear path (e.g., in the direction of arrow 3099) relative to the fixed location. A first end effector link 3100A, 3100B, 3100C, 3100D, of the two end effector links 3100A, 3100B, 3100C, 3100D corresponding to a first forearm 3002A, 3002B, of the two forearms 3002A, 3002B, and a first end effector link 3100A, 3100B, 3100C, 3100D, of the two end effector links 3100A, 3100B, 3100C, 3100D corresponding to a second forearm 3002A, 3002B, of the two forearms 3002A, 3002B, are operably coupled to a common drive axis, of the at least one drive axis, that defines a common degree of freedom for the first end effector link 3100A, 3100B, 3100C, 3100D of the first forearm 3002A, 3002B and the first end effector link 3100A, 3100B, 3100C, 3100D of the second forearm 3002A, 3002B rotating each respective first end effector link 3100A, 3100B, 3100C, 3100D relative to the corresponding first and second forearm 3002A, 3002B, and a second end effector link 3100A, 3100B, 3100C, 3100D of the first forearm 3002A, 3002B has another degree of freedom rotating the second end effector link 3100A, 3100B, 3100C, 3100D about the first forearm 3002A, 3002B independent from the common degree of freedom.

In accordance with one or more aspects of the present disclosure a substrate transport apparatus comprises:

a frame;

a drive section connected to the frame;

at least one articulated multi-link arm having an upper arm and a forearm, the upper arm being rotatably joined at one end to the drive section, the forearm being rotatably joined to the upper arm at an opposite end of the upper arm and the upper arm being a substantially rigid unarticulated link between the one end and the opposite end;

dual end effector links that are separate and distinct from each other, each of which is rotatably and separately joined to a common end of the forearm so that each end effector link rotates relative to the forearm about a common axis of rotation, each end effector link has a corresponding at least one substrate holding station dependent therefrom;

wherein the corresponding at least one substrate holding station dependent from at least one end effector link of the dual end effector links includes one substrate holding station at opposite ends of the at least one end effector link that is substantially rigid and unarticulated between the opposite ends, and wherein the substrate holding station at one of the opposite ends is substantially coplanar with the corresponding at least one substrate holding station of each other separate and distinct end effector link.

In accordance with one or more aspects of the present disclosure the dual end effector links are disposed so that radial extension and retraction of the multi-link arm effects substantially simultaneous extension and retraction of the corresponding at least one substrate holding station of each end effector link through respective separate openings in a transport chamber wall that are juxtaposed with respect to each other at a substantially common level.

In accordance with one or more aspects of the present disclosure the substrate holding station at opposite ends of the at least one end effector link are substantially coplanar with each other.

In accordance with one or more aspects of the present disclosure the substrate holding station at opposite ends of the at least one end effector link are substantially coplanar with the corresponding at least one substrate holding station of each other separate and distinct end effector link.

In accordance with one or more aspects of the present disclosure the corresponding at least one substrate holding station of each separate and distinct end effector link includes one substrate holding station at opposite ends of the at least one end effector link, and each of the separate and distinct end effector link is substantially rigid and unarticulated between opposite ends.

In accordance with one or more aspects of the present disclosure the drive section is a multi-axis drive section that defines an independent degree of freedom for at least one end effector link relative to the other.

In accordance with one or more aspects of the present disclosure the independent degree of freedom for each end effector link enables independent automatic wafer centering at the corresponding at least one substrate holding station of each one of the dual end effector links.

In accordance with one or more aspects of the present disclosure the drive section is a multi-axis drive section configured to effect independent automatic wafer centering at the corresponding at least one substrate holding station of each one of the dual end effector links substantially coincident with substantially simultaneous extension of the corresponding at least one substrate holding station of each of the dual end effector links through respective separate openings in a transport chamber wall.

In accordance with one or more aspects of the present disclosure the substrate transport apparatus further comprises a controller operably coupled to the drive section and configured to extend the multi-link arm for substantially simultaneously picking or placing dual first substrates with the corresponding at least one substrate holding stations of the dual end effector links through the respective separate openings in the transport chamber wall.

In accordance with one or more aspects of the present disclosure the controller is configured to substantially simultaneously fast swap the dual first substrates with at least one second substrate held on the corresponding at least one substrate holding stations of the dual end effector links, through the respective separate openings, with the dual first substrates held simultaneously on the corresponding at least one substrate holding stations of the dual end effector links.

In accordance with one or more aspects of the present disclosure a substrate processing apparatus comprises:

a transport chamber configured to hold an isolated atmosphere therein, and having a side wall with more than one substrate transport openings separate and juxtaposed with respect to each other along the side wall on a common level;

at least one articulated multi-link arm with a drive section connected to the transport chamber at a fixed location and having an upper arm and a forearm located in the transport chamber, the upper arm being rotatably joined at one end to the drive section, the forearm being rotatably joined to the upper arm at an opposite end of the upper arm and the upper arm being a substantially rigid unarticulated link between the one end and the opposite end; and wherein the multi-link arm has more than one separate and distinct end effector links, each of which is rotatably and separately joined to a joint at a common end of the forearm so that each end effector link rotates relative to the forearm about a common axis of rotation at the joint, each end effector link has a corresponding at least one substrate holding station dependent therefrom, and extends from the joint so that the more than one end effector links are juxtaposed along a common plane with respect to each other, wherein the drive section is configured to at least extend and retract the multi-link arm along a radial axis, which extension and retraction effects substantially simultaneous extension and retraction of the corresponding at least one substrate holding station of each end effector link respectively through the separate openings juxtaposed along the side wall, and to independently align at least one of the corresponding substrate holding station relative to another of the more than one end effector links.

In accordance with one or more aspects of the present disclosure the drive section is configured to independently align the corresponding at least one substrate holding station of each of the end effector links relative to the corresponding substrate holding station of another of the end effector links.

In accordance with one or more aspects of the present disclosure the corresponding at least one substrate holding station dependent from at least one of the end effector links includes one substrate holding station at opposite ends of the at least one of the end effector links that is substantially rigid and unarticulated between the opposite ends.

In accordance with one or more aspects of the present disclosure the corresponding at least one substrate holding station at one of the opposite ends is substantially coplanar with the corresponding at least one substrate holding station of each other separate and distinct end effector link.

In accordance with one or more aspects of the present disclosure the corresponding at least one substrate holding station at opposite ends of the at least one of the end effector links are substantially coplanar with each other.

In accordance with one or more aspects of the present disclosure the drive section is a multi-axis drive section that defines an independent degree of freedom for at least one end effector link relative to the other.

In accordance with one or more aspects of the present disclosure the independent degree of freedom for each end effector link enables independent automatic wafer centering at the corresponding at least one substrate holding station of each one of the more than one separate and distinct end effector links.

In accordance with one or more aspects of the present disclosure the drive section is a multi-axis drive section configured to effect independent automatic wafer centering at the corresponding at least one substrate holding station of each one of the more than one separate and distinct end effector links substantially coincident with substantially simultaneous extension of the corresponding at least one substrate holding station of each of the more than one separate and distinct end effector links through respective substrate transport openings in the side wall of the transport chamber.

In accordance with one or more aspects of the present disclosure the substrate transport apparatus further comprises a controller operably coupled to the drive section and configured to extend the multi-link arm for substantially simultaneously picking or placing dual first substrates with the corresponding at least one substrate holding stations of the more than one separate and distinct end effector links through the respective substrate transport openings in the side wall of the transport chamber.

In accordance with one or more aspects of the present disclosure the controller is configured to substantially simultaneously fast swap the dual first substrates with at least one second substrate held on the corresponding at least one substrate holding stations of the more than one separate and distinct end effector links, through the respective substrate transport openings, with the dual first substrates held simultaneously on the corresponding at least one substrate holding stations of the more than one separate and distinct end effector links.

In accordance with one or more aspects of the present disclosure a substrate transport apparatus comprises:
  a frame;
  a drive section connected to the frame;
  at least one two link SCARA arm having a first arm link and a second arm link joined to each other at an elbow joint of the SCARA arm, the first arm link being joined at a shoulder joint to the drive section; and
  more than one end effector links that are separate and distinct from each other, each of which is rotatably and separately joined at a common wrist joint to the second arm link so that each end effector link rotates relative to the second arm link about a common axis of rotation at the common wrist joint, each end effector link has a corresponding at least one substrate holding station dependent therefrom;
  wherein the corresponding at least one substrate holding station dependent from each of the more than one end effector links is disposed substantially coplanar with the corresponding at least one substrate holding station dependent from each other of the more than one end effector links on a common plane determined by at least three of the corresponding at least one substrate holding station of the more than one end effector links.

In accordance with one or more aspects of the present disclosure two substrate holding stations of the at least three of the corresponding at least one substrate holding station, correspond to a common end effector link of the more than one end effector links.

In accordance with one or more aspects of the present disclosure the two substrate holding stations are disposed one each at opposite ends of the common end effector link.

In accordance with one or more aspects of the present disclosure the two substrate holding stations at opposite ends of the common end effector link are substantially coplanar with each other.

In accordance with one or more aspects of the present disclosure the two substrate holding stations at opposite ends of the common end effector link are substantially coplanar with the corresponding at least one substrate holding station of each other separate and distinct end effector link.

In accordance with one or more aspects of the present disclosure the common end effector link is substantially rigid and unarticulated between the opposite ends.

In accordance with one or more aspects of the present disclosure the more than one end effector links are disposed so that radial extension and retraction of the SCARA arm effects substantially simultaneous extension and retraction of the corresponding at least one substrate holding station of each end effector link through respective separate openings in a transport chamber wall that are juxtaposed with respect to each other at a substantially common level.

In accordance with one or more aspects of the present disclosure the drive section is a multi-axis drive section that defines an independent degree of freedom for at least one end effector link relative to other end effector links of the more than one end effector links.

In accordance with one or more aspects of the present disclosure the independent degree of freedom for each end effector link enables independent automatic wafer centering at the corresponding at least one substrate holding station of each one of the more than one effector links.

In accordance with one or more aspects of the present disclosure the drive section is a multi-axis drive section configured to effect independent automatic wafer centering at the corresponding at least one substrate holding station of each one of the more than one end effector links substantially coincident with substantially simultaneous extension of the corresponding at least one substrate holding station of each of the more than one end effector links through respective separate openings in a transport chamber wall.

In accordance with one or more aspects of the present disclosure the substrate transport apparatus further comprises a controller operably coupled to the drive section and configured to extend the SCARA arm for substantially simultaneously picking or placing dual first substrates with the corresponding at least one substrate holding stations of the more than one end effector links through the respective separate openings in the transport chamber wall.

In accordance with one or more aspects of the present disclosure the controller is configured to substantially simultaneously fast swap the dual first substrates with at least one second substrate held on the corresponding at least one substrate holding stations of the more than one end effector links, through the respective separate openings, with the dual first substrates held simultaneously on the corresponding at least one substrate holding stations of the more than one end effector links.

In accordance with one or more aspects of the present disclosure a method for transporting a substrate is provided. The method comprises:

providing a substrate transport apparatus comprising:
a frame;
a drive section connected to the frame;
at least one articulated multi-link arm having an upper arm and a forearm, the upper arm being rotatably joined at one end to the drive section, the forearm being rotatably joined to the upper arm at an opposite end of the upper arm and the upper arm being a substantially rigid unarticulated link between the one end and the opposite end;
dual end effector links that are separate and distinct from each other, each of which is rotatably and separately joined to a common end of the forearm so that each end effector link rotates relative to the forearm about a common axis of rotation, each end effector link has a corresponding at least one substrate holding station dependent therefrom;
wherein the corresponding at least one substrate holding station dependent from at least one end effector link of the dual end effector links includes one substrate holding station at opposite ends of the at least one end effector link that is substantially rigid and unarticulated between the opposite ends, and wherein the substrate holding station at one of the opposite ends is substantially coplanar with the corresponding at least one substrate holding station of each other separate and distinct end effector link; and extending the at least one articulated multi-link arm so that the dual end effector links extend through a side wall of a transport chamber, the side wall having more than one substrate transport openings separate and juxtaposed with respect to each other along the side wall on a common level.

In accordance with one or more aspects of the present disclosure the drive section is a multi-axis drive section, and the method further comprises effecting, with the drive section, independent automatic wafer centering at the corresponding at least one substrate holding station of each one of the dual end effector links substantially coincident with substantially simultaneous extension of the corresponding at least one substrate holding station of each of the dual end effector links through respective separate openings in the transport chamber wall.

In accordance with one or more aspects of the present disclosure the method further comprises:

providing a controller operably coupled to the drive section; and effecting extension of the at least one articulated multi-link arm for substantially simultaneously picking or placing dual first substrates with the corresponding at least one substrate holding stations of the dual end effector links through the respective separate openings in the transport chamber wall.

In accordance with one or more aspects of the present disclosure the method further comprises effecting, with the controller, substantially simultaneously fast swapping of the dual first substrates with at least one second substrate held on the corresponding at least one substrate holding stations of the dual end effector links, through the respective separate openings, with the dual first substrates held simultaneously on the corresponding at least one substrate holding stations of the dual end effector links.

In accordance with one or more aspects of the present disclosure a substrate processing apparatus comprises:

a transport chamber configured to hold an isolated atmosphere therein, and having a side wall with more than one substrate transport openings separate and juxtaposed with respect to each other along the side wall on a common level;

at least one articulated multi-link arm with a drive section connected to the transport chamber at a fixed location and having an upper arm and a forearm located in the transport chamber, a proximate end of the upper arm being rotatably joined to the drive section at the fixed location, the forearm being rotatably joined to the upper arm at a distal end of the upper arm and the upper arm being a substantially rigid unarticulated link between the proximate end (e.g., the fixed location) and the distal end; and wherein the multi-link arm has at least one end effector link rotatably joined to a joint at an end of the forearm so that the at least one effector link rotates relative to the forearm about a common axis of rotation at the joint, the at least one end effector link has more than one substrate holding station dependent therefrom juxtaposed along a common plane with respect to each other and configured so that rotation of the at least one end effector link about the common axis of rotation rotates the more than one substrate holding station about the common axis of rotation;

wherein the drive section is configured to at least extend and retract the multi-link arm along a non-radial linear path, relative to the fixed location, so the more than one juxtaposed substrate holding station each traverse linearly along the non-radial path, with extension and retraction of the arm, and pass substantially simultaneously through separate corresponding openings of the more than one juxtaposed substrate transport openings on the common level.

In accordance with one or more aspects of the present disclosure the more than one juxtaposed substrate holding station are dependent from a common end effector link that is a substantially rigid unarticulated link between the more than one juxtaposed substrate holding station.

In accordance with one or more aspects of the present disclosure the at least one end effector link comprises more than one end effector link joined to the end of the forearm to rotate relative to the forearm about the common axis of rotation, and each of the more than one end effector link has at least one corresponding substrate holding station, of the more than one juxtaposed substrate holding station, dependent therefrom.

In accordance with one or more aspects of the present disclosure each of the more than one end effector link has more than one corresponding substrate holding station, of the more than one juxtaposed substrate holding station, dependent therefrom and is respectively a substantially rigid unarticulated link between the more than one corresponding substrate holding station dependent from the respective end effector link.

In accordance with one or more aspects of the present disclosure the drive section is configured to extend and retract the at least one multi-link arm along the non-radial linear path and substantially simultaneously pass the at least one corresponding substrate holding station of each end effector link respectively through the separate substrate transport openings juxtaposed along the side wall, and to independently align the at least one corresponding substrate holding station relative to another of the more than one end effector links.

In accordance with one or more aspects of the present disclosure the at least one end effector link comprises more than one end effector link joined to the end of the forearm to rotate relative to the forearm about the common axis of rotation, wherein the drive section is configured so that each of the more than one end effector link respectively rotates independent of another of the more than one end effector link about the common axis of rotation, and each respective one of the more than one end effector link has at least one corresponding substrate holding station, of the more than one juxtaposed substrate holding station, dependent therefrom.

In accordance with one or more aspects of the present disclosure a substrate processing apparatus comprises:

a transport chamber configured to hold an isolated atmosphere therein, and having a side wall with more than one substrate transport openings separate and juxtaposed with respect to each other along the side wall on a common level;

at least one articulated multi-link arm with a drive section connected to the transport chamber at a fixed location and having an upper arm and a forearm located in the transport chamber, a proximate end of the upper arm being rotatably joined to the drive section at the fixed location, the forearm being rotatably joined to the upper arm at a distal end of the upper arm and the upper arm being a substantially rigid unarticulated link between the proximate end (fixed location) and the distal end; and wherein the multi-link arm has at least one end effector link rotatably joined to a joint at an end of the forearm so that the at least one effector link rotates relative to the forearm about a common axis of rotation at the joint, the at least one end effector link has more than one substrate holding station dependent therefrom and disposed on a common plane with respect to each other and configured so that rotation of the at least one end effector link about the common axis of rotation rotates each of the more than one substrate holding station about the common axis of rotation, wherein the drive section is configured to at least extend and retract the multi-link arm along a radial or non-radial linear path, relative to the fixed location, so at least two juxtaposed substrate holding stations, of the more than one substrate holding station, each traverse linearly along the radial or non-radial path, with extension and retraction of the arm, and pass substantially simultaneously through separate corresponding openings of the more than one juxtaposed substrate transport openings on the common level, and so at least another of the more than one substrate holding station, different from each of the two juxtaposed substrate holding stations, is rotatable about the common axis of rotation independent of the at least two juxtaposed substrate holding stations.

In accordance with one or more aspects of the present disclosure the at least two juxtaposed substrate holding stations and the at least another substrate holding station are disposed on the at least one end effector link so that the at least two juxtaposed substrate holding stations and the at least another substrate holding station are arranged on opposite sides of the common axis of rotation.

In accordance with one or more aspects of the present disclosure the at least two juxtaposed substrate holding stations and the at least another substrate holding stations are disposed on the at least one end effector link to rotate about the common axis, with extension and retraction of the arm along the radial or non-radial path, to selectably conform a position of the at least one end effector to another side wall of the transport chamber different than the side wall through which openings of the at least one of the more than one substrate holding stations of the at least one end effector link pass through with extension and retraction of the arm.

In accordance with one or more aspects of the present disclosure the at least two juxtaposed substrate holding stations are disposed on the at least one end effector link operably connected to the drive section and arranged so that the at least one end effector link rotates the at least two juxtaposed substrate holding stations about the common axis of rotation with a common independent degree of freedom.

In accordance with one or more aspects of the present disclosure the at least two juxtaposed substrate holding stations are disposed on the at least one end effector link operably connected to the drive section and arranged so that the at least one end effector link rotates each of the at least two juxtaposed substrate holding stations about the common axis of rotation with a different respective independent degree of freedom so that each of the at least two juxtaposed substrate holding stations is independently rotated with respect to each other about the common axis of rotation.

In accordance with one or more aspects of the present disclosure a substrate processing apparatus comprises:

a transport chamber configured to hold an isolated atmosphere therein, and having a side wall with more than one substrate transport openings separate and juxtaposed with respect to each other along the side wall on a common level;

at least one articulated multi-link arm with a drive section connected to the transport chamber at a fixed location and having an upper arm and a forearm located in the transport chamber, a proximate end of the upper arm being rotatably joined to the drive section at the fixed location, the forearm being rotatably joined to the upper arm at a distal end of the upper arm and the upper arm being a substantially rigid unarticulated link between the proximate end (fixed location) and the distal end; and wherein the multi-link arm has at least one end effector link rotatably joined to a joint at an end of the forearm so that the at least one effector link rotates relative to the forearm about a common axis of rotation at the joint, the at least one end effector link has more than one substrate holding station dependent therefrom juxtaposed along different planes, offset in height with respect to each other, and configured so that rotation of the at least one end effector link about the common axis of rotation rotates each of the more than one substrate holding station about the common axis of rotation, wherein the drive section is configured to at least extend and retract the multi-link arm along a radial or non-radial linear path, relative to the fixed location, so at least two juxtaposed substrate holding stations, of the more than one substrate holding station, each traverse linearly along the radial or non-radial path, with extension and retraction of the arm, and are each rotatable about the common axis of rotation independent of each other so as to pass separately through a common opening of the more than one juxtaposed substrate transport openings on the common level, and at least another of the more than one substrate holding station, different from each of the two juxtaposed substrate holding stations, is disposed on the at least one end effector link substantially opposite each of the at least two juxtaposed substrate holding stations.

In accordance with one or more aspects of the present disclosure the at least one end effector is configured so the at least another substrate holding station, is rotatable about the common axis of rotation independent of the at least two juxtaposed substrate holding stations.

In accordance with one or more aspects of the present disclosure the at least two juxtaposed substrate holding stations and the at least another substrate holding station are disposed on the at least one end effector link so that the at least two juxtaposed substrate holding stations and the at least another substrate holding station are arranged on opposite sides of the common axis of rotation.

In accordance with one or more aspects of the present disclosure the at least two juxtaposed substrate holding stations and the at least another substrate holding stations are disposed on the at least one end effector link to rotate about the common axis, with extension and retraction of the arm along the radial or non-radial path, to selectably conform a position of the at least one end effector to another side wall of the transport chamber different than the side wall through which openings of the at least one of the more than one substrate holding stations of the at least one end effector link pass through with extension and retraction of the arm.

In accordance with one or more aspects of the present disclosure the at least two juxtaposed substrate holding stations are disposed on the at least one end effector link operably connected to the drive section and arranged so that the at least one end effector link rotates each of the at least two juxtaposed substrate holding stations about the common axis of rotation with a different respective independent degree of freedom so that each of the at least two juxtaposed substrate holding stations is independently rotated with respect to each other about the common axis of rotation.

In accordance with one or more aspects of the present disclosure the drive section is configured to move the more than one substrate holding station of the at least one end effector link in height with respect to each other so as to place the more than one substrate holding station on the common level juxtaposed to one another.

In accordance with one or more aspects of the present disclosure a substrate processing apparatus comprises: a transport chamber configured to hold an isolated atmosphere therein, and having a side wall with more than one substrate transport openings separate and juxtaposed with respect to each other along the side wall on a common level; a five degree of freedom drive section connected to the transport chamber at a fixed location; and an articulated multi-link arm having at least one upper arm with a common upper arm link, pivotally mounted to the drive section, and two forearms being pivotally mounted to ends of the common upper arm link, each of the two forearms having respectively two end effector links pivotally mounted at one end of the respective forearm to rotate relative to the respective forearm, each of the two end effector links having a substrate holding station thereon; wherein the five degree of freedom drive section is configured so that the five degrees of freedom of the drive section define at least extension and retraction of the articulated multi-link arm along a linear path, relative to the fixed location, with each respective forearm being independently pivotable relative to the common upper arm link, and each of the two end effector links at the one end of each of the respective forearm being independently pivotable about the one end of the respective forearm.

In accordance with one or more aspects of the present disclosure the two end effector links are pivotally mounted at a joint at the one end of the respective forearm to rotate relative to the respective forearm.

In accordance with one or more aspects of the present disclosure each of the two end effector links pivotally mounted at the one end of the respective forearm rotates relative to the respective forearm about a common axis of rotation at the joint.

In accordance with one or more aspects of the present disclosure the common upper arm link is a substantially rigid unarticulated link between the fixed location and a respective joint of each of the two forearms and the common upper arm link.

In accordance with one or more aspects of the present disclosure each forearm is disposed to resolve automated centering of each substrate at substrate holding stations of the two end effectors of the respective forearm independent from each other forearm.

In accordance with one or more aspects of the present disclosure each forearm is disposed to respectively resolve, independent from each other forearm, automated centering of each substrate at substrate holding stations of the two end effectors of the respective forearm so as to effect fast swap of substrates through the more than one substrate transport openings along the side wall.

In accordance with one or more aspects of the present disclosure a substrate processing apparatus comprises: a transport chamber configured to hold an isolated atmosphere therein, and having a side wall with more than one substrate transport openings separate and juxtaposed with respect to each other along the side wall on a common level; a drive section with at least one drive axis connected to the transport chamber at a fixed location; and an articulated multi-link arm having at least one upper arm with a common upper arm link, pivotally mounted to the drive section, and two forearms being pivotally mounted to ends of the common upper arm link, each of the two forearms having respectively two end effector links pivotally mounted at one end of the respective forearm to rotate relative to the respective forearm, each of the two end effector links having a substrate holding station thereon; wherein the at least one drive axis of the drive section is configured to at least extend and retract the articulated multi-link arm along a linear path relative to the fixed location, with each respective forearm being independently pivotable relative to the common upper arm link; wherein each respective forearm has an end effector link, of the two end effector links mounted to the one end of the respective forearm, operably coupled to a common drive axis, of the at least one drive axis, that defines a common degree of freedom for two end effector links, one on each respective forearm, rotating the end effector link relative to the respective forearm, and at least another of the two end effector links at the one end of at least one forearm, of the two forearms, has another degree of freedom rotating the other end effector link about the at least one forearm independent from the common degree of freedom.

In accordance with one or more aspects of the present disclosure the drive section is a five drive axis drive section.

In accordance with one or more aspects of the present disclosure the common degree of freedom rotates the two end effector links, one on each respective forearm, in unison relative to the respective forearm.

In accordance with one or more aspects of the present disclosure the two end effector links are pivotally mounted at a joint at the one end of the respective forearm to rotate relative to the respective forearm.

In accordance with one or more aspects of the present disclosure each of the two end effector links pivotally mounted at the one end of the respective forearm rotates relative to the respective forearm about a common axis of rotation at the joint.

In accordance with one or more aspects of the present disclosure the common upper arm link is a substantially rigid unarticulated link between the fixed location and a respective joint of each of the two forearms and the common upper arm link.

In accordance with one or more aspects of the present disclosure each forearm is disposed to resolve automated centering of each substrate at substrate holding stations of the two end effectors of the respective forearm independent from each other forearm.

In accordance with one or more aspects of the present disclosure each forearm is disposed to respectively resolve, independent from each other forearm, automated centering of each substrate at substrate holding stations of the two end effectors of the respective forearm so as to effect fast swap of substrates through the more than one substrate transport openings along the side wall.

In accordance with one or more aspects of the present disclosure a substrate processing apparatus comprises: a transport chamber configured to hold an isolated atmosphere therein, and having a side wall with more than one substrate transport openings separate and juxtaposed with respect to each other along the side wall on a common level; a drive section with at least one drive axis connected to the transport chamber at a fixed location; and an articulated multi-link arm having at least one upper arm with a common upper arm link, pivotally mounted to the drive section, and two forearms being pivotally mounted to ends of the common upper arm link, each of the two forearms having respectively two end effector links pivotally mounted at one end of the respective forearm to rotate relative to the respective forearm, each of the two end effector links having a substrate holding station thereon; wherein the at least one drive axis of the drive section is configured to at least extend and retract the articulated multi-link arm along a linear path relative to the fixed location; and wherein a first end effector link, of the two end effector links corresponding to a first forearm, of the two forearms, and a first end effector link, of the two end effector links corresponding to a second forearm, of the two forearms, are operably coupled to a common drive axis, of the at least one drive axis, that defines a common degree of freedom for the first end effector link of the first forearm and the first end effector link of the second forearm rotating each respective first end effector link relative to the corresponding first and second forearm, and a second end effector link of the first forearm has another degree of freedom rotating the second end effector link about the first forearm independent from the common degree of freedom.

In accordance with one or more aspects of the present disclosure each respective forearm is independently pivotable relative to the common upper arm link.

In accordance with one or more aspects of the present disclosure the drive section is a five drive axis drive section.

In accordance with one or more aspects of the present disclosure the common degree of freedom rotates the two end effector links, one on each respective forearm, in unison relative to the respective forearm.

In accordance with one or more aspects of the present disclosure the two end effector links are pivotally mounted at a joint at the one end of the respective forearm to rotate relative to the respective forearm.

In accordance with one or more aspects of the present disclosure each of the two end effector links pivotally mounted at the one end of the respective forearm rotates relative to the respective forearm about a common axis of rotation at the joint.

In accordance with one or more aspects of the present disclosure the common upper arm link is a substantially rigid unarticulated link between the fixed location and a respective joint of each of the two forearms and the common upper arm link.

In accordance with one or more aspects of the present disclosure each forearm is disposed to resolve automated centering of each substrate at substrate holding stations of the two end effectors of the respective forearm independent from each other forearm.

In accordance with one or more aspects of the present disclosure each forearm is disposed to respectively resolve, independent from each other forearm, automated centering of each substrate at substrate holding stations of the two end effectors of the respective forearm so as to effect fast swap of substrates through the more than one substrate transport openings along the side wall.

In accordance with one or more aspects of the present disclosure a method comprises: providing a transport chamber configured to hold an isolated atmosphere therein, and having a side wall with more than one substrate transport openings separate and juxtaposed with respect to each other along the side wall on a common level; providing an articulated multi-link arm having at least one upper arm with a common upper arm link, pivotally mounted to a five degree of freedom drive section, and two forearms being pivotally mounted to ends of the common upper arm link, each of the two forearms having respectively two end effector links pivotally mounted at one end of the respective forearm to rotate relative to the respective forearm, each of the two end effector links having a substrate holding station thereon; and driving the articulated multi-link arm with the five degree of freedom drive section that is connected to the transport chamber at a fixed location, wherein the five degree of freedom drive section defines at least extension and retraction of the articulated multi-link arm along a linear path, relative to the fixed location, with each respective forearm being independently pivotable relative to the common upper arm link, and each of the two end effector links at the one end of each of the respective forearm being independently pivotable about the one end of the respective forearm.

In accordance with one or more aspects of the present disclosure the two end effector links are pivotally mounted at a joint at the one end of the respective forearm to rotate relative to the respective forearm.

In accordance with one or more aspects of the present disclosure each of the two end effector links pivotally mounted at the one end of the respective forearm rotates relative to the respective forearm about a common axis of rotation at the joint.

In accordance with one or more aspects of the present disclosure the common upper arm link is a substantially rigid unarticulated link between the fixed location and a respective joint of each of the two forearms and the common upper arm link.

In accordance with one or more aspects of the present disclosure the method further comprises resolving, with each forearm, automated centering of each substrate at substrate holding stations of the two end effectors of the respective forearm independent from each other forearm.

In accordance with one or more aspects of the present disclosure the method further comprises, respectively resolving, with each forearm, independent from each other forearm, automated centering of each substrate at substrate holding stations of the two end effectors of the respective forearm so as to effect fast swap of substrates through the more than one substrate transport openings along the side wall.

In accordance with one or more aspects of the present disclosure a method comprises: providing a transport chamber configured to hold an isolated atmosphere therein, and having a side wall with more than one substrate transport openings separate and juxtaposed with respect to each other along the side wall on a common level; providing an articulated multi-link arm having at least one upper arm with a common upper arm link, pivotally mounted to a drive section, and two forearms being pivotally mounted to ends of the common upper arm link, each of the two forearms having respectively two end effector links pivotally mounted at one end of the respective forearm to rotate relative to the respective forearm, each of the two end effector links having a substrate holding station thereon; and driving the articulated multi-link arm with the drive section having at least one drive axis connected to the transport chamber at a fixed location, wherein: the at least one drive axis of the drive section is configured to at least extend and retract the articulated multi-link arm along a linear path relative to the fixed location, with each respective forearm being independently pivotable relative to the common upper arm link; and each respective forearm has an end effector link, of the two end effector links mounted to the one end of the respective forearm, operably coupled to a common drive axis, of the at least one drive axis, that defines a common degree of freedom for two end effector links, one on each respective forearm, rotating the end effector link relative to the respective forearm, and at least another of the two end effector links at the one end of at least one forearm, of the two forearms, has another degree of freedom rotating the other end effector link about the at least one forearm independent from the common degree of freedom.

In accordance with one or more aspects of the present disclosure the drive section is a five drive axis drive section.

In accordance with one or more aspects of the present disclosure the common degree of freedom rotates the two end effector links, one on each respective forearm, in unison relative to the respective forearm.

In accordance with one or more aspects of the present disclosure the two end effector links are pivotally mounted at a joint at the one end of the respective forearm to rotate relative to the respective forearm.

In accordance with one or more aspects of the present disclosure each of the two end effector links pivotally mounted at the one end of the respective forearm rotates relative to the respective forearm about a common axis of rotation at the joint.

In accordance with one or more aspects of the present disclosure the common upper arm link is a substantially rigid unarticulated link between the fixed location and a respective joint of each of the two forearms and the common upper arm link.

In accordance with one or more aspects of the present disclosure the method further comprises resolving, with each forearm, automated centering of each substrate at substrate holding stations of the two end effectors of the respective forearm independent from each other forearm.

In accordance with one or more aspects of the present disclosure the method further comprises resolving, with each forearm, independent from each other forearm, automated centering of each substrate at substrate holding stations of the two end effectors of the respective forearm so as to effect fast swap of substrates through the more than one substrate transport openings along the side wall.

In accordance with one or more aspects of the present disclosure a method comprises: providing a transport chamber configured to hold an isolated atmosphere therein, and having a side wall with more than one substrate transport openings separate and juxtaposed with respect to each other along the side wall on a common level; providing an articulated multi-link arm having at least one upper arm with a common upper arm link, pivotally mounted to a drive section, and two forearms being pivotally mounted to ends of the common upper arm link, each of the two forearms having respectively two end effector links pivotally mounted at one end of the respective forearm to rotate relative to the respective forearm, each of the two end effector links having a substrate holding station thereon; and driving the articulated multi-link arm with the drive section having at least one drive axis connected to the transport chamber at a fixed location wherein: the at least one drive axis of the drive section is configured to at least extend and retract the articulated multi-link arm along a linear path relative to the fixed location; and a first end effector link, of the two end effector links corresponding to a first forearm, of the two forearms, and a first end effector link, of the two end effector links corresponding to a second forearm, of the two forearms, are operably coupled to a common drive axis, of the at least one drive axis, that defines a common degree of freedom for the first end effector link of the first forearm and the first end effector link of the second forearm rotating each respective first end effector link relative to the corresponding first and second forearm, and a second end effector link of the first forearm has another degree of freedom rotating the second end effector link about the first forearm independent from the common degree of freedom.

In accordance with one or more aspects of the present disclosure each respective forearm is independently pivotable relative to the common upper arm link.

In accordance with one or more aspects of the present disclosure the drive section is a five drive axis drive section.

In accordance with one or more aspects of the present disclosure the common degree of freedom rotates the two end effector links, one on each respective forearm, in unison relative to the respective forearm.

In accordance with one or more aspects of the present disclosure the two end effector links are pivotally mounted at a joint at the one end of the respective forearm to rotate relative to the respective forearm.

In accordance with one or more aspects of the present disclosure each of the two end effector links pivotally mounted at the one end of the respective forearm rotates relative to the respective forearm about a common axis of rotation at the joint.

In accordance with one or more aspects of the present disclosure the common upper arm link is a substantially rigid unarticulated link between the fixed location and a respective joint of each of the two forearms and the common upper arm link.

In accordance with one or more aspects of the present disclosure the method further comprises resolving, with each forearm, automated centering of each substrate at substrate holding stations of the two end effectors of the respective forearm independent from each other forearm.

In accordance with one or more aspects of the present disclosure the method further comprises resolving, with each forearm, independent from each other forearm, automated centering of each substrate at substrate holding stations of the two end effectors of the respective forearm so as to effect fast swap of substrates through the more than one substrate transport openings along the side wall.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A substrate transport apparatus comprising:
a frame;
a drive section connected to the frame;
at least one articulated multi-link arm having an upper arm and a forearm, the upper arm being rotatably joined at one end to the drive section, the forearm being rotatably joined to the upper arm at an opposite end of the upper arm and the upper arm being a substantially rigid unarticulated link between the one end and the opposite end;
dual end effector links that are separate and distinct from each other, each of which is rotatably and separately joined to a common end of the forearm so that each end effector link rotates relative to the forearm about a common axis of rotation, each end effector link has a corresponding at least one substrate holding station dependent therefrom;
wherein:
the corresponding at least one substrate holding station dependent from at least one end effector link of the dual end effector links includes one substrate holding station at opposite ends of the at least one end effector link that is substantially rigid and unarticulated between the opposite ends, and wherein the substrate holding station at one of the opposite ends is substantially coplanar with the corresponding at least one substrate holding station of each other separate and distinct end effector link, and
the drive section is a multi-axis drive section that defines an independent degree of freedom for at least one end effector link relative to the other.

2. The substrate transport apparatus of claim 1, wherein the dual end effector links are disposed so that radial extension and retraction of the multi-link arm effects substantially simultaneous extension and retraction of the corresponding at least one substrate holding station of each end effector link through respective separate openings in a transport chamber wall that are juxtaposed with respect to each other at a substantially common level.

3. The substrate transport apparatus of claim 1, wherein the substrate holding station at opposite ends of the at least one end effector link are substantially coplanar with each other.

4. The substrate transport apparatus of claim 1, wherein the substrate holding station at opposite ends of the at least one end effector link are substantially coplanar with the corresponding at least one substrate holding station of each other separate and distinct end effector link.

5. The substrate transport apparatus of claim 1, wherein the corresponding at least one substrate holding station of each separate and distinct end effector link includes one substrate holding station at opposite ends of the at least one end effector link, and each of the separate and distinct end effector link is substantially rigid and unarticulated between opposite ends.

6. The substrate transport apparatus of claim 1, wherein the independent degree of freedom for each end effector link enables independent automatic wafer centering at the corresponding at least one substrate holding station of each one of the dual end effector links.

7. The substrate transport apparatus of claim 1, wherein the multi-axis drive section is configured to effect independent automatic wafer centering at the corresponding at least one substrate holding station of each one of the dual end effector links substantially coincident with substantially simultaneous extension of the corresponding at least one substrate holding station of each of the dual end effector links through respective separate openings in a transport chamber wall.

8. The substrate transport apparatus of claim 7, further comprising a controller operably coupled to the drive section and configured to extend the multi-link arm for substantially simultaneously picking or placing dual first substrates with the corresponding at least one substrate holding stations of the dual end effector links through the respective separate openings in the transport chamber wall.

9. The substrate transport apparatus of claim 8, wherein the controller is configured to substantially simultaneously fast swap the dual first substrates with at least one second substrate held on the corresponding at least one substrate holding stations of the dual end effector links, through the respective separate openings, with the dual first substrates held simultaneously on the corresponding at least one substrate holding stations of the dual end effector links.

10. A substrate processing apparatus comprising:
a transport chamber configured to hold an isolated atmosphere therein, and having a side wall with more than one substrate transport openings separate and juxtaposed with respect to each other along the side wall on a common level;
at least one articulated multi-link arm with a drive section connected to the transport chamber at a fixed location and having an upper arm and a forearm located in the transport chamber, the upper arm being rotatably joined at one end to the drive section, the forearm being rotatably joined to the upper arm at an opposite end of the upper arm and the upper arm being a substantially rigid unarticulated link between the one end and the opposite end; and
wherein the multi-link arm has more than one separate and distinct end effector links, each of which is rotatably and separately joined to a joint at a common end of the forearm so that each end effector link rotates relative to the forearm about a common axis of rotation at the joint, each end effector link has a corresponding at least one substrate holding station dependent therefrom, and extends from the joint so that the more than one end effector links are juxtaposed along a common plane with respect to each other,
wherein the drive section is configured to at least extend and retract the multi-link arm along a radial axis, which extension and retraction effects substantially simultaneous extension and retraction of the corresponding at least one substrate holding station of each end effector link respectively through the separate openings juxtaposed along the side wall, and to independently align at least one of the corresponding substrate holding station relative to another of the more than one end effector links.

11. The substrate transport apparatus of claim 10, wherein the drive section is configured to independently align the corresponding at least one substrate holding station of each of the end effector links relative to the corresponding substrate holding station of another of the end effector links.

12. The substrate transport apparatus of claim 10, wherein the corresponding at least one substrate holding station dependent from at least one of the end effector links includes one substrate holding station at opposite ends of the at least one of the end effector links that is substantially rigid and unarticulated between the opposite ends.

13. The substrate transport apparatus of claim 12, wherein the corresponding at least one substrate holding station at one of the opposite ends is substantially coplanar with the corresponding at least one substrate holding station of each other separate and distinct end effector link.

14. The substrate transport apparatus of claim 12, wherein the corresponding at least one substrate holding station at opposite ends of the at least one of the end effector links are substantially coplanar with each other.

15. The substrate transport apparatus of claim 10, wherein the drive section is a multi-axis drive section that defines an independent degree of freedom for at least one end effector link relative to the other.

16. The substrate transport apparatus of claim 15, wherein the independent degree of freedom for each end effector link enables independent automatic wafer centering at the corresponding at least one substrate holding station of each one of the more than one separate and distinct end effector links.

17. The substrate transport apparatus of claim 10, wherein the drive section is a multi-axis drive section configured to effect independent automatic wafer centering at the corresponding at least one substrate holding station of each one of the more than one separate and distinct end effector links substantially coincident with substantially simultaneous extension of the corresponding at least one substrate holding station of each of the more than one separate and distinct end effector links through respective substrate transport openings in the side wall of the transport chamber.

18. The substrate transport apparatus of claim 10, further comprising a controller operably coupled to the drive section and configured to extend the multi-link arm for substantially simultaneously picking or placing dual first substrates with the corresponding at least one substrate holding stations of the more than one separate and distinct end effector links through the respective substrate transport openings in the side wall of the transport chamber.

19. The substrate transport apparatus of claim 18, wherein the controller is configured to substantially simultaneously fast swap the dual first substrates with at least one second substrate held on the corresponding at least one substrate holding stations of the more than one separate and distinct end effector links, through the respective substrate transport openings, with the dual first substrates held simultaneously on the corresponding at least one substrate holding stations of the more than one separate and distinct end effector links.

20. A substrate transport apparatus comprising:
a frame;
a drive section connected to the frame;
at least one two link SCARA arm having a first arm link and a second arm link joined to each other at an elbow joint of the SCARA arm, the first arm link being joined at a shoulder joint to the drive section; and
more than one end effector links that are separate and distinct from each other, each of which is rotatably and separately joined at a common wrist joint to the second arm link so that each end effector link rotates relative to the second arm link about a common axis of rotation at the common wrist joint, each end effector link has a corresponding at least one substrate holding station dependent therefrom;
wherein:
the corresponding at least one substrate holding station dependent from each of the more than one end effector links is disposed substantially coplanar with the corresponding at least one substrate holding station dependent from each other of the more than one end effector links on a common plane determined by at least three of the corresponding at least one substrate holding station of the more than one end effector links, and
the drive section is a multi-axis drive section that defines an independent degree of freedom for at least one end effector link relative to other end effector links of the more than one end effector links.

21. The substrate transport apparatus of claim 20, wherein two substrate holding stations of the at least three of the corresponding at least one substrate holding station, correspond to a common end effector link of the more than one end effector links.

22. The substrate transport apparatus of claim 21, wherein the two substrate holding stations are disposed one each at opposite ends of the common end effector link.

23. The substrate transport apparatus of claim 21, wherein the two substrate holding stations at opposite ends of the common end effector link are substantially coplanar with each other.

24. The substrate transport apparatus of claim 21, wherein the two substrate holding stations at opposite ends of the common end effector link are substantially coplanar with the corresponding at least one substrate holding station of each other separate and distinct end effector link.

25. The substrate transport apparatus of claim 21, wherein the common end effector link is substantially rigid and unarticulated between the opposite ends.

26. The substrate transport apparatus of claim 20, wherein the more than one end effector links are disposed so that radial extension and retraction of the SCARA arm effects substantially simultaneous extension and retraction of the corresponding at least one substrate holding station of each end effector link through respective separate openings in a transport chamber wall that are juxtaposed with respect to each other at a substantially common level.

27. The substrate transport apparatus of claim 20, wherein the independent degree of freedom for each end effector link enables independent automatic wafer centering at the corresponding at least one substrate holding station of each one of the more than one effector links.

28. The substrate transport apparatus of claim 20, wherein the multi-axis drive section configured to effect independent automatic wafer centering at the corresponding at least one substrate holding station of each one of the more than one end effector links substantially coincident with substantially simultaneous extension of the corresponding at least one substrate holding station of each of the more than one end effector links through respective separate openings in a transport chamber wall.

29. The substrate transport apparatus of claim 28, further comprising a controller operably coupled to the drive section and configured to extend the SCARA arm for substantially simultaneously picking or placing dual first substrates with the corresponding at least one substrate holding stations of the more than one end effector links through the respective separate openings in the transport chamber wall.

30. The substrate transport apparatus of claim 29, wherein the controller is configured to substantially simultaneously fast swap the dual first substrates with at least one second substrate held on the corresponding at least one substrate holding stations of the more than one end effector links, through the respective separate openings, with the dual first substrates held simultaneously on the corresponding at least one substrate holding stations of the more than one end effector links.

31. A method for transporting a substrate, the method comprising:
providing a substrate transport apparatus comprising:
a frame;
a multi-axis drive section connected to the frame;
at least one articulated multi-link arm having an upper arm and a forearm, the upper arm being rotatably joined at one end to the multi-axis drive section, the forearm being rotatably joined to the upper arm at an opposite end of the upper arm and the upper arm being a substantially rigid unarticulated link between the one end and the opposite end;
dual end effector links that are separate and distinct from each other, each of which is rotatably and separately joined to a common end of the forearm so that each end effector link rotates relative to the forearm about a common axis of rotation, each end effector link has a corresponding at least one substrate holding station dependent therefrom,
wherein:
the corresponding at least one substrate holding station dependent from at least one end effector link of the dual end effector links includes one substrate holding station at opposite ends of the at least one end effector link that is substantially rigid and unarticulated between the opposite ends, and wherein the substrate holding station at one of the opposite ends is substantially coplanar with the corresponding at least one substrate holding station of each other separate and distinct end effector link, and
the multi-axis drive section defines an independent degree of freedom for at least one end effector link relative to the other; and
extending the at least one articulated multi-link arm so that the dual end effector links extend through a side wall of a transport chamber, the side wall having more than one substrate transport openings separate and juxtaposed with respect to each other along the side wall on a common level.

32. The method of claim 31, further comprising effecting, with the multi-axis drive section, independent automatic wafer centering at the corresponding at least one substrate holding station of each one of the dual end effector links substantially coincident with substantially simultaneous extension of the corresponding at least one substrate holding station of each of the dual end effector links through respective separate openings in the transport chamber wall.

33. The method of claim 31, further comprising:
providing a controller operably coupled to the multi-axis drive section; and
effecting extension of the at least one articulated multi-link arm for substantially simultaneously picking or placing dual first substrates with the corresponding at least one substrate holding stations of the dual end effector links through the respective separate openings in the transport chamber wall.

34. The method of claim 33, further comprising effecting, with the controller, substantially simultaneously fast swapping of the dual first substrates with at least one second substrate held on the corresponding at least one substrate holding stations of the dual end effector links, through the respective separate openings, with the dual first substrates held simultaneously on the corresponding at least one substrate holding stations of the dual end effector links.

* * * * *